(12) United States Patent
Sasada et al.

(10) Patent No.: US 11,225,602 B2
(45) Date of Patent: Jan. 18, 2022

(54) LIGHT EMITTING DEVICE

(71) Applicant: Sumitomo Chemical Company, Limited, Tokyo (JP)

(72) Inventors: Toshiaki Sasada, Tsukuba (JP); Takakazu Saito, Tsukuba (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 236 days.

(21) Appl. No.: 16/307,161

(22) PCT Filed: Jun. 16, 2017

(86) PCT No.: PCT/JP2017/022264
§ 371 (c)(1),
(2) Date: Dec. 5, 2018

(87) PCT Pub. No.: WO2017/221822
PCT Pub. Date: Dec. 28, 2017

(65) Prior Publication Data
US 2019/0203115 A1    Jul. 4, 2019

(30) Foreign Application Priority Data
Jun. 24, 2016  (JP) .............. JP2016-125296

(51) Int. Cl.
| H01L 51/50 | (2006.01) |
| C09K 11/06 | (2006.01) |
| H05B 33/12 | (2006.01) |
| H01L 51/00 | (2006.01) |

(52) U.S. Cl.
CPC .......... C09K 11/06 (2013.01); H01L 51/0036 (2013.01); H01L 51/50 (2013.01); H01L 51/5012 (2013.01); H01L 51/5056 (2013.01); H01L 51/5072 (2013.01); H01L 51/5092 (2013.01); H05B 33/12 (2013.01)

(58) Field of Classification Search
None
See application file for complete search history.

(56) References Cited

U.S. PATENT DOCUMENTS

| 2004/0169461 | A1 | 9/2004 | Moriyama et al. | |
| 2011/0089411 | A1 | 4/2011 | Xia et al. | |
| 2012/0049168 | A1* | 3/2012 | Inbasekaran ........... | H05B 33/14 257/40 |
| 2014/0217376 | A1 | 8/2014 | Steudel | |
| 2014/0252339 | A1 | 9/2014 | King et al. | |
| 2014/0291651 | A1 | 10/2014 | Humphries et al. | |
| 2015/0115245 | A1 | 4/2015 | Archer | |
| 2017/0040538 | A1 | 2/2017 | Matsumoto et al. | |
| 2017/0194584 | A1 | 7/2017 | Anryu et al. | |

FOREIGN PATENT DOCUMENTS

| CN | 1585578 | A | 2/2005 |
| JP | 2004014155 | A | 1/2004 |
| JP | 2011525918 | A | 9/2011 |
| JP | 2012079900 | A | 4/2012 |
| JP | 2014519702 | A | 8/2014 |
| JP | 2014528972 | A | 10/2014 |
| JP | 2015012551 | A | 1/2015 |
| JP | 2015035600 | A | 2/2015 |
| JP | 2015523675 | A | 8/2015 |

(Continued)

OTHER PUBLICATIONS

International Search Report dated Aug. 8, 2017 in International Application No. PCT/JP2017/022264.
Written Opinion dated Aug. 8, 2017 in International Application No. PCT/JP2017/022264.
Extended European Search Report dated Jan. 3, 2020 in EP Application No. 17815290.6.
Schwartz et al., "Triplet Harvesting in Hybrid White Organic Light-Emitting Diodes," Advanced Functional Materials, vol. 19, pp. 1319-1333 (2009).
Office Action dated Feb. 9, 2021 in JP Application No. 2018524026.

*Primary Examiner* — Gregory D Clark
(74) *Attorney, Agent, or Firm* — Panitch Schwarze Belisario & Nadel LLP

(57) ABSTRACT

A light emitting device having excellent external quantum efficiency contains an anode, a cathode, and two organic layers between the anode and cathode. The first organic layer contains a fluorescent low-molecular weight compound, and the second organic layer contains a cross-linked body of a cross-linkable polymer compound containing a unit having a group obtained from a metal complex represented by the formula (1), a cross-linkable constitutional unit having a cross-linkable group, and an aromatic amine constitutional unit:

(1)

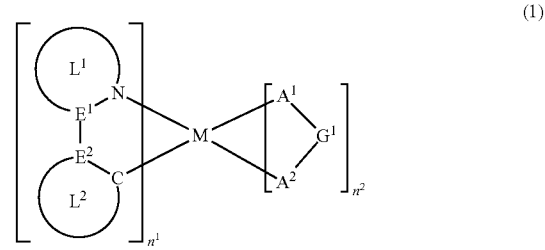

In formula (1), M represents a palladium atom, $n^1$ represents an integer of 1 or more, $n^2$ represents an integer of 0 or more, $E^1$ and $E^2$ represent a carbon atom, Ring $L^1$ represents an aromatic hetero ring, Ring $L^2$ represents an aromatic hydrocarbon ring or an aromatic hetero ring, and $A^1$-$G^1$-$A^2$ represents an anionic bidentate ligand.

14 Claims, No Drawings

(56) References Cited

FOREIGN PATENT DOCUMENTS

| JP | 2015174932 A | 10/2015 |
|----|--------------|---------|
| WO | 2012052713 A1 | 4/2012 |
| WO | 2013064814 A1 | 5/2013 |
| WO | 2015163174 A1 | 10/2015 |
| WO | 2016026806 A1 | 2/2016 |

* cited by examiner

LIGHT EMITTING DEVICE

CROSS-REFERENCE TO RELATED APPLICATION

This application is a Section 371 of International Application No. PCT/JP2017/022264, filed Jun. 16, 2017, which was published in the Japanese language on Dec. 28, 2017 under International Publication No. WO 2017/221822 A1, which claims priority under 35 U.S.C. § 119(b) to Japanese Application No. 2016-125296, filed Jun. 24, 2016, the disclosures of which are incorporated herein by reference in their entirety.

TECHNICAL FIELD

The present invention relates to a light emitting device.

BACKGROUND ART

Light emitting devices such as organic electroluminescent devices and the like can be suitably used for applications of display and illumination, and researches and developments thereof are being conducted.

For example, Patent Document 1 describes a light emitting device having a light emitting layer containing a fluorescent compound and a metal complex. This light emitting device is not a light emitting device having a layer containing a fluorescent compound and a layer containing a metal complex (different from the layer containing a fluorescent compound).

Patent Document 2 describes a light emitting device having a light emitting layer containing a fluorescent compound and a light emitting layer containing a polymer compound containing a constitutional unit having a group obtained by removing some hydrogen atoms from a metal complex. This polymer compound is a polymer compound not containing a constitutional unit represented by the formula (X) described later.

PRIOR ART DOCUMENT

Patent Document

[Patent Document 1] Japanese Unexamined Patent Application Publication No. 2004-14155
[Patent Document 2] International Publication WO 2013/064814

SUMMARY OF THE INVENTION

Problem to be Solved by the Invention

However, the above-described light emitting device is not necessarily sufficient in external quantum efficiency.

Then, the present invention has an object of providing a light emitting device excellent in the external quantum efficiency.

Means for Solving the Problem

The present invention provides the following [1] to [14].
[1] A light emitting device comprising an anode, a cathode, a first organic layer disposed between the anode and the cathode and a second organic layer disposed between the anode and the cathode, wherein the first organic layer is a layer containing a fluorescent low-molecular weight compound, and
the second organic layer is
Layer C containing a cross-linked body of a cross-linkable polymer compound containing a constitutional unit having a group obtained by removing from a metal complex represented by the formula (1) a part or all of hydrogen atoms bonding directly to carbon atoms or hetero atoms constituting the metal complex (hereinafter, referred to also as "constitutional unit Z"), a cross-linkable constitutional unit having a cross-linkable group, and a constitutional unit represented by the formula (X) (hereinafter, referred to also as "cross-linkable polymer compound Y"),
Layer B containing a polymer compound containing a constitutional unit having a group obtained by removing from a metal complex represented by the formula (1) a part or all of hydrogen atoms bonding directly to carbon atoms or hetero atoms constituting the metal complex (constitutional unit Z), and a constitutional unit represented by the formula (X) (hereinafter, referred to also as "polymer compound X"), or
Layer A containing a composition containing a cross-linked body of a cross-linkable material and a metal complex represented by the formula (1):

[Chemical Formula 1]

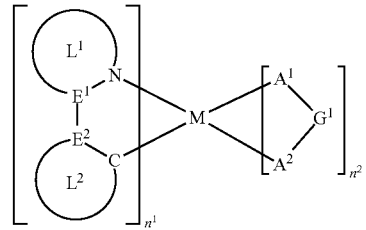

(1)

[wherein,
M represents a ruthenium atom, a rhodium atom, a palladium atom, an iridium atom or a platinum atom.
$n^1$ represents an integer of 1 or more, n-represents an integer of 0 or more and $n^1+n^2$ is 2 or 3. $n^1+n^2$ is 3 when M is a ruthenium atom, a rhodium atom or an iridium atom, while $n^1+n^2$ is 2 when M is a palladium atom or a platinum atom.
$E^1$ and $E^2$ each independently represent a carbon atom or a nitrogen atom. At least one of $E^1$ and $E^2$ is a carbon atom. When a plurality of $E^1$ and $E^2$ are present, they may be the same or different at each occurrence.
Ring $L^1$ represents an aromatic hetero ring, and the ring optionally has a substituent. When a plurality of the substituents are present, they may be the same or different and may be combined together to form a ring together with atoms to which they are attached. When a plurality of Ring $L^1$ are present, they may be the same or different.
Ring $L^2$ represents an aromatic hydrocarbon ring or an aromatic hetero ring, and these rings optionally have a substituent. When a plurality of the substituents are present, they may be the same or different and may be combined together to form a ring together with atoms to which they are attached. When a plurality of Ring $L^2$ are present, they may be the same or different.
The substituent which Ring $L^1$ optionally has and the substituent which Ring $L^2$ optionally has may be combined together to form a ring together with atoms to which they are attached.

$A^1\text{-}G^1\text{-}A^2$ represents an anionic bidentate ligand. $A^1$ and $A^2$ each independently represent a carbon atom, an oxygen atom or a nitrogen atom, and these atoms may be ring-constituent atoms. $G^1$ represents a single bond or an atomic group constituting a bidentate ligand together with $A^1$ and $A^2$. When a plurality of $A^1\text{-}G^1\text{-}A^2$ are present, they may be the same or different.]

[Chemical Formula 2]

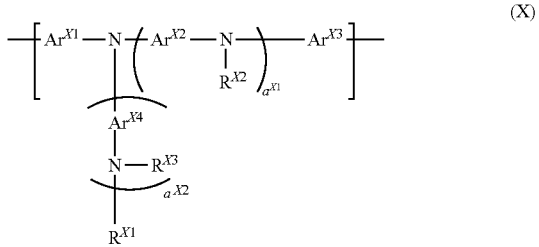

(X)

[wherein, $a^{X1}$ and $a^{X2}$ each independently represent an integer of 0 or more.

$Ar^{X1}$ and $Ar^{X3}$ each independently represent an arylene group or a divalent heterocyclic group, and these groups optionally have a substituent.

$Ar^{X2}$ and $Ar^{X4}$ each independently represent an arylene group, a divalent heterocyclic group or a divalent group in which at least one arylene group and at least one divalent heterocyclic group are bonded directly, and these groups optionally have a substituent. When a plurality of $Ar^{X2}$ and $Ar^{X4}$ are present, they may be the same or different at each occurrence.

$R^{X1}$, $R^{X2}$ and $R^{X3}$ each independently represent a hydrogen atom, an alkyl group, a cycloalkyl group, an aryl group or a monovalent heterocyclic group, and these groups optionally have a substituent. When a plurality of $R^{X1}$ and $R^{X3}$ are present, they may be the same or different at each occurrence.].

[2] The light emitting device according to [1], wherein the above-described fluorescent low-molecular weight compound is a compound represented by the formula (FB):

[Chemical Formula 3]

(FB)

[wherein, $n^{1B}$ represents an integer of 0 or more and 15 or less.

$Ar^{1B}$ represents an aromatic hydrocarbon group or an aromatic heterocyclic group, and these groups optionally have a substituent. When a plurality of the substituents are present, they may be the same or different and may be combined together to form a ring together with atoms to which they are attached.

$R^{1B}$ represents an alkyl group, a cycloalkyl group, an alkoxy group, a cycloalkoxy group, an aryl group, a monovalent heterocyclic group, a substituted amino group, an alkenyl group, a cycloalkenyl group, an alkynyl group or a cycloalkynyl group, and these groups optionally have a substituent. When a plurality of $R^{1B}$ are present, they may be the same or different and may be combined together to form a ring together with carbon atoms to which they are attached.].

[3] The light emitting device according to [2], wherein the above-described $n^{1B}$ is an integer of 1 or more and 8 or less, and the above-described $R^{1B}$ is an alkyl group, a cycloalkyl group, an alkoxy group, a cycloalkoxy group, an aryl group, a monovalent heterocyclic group, a substituted amino group, alkenyl group or a cycloalkenyl group (and these groups optionally have a substituent).

[4] The light emitting device according to [2] or [3], wherein the above-described $Ar^{1B}$ is a condensed-ring aromatic hydrocarbon group optionally having a substituent.

[5] The light emitting device according to any one of [1] to [4], wherein the above-described second organic layer is the above-described Layer B or the above-described Layer C, and the above-described constitutional unit having a group obtained by removing from a metal complex represented by the formula (1) a part or all of hydrogen atoms bonding directly to carbon atoms or hetero atoms constituting the metal complex (constitutional unit Z) is a constitutional unit represented by the formula (1B), a constitutional unit represented by the formula (2B), a constitutional unit represented by the formula (3B) or a constitutional unit represented by the formula (4B):

[Chemical Formula 4]

(1B)

[wherein, $M^{1B}$ represents a group obtained by removing from the above-described metal complex represented by the formula (1) one hydrogen atom bonding directly to a carbon atom or a hetero atom constituting the metal complex.

$L^C$ represents an oxygen atom, a sulfur atom, —N($R^A$)—, —C($R^B$)$_2$—, —C($R^B$)=C(R)—, —C≡C—, an arylene group or a divalent heterocyclic group, and these groups optionally have a substituent. $R^A$ represents a hydrogen atom, an alkyl group, a cycloalkyl group, an aryl group or a monovalent heterocyclic group, and these groups optionally have a substituent. $R^B$ represents a hydrogen atom, an alkyl group, a cycloalkyl group, an alkoxy group, a cycloalkoxy group, an aryl group or a monovalent heterocyclic group, and these groups optionally have a substituent. A plurality of $R^B$ may be the same or different and may be combined together to form a ring together with carbon atoms to which they are attached. When a plurality of $L^C$ are present, they may be the same or different.

$n^{c1}$ represents an integer of 0 or more.]

[Chemical Formula 5]

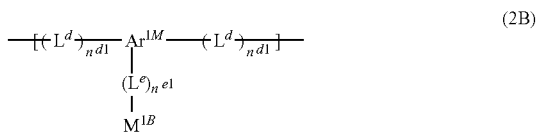

(2B)

[wherein, $M^{1B}$ represents the same meaning as described above.

$L^d$ and $L^e$ each independently represent an oxygen atom, a sulfur atom, —N($R^A$)—, —C($R^6$)$_2$—, —C($R^B$)=C($R^B$)—, —C≡C—, an arylene group or a divalent heterocyclic group, and these groups optionally have a substituent. $R^A$ and $R^B$ represent the same meaning as described above. When a plurality of $L^d$ and $L^e$ are present, they may be the same or different at each occurrence.

$n^{d1}$ and $n^{e1}$ each independently represent an integer of 0 or more. A plurality of $n^{d1}$ may be the same or different.

$Ar^{1M}$ represents an aromatic hydrocarbon group or a heterocyclic group, and these groups optionally have a substituent.]

[Chemical Formula 6]

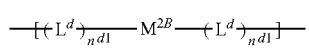
(3B)

[wherein, $L^d$ and $n^{d1}$ represent the same meaning as described above.

$M^{2B}$ represents a group obtained by removing from the above-described metal complex represented by the formula (1) two hydrogen atoms bonding directly to carbon atoms or hetero atoms constituting the metal complex.]

[Chemical Formula 7]

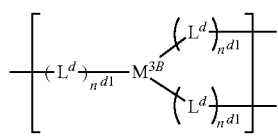
(4B)

[wherein, $L^d$ and $n^{d1}$ represent the same meaning as described above.

$M^{3B}$ represents a group obtained by removing from the above-described metal complex represented by the formula (1) three hydrogen atoms bonding directly to carbon atoms or hetero atoms constituting the metal complex.].

[6] The light emitting device according to any one of [1] to [4], wherein the above-described second organic layer is the above-described Layer A, and the above-described cross-linkable material is a low-molecular weight compound having at least one cross-linkable group selected from Group A of cross-linkable group or a polymer compound containing a cross-linkable constitutional unit having at least one cross-linkable group selected from Group A of cross-linkable group:

(Group a of Cross-Linkable Group)

[Chemical Formula 8]

(XL-1)

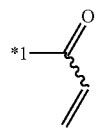
(XL-2)

-continued

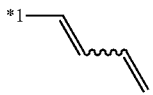
(XL-3)

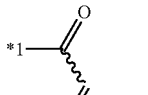
(XL-4)

(XL-5)

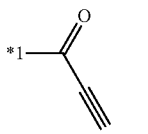
(XL-6)

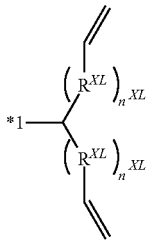
(XL-7)

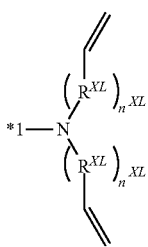
(XL-8)

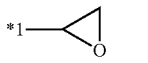
(XL-9)

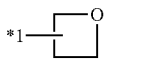
(XL-10)

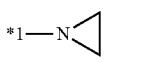
(XL-11)

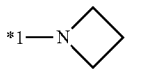
(XL-12)

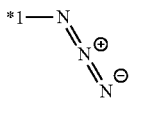
(XL-13)

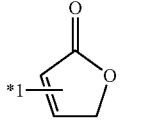
(XL-14)

-continued (XL-15)

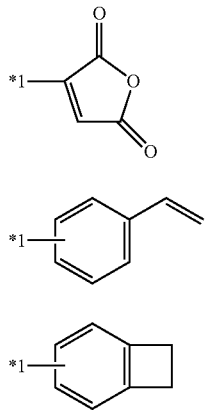

(XL-16)

(XL-17)

[wherein, $R^{XL}$ represents a methylene group, an oxygen atom or a sulfur atom, and $n^{XL}$ represents an integer of 0 to 5. When a plurality of $R^{XL}$ are present, they may be the same or different, and when a plurality of $n^{XL}$ are present, they may be the same or different. *1 represents a binding position. These cross-linkable groups optionally have a substituent.].

[7] The light emitting device according to [6], wherein said cross-linkable material is a polymer compound containing a cross-linkable constitutional unit having at least one cross-linkable group selected from Group A of cross-linkable group, and said cross-linkable constitutional unit is a constitutional unit represented by the formula (2) or a constitutional unit represented by the formula (2'):

[Chemical Formula 9]

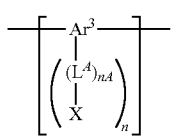

(2)

[wherein, nA represents an integer of 0 to 5, and n represents 1 or 2. When a plurality of nA are present, they may be the same or different.

$Ar^3$ represents an aromatic hydrocarbon group or a heterocyclic group, and these groups optionally have a substituent.

$L^A$ represents an alkylene group, a cycloalkylene group, an arylene group, a divalent heterocyclic group, a group represented by —NR'—, an oxygen atom or a sulfur atom, and these groups optionally have a substituent. R' represents a hydrogen atom, an alkyl group, a cycloalkyl group, an aryl group or a monovalent heterocyclic group, and these groups optionally have a substituent. When a plurality of $L^A$ are present, they may be the same or different.

X represents a cross-linkable group selected from Group A of cross-linkable group. When a plurality of X are present, they may be the same or different.]

[Chemical Formula 10]

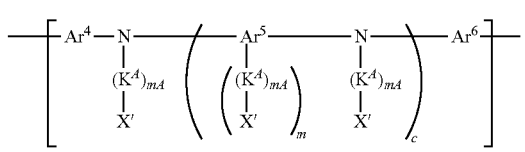

(2')

[wherein, mA represents an integer of 0 to 5, m represents an integer of 1 to 4, and c represents an integer of 0 or 1. When a plurality of mA are present, they may be the same or different.

$Ar^5$ represents an aromatic hydrocarbon group, a heterocyclic group or a group in which at least one aromatic hydrocarbon ring and at least one hetero ring are bonded directly, and these groups optionally have a substituent.

$Ar^4$ and $Ar^6$ each independently represent an arylene group or a divalent heterocyclic group, and these groups optionally have a substituent.

$Ar^4$, $Ar^5$ and $Ar^6$ each may be bonded directly or via an oxygen atom or a sulfur atom to a group other than these groups bonded to a nitrogen atom to which these groups are attached, to form a ring.

$K^A$ represents an alkylene group, a cycloalkylene group, an arylene group, a divalent heterocyclic group, a group represented by —NR'—, an oxygen atom or a sulfur atom, and these groups optionally have a substituent. R' represents a hydrogen atom, an alkyl group, a cycloalkyl group, an aryl group or a monovalent heterocyclic group, and these groups optionally have a substituent. When a plurality of $K^A$ are present, they may be the same or different.

X' represents a cross-linkable group selected from Group A of cross-linkable group, a hydrogen atom, an alkyl group, a cycloalkyl group, an aryl group or a monovalent heterocyclic group, and these groups optionally have a substituent. When a plurality of X' are present, they may be the same or different. At least one X' is a cross-linkable group selected from Group A of cross-linkable group.].

[8] The light emitting device according to any one of [1] to [7], wherein the above-described metal complex represented by the formula (1) is a metal complex represented by the formula (1-B):

[Chemical Formula 11]

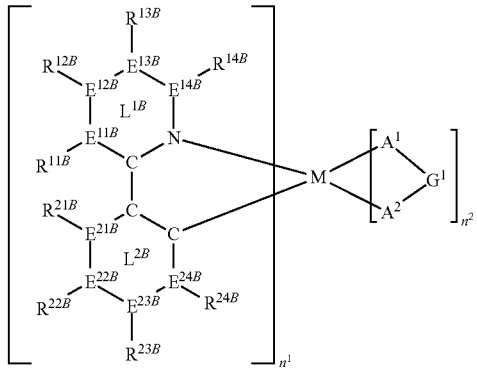

(1-B)

[wherein,

M, $n^1$, $n^2$ and $A^1$-$G^1$-$A^2$ represent the same meaning as described above.

$E^{11B}$, $E^{12B}$, $E^{13B}$, $E^{14B}$, $E^{21B}$, $E^{22B}$, $E^{23B}$ and $E^{24B}$ each independently represent a nitrogen atom or a carbon atom. When a plurality of $E^{11B}$, $E^{12B}$, $E^{13B}$, $E^{14B}$, $E^{21B}$, $E^{22B}$, $E^{23B}$ and $E^{24B}$ are present, they may be the same or different at each occurrence. When $E^{11B}$ is a nitrogen atom, $R^{11B}$ is absent. When $E^{12B}$ is a nitrogen atom, $R^{12B}$ is absent. When $E^{13B}$ is a nitrogen atom, $R^{13B}$ is absent. When $E^{14B}$ is a nitrogen atom, $R^{14B}$ is absent. When $E^{21B}$ is a nitrogen atom, $R^{21B}$ is absent. When $E^{22B}$ is a nitrogen atom, $R^{22B}$ is absent. When $E^{23B}$ is a nitrogen atom, $R^{23B}$ is absent. When $E^{24B}$ is a nitrogen atom, $R^{24B}$ is absent.

$R^{11B}$, $R^{12B}$, $R^{13B}$, $R^{14B}$, $R^{21B}$, $R^{22B}$, $R^{23B}$ and $R^{24B}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and these groups optionally have a substituent. When a plurality of $R^{11B}$, $R^{12B}$, $R^{13B}$, $R^{14B}$, $R^{21B}$, $R^{22B}$, $R^{23B}$ and $R^{24B}$ are present, they may be the same or different at each occurrence. $R^{11B}$ and $R^{12B}$, $R^{12B}$ and $R^{13B}$, $R^{13B}$ and $R^{14B}$, $R^{14B}$ and $R^{21B}$, $R^{21B}$ and $R^{22B}$, $R^{22B}$ and $R^{23B}$, and $R^{23B}$ and $R^{24B}$ each may be combined together to form a ring together with atoms to which they are attached.

Ring $L^{1B}$ represents a pyridine ring or a pyrimidine ring.

Ring $L^{2B}$ represents a benzene ring, a pyridine ring or a pyrimidine ring.].

[9] The light emitting device according to [8], wherein the above-described metal complex represented by the formula (1-B) is a metal complex represented by the formula (1-B1), a metal complex represented by the formula (1-B2), a metal complex represented by the formula (1-B3), a metal complex represented by the formula (1-B4) or a metal complex represented by the formula (1-B5):

[Chemical Formula 12]

(1-B1)

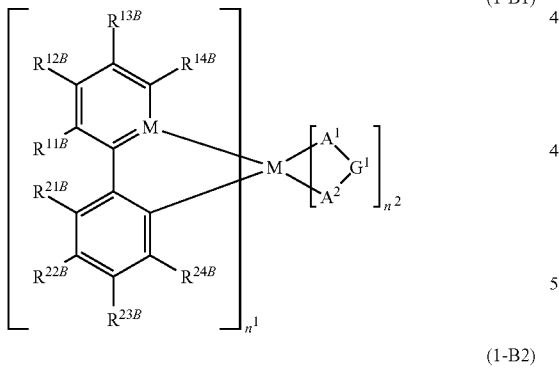

(1-B2)

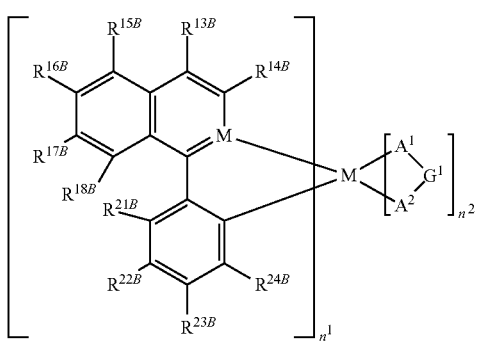

(1-B3)

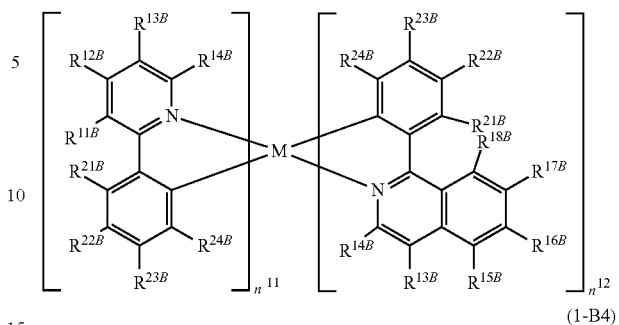

(1-B4)

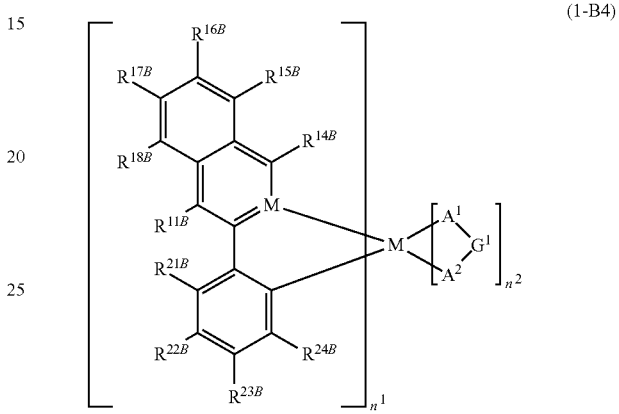

(1-B5)

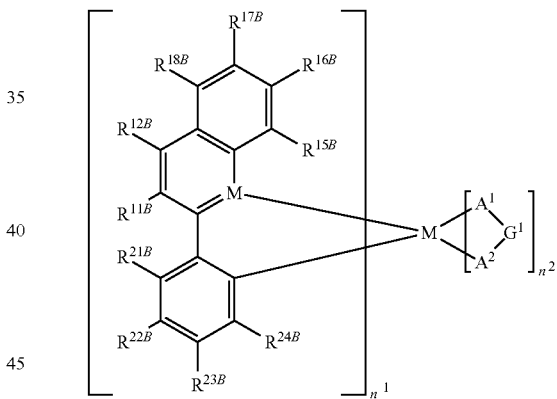

[wherein,

M, $n^1$, $n^2$, $A^1$-$G^1$-$A^2$, $R^{11B}$, $R^{12B}$, $R^{13B}$, $R^{14B}$, $R^{21B}$, $R^{22B}$, $R^{23B}$ and $R^{24B}$ represent the same meaning as described above.

$n^{11}$ and $n^{12}$ each independently represent an integer of 1 or more, and $n^{11}+n^{12}$ is 2 or 3. $n^{11}+n^{12}$ is 3 when M is a ruthenium atom, a rhodium atom or an iridium atom, while $n^{11}+n^{x2}$ is 2 when M is a palladium atom or a platinum atom.

$R^{15B}$, $R^{16B}$, $R^{17B}$ and $R^{18B}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and these groups optionally have a substituent. When a plurality of $R^{15B}$, $R^{16B}$, $R^{17B}$ and $R^{18B}$ are present, they may be the same or different at each occurrence. $R^{13B}$ and $R^{15B}$, $R^{15B}$ and $R^{16B}$, $R^{16B}$ and $R^{17B}$, $R^{17B}$ and $R^{18B}$, and $R^{18B}$ and $R^{21B}$ each may be combined together to form a ring together with atoms to which they are attached.].

[10] The light emitting device according to any one of [1] to [7], wherein the above-described metal complex represented by the formula (1) is a metal complex represented by the formula (1-A):

[Chemical Formula 13]

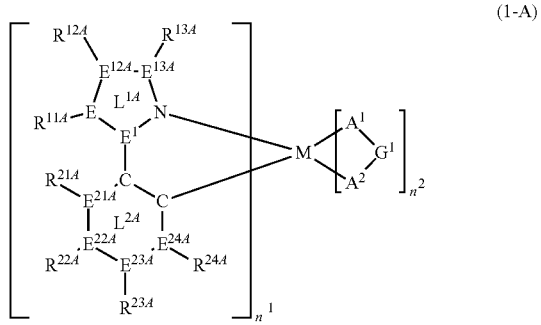

(1-A)

[wherein,

M, $n^1$, $n^2$, $E^1$ and $A^1$-$G^1$-$A^2$ represent the same meaning as described above.

$E^{11A}$, $E^{12A}$, $E^{13A}$, $E^{21A}$, $E^{22A}$, $E^{23A}$ and $E^{24A}$ each independently represent a nitrogen atom or a carbon atom. When a plurality of $E^{11A}$, $E^{12A}$, $E^{13A}$, $E^{21A}$, $E^{22A}$, $E^{23A}$ and $E^{24A}$ are present, they may be the same or different at each occurrence. When $E^{11A}$ is a nitrogen atom, $R^{11A}$ may be present or absent. When $E^{12A}$ is a nitrogen atom, $R^{12A}$ may be present or absent. When $E^{13A}$ is a nitrogen atom, $R^{13A}$ may be present or absent. When $E^{21A}$ is a nitrogen atom, $R^{21A}$ is absent. When $E^{22A}$ is a nitrogen atom, $R^{22A}$ is absent. When $E^{23A}$ is a nitrogen atom, $R^{23A}$ is absent. When $E^{24A}$ is a nitrogen atom, $R^{24A}$ is absent.

$R^{11A}$, $R^{12A}$, $R^{13A}$, $R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and these groups optionally have a substituent. When a plurality of $R^{11A}$, $R^{12A}$, $R^{13A}$, $R^{21A}$, $R^{22A}$, $R^{23A}$ and $R^{24A}$ are present, they may be the same or different at each occurrence. $R^{11A}$ and $R^{12A}$, $R^{12A}$ and $R^{13A}$, $R^{11A}$ and $R^{22A}$, $R^{21A}$ and $R^{22A}$, $R^{22A}$ and $R^{23A}$, and $R^{23A}$ and $R^{24A}$ each may be combined together to form a ring together with atoms to which they are attached.

Ring $L^{1A}$ represents a triazole ring or a diazole ring.

Ring $L^{2A}$ represents a benzene ring, a pyridine ring or a pyrimidine ring.].

[11] The light emitting device according to any one of [1] to [10], wherein the above-described first organic layer further contains a compound represented by the formula (FH-1), a polymer compound containing a constitutional unit represented by the formula (Y) or a combination thereof:

[Chemical Formula 14]

(FH-1)

[wherein, $Ar^{H1}$ and $Ar^{H2}$ each independently represent an aryl group, a monovalent heterocyclic group or a substituted amino group, and these groups optionally have a substituent. $n^{H1}$ represents an integer of 0 or more and 15 or less.

$L^{H1}$ represents an arylene group, a divalent heterocyclic group or a group represented by —[C($R^{H11}$)$_2$]$n^{H11}$-, and these groups optionally have a substituent. When a plurality of $L^{H1}$ are present, they may be the same or different. $n^{H11}$ represents an integer of 1 or more and 10 or less. $R^{H11}$ represents a hydrogen atom, an alkyl group, a cycloalkyl group, an alkoxy group, a cycloalkoxy group, an aryl group or a monovalent heterocyclic group, and these groups optionally have a substituent. A plurality of $R^{H11}$ may be the same or different and may be combined together to form a ring together with carbon atoms to which they are attached.]

[Chemical Formula 15]

(Y)

[wherein, $Ar^{Y1}$ represents an arylene group, a divalent heterocyclic group or a divalent group in which at least one arylene group and at least one divalent heterocyclic group are bonded directly, and these groups optionally have a substituent.].

[12] The light emitting device according to any one of [1] to [11], wherein the above-described first organic layer further contains at least one material selected from the group consisting of a hole transporting material, a hole injection material, an electron transporting material, an electron injection material and a light emitting material.

[13] The light emitting device according to any one of [1] to [12], wherein the above-described first organic layer and the above-described second organic layer are adjacent.

[14] The light emitting device according to any one of [1] to [13], wherein the above-described second organic layer is a layer disposed between the above-described anode and the above-described first organic layer.

Effect of the Invention

According to the present invention, a light emitting device excellent in the external quantum efficiency can be provided.

MODES FOR CARRYING OUT THE INVENTION

Suitable embodiments of the present invention will be illustrated in detail below.

Explanation of Common Terms

Terms commonly used in the present specification have the following meanings unless otherwise stated.

Me represents a methyl group, Et represents an ethyl group, Bu represents a butyl group, i-Pr represents an isopropyl group and t-Bu represents a tert-butyl group.

The hydrogen atom may be a heavy hydrogen atom or a light hydrogen atom.

In the formula showing a metal complex, the solid line representing a bond to the central metal denotes the covalent bond or the coordinate bond.

The term "polymer compound" means a polymer having molecular weight distribution and having a polystyrene-equivalent number-average molecular weight of $1 \times 10^5$ to $1 \times 10^8$.

The term "low-molecular weight compound" means a compound not having molecular weight distribution and having a molecular weight of $1 \times 10^4$ or less.

The term "constitutional unit" means a unit occurring once or more times in a polymer compound.

The "alkyl group" may be any of linear or branched. The number of carbon atoms of the linear alkyl group, not including the number of carbon atoms of the substituent, is usually 1 to 50, preferably 3 to 30, more preferably 4 to 20. The number of carbon atoms of the branched alkyl group, not including the number of carbon atoms of the substituent, is usually 3 to 50, preferably 3 to 30, more preferably 4 to 20.

The alkyl group optionally has a substituent, and examples thereof include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom of these groups with a cycloalkyl group, an alkoxy group, a cycloalkoxy group, an aryl group, a fluorine atom or the like, and examples thereof include a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl)propyl group and a 6-ethyloxyhexyl group.

The number of carbon atoms of the "cycloalkyl group", not including the number of carbon atoms of the substituent, is usually 3 to 50, preferably 3 to 30, more preferably 4 to 20.

The cycloalkyl group optionally has a substituent, and examples thereof include a cyclohexyl group, a cyclohexylmethyl group and a cyclohexylethyl group.

The "aryl group" means an atomic group remaining after removing from an aromatic hydrocarbon one hydrogen atom bonding directly to a carbon atom constituting the ring. The number of carbon atoms of the aryl group, not including the number of carbon atoms of the substituent, is usually 6 to 60, preferably 6 to 20, more preferably 6 to 10.

The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group and a 4-phenylphenyl group, and groups obtained by substituting a hydrogen atom of these groups with an alkyl group, a cycloalkyl group, an alkoxy group, a cycloalkoxy group, an aryl group, a fluorine atom or the like.

The "alkoxy group" may be any of linear or branched. The number of carbon atoms of the linear alkoxy group, not including the number of carbon atoms of the substituent, is usually 1 to 40, preferably 4 to 10. The number of carbon atoms of the branched alkoxy group, not including the number of carbon atoms of the substituent, is usually 3 to 40, preferably 4 to 10.

The alkoxy group optionally has a substituent, and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom of these groups with a cycloalkyl group, an alkoxy group, a cycloalkoxy group, an aryl group, a fluorine atom or the like.

The number of carbon atoms of the "cycloalkoxy group", not including the number of carbon atoms of the substituent, is usually 3 to 40, preferably 4 to 10.

The cycloalkoxy group optionally has a substituent, and examples thereof include a cyclohexyloxy group.

The number of carbon atoms of the "aryloxy group", not including the number of carbon atoms of the substituent, is usually 6 to 60, preferably 6 to 48.

The aryloxy group optionally has a substituent, and examples thereof include a phenoxy group, a 1-naphthyloxy group, a 2-naphthyloxy group, a 1-anthracenyloxy group, a 9-anthracenyloxy group and a 1-pyrenyloxy group, and groups obtained by substituting a hydrogen atom of these groups with an alkyl group, a cycloalkyl group, an alkoxy group, a cycloalkoxy group, a fluorine atom or the like.

The "p-valent heterocyclic group" (p represents an integer of 1 or more) means an atomic group remaining after removing from a heterocyclic compound p hydrogen atoms among hydrogen atoms bonding directly to carbon atoms or hetero atoms constituting the ring. Of p-valent heterocyclic groups, preferable are "p-valent aromatic heterocyclic groups" as an atomic group remaining after removing from an aromatic heterocyclic compound p hydrogen atoms among hydrogen atoms bonding directly to carbon atoms or hetero atoms constituting the ring.

The "aromatic heterocyclic compound" means a compound in which the hetero ring itself shows aromaticity, such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzophosphole and the like, and a compound in which the hetero ring itself shows no aromaticity but an aromatic ring is condensed to the hetero ring, such as phenoxazine, phenothiazine, dibenzoborole, dibenzosilole, benzopyran and the like.

The number of carbon atoms of the monovalent heterocyclic group, not including the number of carbon atoms of the substituent, is usually 2 to 60, preferably 4 to 20.

The monovalent heterocyclic group optionally has a substituent, and examples thereof include a thienyl group, a pyrrolyl group, a furyl group, a pyridyl group, a piperidinyl group, a quinolinyl group, an isoquinolinyl group, a pyrimidinyl group and a triazinyl group, and groups obtained by substituting a hydrogen atom of these groups with an alkyl group, a cycloalkyl group, an alkoxy group, a cycloalkoxy group or the like.

The "halogen atom" denotes a fluorine atom, a chlorine atom, a bromine atom or an iodine atom.

The "amino group" optionally has a substituent, and a substituted amino group is preferable. As the substituent which the amino group has, an alkyl group, a cycloalkyl group, an aryl group or a monovalent heterocyclic group is preferable.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

The "alkenyl group" may be any of linear or branched. The number of carbon atoms of the linear alkenyl group, not including the number of carbon atoms of the substituent, is usually 2 to 30, preferably 3 to 20. The number of carbon atoms of the branched alkenyl group, not including the number of carbon atoms of the substituent, is usually 3 to 30, preferably 4 to 20.

The number of carbon atoms of the "cycloalkenyl group", not including the number of carbon atoms of the substituent, is usually 3 to 30, preferably 4 to 20.

The alkenyl group and the cycloalkenyl group optionally have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group and a 7-octenyl group, and these groups having a substituent.

The "alkynyl group" may be any of linear or branched. The number of carbon atoms of the alkynyl group, not including carbon atoms of the substituent, is usually 2 to 20, preferably 3 to 20. The number of carbon atoms of the branched alkynyl group, not including carbon atoms of the substituent, is usually 4 to 30, preferably 4 to 20.

The number of carbon atoms of the "cycloalkynyl group", not including carbon atoms of the substituent, is usually 4 to 30, preferably 4 to 20.

The alkynyl group and the cycloalkynyl group optionally have a substituent, and examples thereof include an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and these groups having a substituent.

The "arylene group" means an atomic group remaining after removing from an aromatic hydrocarbon two hydrogen atoms bonding directly to carbon atoms constituting the ring. The number of carbon atoms of the arylene group, not including the number of carbon atoms of the substituent, is usually 6 to 60, preferably 6 to 30, more preferably 6 to 18.

The arylene group optionally has a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group and a chrysenediyl group, and these groups having a substituent, preferably groups represented by the formula (A-1) to the formula (A-20). The arylene group includes groups obtained by bonding a plurality of these groups.

[Chemical Formula 16]

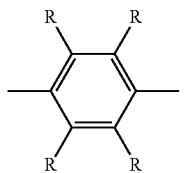
(A-1)

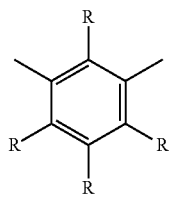
(A-2)

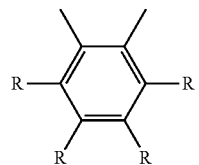
(A-3)

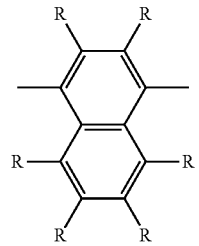
(A-4)

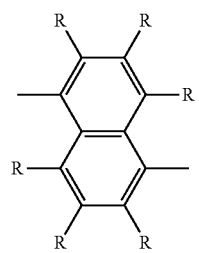
(A-5)

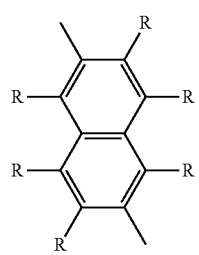
(A-6)

[Chemical Formula 17]

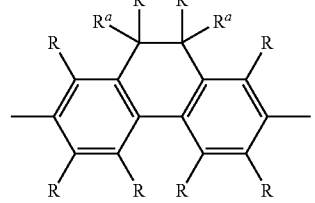
(A-7)

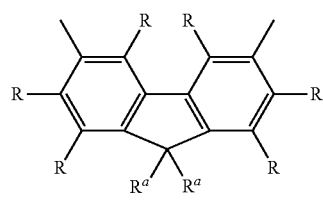
(A-8)

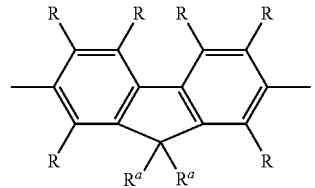
(A-9)

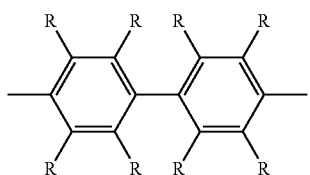
(A-10)
[Chemical Formula 18]
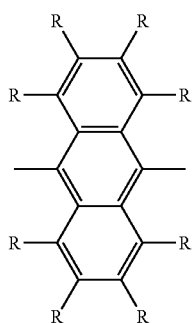
(A-11)
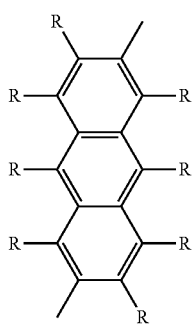
(A-12)
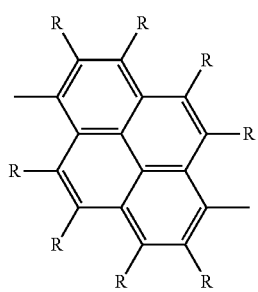
(A-13)
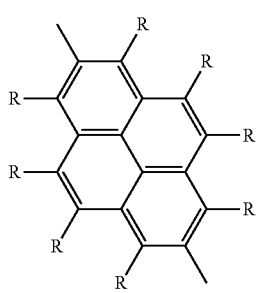
(A-14)
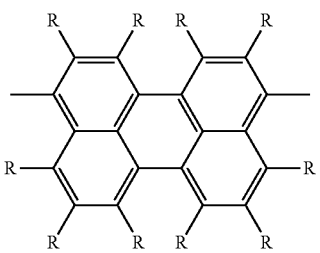
(A-15)
[Chemical Formula 19]
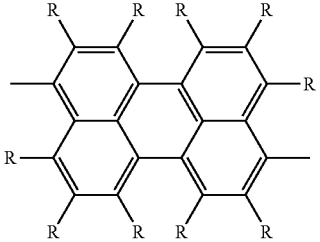
(A-16)
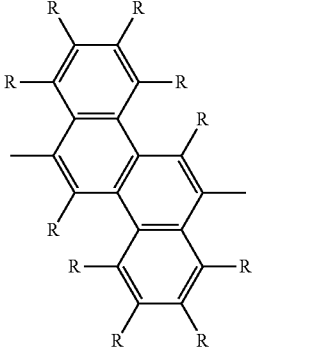
(A-17)
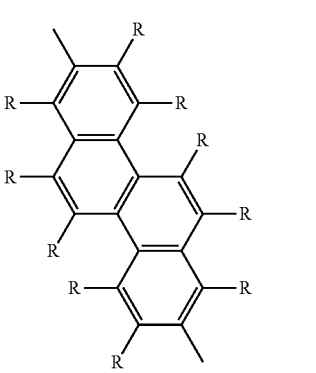
(A-18)
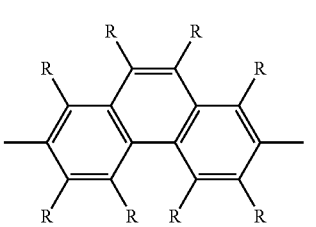
(A-19)

-continued (A-20)

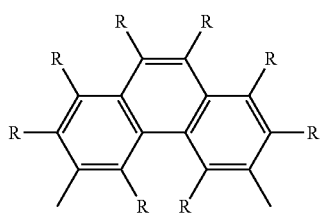

[wherein, R and $R^a$ each independently represent a hydrogen atom, an alkyl group, a cycloalkyl group, an aryl group or a monovalent heterocyclic group. A plurality of R and $R^a$ each may be the same or different, and the plurality of $R^a$ may be combined together to form a ring together with atoms to which they are attached.]

The number of carbon atoms of the divalent heterocyclic group, not including the number of carbon atoms of the substituent, is usually 2 to 60, preferably 3 to 20, more preferably 4 to 15.

The divalent heterocyclic group optionally has a substituent, and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms bonding directly to carbon atoms or hetero atoms constituting the ring, preferably groups represented by the formula AA-1) to the formula (AA-34). The divalent heterocyclic group includes groups obtained by bonding a plurality of these groups.

[Chemical Formula 20]

(AA-1)

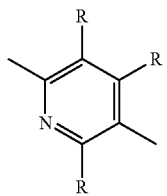

(AA-2)

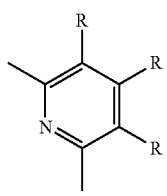

(AA-3)

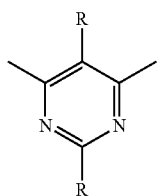

(AA-4)

(AA-5)

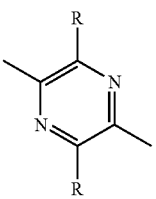

(AA-6)

(AA-7)

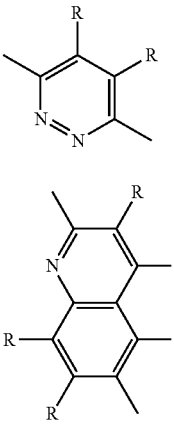

[Chemical Formula 21]

(AA-8)

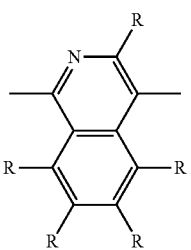

(AA-9)

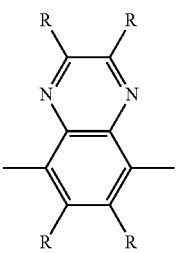

(AA-10)

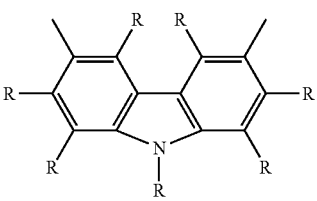

(AA-11)

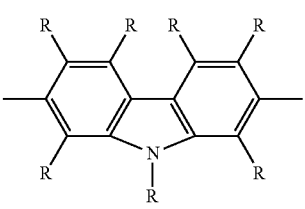

-continued
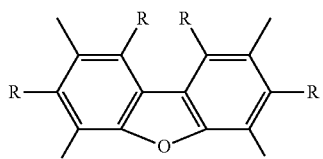
(AA-12)
[Chemical Formula 22]
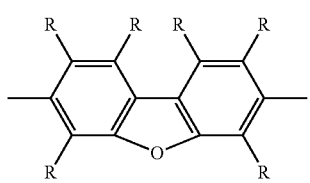
(AA-13)
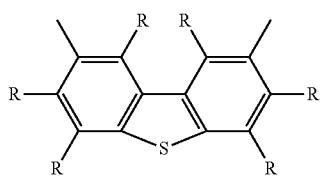
(AA-14)
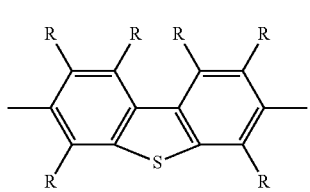
(AA-15)
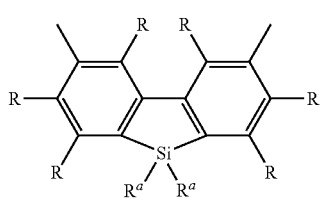
(AA-16)
[Chemical Formula 23]
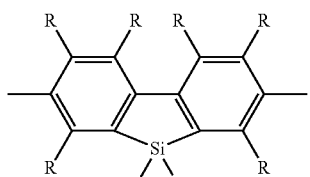
(AA-16)
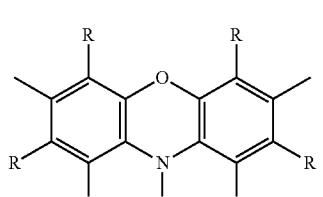
(AA-18)
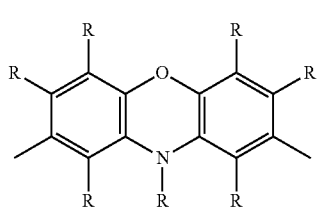
(AA-19)
-continued
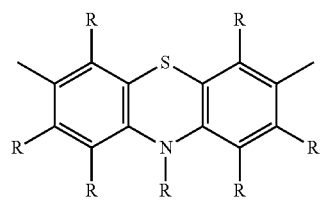
(AA-20)
[Chemical Formula 24]
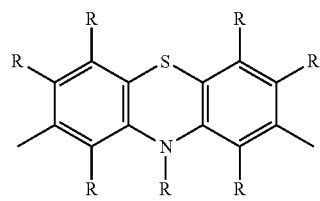
(AA-21)
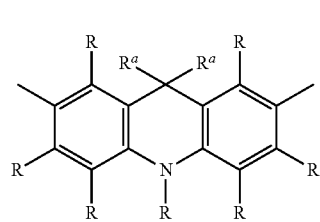
(AA-22)
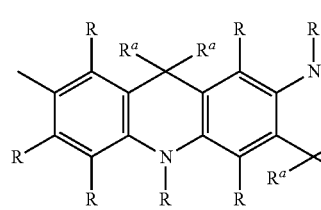
(AA-23)
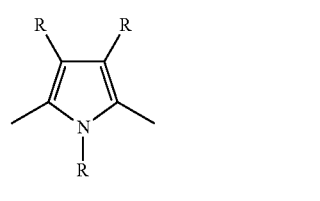
(AA-24)
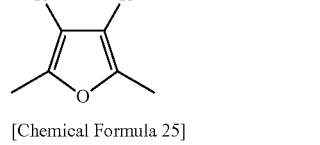
(AA-25)
[Chemical Formula 25]
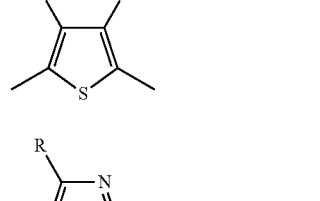
(AA-26)
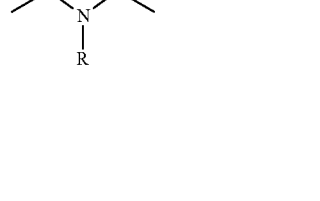
(AA27)

(AA-28)

(AA-29)

(AA-30)

(AA-31)

(AA-32)

[Chemical Formula 26]

(AA-33)

(AA-34)

[wherein, R and $R^a$ represent the same meaning as described above.]

The "cross-linkable group" is a group capable of generating a new bond by being subjected to heating, ultraviolet irradiation, near ultraviolet irradiation, visible light irradiation, infrared irradiation, radical reaction or the like, and preferable are cross-linkable groups represented by the formulae (XL-1) to (XL-17) in Group A of cross-linkable group.

The "substituent" represents a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may be a cross-linkable group.

<Light Emitting Device>

The light emitting device of the present invention is a light emitting device comprising an anode, a cathode, a first organic layer disposed between the anode and the cathode and a second organic layer disposed between the anode and the cathode.

[First Organic Layer]

The first organic layer is a layer containing a fluorescent low-molecular weight compound. In the first organic layer, the fluorescent low-molecular weight compound may be contained singly or in combination of two or more kinds thereof.

[Fluorescent Low-Molecular Weight Compound]

The "fluorescent low-molecular weight compound" means a compound showing fluorescence at room temperature (usually 25° C.; the same shall apply hereinafter). The fluorescent low-molecular weight compound is preferably a compound showing light emission from the single excited state at room temperature.

The fluorescent low-molecular weight compound is preferably a compound represented by the formula (FB), since the light emitting device of the present invention is excellent in the external quantum efficiency.

[Compound Represented by the Formula (FB)]

$n^{1B}$ is preferably an integer of 1 to 8, more preferably an integer of 1 to 6, further preferably an integer of 1 to 4, particularly preferably an integer of 2 to 4.

$Ar^{1B}$ is preferably a monocyclic or condensed-ring aromatic hydrocarbon group optionally having a substituent, more preferably a condensed-ring aromatic hydrocarbon group optionally having a substituent.

The number of carbon atoms of the monocyclic aromatic hydrocarbon group represented by $Ar^{1B}$, not including the number of carbon atoms of the substituent, is preferably 6. The monocyclic aromatic hydrocarbon group represented by $Ar^{1B}$, is preferably a group obtained by removing from a benzene ring one or more hydrogen atoms bonding directly to carbon atoms constituting the ring, and this ring optionally has a substituent.

The number of carbon atoms of the condensed-ring aromatic hydrocarbon group represented by $Ar^{1B}$, not including the number of carbon atoms of the substituent, is usually 7 to 60, preferably 8 to 40, more preferably 9 to 30, further preferably 10 to 20.

The condensed-ring aromatic hydrocarbon group represented by $Ar^{1B}$ includes, for example, groups obtained by removing from a naphthalene ring, an anthracene ring, a phenanthrene ring, a dihydrophenanthrene ring, a triphenylene ring, naphthacene ring, a fluorene ring, a spirobifluorene ring, a pyrene ring, a perylene ring, a chrysene ring, an indene ring, a fluoranthene ring, a benzofluoranthene ring and an acenaphthofluoranthene ring one or more hydrogen atoms bonding directly to carbon atoms constituting the ring, and is preferably a group obtained by removing from a naphthalene ring, an anthracene ring, a phenanthrene ring, a dihydrophenanthrene ring, a triphenylene ring, a naphthacene ring, a fluorene ring, a spirobifluorene ring, a pyrene ring, a perylene ring, a chrysene ring, a fluoranthene ring, a benzofluoranthene ring or an acenaphthofluoranthene ring one or more hydrogen atoms bonding directly to carbon atoms constituting the ring, more preferably a group obtained by removing from a naphthalene ring, an anthracene ring, a phenanthrene ring, a dihydrophenanthrene ring, a fluorene ring, a spirobifluorene ring, a pyrene ring, a perylene ring, a chrysene ring, a fluoranthene ring, a benzofluoranthene ring or an acenaphthofluoranthene ring one or more hydrogen atoms bonding directly to carbon atoms constituting the ring, further preferably a group obtained by removing from a naphthalene ring, an anthracene ring, a phenanthrene ring, a fluorene ring, a spirobifluorene ring, a pyrene ring, a chrysene ring, a fluoranthene ring, a benzofluoranthene ring or an acenaphthofluoranthene ring one or more hydrogen atoms bonding directly to carbon atoms constituting the ring, particularly preferably a group obtained by removing from a naphthalene ring, a chrysene ring, a fluoranthene ring or a benzofluoranthene ring one or more hydrogen atoms bonding directly to carbon atoms constituting the ring, especially preferably a group obtained by removing from a chrysene ring or a benzofluoranthene ring one or more hydrogen atoms bonding directly to carbon atoms constituting the ring, and these groups optionally have a substituent.

The number of carbon atoms of the aromatic heterocyclic group represented by $Ar^{1B}$, not including the number of carbon atoms of the substituent, is usually 2 to 60, preferably 3 to 30, more preferably 3 to 20.

The aromatic heterocyclic group represented by $Ar^{1B}$ includes, for example, groups obtained by removing from a pyrrole ring, a diazole ring, a triazole ring, a pyridine ring, a diazabenzene ring, a triazine ring, an azanaphthalene ring, a diazanaphthalene ring, a triazanaphthalene ring, an indole ring, a benzodiazole ring, a benzotriazole ring, a carbazole ring, an azacarbazole ring, a diazacarbazole ring, a dibenzofuran ring, a dibenzothiophene ring, a phenoxazine ring, a phenothiazine ring, an acridine ring, a 9,10-dihydroacridine ring, an acridone ring, a phenazine ring, a 5,10-dihydrophenazine ring and a coumarin ring one hydrogen atom bonding directly to a carbon atom or a hetero atom constituting the ring, and is preferably a group obtained by removing from a pyrrole ring, a diazole ring, a triazole ring, a pyridine ring, a diazabenzene ring, a triazine ring, an azanaphthalene ring, a diazanaphthalene ring, a triazanaphthalene ring, an indole ring, a benzodiazole ring, a benzotriazole ring, a carbazole ring, an azacarbazole ring, a diazacarbazole ring, a dibenzofuran ring, a dibenzothiophene ring, a phenoxazine ring, a phenothiazine ring, an acridine ring, a 9,10-dihydroacridine ring, an acridone ring, a phenazine ring or a 5,10-dihydrophenazine ring one hydrogen atom bonding directly to a carbon atom or a hetero atom constituting the ring, more preferably a group obtained by removing from a diazole ring, a triazole ring, a pyridine ring, a diazabenzene ring, a triazine ring, an indole ring, a benzodiazole ring, a benzotriazole ring, a carbazole ring, a dibenzofuran ring, a dibenzothiophene ring, a phenoxazine ring, a phenothiazine ring, a 9,10-dihydroacridine ring or a 5,10-dihydrophenazine ring one hydrogen atom bonding directly to a carbon atom or a hetero atom constituting the ring, further preferably a group obtained by removing from a diazole ring, a triazole ring, a pyridine ring, a diazabenzene ring, a triazine ring, a benzodiazole ring, a benzotriazole ring, a phenoxazine ring, a phenothiazine ring, a carbazole ring, a dibenzofuran ring or a dibenzothiophene ring one hydrogen atom bonding directly to a carbon atom or a hetero atom constituting the ring, particularly preferably a group obtained by removing from a diazole ring, a triazole ring, a pyridine ring, a diazabenzene ring, a triazine ring, a benzodiazole ring, a benzotriazole ring, a carbazole ring, a dibenzofuran ring or a dibenzothiophene ring one hydrogen atom bonding directly to a carbon atom or a hetero atom constituting the ring, and these groups optionally have a substituent.

The substituent which $Ar^{1B}$ optionally has is preferably a halogen atom, a cyano group, an aryloxy group or an amino group, more preferably a fluorine atom or a cyano group, and these groups optionally further have a substituent.

The examples and preferable range of the substituent which the substituent which $Ar^{1B}$ optionally has optionally further has are the same as the examples and preferable range of the substituent which $R^{1B}$ optionally has described later.

$R^{1B}$ is preferably an alkyl group, a cycloalkyl group, an alkoxy group, a cycloalkoxy group, an aryl group, a monovalent heterocyclic group, a substituted amino group, an alkenyl group or a cycloalkenyl group, more preferably an alkyl group, a cycloalkyl group, an alkoxy group, a cycloalkoxy group, an aryl group, a monovalent heterocyclic group or a substituted amino group, further preferably an alkyl group, a cycloalkyl group, an aryl group, a monovalent heterocyclic group or a substituted amino group, particularly preferably an alkyl group, a cycloalkyl group, an aryl group or a substituted amino group, especially preferably an aryl group or a substituted amino group, and these groups optionally have a substituent.

The number of carbon atoms of the aryl group represented by $R^{1B}$, not including the number of carbon atoms of the substituent, is usually 6 to 60, preferably 6 to 40, more preferably 6 to 30, further preferably 6 to 14.

The aryl group represented by $R^{1B}$ includes, for example, groups obtained by removing from a benzene ring, a naphthalene ring, an anthracene ring, a phenanthrene ring, a triphenylene ring, a dihydrophenanthrene ring, a naphthacene ring, a fluorene ring, a spirobifluorene ring, a pyrene ring, a perylene ring, a chrysene ring, an indene ring, a fluoranthene ring and a benzofluoranthene ring one hydrogen atom bonding directly to a carbon atom constituting the ring, and is preferably a group obtained by removing from a benzene ring, a naphthalene ring, an anthracene ring, a phenanthrene ring, a dihydrophenanthrene ring, a fluorene ring, a spirobifluorene ring, a pyrene ring, a fluoranthene ring or a benzofluoranthene ring one hydrogen atom bonding directly to a carbon atom constituting the ring, more preferably a group obtained by removing from a benzene ring, a naphthalene ring, an anthracene ring, a fluorene ring, a spirobifluorene ring, a fluoranthene ring or a benzofluoranthene ring one hydrogen atom bonding directly to a carbon atom constituting the ring, further preferably a group obtained by removing from a benzene ring, a naphthalene ring, a fluorene ring or a spirobifluorene ring one hydrogen atom bonding directly to a carbon atom constituting the ring, particularly preferably a phenyl group or a naphthyl group, and these groups optionally further have a substituent.

The number of carbon atoms of the monovalent heterocyclic group represented by $R^{1B}$, not including the number of carbon atoms of the substituent, is usually 2 to 60, preferably 3 to 30, more preferably 3 to 20.

The monovalent heterocyclic group represented by $R^{1B}$ includes, for example, groups obtained by removing from a pyrrole ring, a diazole ring, a triazole ring, a pyridine ring, a diazabenzene ring, a triazine ring, an azanaphthalene ring, a diazanaphthalene ring, a triazanaphthalene ring, an indole ring, a carbazole ring, an azacarbazole ring, a diazacarbazole ring, a dibenzofuran ring, a dibenzothiophene ring, a phenoxazine ring, a phenothiazine ring, an acridine ring, a 9,10-dihydroacridine ring, an acridone ring, a phenazine ring and a 5,10-dihydrophenazine ring one hydrogen atom bonding directly to a carbon atom or a hetero atom constituting the ring, and is preferably a group obtained by removing from a pyridine ring, a diazabenzene ring, a triazine ring, an azanaphthalene ring, a diazanaphthalene ring, a carbazole ring, an azacarbazole ring, a diazacarbazole ring, a dibenzofuran ring, a dibenzothiophene ring, a phenoxazine ring, a phenothiazine ring, a 9,10-dihydroacridine ring or a 5,10-dihydrophenazine ring one hydrogen atom bonding directly to a carbon atom or a hetero atom constituting the ring, more preferably a group obtained by removing from a pyridine ring, a diazabenzene ring, a triazine ring, an azanaphthalene ring, a diazanaphthalene ring, a phenoxazine ring, a phenothiazine ring, a carbazole ring, a dibenzofuran ring or a dibenzothiophene ring one hydrogen atom bonding directly to a carbon atom or a hetero atom constituting the ring, further preferably a group obtained by removing from a pyridine ring, a diazabenzene ring, a triazine ring, an azanaphthalene ring, a diazanaphthalene ring, a carbazole ring, a dibenzofuran ring or a dibenzothiophene ring one hydrogen atom bonding directly to a carbon atom or a hetero atom constituting the ring, and these groups optionally further have a substituent.

The substituent which the amino group has in the substituted amino group represented by $R^{1B}$ is preferably an aryl group or a monovalent heterocyclic group, more preferably an aryl group, and these groups optionally further have a substituent. The examples and preferable range of the aryl group as the substituent which the amino group has are the same as the examples and preferable range of the aryl group represented by $R^{1B}$. The examples and preferable range of the monovalent heterocyclic group as the substituent which the amino group has are the same as the examples and preferable range of the monovalent heterocyclic group represented by $R^{1B}$.

The substituent which $R^{1B}$ optionally has is preferably an alkyl group, a cycloalkyl group, an aryl group, a monovalent heterocyclic group, an alkoxy group, a cycloalkoxy group, an aryloxy group, a substituted amino group or a halogen atom, more preferably an alkyl group, a cycloalkyl group, an alkoxy group, a cycloalkoxy group, an aryl group, a monovalent heterocyclic group or a substituted amino group, further preferably an alkyl group, a cycloalkyl group, an aryl group or a monovalent heterocyclic group, particularly preferably an alkyl group, a cycloalkyl group or an aryl group, and these groups optionally further have a substituent.

The examples and preferable range of the aryl group, the monovalent heterocyclic group and the substituted amino group as the substituent which $R^{1B}$ optionally has are the same as the examples and preferable range of the aryl group, the monovalent heterocyclic group and the substituted amino group represented by $R^{13}$, respectively.

The substituent which the substituent which $R^{1B}$ optionally has optionally further has is preferably an alkyl group, a cycloalkyl group, an aryl group, a monovalent heterocyclic group, an alkoxy group, a cycloalkoxy group, an aryloxy group, a substituted amino group or a halogen atom, more preferably an alkyl group, a cycloalkyl group, an aryl group or a monovalent heterocyclic group, further preferably an alkyl group or a cycloalkyl group, and these groups optionally further have a substituent.

The examples and preferable range of the aryl group, the monovalent heterocyclic group and the substituted amino group as the substituent which the substituent which $R^{1B}$ optionally has optionally further has are the same as the examples and preferable range of the aryl group, the monovalent heterocyclic group and the substituted amino group represented by $R^{1B}$, respectively.

When a plurality of $R^{1B}$ are present, it is preferable that they are not combined together, since the maximum peak wavelength of the emission spectrum of the compound represented by the formula (FB) is short.

The fluorescent low-molecular weight compound includes, for example, compounds represented by the following formulae.

[Chemical Formula 27]

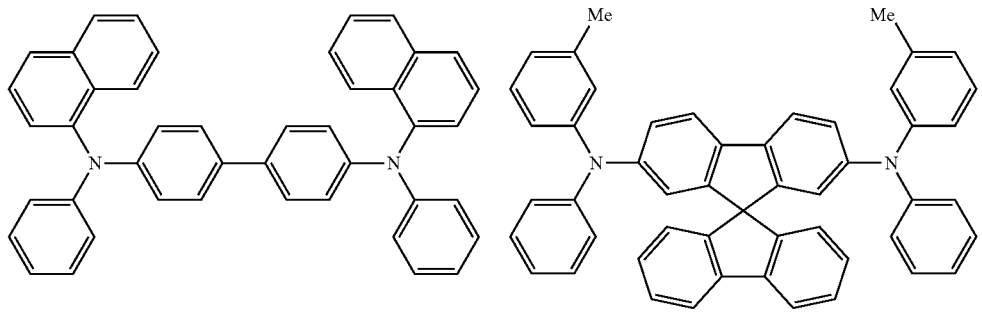

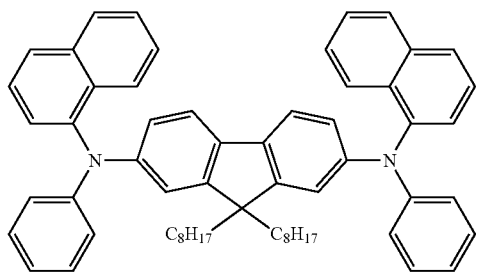

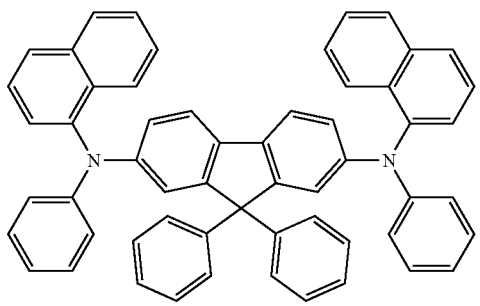

[Chemical Formula 28]
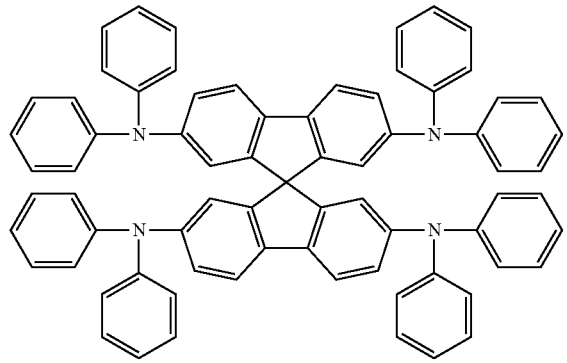
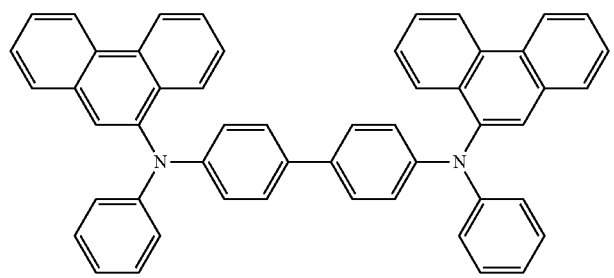
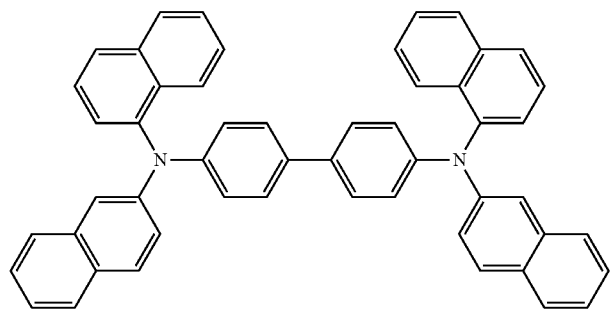
[Chemical Formula 29]
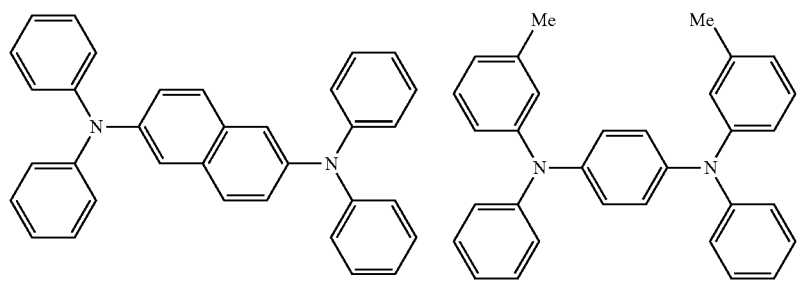

31
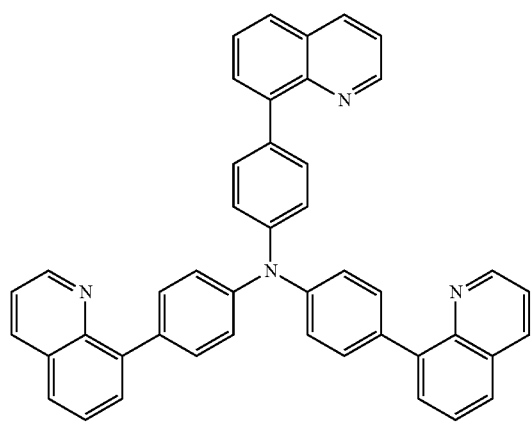
32
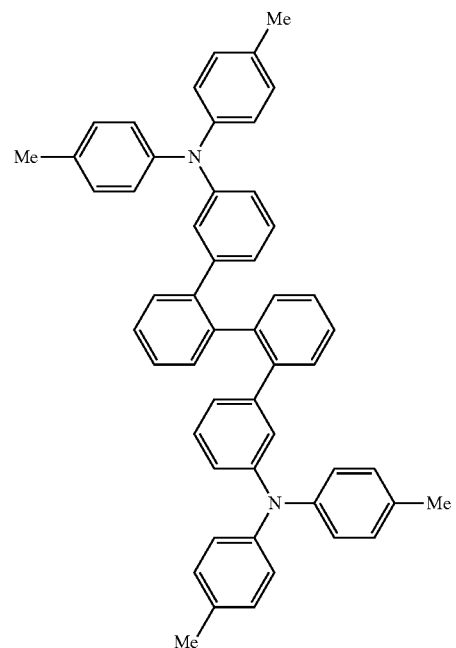
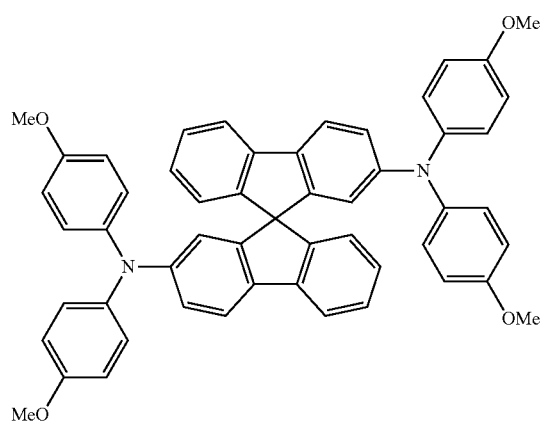
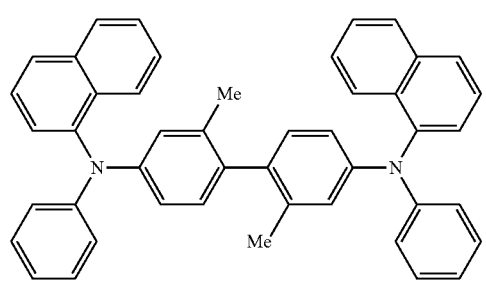
[Chemical Formula 30]
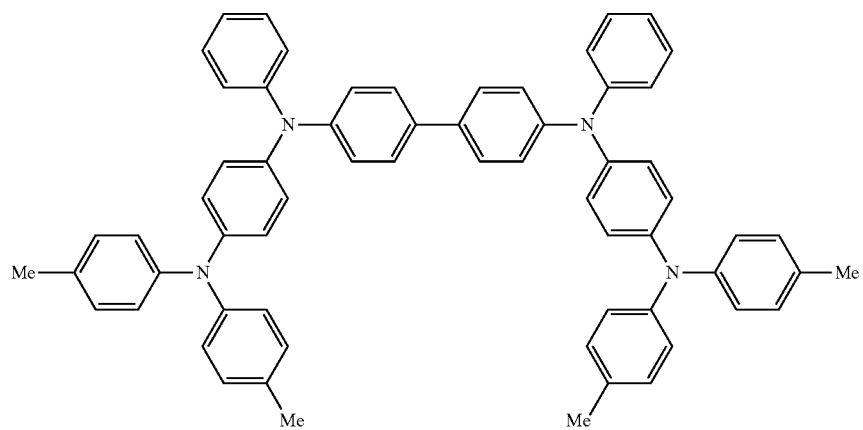

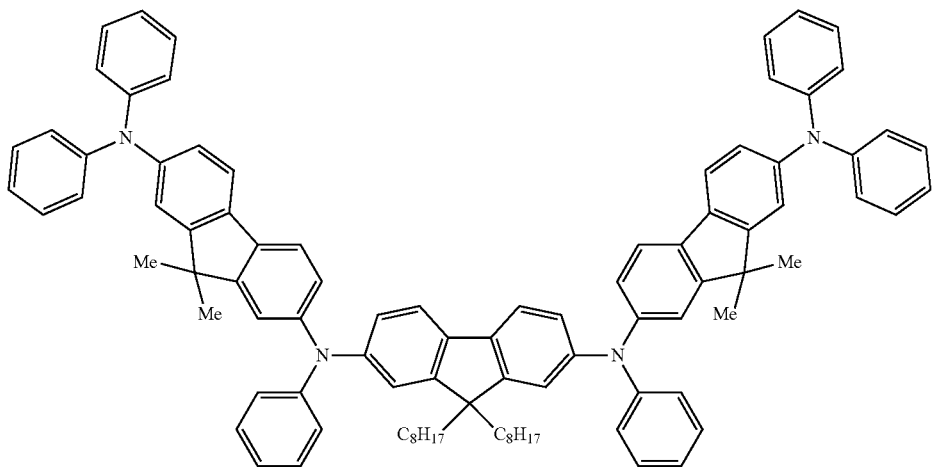
[Chemical Formula 31]
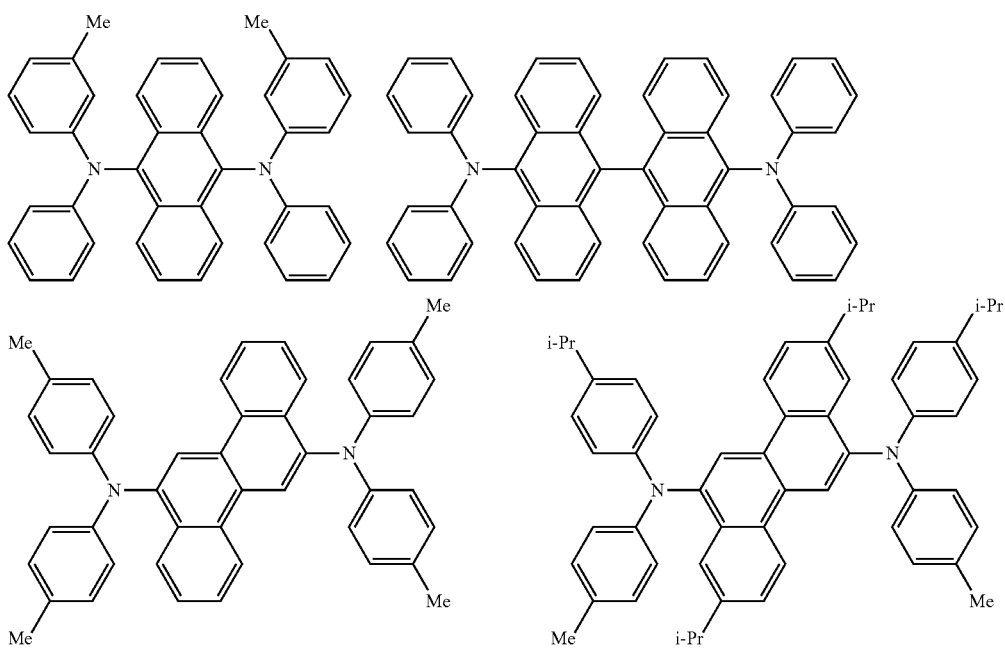
[Chemical Formula 32]
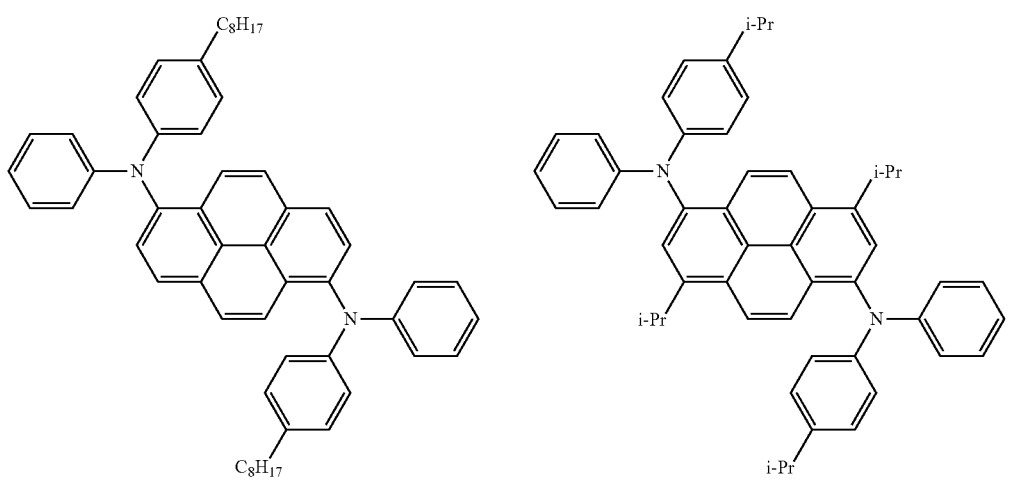

-continued
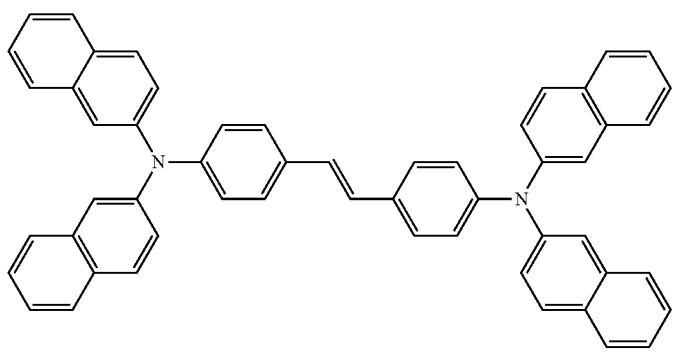
[Chemical Formula 33]
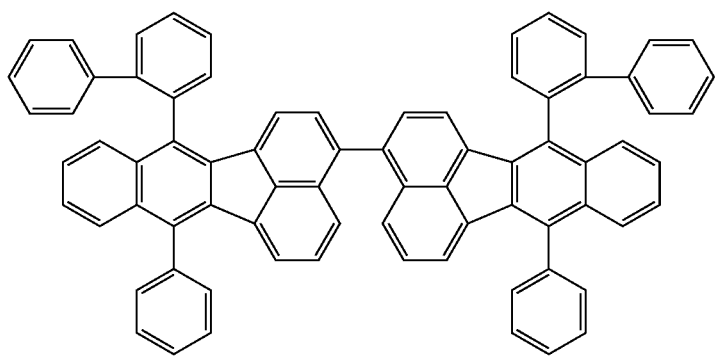
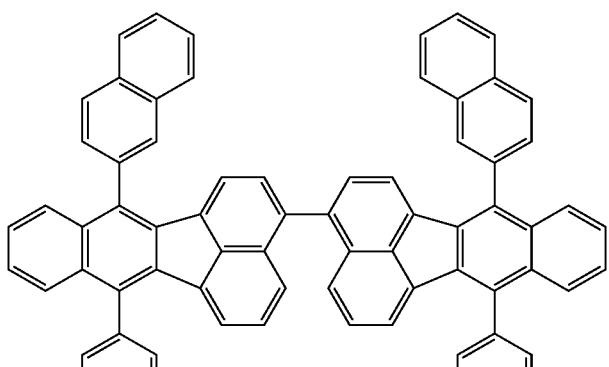
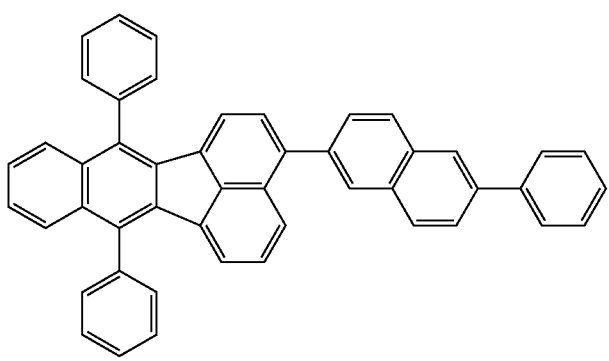

[Chemical Formula 34]
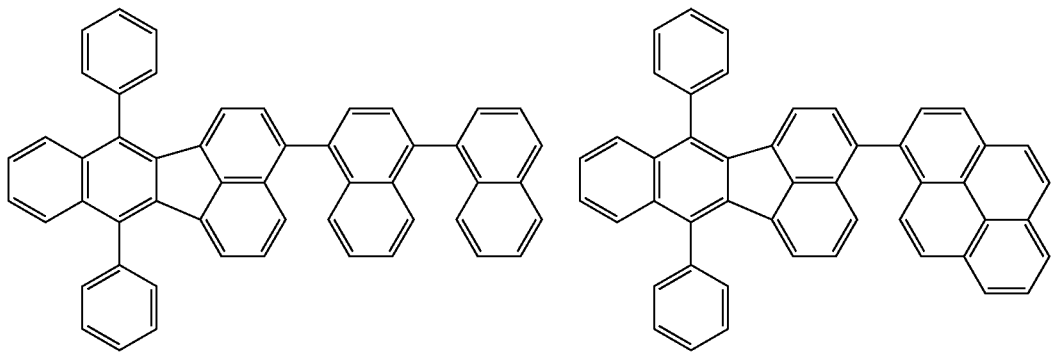
[Chemical Formula 35]
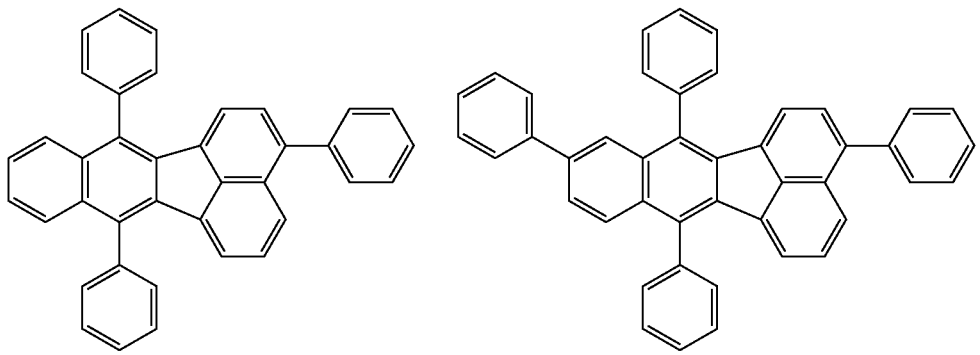
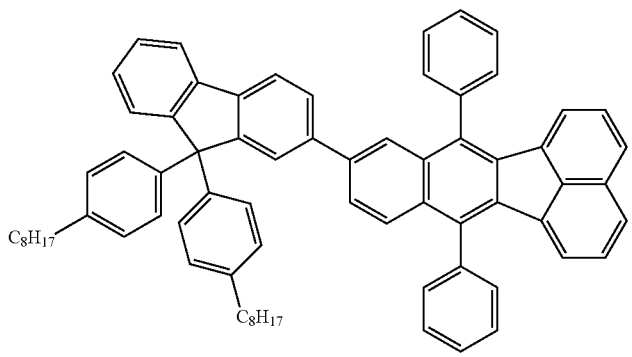

[Chemical Formula 36]
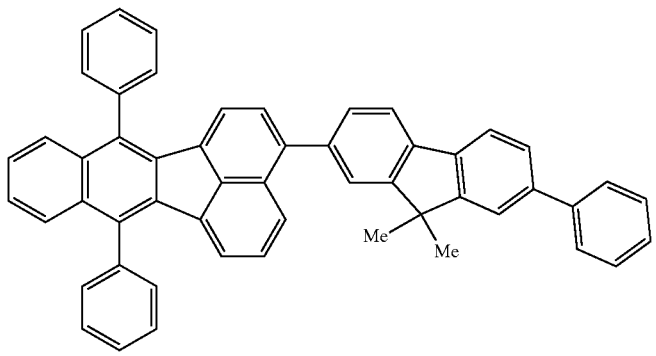
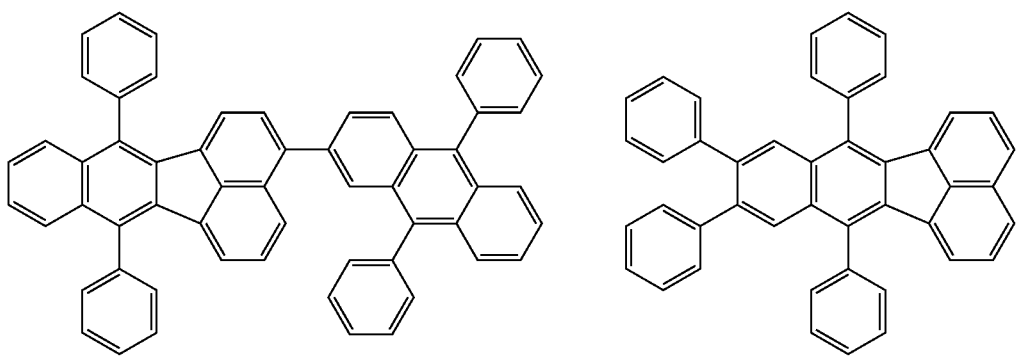
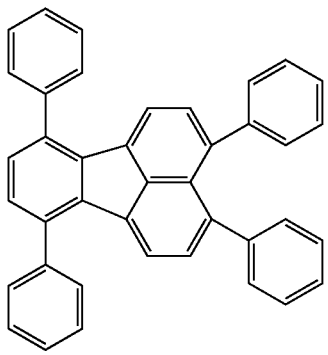
[Chemical Formula 37]
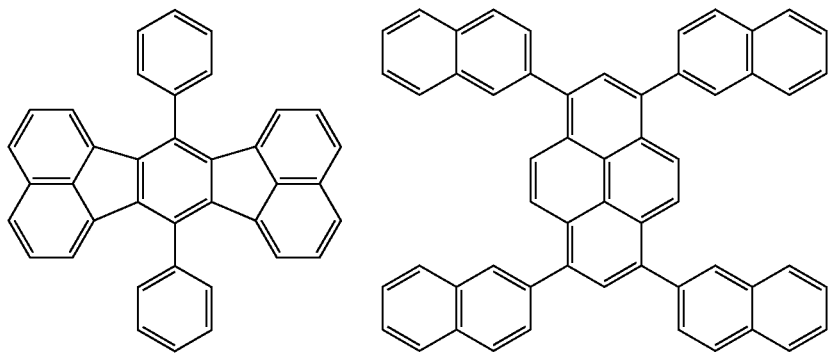

41 42
-continued
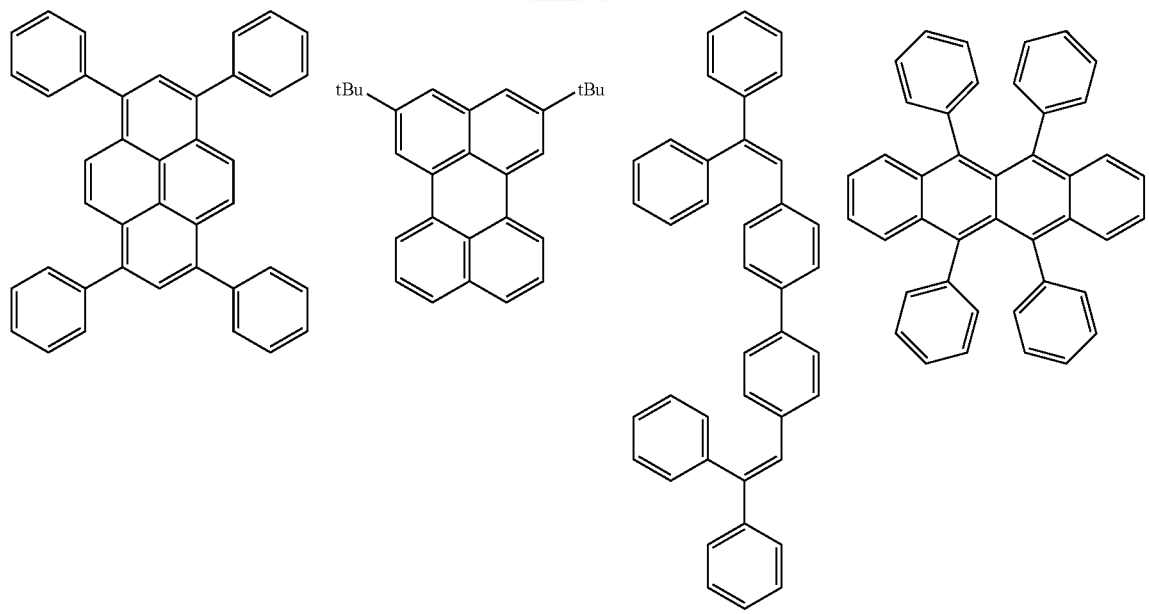
[Chemical Formula 38]
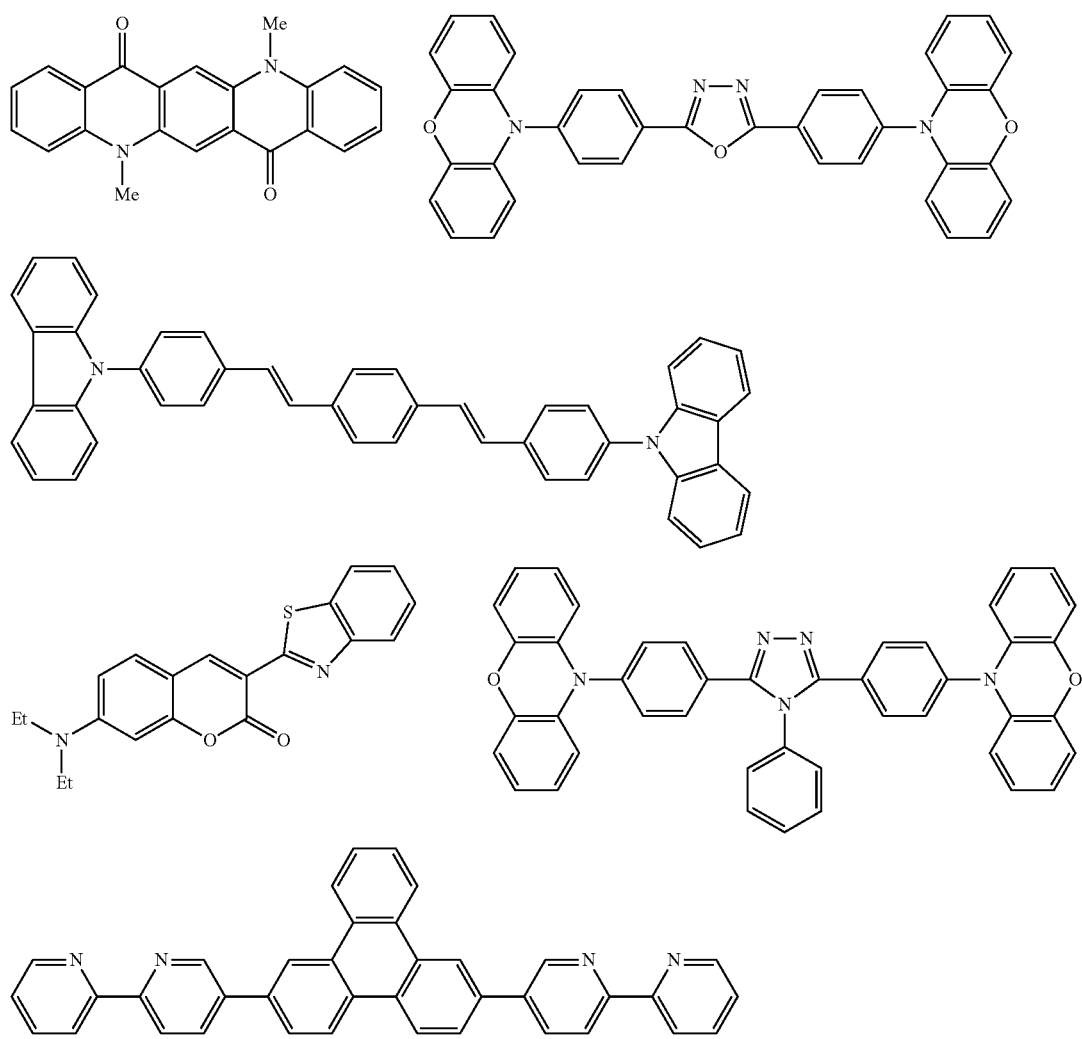

The fluorescent low-molecular weight compound is available, for example, from Aldrich Corp., Luminescence Technology Corp. and AK Scientific, Inc. In addition, the fluorescent low-molecular weight compound can be synthesized, for example, according to a method described in International Publication WO 2007/100010, International Publication WO 2008/059713, International Publication WO 2011/1012212, International Publication WO 2012/096263, International Publication WO 2006/025273 and International Publication WO 2006/030527.

[Host Material]

It is preferable that the first organic layer is a layer containing a fluorescent low-molecular weight compound and a host material having at least one function selected from the group consisting of hole injectability, hole transportability, electron injectability and electron transportability, since the light emitting device of the present invention is more excellent in the external quantum efficiency. The host material may be contained singly or in combination of two or more kinds thereof.

When the first organic layer is a layer containing a fluorescent low-molecular weight compound and a host material, the content of the fluorescent low-molecular weight compound is usually 0.01 to 80 parts by mass, preferably 0.1 to 50 parts by mass, more preferably 0.5 to 30 parts by mass, further preferably 1 to 20 parts by mass, when the sum of the fluorescent low-molecular weight compound and the host material is taken as 100 parts by mass.

When the first organic layer is a layer containing a fluorescent low-molecular weight compound and a host material, the lowest excited singlet state ($S_1$) of the host material preferably has energy level corresponding to or higher than $S_1$ of the fluorescent low-molecular weight compound (that is, the maximum peak wavelength of the emission spectrum of the host material is shorter than the maximum peak wavelength of the emission spectrum of the fluorescent low-molecular weight compound), more preferably has energy level higher than $S_1$ of the fluorescent low-molecular weight compound, since the light emitting device of the present invention is excellent in the external quantum efficiency.

It is preferable that the host material is one showing solubility in solvent capable of dissolving the fluorescent low-molecular weight compound contained in the first organic layer, since the light emitting device of the present invention can be fabricated by a solution application process.

The host material is classified into low-molecular weight compounds and polymer compounds. The host material includes, for example, hole transporting materials described later and electron transporting materials described later.

[Low-Molecular Host]

The low-molecular weight compound which is preferable as the host material (hereinafter, referred to as "low-molecular host") is, for example, a compound represented by the above-described formula (FH-1).

$Ar^{H1}$ and $Ar^{H2}$ are each preferably an aryl group or a monovalent heterocyclic group, more preferably an aryl group, and these groups optionally have a substituent.

The number of carbon atoms of the aryl group represented by $Ar^{H1}$ and $Ar^{H2}$, not including the number of carbon atoms of the substituent, is usually 6 to 60, preferably 6 to 30, more preferably 6 to 20, further preferably 6 to 14.

The aryl group represented by $Ar^{H1}$ and $Ar^{H2}$ includes groups obtained by removing from a benzene ring, a naphthalene ring, an anthracene ring, a phenanthrene ring, a triphenylene ring, a dihydrophenanthrene ring, a naphthacene ring, a fluorene ring, a spirobifluorene ring, a pyrene ring, a perylene ring, a chrysene ring, an indene ring, a fluoranthene ring and a benzofluoranthene ring one hydrogen atom bonding directly to a carbon atom constituting the ring, and is preferably a group obtained by removing from a benzene ring, a naphthalene ring, an anthracene ring, a phenanthrene ring, a dihydrophenanthrene ring, a fluorene ring, a spirobi fluorene ring, a pyrene ring or a chrysene ring one hydrogen atom bonding directly to a carbon atom constituting the ring, more preferably a group obtained by removing from a benzene ring, a naphthalene ring, an anthracene ring, a pyrene ring, a fluorene ring or a spirobifluorene ring one hydrogen atom bonding directly to a carbon atom constituting the ring, further preferably a phenyl group, a naphthyl group or an anthracenyl group, particularly preferably a phenyl group or a naphthyl group, and these groups optionally further have a substituent.

The number of carbon atoms of the monovalent heterocyclic group represented by $Ar^{H1}$ and $Ar^{H2}$, not including the number of carbon atoms of the substituent, is usually 2 to 60, preferably 3 to 30, more preferably 3 to 20.

The monovalent heterocyclic group represented by $Ar^{H1}$ and $Ar^{H2}$ includes, for example, groups obtained by removing from a pyrrole ring, a diazole ring, a triazole ring, a pyridine ring, a diazabenzene ring, a triazine ring, an azanaphthalene ring, a diazanaphthalene ring, a triazanaphthalene ring, an indole ring, a benzodiazole ring, a benzotriazole ring, a carbazole ring, an azacarbazole ring, a diazacarbazole ring, a dibenzofuran ring, a dibenzothiophene ring, a phenoxazine ring, a phenothiazine ring, an acridine ring, a 9,10-dihydroacridine ring, an acridone ring, a phenazine ring and a 5,10-dihydrophenazine ring one hydrogen atom bonding directly to a carbon atom or a hetero atom constituting the ring, and is preferably a group obtained by removing from a diazole ring, a triazole ring, a pyridine ring, a diazabenzene ring, a triazine ring, an indole ring, a benzodiazole ring, a benzotriazole ring, a carbazole ring, a dibenzofuran ring, a dibenzothiophene ring, a phenoxazine ring, a phenothiazine ring, a 9,10-dihydroacridine ring or a 5,10-dihydrophenazine ring one hydrogen atom bonding directly to a carbon atom or a hetero atom constituting the ring, more preferably a group obtained by removing from a diazole ring, a triazole ring, a pyridine ring, a diazabenzene ring, a triazine ring, a benzodiazole ring, a benzotriazole ring, a carbazole ring, a dibenzofuran ring or a dibenzothiophene ring one hydrogen atom bonding directly to a carbon atom or a hetero atom constituting the ring, and these groups optionally further have a substituent.

The substituent which the amino group has in the substituted amino group represented by $Ar^{H1}$ and $Ar^{H2}$ is preferably an aryl group or a monovalent heterocyclic group, more preferably an aryl group, and these groups optionally further have a substituent. The examples and preferable range of the aryl group as the substituent which the amino group has are the same as the examples and preferable range of the aryl group represented by $Ar^{H1}$ and $Ar^{H2}$. The examples and preferable range of the monovalent heterocyclic group as the substituent which the amino group has are the same as the examples and preferable range of the monovalent heterocyclic group represented by $Ar^{H1}$ and $Ar^{H2}$.

The substituent which $Ar^{H1}$ and $Ar^{H2}$ optionally have is preferably an alkyl group, a cycloalkyl group, an aryl group, a monovalent heterocyclic group, an alkoxy group, a cycloalkoxy group, an aryloxy group, a substituted amino group or a halogen atom, more preferably an alkyl group, a cycloalkyl group, an alkoxy group, a cycloalkoxy group, an aryl group, a monovalent heterocyclic group or a substituted amino group, further preferably an alkyl group, a cycloalkyl group, an aryl group or a monovalent heterocyclic group, particularly preferably an alkyl group, a cycloalkyl group or an aryl group, and these groups optionally further have a substituent.

The examples and preferable range of the aryl group, the monovalent heterocyclic group and the substituted amino group as the substituent which $Ar^{H1}$ and $Ar^{H2}$ optionally have are the same as the examples and preferable range of the aryl group, the monovalent heterocyclic group and the substituted amino group represented by $Ar^{H1}$ and $Ar^{H2}$, respectively.

The substituent which the substituent which $Ar^{H1}$ and $Ar^{H2}$ optionally have optionally further has is preferably an alkyl group, a cycloalkyl group, an aryl group, a monovalent heterocyclic group, an alkoxy group, a cycloalkoxy group, an aryloxy group, a substituted amino group or a halogen atom, more preferably an alkyl group, a cycloalkyl group, an alkoxy group, a cycloalkoxy group, an aryl group, a monovalent heterocyclic group or a substituted amino group, further preferably an alkyl group, a cycloalkyl group, an aryl group or a monovalent heterocyclic group, particularly preferably an alkyl group or cycloalkyl group, and these groups optionally further have a substituent.

The examples and preferable range of the aryl group, the monovalent heterocyclic group and the substituted amino group as the substituent which the substituent which $Ar^{H1}$ and $Ar^{H2}$ optionally have optionally further has are the same as the examples and preferable range of the aryl group, the monovalent heterocyclic group and the substituted amino group represented by $Ar^{H1}$ and $Ar^{H2}$, respectively.

$n^{H1}$ is preferably an integer of 0 or more and 10 or less, more preferably an integer of 1 or more and 5 or less, further preferably an integer of 1 or more and 3 or less.

$L^{H1}$ is preferably an arylene group or a divalent heterocyclic group, more preferably an arylene group, and these groups optionally have a substituent.

The examples and preferable range of the substituent which $L^{H1}$ optionally has are the same as the examples and preferable range of the substituent which $Ar^{H1}$ and $Ar^{H2}$ optionally have.

The arylene group represented by $L^{H1}$ is preferably a group represented by the formula (A-1) to the formula (A-14) or the formula (A-17) to the formula (A-20), more preferably a group represented by the formula (A-1) to the formula (A-9), the formula (A-11) to the formula (A-14), the formula (A-19) or the formula (A-20), further preferably a group represented by the formula (A-1) to the formula (A-7), the formula (A-9), the formula (A-1) to the formula (A-14) or the formula (A-19), particularly preferably a group represented by the formula (A-1) to the formula (A-6), the formula (A-1) or the formula (A-12).

The divalent heterocyclic group represented by $L^{H1}$ is preferably a group represented by the formula (AA-1) to the formula (AA-6), the formula (AA-10) to the formula (AA-22) or the formula (AA-24) to the formula (AA-34), more preferably a group represented by the formula (AA-1) to the formula (AA-4), the formula (AA-10) to the formula (AA-15) or the formula (AA-18) to the formula (AA-21) or the formula (AA-27) to the formula (AA-34), further preferably a group represented by the formula (AA-1) to the formula (AA-4), the formula (AA-10) to the formula (AA-15) or the formula (AA-27) to the formula (AA-32).

$n^{H11}$ is preferably an integer of 1 or more and 5 or less, more preferably an integer of 1 or more and 3 or less, further preferably 1.

$R^{H11}$ is preferably a hydrogen atom, an alkyl group, a cycloalkyl group, an aryl group or a monovalent heterocyclic group, more preferably a hydrogen atom, an alkyl group or a cycloalkyl group, further preferably a hydrogen atom or an alkyl group, and these groups optionally have a substituent.

The examples and preferable range of the substituent which $R^{H11}$ optionally has are the same as the examples and preferable range of the substituent which $Ar^{H1}$ and $Ar^{H2}$ optionally have.

The compound represented by the formula (FH-1) includes, for example, compounds represented by the following formulae.

[Chemical Formula 39]

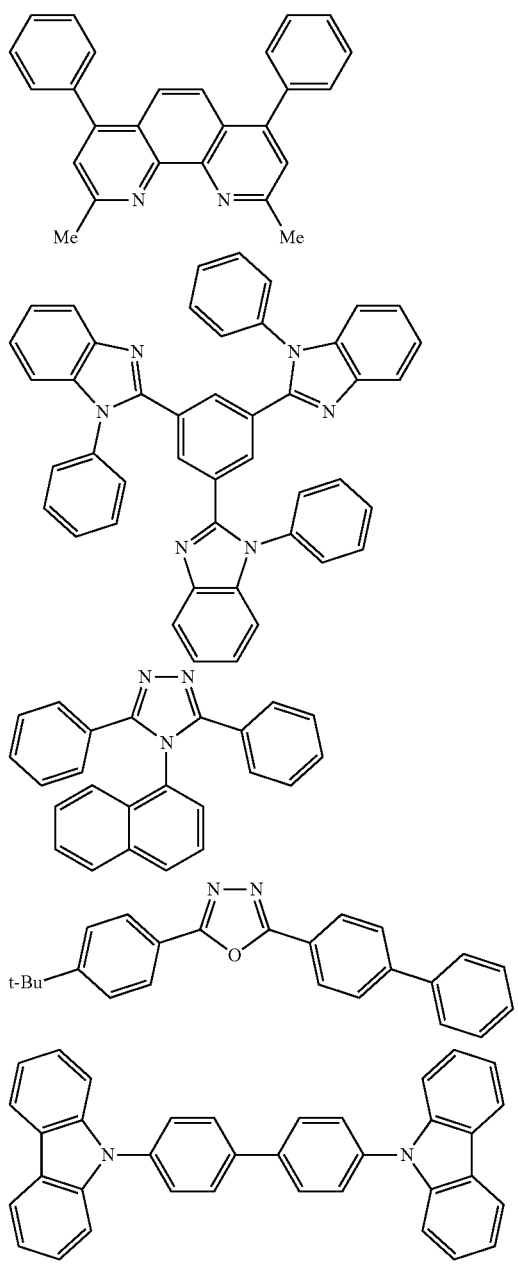

[Chemical Formula 40]
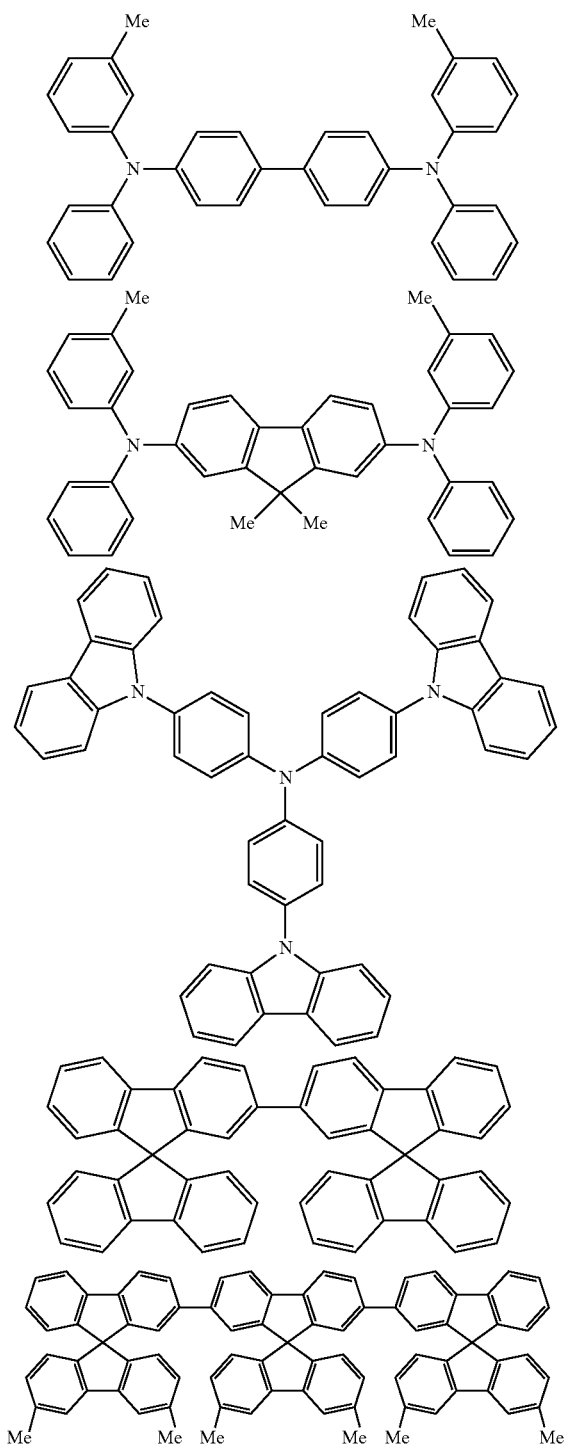
[Chemical Formula 41]
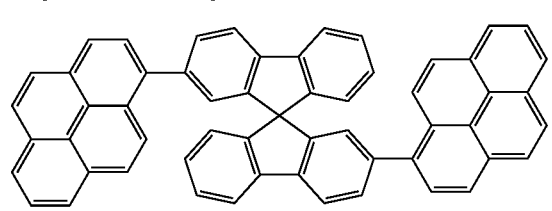
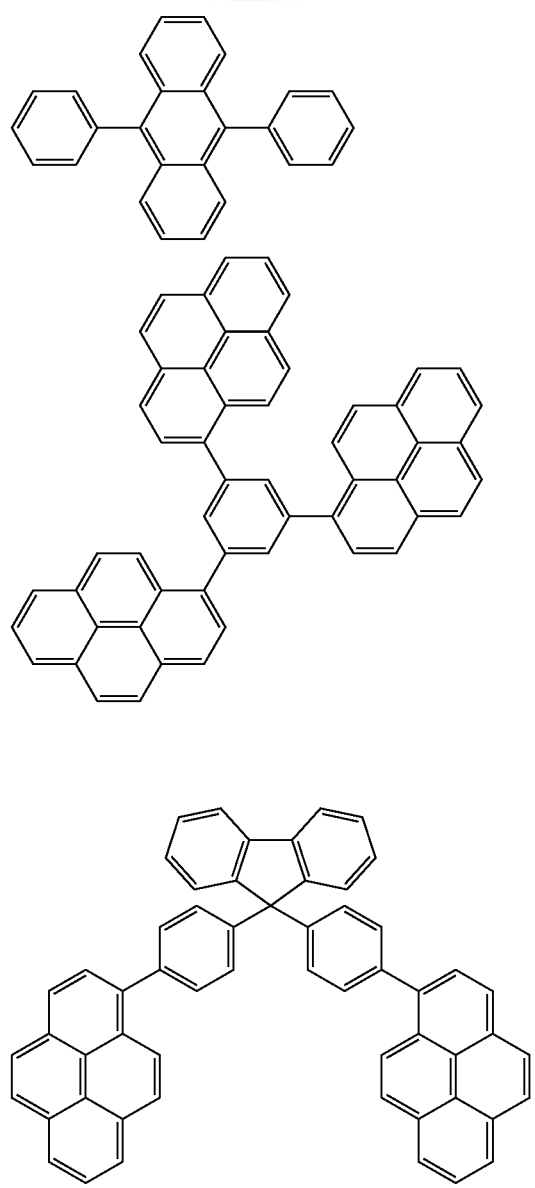
[Chemical Formula 42]
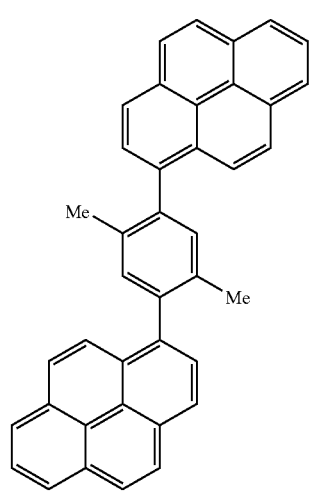

-continued
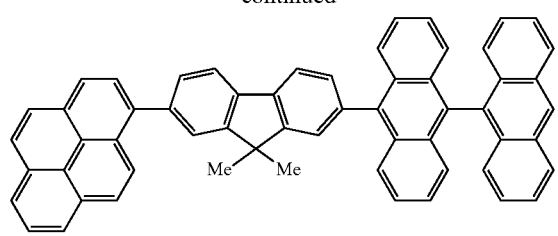
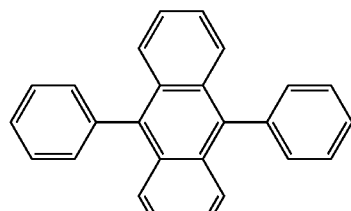
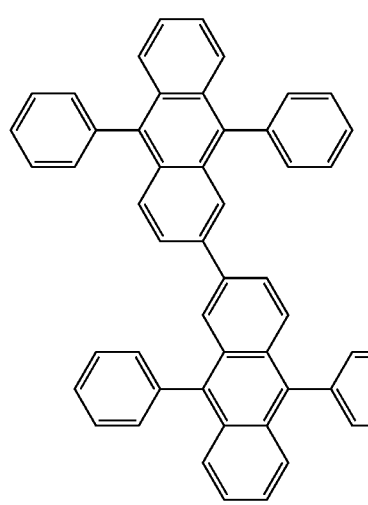
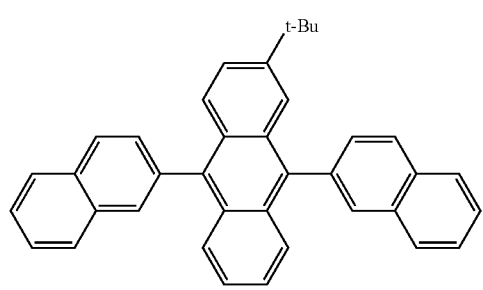
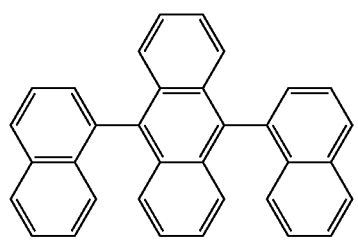
-continued
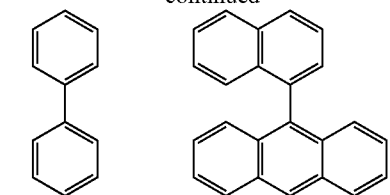
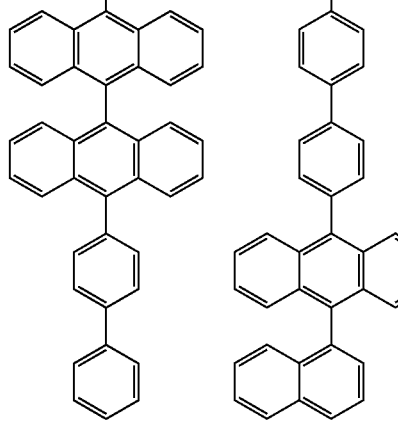
[Chemical Formula 43]
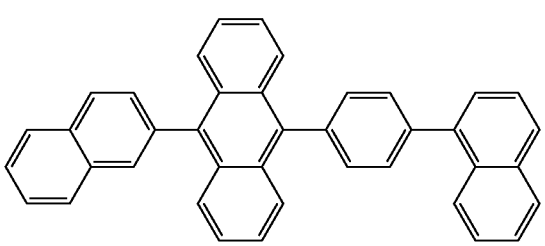
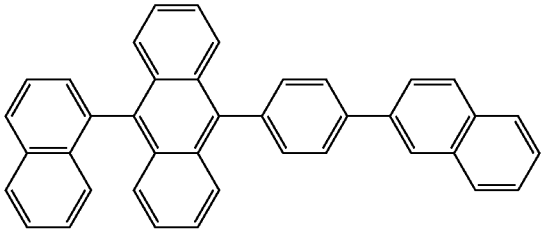
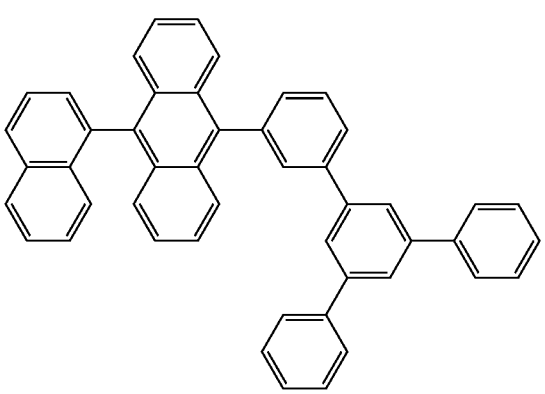

[Chemical Formula 44]

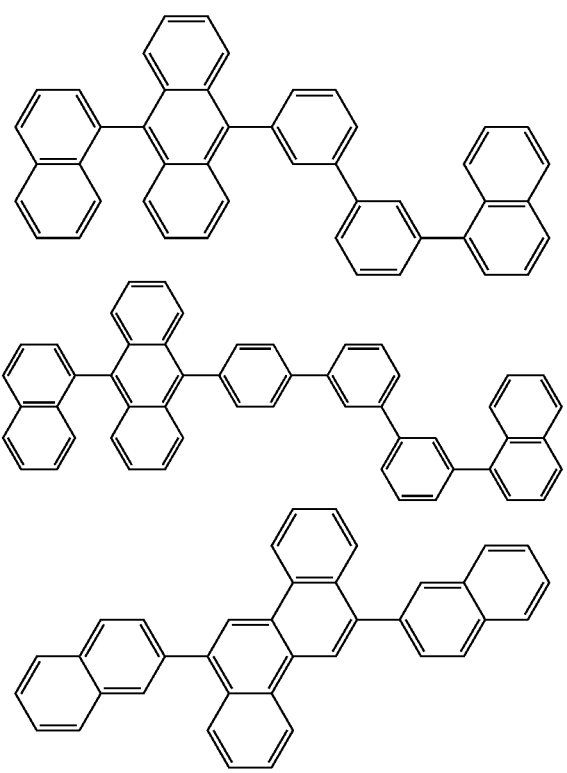

[Chemical Formula 45]

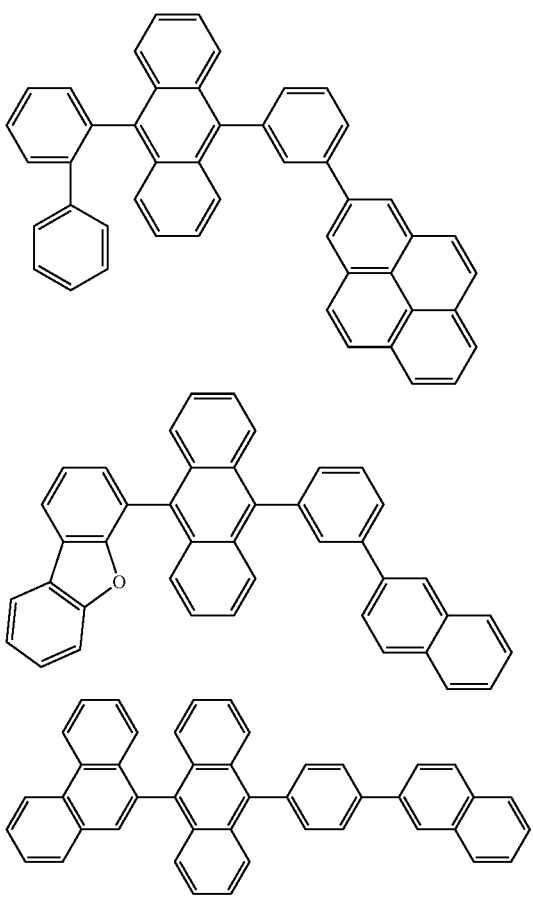

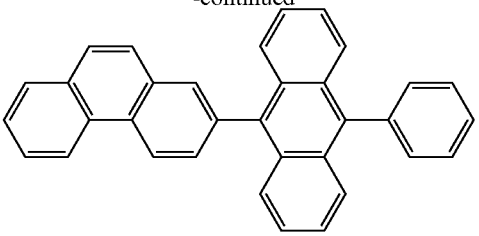

[Polymer Host]

The polymer compound preferable as the host material (hereinafter, referred to as "polymer host") is, for example, a polymer compound containing a constitutional unit represented by the formula (Y).

The arylene group represented by $Ar^{Y1}$ is more preferably a group represented by the formula (A-1), the formula (A-6), the formula (A-7), the formula (A-9) to the formula (A-1), the formula (A-13) or the formula (A-19), further preferably a group represented by the formula (A-1), the formula (A-7), the formula (A-9), the formula (A-11) or the formula (A-19), and these groups optionally have a substituent.

The divalent heterocyclic group represented by $Ar^{Y1}$ is more preferably a group represented by the formula (AA-4), the formula (AA-10), the formula (AA-13), the formula (AA-15), the formula (AA-18) or the formula (AA-20), especially preferably a group represented by the formula (AA-4), the formula (AA-10), the formula (AA-18) or the formula (AA-20), and these groups optionally have a substituent.

The more preferable range and the further preferable range of the arylene group and the divalent heterocyclic group in the divalent group in which at least one arylene group and at least one divalent heterocyclic group are bonded directly represented by $Ar^{Y1}$ are the same as the more preferable range and the further preferable range of the arylene group and the divalent heterocyclic group represented by $Ar^{Y1}$ described above, respectively.

The divalent group in which at least one arylene group and at least one divalent heterocyclic group are bonded directly represented by $Ar^{Y1}$ includes those which are the same as the divalent group in which at least one arylene group and at least one divalent heterocyclic group are bonded directly represented by $Ar^{X2}$ and $Ar^{X4}$ in the formula (X) described later.

The substituent which the group represented by $Ar^{Y1}$ optionally has is preferably an alkyl group, a cycloalkyl group or an aryl group, and these groups optionally further have a substituent.

The constitutional unit represented by the formula (Y) includes, for example, constitutional units represented by the formula (Y-1) to the formula (Y-8), and is preferably a constitutional unit represented by the formula (Y-1), the formula (Y-2) or the formula (Y-8) from the standpoint of the external quantum efficiency of the light emitting device of the present invention, preferably a constitutional unit represented by the formula (Y-3) or the formula (Y-4) from the standpoint of the electron transportability of the polymer host and preferably a constitutional unit represented by the formula (Y-5) to the formula (Y-1) from the standpoint of the hole transportability of the polymer host.

The polymer host is preferably a polymer compound containing a constitutional unit represented by the formula (Y-2) and/or a constitutional unit represented by the formula (Y-8), more preferably a polymer compound containing a constitutional unit represented by the formula (Y-2) and a constitutional unit represented by the formula (Y-8), since the light emitting device of the present invention is more excellent in the external quantum efficiency.

[Chemical Formula 46]

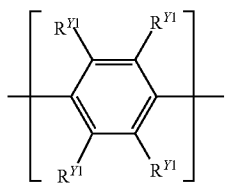

(Y-1)

[wherein, $R^{Y1}$ is a hydrogen atom, an alkyl group, a cycloalkyl group, an alkoxy group, a cycloalkoxy group, an aryl group or a monovalent heterocyclic group, and these groups optionally have a substituent. A plurality of $R^{Y2}$ may be the same or different, and the adjacent $R^{Y1}$ may be combined together to form a ring together with carbon atoms to which they are attached.]

$R^{Y1}$ is preferably a hydrogen atom, an alkyl group, a cycloalkyl group or an aryl group, and these groups optionally have a substituent.

The constitutional unit represented by the formula (Y-1) is preferably a constitutional unit represented by the formula (Y-1').

[Chemical Formula 47]

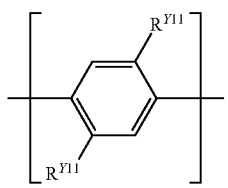

(Y-1')

[wherein, $R^{Y11}$ is an alkyl group, a cycloalkyl group, an alkoxy group, a cycloalkoxy group, an aryl group or a monovalent heterocyclic group, and these groups optionally have a substituent. A plurality of $R^{Y11}$ may be the same or different.]

$R^{Y11}$ is preferably an alkyl group, a cycloalkyl group or an aryl group, more preferably an alkyl group or a cycloalkyl group, and these groups optionally have a substituent.

[Chemical Formula 48]

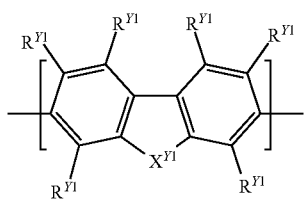

(Y-2)

[wherein,
$R^{Y1}$ represents the same meaning as described above.
$X^{Y1}$ is a group represented by —C($R^{Y2}$)$_2$—, —C($R^{Y2}$)=C($R^{Y2}$)— or C($R^{Y2}$)$_2$—C($R^{Y2}$)$_2$—. $R^{Y2}$ is a hydrogen atom, an alkyl group, a cycloalkyl group, an alkoxy group, a cycloalkoxy group, an aryl group or a monovalent heterocyclic group, and these groups optionally have a substituent. A plurality of $R^{Y2}$ may be the same or different, and the plurality of $R^{Y2}$ may be combined together to form a ring together with carbon atoms to which they are attached.]

$R^{Y2}$ is preferably an alkyl group, a cycloalkyl group, an aryl group or a monovalent heterocyclic group, more preferably an alkyl group, a cycloalkyl group or an aryl group, and these groups optionally have a substituent.

The combination of two $R^{Y2}$ in the group represented by —C($R^{Y2}$)$_2$— as $X^{Y1}$ is preferably a combination in which both are alkyl groups or cycloalkyl groups, a combination in which both are aryl groups, a combination in which both are monovalent heterocyclic groups, or a combination in which one is an alkyl group or a cycloalkyl group and the other is an aryl group or a monovalent heterocyclic group, more preferably a combination in which one is an alkyl group or a cycloalkyl group and the other is an aryl group, and these groups optionally have a substituent. Two $R^{Y2}$ may be combined together to form a ring together with atoms to which they are attached, and when $R^{Y2}$ forms a ring, the group represented by —C($R^{Y2}$)$_2$— is preferably a group represented by the formula (Y-A1) to the formula (Y-A5), more preferably a group represented by the formula (Y-A4), and these groups optionally have a substituent.

[Chemical Formula 49]

(Y-A1)

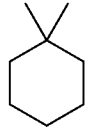

(Y-A2)

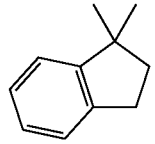

(Y-A3)

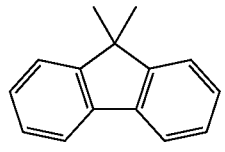

(Y-A4)

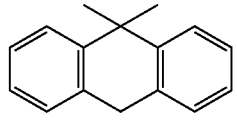

(Y-A5)

The combination of two $R^{Y2}$ in the group represented by —C($R^{Y2}$)=C($R^{Y2}$)— as $X^{Y1}$ is preferably a combination in which both are alkyl groups or cycloalkyl groups, or a combination in which one is an alkyl group or a cycloalkyl group and the other is an aryl group, and these groups optionally have a substituent.

The combination of four $R^{Y2}$ in the group represented by —C($R^{Y2}$)$_2$—C($R^{Y2}$)$_2$— as $X^{Y1}$ is preferably an alkyl group optionally having a substituent or a cycloalkyl group optionally having a substituent. The plurality of $R^{Y2}$ may be combined together to form a ring together with atoms to which they are attached, and when $R^{Y2}$ forms a ring, the group represented by $-C(R^{Y2})_2-C(R^{Y2})_2-$ is preferably a group represented by the formula (Y-B1) to the formula (Y-B5), more preferably a group represented by the formula (Y-B3), and these groups optionally have a substituent.

[Chemical Formula 50]

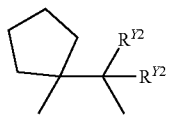
(Y-B1)

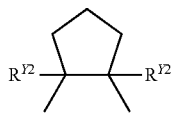
(Y-B2)

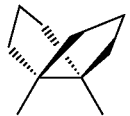
(Y-B3)

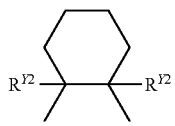
(Y-B4)

(Y-B5)

[wherein, $R^{Y2}$ represents the same meaning as described above.]

The constitutional unit represented by the formula (Y-2) is preferably a constitutional unit represented by the formula (Y-2').

[Chemical Formula 51]

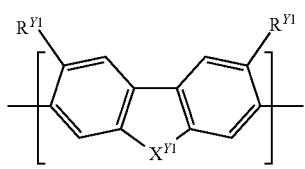
(Y-2')

[wherein, $R^{Y1}$ and $X^{Y1}$ represent the same meaning as described above.]

[Chemical Formula 52]

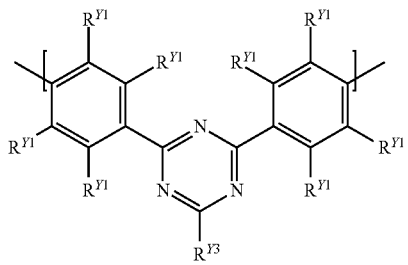
(Y-3)

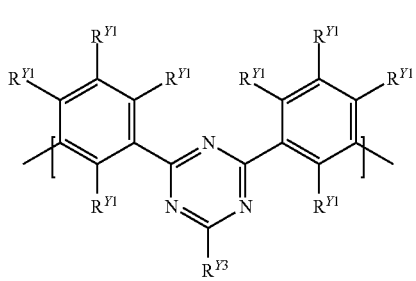
(Y-4)

[wherein, $R^{Y1}$ represents the same meaning as described above.

$R^{Y3}$ is a hydrogen atom, an alkyl group, a cycloalkyl group, an alkoxy group, a cycloalkoxy group, an aryl group or a monovalent heterocyclic group, and these groups optionally have a substituent.]

$R^{Y3}$ is preferably an alkyl group, a cycloalkyl group, an alkoxy group, a cycloalkoxy group, an aryl group or a monovalent heterocyclic group, more preferably an aryl group, and these groups optionally have a substituent.

[Chemical Formula 53]

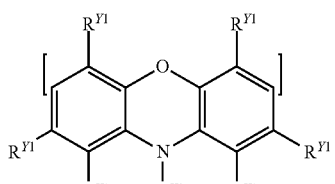
(Y-5)

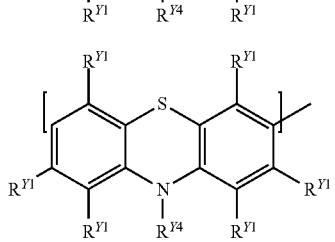
(Y-6)

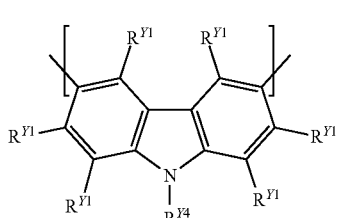
(Y-7)

[wherein, $R^{Y1}$ represents the same meaning as described above.

$R^{Y4}$ represents a hydrogen atom, an alkyl group, a cycloalkyl group, an alkoxy group, a cycloalkoxy group, an aryl group or a monovalent heterocyclic group, and these groups optionally have a substituent.]

$R^{Y4}$ is preferably an alkyl group, a cycloalkyl group, an alkoxy group, a cycloalkoxy group, an aryl group or a monovalent heterocyclic group, more preferably an aryl group, and these groups optionally have a substituent.

[Chemical Formula 54]

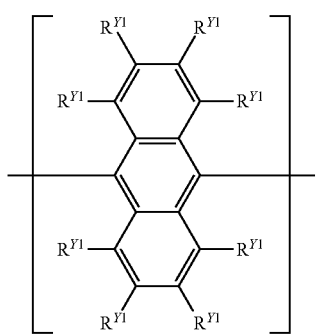

(Y-8)

[wherein, $R^{Y1}$ represents the same meaning as described above.]

The constitutional unit represented by the formula (Y) includes, for example, constitutional units represented by the formula (Y-11) to the formula (Y-56).

[Chemical Formula 55]

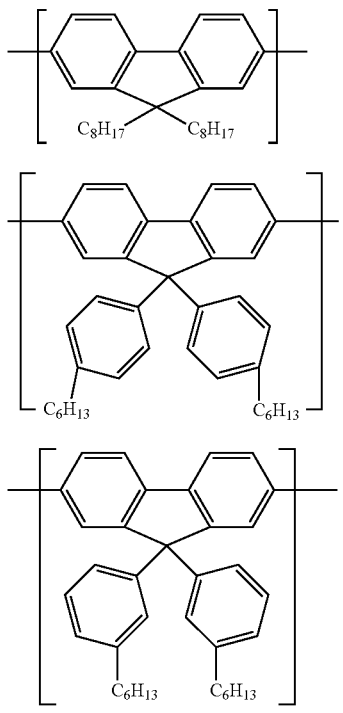

(Y-11)

(Y-12)

(Y-13)

[Chemical Formula 56]

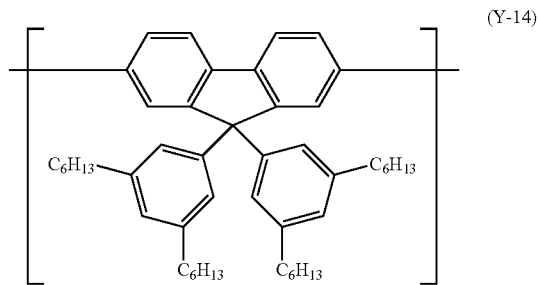

(Y-14)

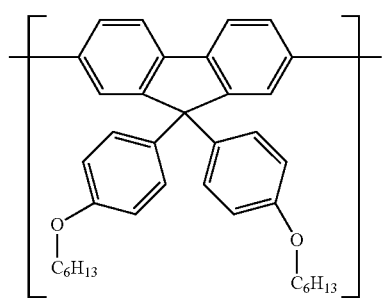

(Y-15)

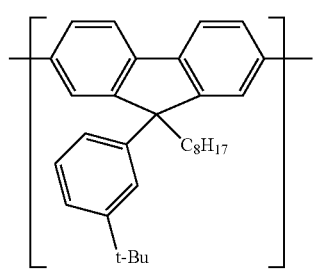

(Y-16)

[Chemical Formula 57]

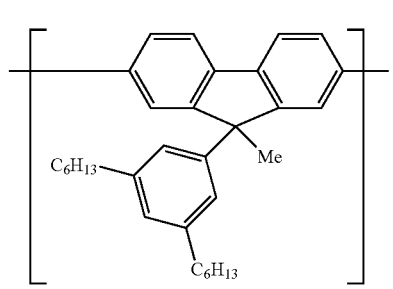

(Y-17)

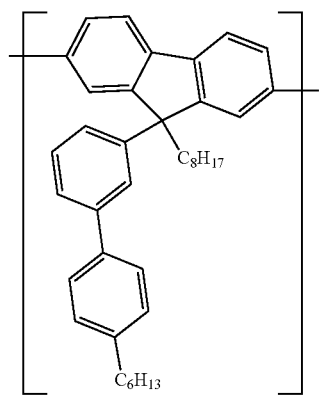

(Y-18)

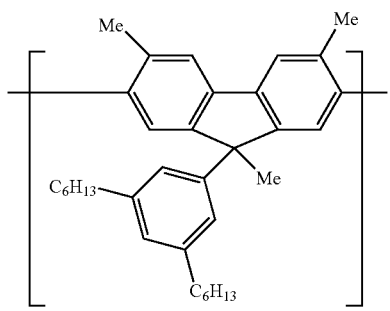
(Y-19)
[Chemical Formula 58]
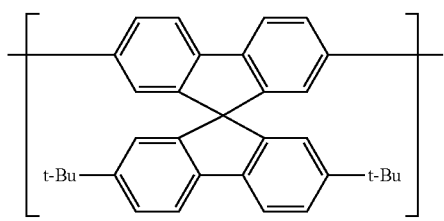
(Y-20)
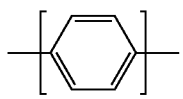
(Y-21)
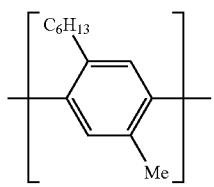
(Y-22)
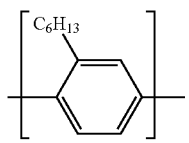
(Y-23)
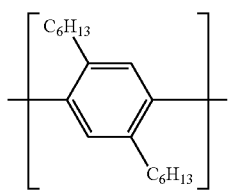
(Y-24)
[Chemical Formula 59]
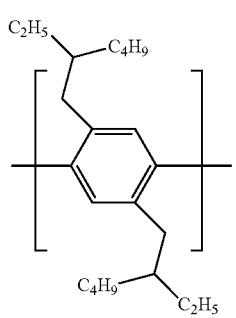
(Y-25)
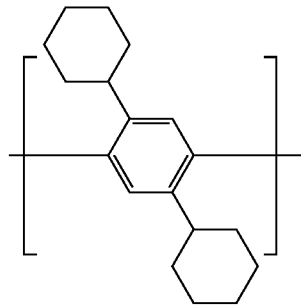
(Y-26)
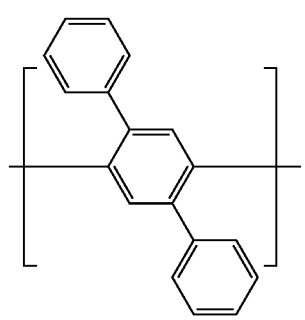
(Y-27)
[Chemical Formula 60]
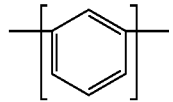
(Y-28)
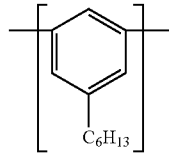
(Y-29)
(Y-30)
(Y-31)
[Chemical Formula 61]
(Y-32)

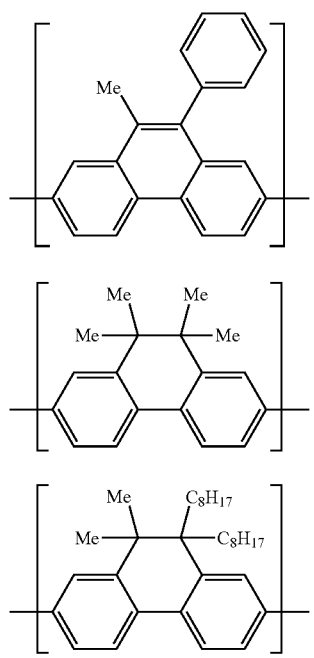
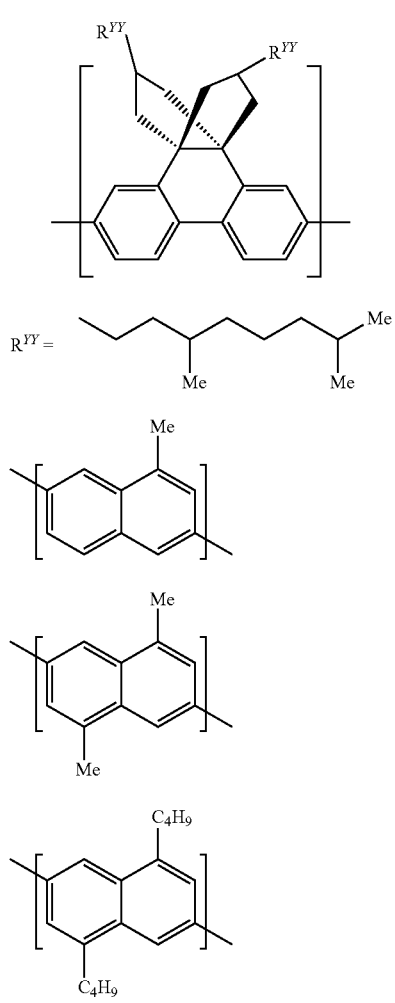
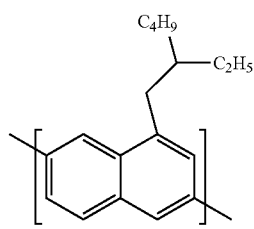
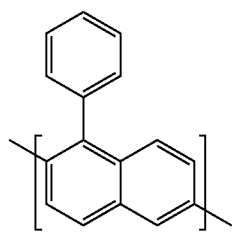
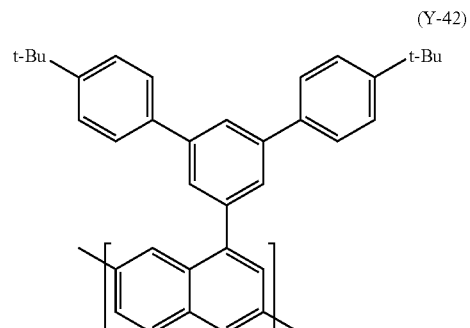
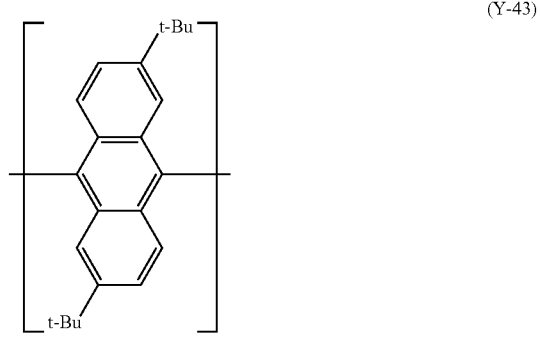

(Y-44)
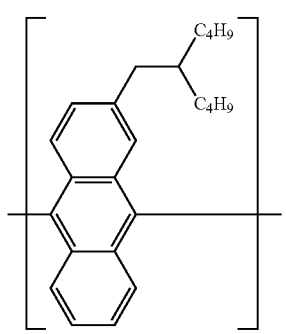
[Chemical Formula 64]
(Y-45)
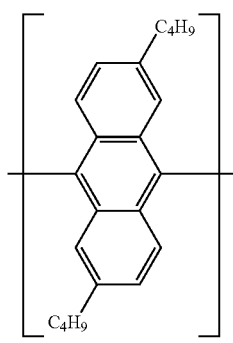
(Y-46)
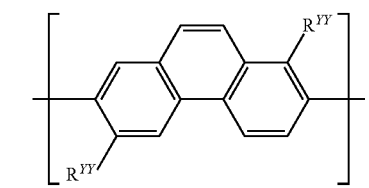
$R^{YY} =$ 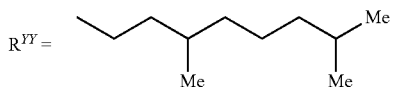
(Y-47)
[Chemical Formula 65]
(Y-48)
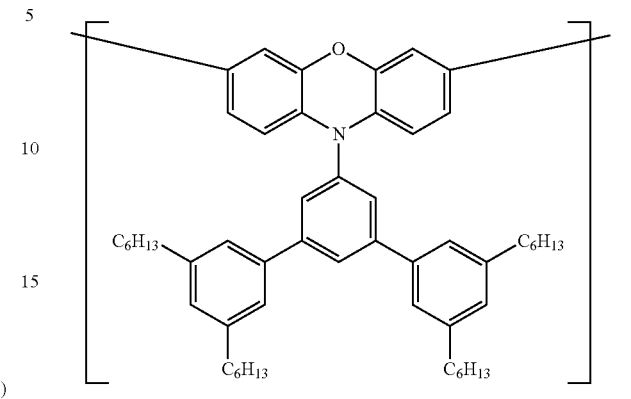
(Y-49)
[Chemical Formula 66]
(Y-50)
(Y-51)
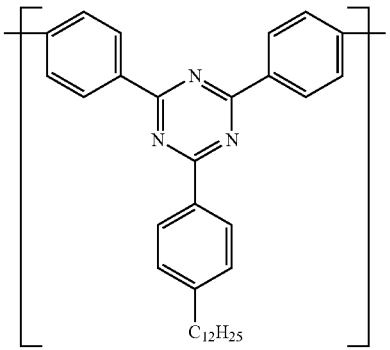

(Y-52)

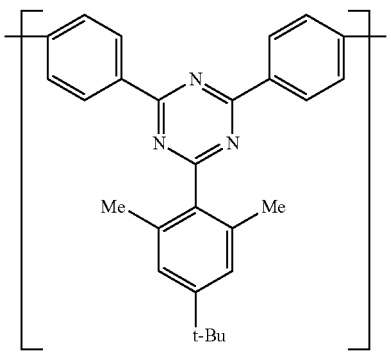

(Y-53)

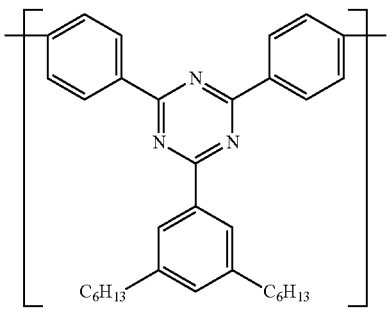

[Chemical Formula 67]

(Y-54)

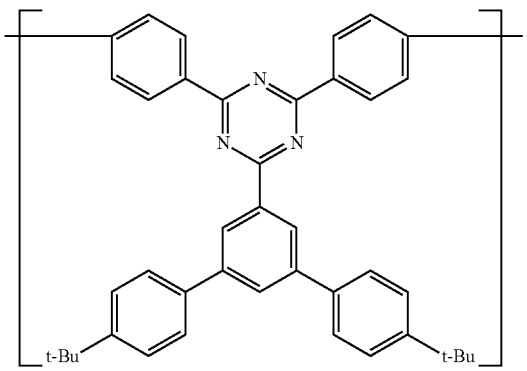

(Y-55)

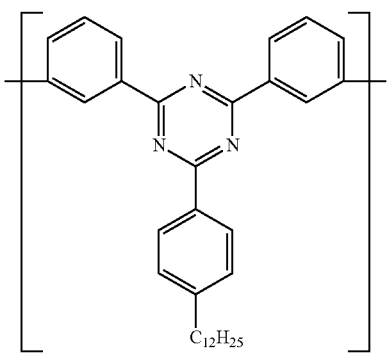

(Y-56)

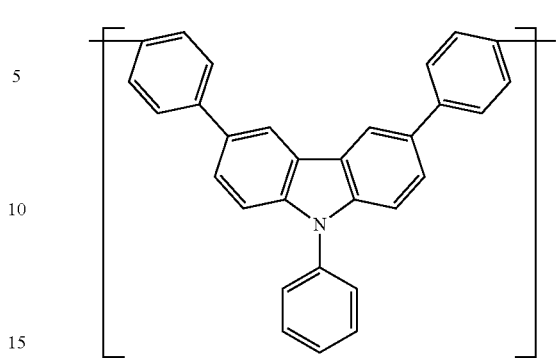

The amount of the constitutional unit represented by the formula (Y) in which $Ar^{Y1}$ is an arylene group is preferably 10 to 100 mol %, more preferably 50 to 100 mol %, with respect to the total amount of constitutional units contained in the polymer host, since the light emitting device of the present invention is more excellent in the external quantum efficiency.

The amount of the constitutional unit represented by the formula (Y) in which $Ar^{Y1}$ is a divalent heterocyclic group or a divalent group in which at least one arylene group and at least one divalent heterocyclic group are bonded directly is preferably 0.5 to 40 mol %, more preferably 3 to 30 mol %, with respect to the total amount of constitutional units contained in the polymer host, since the polymer host is excellent in charge transportability.

The constitutional unit represented by the formula (Y) may be contained singly or in combination of two or more kinds thereof, in the polymer host.

It is preferable that the polymer host further contains the above-described constitutional unit represented by the formula (X), since hole transportability is excellent.

$a^{x1}$ is preferably an integer of 2 or less, more preferably 1, since the light emitting device of the present invention is more excellent in the external quantum efficiency.

$a^{x2}$ is preferably an integer of 2 or less, more preferably 0, since the light emitting device of the present invention is more excellent in the external quantum efficiency.

$R^{X1}$, $R^{X2}$ and $R^{X3}$ are each preferably an alkyl group, a cycloalkyl group, an aryl group or a monovalent heterocyclic group, more preferably an aryl group, and these groups optionally have a substituent.

The arylene group represented by $Ar^{X1}$ and $Ar^{X3}$ is more preferably a group represented by the formula (A-1) or the formula (A-9), further preferably a group represented by the formula (A-1), and these groups optionally have a substituent.

The divalent heterocyclic group represented by $Ar^{X1}$ and $Ar^{X3}$ is more preferably a group represented by the formula (AA-1), the formula (AA-2) or the formula (AA-7) to the formula (AA-26), and these groups optionally have a substituent.

$Ar^{X1}$ and $Ar^{X3}$ are each preferably an arylene group optionally having a substituent.

The arylene group represented by $Ar^{X2}$ and $Ar^{X4}$ is more preferably a group represented by the formula (A-1), the formula (A-6), the formula (A-7), the formula (A-9) to the formula (A-11) or the formula (A-19), and these groups optionally have a substituent.

The more preferable range of the divalent heterocyclic group represented by $Ar^{X2}$ and $Ar^{X4}$ is the same as the more preferable range of the divalent heterocyclic group represented by $Ar^{X1}$ and $Ar^{X3}$.

The more preferable range and the further preferable range of the arylene group and the divalent heterocyclic group in the divalent group in which at least one arylene group and at least one divalent heterocyclic group are bonded directly represented by $Ar^{X2}$ and $Ar^{X4}$ are the same as the more preferable range and the further preferable range of the arylene group and the divalent heterocyclic group represented by $Ar^{X1}$ and $Ar^{X3}$, respectively.

The divalent group in which at least one arylene group and at least one divalent heterocyclic group are bonded directly represented by $Ar^{X2}$ and $Ar^{X4}$ includes, for example, groups represented by the following formulae, and these groups optionally have a substituent.

[Chemical Formula 68]

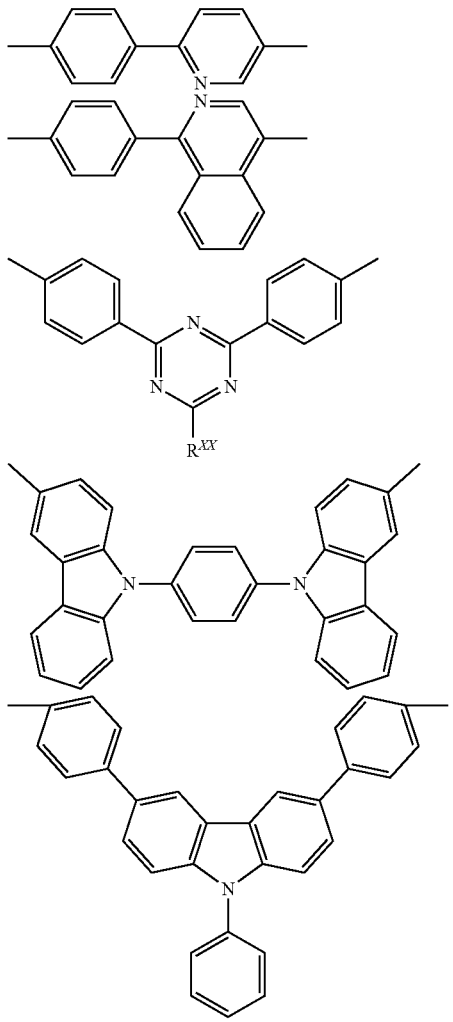

[wherein, $R^{XX}$ is a hydrogen atom, an alkyl group, a cycloalkyl group, an aryl group or a monovalent heterocyclic group, and these groups optionally have a substituent.]

$R^{XX}$ is preferably an alkyl group, a cycloalkyl group or an aryl group, and these groups optionally have a substituent.

$Ar^{X2}$ and $Ar^{X4}$ are each preferably an arylene group optionally having a substituent.

The substituent which the group represented by $Ar^{X1}$ to $Ar^{X4}$ and $R^{X1}$ to $R^{X3}$ optionally has is preferably an alkyl group, a cycloalkyl group or an aryl group, and these groups optionally further have a substituent.

The constitutional unit represented by the formula (X) is preferably a constitutional unit represented by the formula (X-1) to the formula (X-7), more preferably a constitutional unit represented by the formula (X-3) to the formula (X-7), further preferably a constitutional unit represented by the formula (X-3) to the formula (X-6).

[Chemical Formula 69]

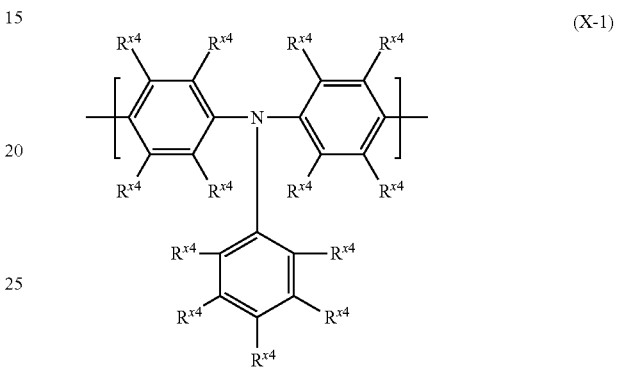

(X-1)

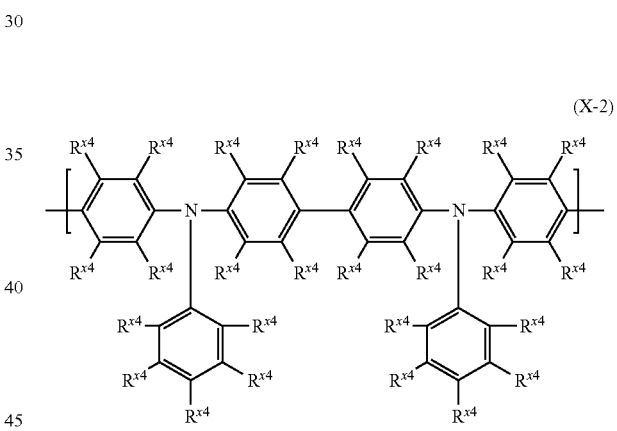

(X-2)

[Chemical Formula 70]

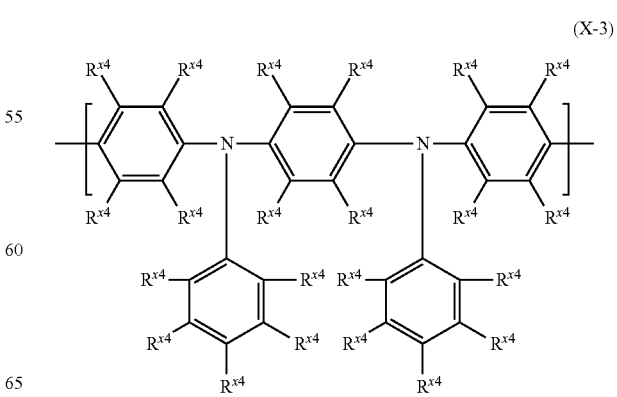

(X-3)

-continued

[Chemical Formula 71]

(X-4)
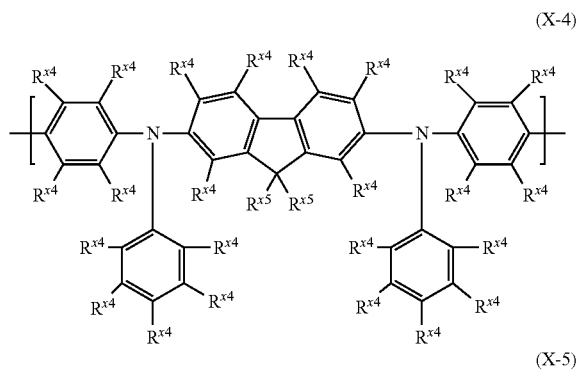

(X-5)
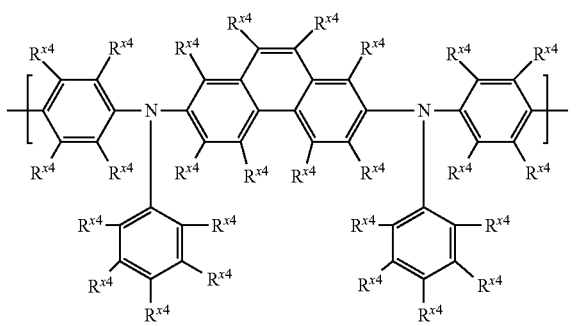

[Chemical Formula 72]

(X-6)
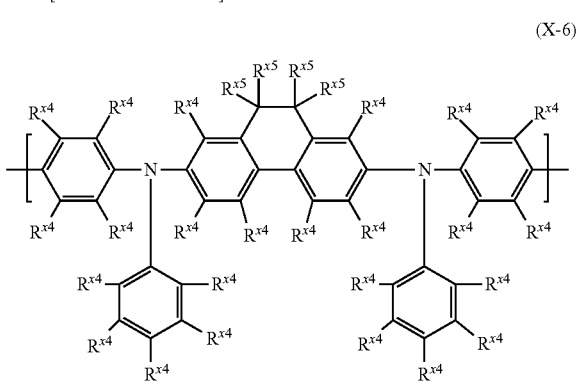

(X-7)
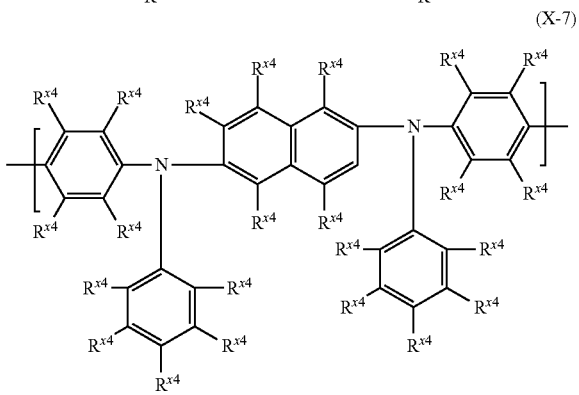

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group or a cyano group, and these groups optionally have a substituent. A plurality of $R^{x4}$ may be the same or different. A plurality of $R^{x5}$ may be the same or different, and the adjacent $R^{x5}$ may be combined together to form a ring together with carbon atoms to which they are attached.]

The amount of the constitutional unit represented by the formula (X) is preferably 0.1 to 50 mol %, more preferably 1 to 40 mol %, further preferably 5 to 30 mol %, with respect to the total amount of constitutional units contained in the polymer host, since hole transportability is excellent.

The constitutional unit represented by the formula (X) includes, for example, constitutional units represented by the formula (X1-1) to the formula (X1-19), and is preferably a constitutional unit represented by the formula (X1-6) to the formula (X1-14).

[Chemical Formula 73]

(X1-1)
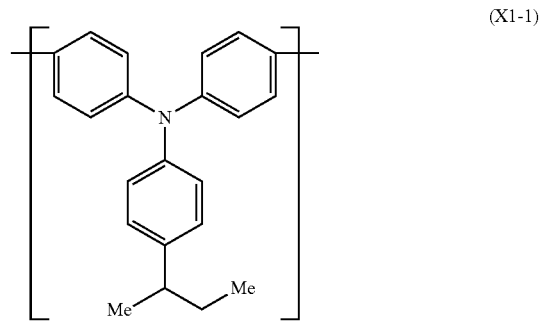

(X1-2)
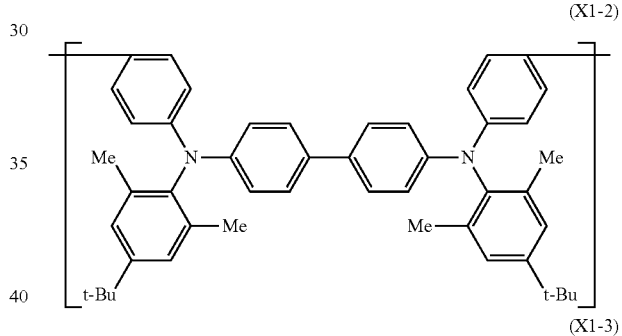

(X1-3)
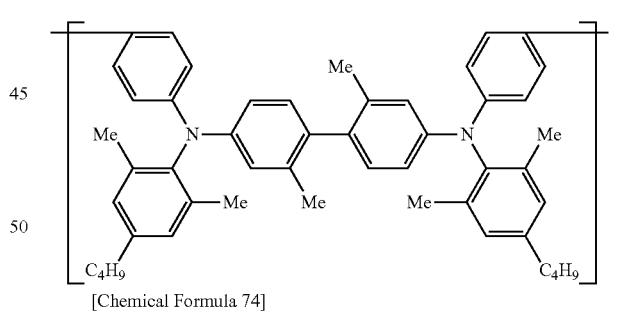

[Chemical Formula 74]

(X1-4)
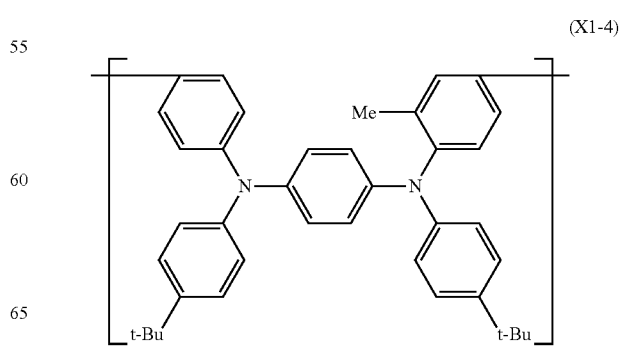

(X1-5)
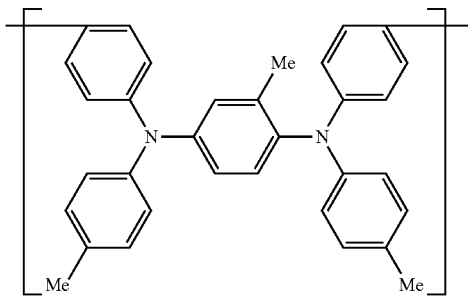
[Chemical Formula 76]
(X1-9)
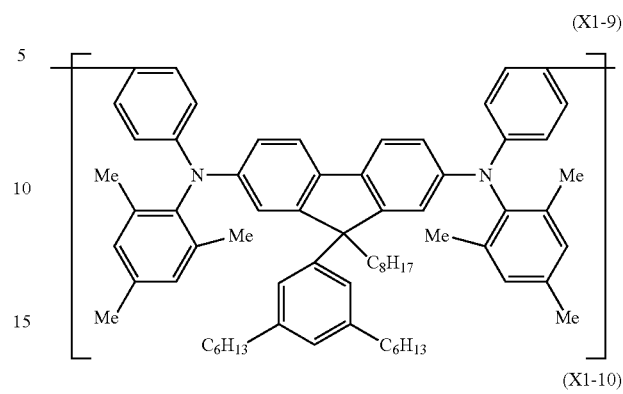
(X1-10)
(X1-6)
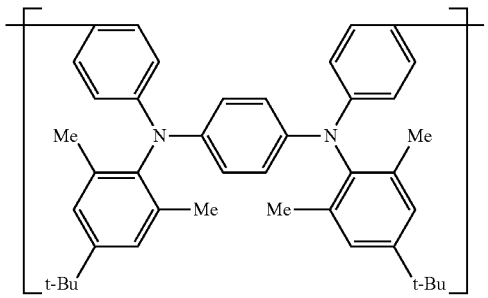
[Chemical Formula 77]
(X1-11)
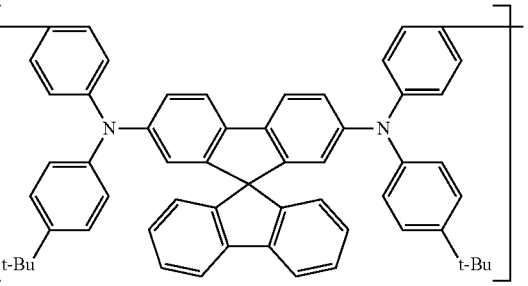
(X1-12)
[Chemical Formula 75]
(X1-7)
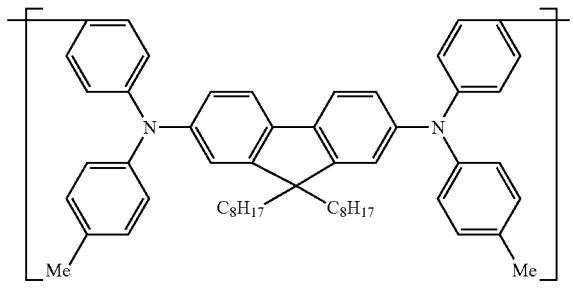
[Chemical Formula 78]
(X1-13)
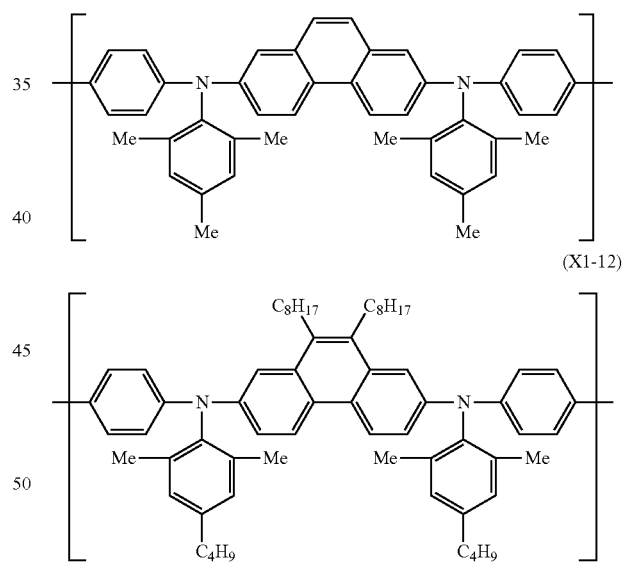
(X1-8)
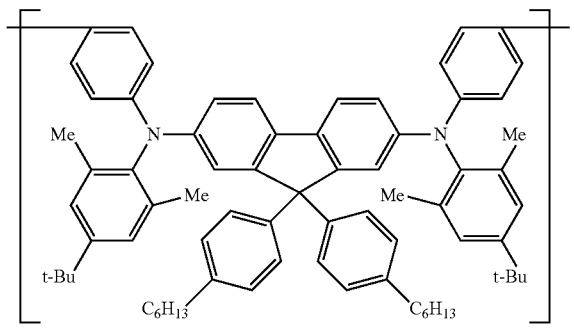
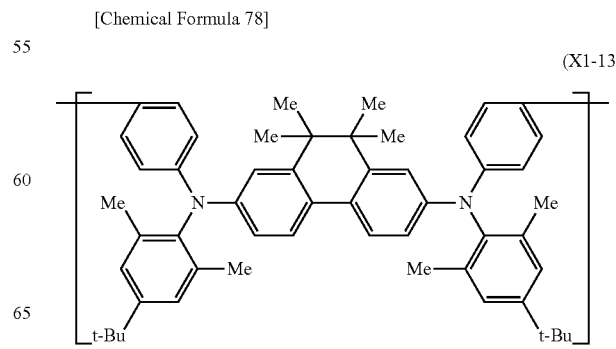

-continued (X1-14)
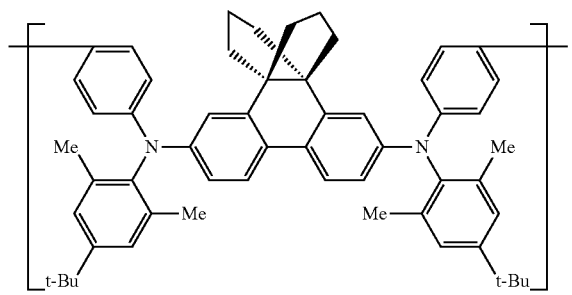

[Chemical Formula 79]

(X1-15)
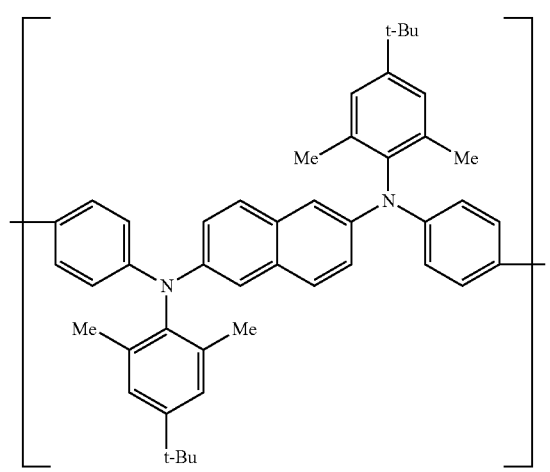

(X1-16)
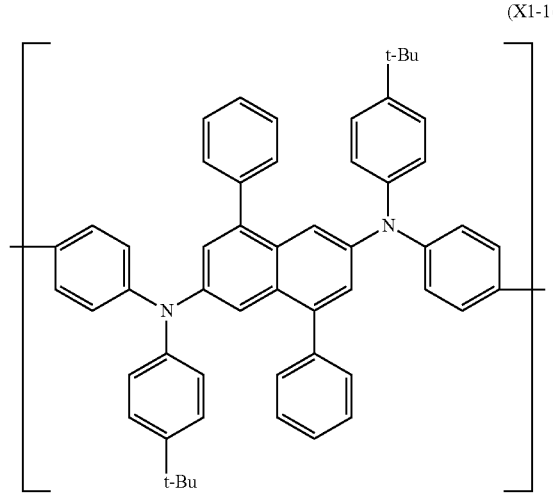

-continued

[Chemical Formula 80]

(X1-17)
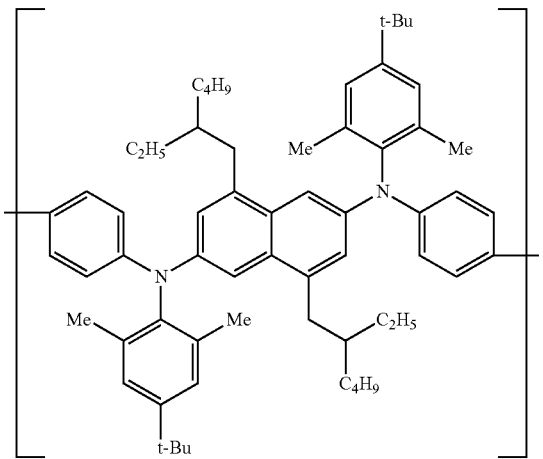

(X1-18)
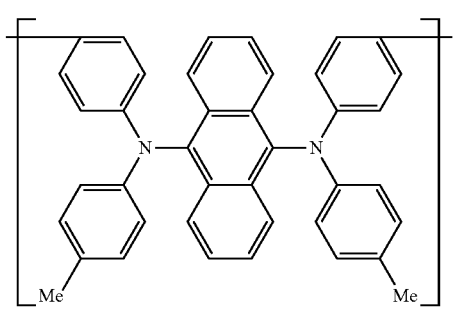

(X1-19)
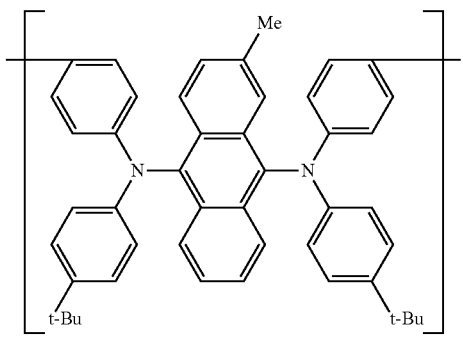

In the polymer host, the constitutional unit represented by the formula (X) may be contained singly or in combination of two or more kinds thereof.

The polymer host includes, for example, polymer compounds P-1 to P-6 shown in Table 1. In the table, the "other" constitutional unit denotes a constitutional unit other than the constitutional unit represented by the formula (Y) and the constitutional unit represented by the formula (X).

TABLE 1

| | constitutional unit and mole fraction thereof | | | | |
|---|---|---|---|---|---|
| | formula (Y) | | | formula (X) | |
| polymer compound | (Y-1)-(Y-2) p | (Y-3)-(Y-4) q | (Y-5)-(Y-7) r | (X-1)-(X-7) s | other t |
| P-1 | 0.1-99.9 | 0.1-99.9 | 0 | 0 | 0-30 |
| P-2 | 0.1-99.9 | 0 | 0.1-99.9 | 0 | 0-30 |
| P-3 | 0.1-99.8 | 0.1-99.8 | 0 | 0.1-99.8 | 0-30 |
| P-4 | 0.1-99.8 | 0.1-99.8 | 0.1-99.8 | 0 | 0-30 |
| P-5 | 0.1-99.8 | 0 | 0.1-99.8 | 0.1-99.8 | 0-30 |
| P-6 | 0.1-99.7 | 0.1-99.7 | 0.1-99.7 | 0.1-99.7 | 0-30 |

[in the table, p, q, r, s and t represent the mole fraction of each constitutional unit, $p+q+r+s+t=100$ and $100 \geq p+q+r+s \geq 70$.]

The polymer host may be any of a block copolymer, a random copolymer, an alternative copolymer or a graft copolymer, and may also be a copolymer in another form, and copolymers obtained by copolymerizing several kinds of raw material monomers are preferable.

The polystyrene-equivalent number-average molecular weight of the polymer host is preferably $5 \times 10^3$ to $1 \times 10^6$, more preferably $1 \times 10^4$ to $5 \times 10^5$, more preferably $1.5 \times 10^4$ to $2 \times 10^5$.

[Production Method of Polymer Host]

The polymer host can be produced by public-known polymerization methods described in Chem. Rev., vol. 109, pp. 897-1091 (2009) and the like, and exemplified are methods of polymerizing by a coupling reaction using a transition metal catalyst such as Suzuki reaction, Yamamoto reaction, Buchwald reaction, Stille reaction, Negishi reaction, Kumada reaction and the like.

In the above-described polymerization method, the method of charging monomers include a method in which the entire monomers are charged all at once into the reaction system, a method in which a part of the monomer is charged and allowed to react, then, the remaining monomers are charged all at once, continuously or in a divided manner, a method in which monomers are charged continuously or in a divided manner, and the like.

The transition metal catalyst includes, palladium catalysts, nickel catalysts and the like.

The post treatment of the polymerization reaction is performed by known methods, for example, a method of removing water soluble impurities by separation, a method in which the reaction liquid after the polymerization reaction is added into a lower alcohol such as methanol and the like, and the deposited precipitate is filtrated, then, dried, and the like, each singly or in combination thereof. When the purity of the polymer host is low, the polymer host can be purified by a usual method such as, for example, crystallization, re-precipitation, continuous extraction with a Soxhlet extractor, column chromatography and the like.

[First Composition]

The first organic layer may be a layer containing a composition containing a fluorescent low-molecular weight compound and at least one material selected from the group consisting of a host material, a hole transporting material, a hole injection material, an electron transporting material, an electron injection material, a light emitting material (different from the fluorescent low-molecular weight compound) and an antioxidant described above (hereinafter, referred to as "first composition" in some cases).

[Hole Transporting Material]

The hole transporting material is classified into low-molecular weight compounds and polymer compounds, and polymer compounds are preferable. The hole transporting material may have a cross-linkable group.

The polymer compound includes, for example, a polyvinylcarbazole and derivatives thereof; a polyarylene having an aromatic amine structure in the side chain or main chain and derivatives thereof. The polymer compound may also be a compound in which an electron-accepting portion is bonded. The electron-accepting portion includes, for example, fullerene, tetrafluorotetracyanoquinodimethane, tetracyanoethylene and trinitrofluorenone, and fullerene is preferable.

In the first composition, the content of the hole transporting material is usually 1 to 1000 parts by mass, preferably 5 to 500 parts by mass, when the amount of the fluorescent low-molecular weight compound is taken as 100 parts by mass.

The hole transporting material may be used singly or in combination of two or more kinds thereof.

[Electron Transporting Material]

The electron transporting material is classified into low-molecular weight compounds and polymer compounds. The electron transporting material may have a cross-linkable group.

The low-molecular weight compound includes, for example, metal complexes having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene and diphenoquinone, and, derivatives thereof.

The polymer compound includes, for example, polyphenylene, polyfluorene and derivatives thereof. The polymer compound may be doped with a metal.

In the first composition, the content of the electron transporting material is usually 1 to 1000 parts by mass, preferably 5 to 500 parts by mass, when the amount of the fluorescent low-molecular weight compound is taken as 100 parts by mass.

The electron transporting material may be used singly or in combination of two or more kinds thereof.

[Hole Injection Material and Electron Injection Material]

The hole injection material and the electron injection material are each classified into low-molecular weight compounds and polymer compounds. The hole injection material and the electron injection material may have a cross-linkable group.

The low-molecular weight compound includes, for example, metallophthalocyanines such as copper phthalocyanine and the like; carbon; oxides of metals such as molybdenum, tungsten and the like; metal fluorides such as lithium fluoride, sodium fluoride, cesium fluoride, potassium fluoride and the like.

The polymer compound includes electrically conductive polymers such as, for example, polyaniline, polythiophene, polypyrrole, polyphenylenevinylene, polythienylenevinylene, polyquinoline and polyquinoxaline, and derivatives thereof; a polymer having an aromatic amine structure in the main chain or side chain, and the like.

In the first composition, the contents of the hole injection material and the electron injection material are each usually 1 to 1000 parts by mass, preferably 5 to 500 parts by mass, when the amount of the fluorescent low-molecular weight compound is taken as 100 parts by mass.

The electron injection material and the hole injection material may each be used singly or in combination of two or more kinds thereof.

[Ion Doping]

When the hole injection material or the electron injection material contains a conductive polymer, the electric conductivity of the conductive polymer is preferably $1\times10^{-5}$ S/cm to $1\times10^{3}$ S/cm. In order to make the electric conductivity of the conductive polymer within such a range, the conductive polymer can be doped with an appropriate amount of ions.

The ion to be doped is an anion for the hole injection material or a cation for the electron injection material. The anion includes, for example, a polystyrenesulfonic ion, an alkylbenzenesulfonic ion and a camphorsulfonic ion. The cation includes, for example, a lithium ion, a sodium ion, a potassium ion and a tetrabutylammonium ion.

The ion to be doped may be used singly or in combination of two or more kinds thereof.

[Light Emitting Material]

The light emitting material (different from the fluorescent low-molecular weight compound) is classified into low-molecular weight compounds and polymer compounds. The light emitting material may have a cross-linkable group.

The low-molecular weight compound includes, for example, metal complexes containing iridium, platinum or europium as the central metal.

The polymer compound includes polymer compounds containing, for example, a phenylene group, a naphthalenediyl group, a fluorenediyl group, a phenanthrenediyl group, a dihydrophenanthrenediyl group, a group represented by the formula (X), a carbazolediyl group, a phenoxazinediyl group, a phenothiazinediyl group, an anthracenediyl group, a pyrenediyl group or a constitutional unit Z described later.

The light emitting material is preferably a metal complex shown below, a metal complex represented by the formula (1) described later, the polymer compound X described later or a cross-linked body of the cross-linkable polymer compound Y described later, more preferably a metal complex represented by the formula (1) described later, the polymer compound X described later or a cross-linked body of the cross-linkable polymer compound Y described later, further preferably a metal complex represented by the formula (1) described later.

[Chemical Formula 81]

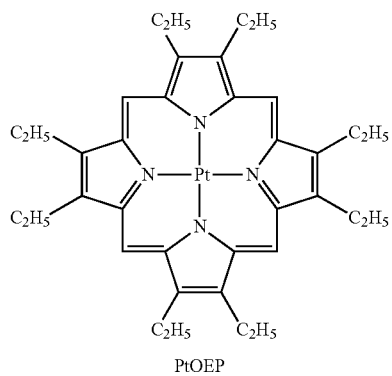

PtOEP

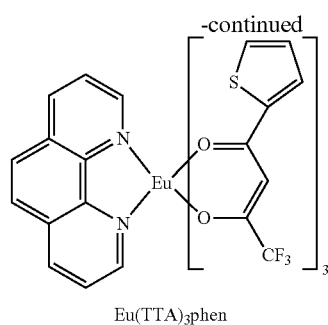

Eu(TTA)₃phen

In the first composition, the content of the light emitting material is usually 1 to 1000 parts by mass, preferably 5 to 500 parts by mass, when the amount of fluorescent low-molecular weight compound is taken as 100 parts by mass.

The light emitting material may be used singly or in combination of two or more kinds thereof.

[Antioxidant]

The antioxidant may advantageously be a compound which is soluble in the same solvent as that for the fluorescent low-molecular weight compound and does not disturb light emission and charge transportation, and includes, for example, phenol type antioxidants and phosphorus-based antioxidants.

In the first composition, the content of the antioxidant is usually 0.001 to 10 parts by mass, when the amount of the fluorescent low-molecular weight compound is taken as 100 parts by mass.

The antioxidant may be used singly or in combination of two or more kinds thereof.

[First Ink]

The first organic layer can be formed, for example, using a composition containing a fluorescent low-molecular weight compound and a solvent (hereinafter, referred to as "first ink" in some cases). The first ink can be suitably used in wet methods such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method, a nozzle coat method and the like.

The viscosity of the first ink may be adjusted depending on the type of the wet method, and when applied to a printing method in which a solution passes through a discharge device such as an inkjet printing method or the like, the viscosity is preferably 1 to 25 mPa·s at 25° C. since clogging and flight deflection at the time of discharge are less likely to occur.

The solvent contained in the first ink is preferably a solvent capable of dissolving or uniformly dispersing the solid component in the ink. The solvent includes, for example, chlorine-based solvents such as 1,2-dichloroethane, 1,1,2-trichloroethane, chlorobenzene, o-dichlorobenzene and the like; ether solvents such as THF, dioxane, anisole, 4-methylanisole and the like; aromatic hydrocarbon solvents such as toluene, xylene, mesitylene, ethylbenzene, n-hexylbenzene, cyclohexylbenzene and the like; aliphatic hydrocarbon solvents such as cyclohexane, methylcyclohexane, n-heptane, n-hexane, n-heptane, n-octane, n-nonane, n-decane, n-dodecane, bicyclohexyl and the like; ketone solvents such as acetone, methyl ethyl ketone, cyclohexanone, acetophenone and the like; ester solvents such as ethyl acetate, butyl acetate, ethyl cellosolve acetate, methyl benzoate, phenyl acetate and the like; polyhydric alcohol solvents such as ethylene glycol, glycerin, 1,2-hexanediol and the like; alcohol solvents such as isopropyl alcohol, cyclohexanol and the like; sulfoxide solvents such as dimethyl sulfoxide and the like; and amide solvents such as N-methyl-2-pyrrolidone, N,N-dimethylformamide and the like. The solvent may be used singly or in combination of two or more kinds thereof.

In the first ink, the content of the solvent is usually 1000 to 100000 parts by mass, preferably 2000 to 20000 parts by mass, when the amount of the fluorescent low-molecular weight compound is taken as 100 parts by mass.

[Second Organic Layer]

The second organic layer is

Layer A containing a composition containing a cross-linked body of a cross-linkable material and a metal complex represented by the formula (1) (hereinafter, referred to as "second composition" in some cases), Layer B containing a polymer compound (polymer compound X) containing a constitutional unit having a group obtained by removing from a metal complex represented by the formula (1) a part or all of hydrogen atoms bonding directly to carbon atoms or hetero atoms constituting the metal complex, and a constitutional unit represented by the formula (X), or Layer C containing a cross-linked body of a cross-linkable polymer compound (cross-linkable polymer compound Y) containing a constitutional unit having a group obtained by removing from a metal complex represented by the formula (1) a part or all of hydrogen atoms bonding directly to carbon atoms or hetero atoms constituting the metal complex, a constitutional unit represented by the formula (X) and a cross-linkable constitutional unit having a cross-linkable group.

It is preferable that the cross-linkable material, the polymer compound X and the cross-linkable polymer compound Y are different from each other.

The second organic layer is preferably Layer A or Layer C, more preferably Layer C, since the light emitting device of the present invention is more excellent in the external quantum efficiency.

The second organic layer is preferably Layer A or Layer C, more preferably Layer C, since production of the light emitting device of the present invention becomes easy.

[Second composition]
[Cross-Linkable Material]

In the second composition, the cross-linked body of the cross-linkable material may be contained singly or in combination of two or more kinds thereof.

The cross-linked body of the cross-linkable material is obtained by bringing the cross-linkable material into a crosslinked state by methods, conditions and the like described later.

The cross-linkable material may be a low-molecular weight compound or a polymer compound, and is preferably a low-molecular weight compound having at least one cross-linkable group selected from Group A of cross-linkable group (hereinafter, referred to as "the low-molecular weight compound of the second organic layer" in some cases) or a polymer compound containing a cross-linkable constitutional unit having at least one cross-linkable group selected from Group A of cross-linkable group (hereinafter, referred to as "the polymer compound of the second organic layer" in some cases), more preferably a polymer compound containing a cross-linkable constitutional unit having at least one cross-linkable group selected from Group A of cross-linkable group, since the light emitting device of the present invention is more excellent in the external quantum efficiency.

The cross-linkable group selected from Group A of cross-linkable group is preferably a cross-linkable group represented by the formula (XL-1) to the formula (XL-4), the formula (XL-7) to the formula (XL-10) or the formula (XL-14) to the formula (XL-17), more preferably a cross-linkable group represented by the formula (XL-1), the formula (XL-3), the formula (XL-9), the formula (XL-10), the formula (XL-16) or the formula (XL-17), further preferably a cross-linkable group represented by the formula (XL-1), the formula (XL-16) or the formula (XL-17), particularly preferably a cross-linkable group represented by the formula (XL-1) or the formula (XL-17), especially preferably a cross-linkable group represented by the formula (XL-17), since the light emitting device of the present invention is more excellent in the external quantum efficiency.

[Polymer Compound of Second Organic Layer]

The constitutional unit having at least one cross-linkable group selected from Group A of cross-linkable group contained in the polymer compound of the second organic layer is preferably a constitutional unit represented by the formula (2) or a constitutional unit represented by the formula (2'), and may also be a constitutional unit represented by the following formula.

[Chemical Formula 82]

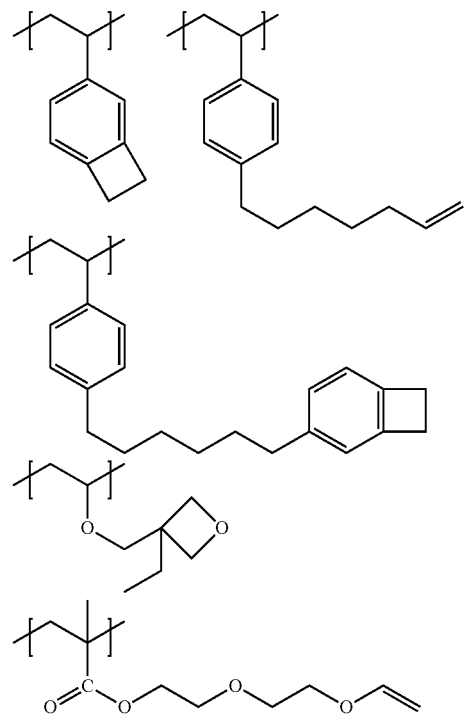

When the polymer compound of the second organic layer contains two or more constitutional units having at least one cross-likable group selected from Group A of cross-linkable group, it is preferable that at least two of the constitutional units having at least one cross-linkable group selected from Group A of cross-linkable group are different from each other in its cross-linkable group. As the combination of mutually different cross-linkable groups, a combination of a cross-linkable group represented by the formula (XL-1), the formula (XL-2), the formula (XL-5) to the formula (XL-8) or the formula (XL-14) to the formula (XL-16) with a cross-linkable group represented by the formula (XL-3), the formula (XL-4), the formula (XL-13) or the formula (XL-17) is preferable, a combination of a cross-linkable group represented by the formula (XL-1) or the formula (XL-16) with a cross-linkable group represented by the formula (XL-17) is more preferable, a combination of a cross-linkable group represented by the formula (XL-1) with a cross-linkable group represented by the formula (XL-17) is further preferable.

[Constitutional Unit Represented by the Formula (2)]

nA is preferably an integer of 0 to 3, more preferably an integer of 0 to 2, further preferably 1 or 2, since the light emitting device of the present invention is more excellent in the external quantum efficiency.

n is preferably 2, since the light emitting device of the present invention is more excellent in the external quantum efficiency.

$Ar^3$ is preferably an aromatic hydrocarbon group optionally having a substituent, since the light emitting device of the present invention is more excellent in the external quantum efficiency.

The number of carbon atoms of the aromatic hydrocarbon group represented by $Ar^3$, not including the number of carbon atoms of the substituent, is usually 6 to 60, preferably 6 to 30, more preferably 6 to 18.

The arylene group portion obtained by removing n substituents from the aromatic hydrocarbon group represented by $Ar^3$ is preferably a group represented by the formula (A-1) to the formula (A-20), more preferably a group represented by the formula (A-1), the formula (A-2), the formula (A-6) to the formula (A-10), the formula (A-19) or the formula (A-20), further preferably a group represented by the formula (A-1), the formula (A-2), the formula (A-7), the formula (A-9) or the formula (A-19), and these groups optionally have a substituent.

The number of carbon atoms of the heterocyclic group represented by $Ar^3$, not including the number of carbon atoms of the substituent, is usually 2 to 60, preferably 3 to 30, more preferably 4 to 18.

The divalent heterocyclic group portion obtained by removing n substituents from the heterocyclic group represented by $Ar^3$ is preferably a group represented by the formula (AA-1) to the formula (AA-34).

The aromatic hydrocarbon group and the heterocyclic group represented by $Ar^3$ optionally have a substituent, and as the substituent, an alkyl group, a cycloalkyl group, an alkoxy group, a cycloalkoxy group, an aryl group, an aryloxy group, a halogen atom, a monovalent heterocyclic group and a cyano group are preferable.

The number of carbon atoms of the alkylene group represented by $L^A$, not including the number of carbon atoms of the substituent, is usually 1 to 20, preferably 1 to 15, more preferably 1 to 10. The number of carbon atoms of the cycloalkylene group represented by $L^A$, not including the number of carbon atoms of the substituent, is usually 3 to 20.

The alkylene group and the cycloalkylene group optionally have a substituent, and examples thereof include a methylene group, an ethylene group, a propylene group, a butylene group, a hexylene group, a cyclohexylene group and an octylene group.

The alkylene group and the the cycloalkylene group represented by $L^A$ optionally have a substituent. The substituent which the alkylene group and the cycloalkylene group optionally have is preferably an alkyl group, a cycloalkyl group, an alkoxy group, a cycloalkoxy group, a halogen atom or a cyano group, and these groups optionally further have a substituent.

The arylene group represented by $L^A$ optionally has a substituent. The arylene group is preferably a phenylene group or a fluorenediyl group, more preferably a m-phenylene group, a p-phenylene group, a fluorene-2,7-diyl group or a fluorene-9,9-diyl group. The substituent which the arylene group optionally has is preferably an alkyl group, a cycloalkyl group, an alkoxy group, a cycloalkoxy group, an aryl group, an aryloxy group, a monovalent heterocyclic group, a halogen atom, a cyano group or a cross-linkable group selected from Group A of cross-linkable group, and these groups optionally further have a substituent.

The divalent heterocyclic group represented by $L^A$ is preferably a group represented by the formula (AA-1) to the formula (AA-34).

$L^A$ is preferably an arylene group or an alkylene group, more preferably a phenylene group, a fluorenediyl group or an alkylene group, and these groups optionally have a substituent, since production of the polymer compound of the second organic layer becomes easy.

The cross-linkable group represented by X is preferably a cross-linkable group represented by the formula (XL-1) to the formula (XL-4), the formula (XL-7) to the formula (XL-10) or the formula (XL-14) to the formula (XL-17), more preferably a cross-linkable group represented by the formula (XL-1), the formula (XL-3), the formula (XL-9), the formula (XL-10), the formula (XL-16) or the formula (XL-17), further preferably a cross-linkable group represented by the formula (XL-1), the formula (XL-16) or the formula (XL-17), particularly preferably a cross-linkable group represented by the formula (XL-1) or the formula (XL-17), especially preferably a cross-linkable group represented by the formula (XL-17), since the light emitting device of the present invention is more excellent in the external quantum efficiency.

The amount of the constitutional unit represented by the formula (2) is preferably 0.5 to 90 mol %, more preferably 3 to 75 mol %, further preferably 5 to 60 mol %, with respect to the total amount of constitutional units contained in the polymer compound of the second organic layer, since the polymer compound of the second organic layer is excellent in stability and crosslinkability.

The constitutional unit represented by the formula (2) may be contained singly or in combination of two or more kinds thereof, in the polymer compound of the second organic layer.

When the polymer compound of the second organic layer contains two or more constitutional units represented by the formula (2), it is preferable that at least two of the constitutional units represented by the formula (2) are different from each other in its cross-linkable group represented by X. The preferable range of the combination of mutually different cross-linkable groups represented by X is the same as the preferable range of the combination of mutually different cross-linkable groups described above.

[Constitutional Unit Represented by the Formula (2')]

mA is preferably an integer of 0 to 3, more preferably an integer of 0 to 2, further preferably 0 or 1, particularly preferably 0, since the light emitting device of the present invention is more excellent in the external quantum efficiency.

m is preferably 1 or 2, more preferably 2, since the light emitting device of the present invention is more excellent in the external quantum efficiency.

c is preferably 0, since production of the polymer compound of the second organic layer becomes easy and the light emitting device of the present invention is more excellent in the external quantum efficiency.

$Ar^5$ is preferably an aromatic hydrocarbon group optionally having a substituent, since the light emitting device of the present invention is more excellent in the external quantum efficiency.

The definition and examples of the arylene group portion obtained by removing m substituents from the aromatic hydrocarbon group represented by $Ar^5$ are the same as the definition and examples of the arylene group represented by $Ar^{X2}$ in the formula (X).

The definition and examples of the divalent heterocyclic group portion obtained by moving m substituents from the heterocyclic group represented by $Ar^5$ are the same as the definition and examples of the divalent heterocyclic group portion represented by $Ar^{X2}$ in the formula (X).

The definition and examples of the divalent group obtained by removing m substituents from the group in which at least one aromatic hydrocarbon ring and at least one hetero ring are bonded directly represented by $Ar^5$ are the same as the definition and examples of the divalent group in which at least one arylene group and at least one divalent heterocyclic group are bonded directly represented by $Ar^{X2}$ in the formula (X).

$Ar^4$ and $Ar^6$ are each preferably an arylene group optionally having a substituent, since the light emitting device of the present invention is more excellent in the external quantum efficiency.

The definition and examples of the arylene group represented by $Ar^4$ and $Ar^6$ are the same as the definition and examples of the arylene group represented by $Ar^{X1}$ and $Ar^{X3}$ in the formula (X).

The definition and examples of the divalent heterocyclic group represented by $Ar^4$ and $Ar^6$ are the same as the definition and examples of the divalent heterocyclic group represented by $Ar^{X2}$ and $Ar^{X3}$ in the formula (X).

The group represented by $Ar^4$, $Ar^5$ and $Ar^6$ optionally has a substituent, and preferable as the substituent are an alkyl group, a cycloalkyl group, an alkoxy group, a cycloalkoxy group, an aryl group, an aryloxy group, a halogen atom, a monovalent heterocyclic group and a cyano group.

The definition and examples of the alkylene group, the cycloalkylene group, the arylene group and the divalent heterocyclic group represented by $K^A$ are the same as the definition and examples of the alkylene group, the cycloalkylene group, the arylene group and the divalent heterocyclic group represented by $L^A$, respectively.

$K^A$ is preferably a phenylene group or a methylene group, since production of the polymer compound of the second organic layer becomes easy.

The definition and examples of the cross-linkable group represented by X' are the same as the definition and examples of the cross-linkable group represented by X described above.

The amount of the constitutional unit represented by the formula (2') is preferably 0.5 to 50 mol %, more preferably 3 to 30 mol %, further preferably 5 to 20 mol %, with respect to the total amount of constitutional units contained in the polymer compound of the second organic layer, since the polymer compound of the second organic layer is excellent in stability and the polymer compound of the second organic layer is excellent in crosslinkability.

The constitutional unit represented by the formula (2') may be contained singly or in combination of two or more kinds thereof, in the polymer compound of the second organic layer.

When the polymer compound of the second organic layer contains two or more constitutional units represented by the formula (2'), it is preferable that at least two of the constitutional units represented by the formula (2') are different from each other in its cross-linkable group represented by X'. The preferable range of the combination of the cross-linkable groups represented by X' different from each other is the same as the preferable range of the combination of the cross-linkable groups different from each other described above.

The constitutional unit represented by the formula (2) includes, for example, constitutional units represented by the formula (2-1) to the formula (2-30). The constitutional unit represented by the formula (2') includes, for example, constitutional units represented by the formula (2'-1) to the formula (2'-9). Of them, preferable are constitutional units represented by the formula (2-1) to the formula (2-30), more preferable are constitutional units represented by the formula (2-1) to the formula (2-15), the formula (2-19), the formula (2-20), the formula (2-23), the formula (2-25) or the formula (2-30), further preferable are constitutional units represented by the formula (2-1) to the formula (2-9), the formula (2-20), the formula (2-22) or the formula (2-30), since the polymer compound of the second organic layer is excellent in crosslinkability.

[Chemical Formula 83]

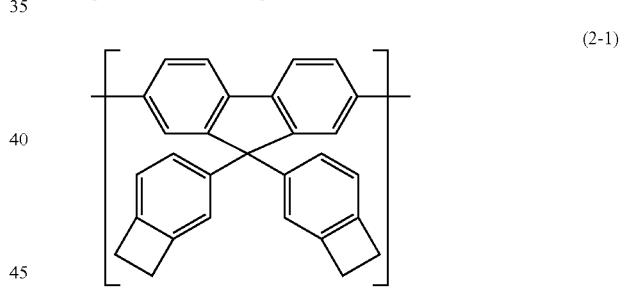

(2-1)

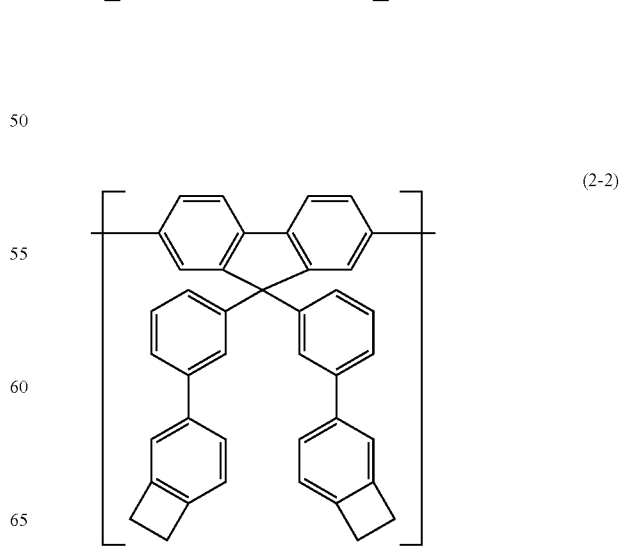

(2-2)

(2-3)
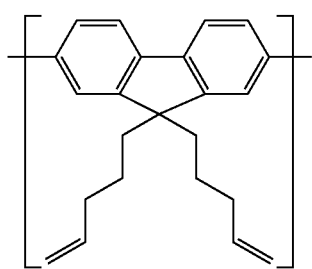
(2-4)
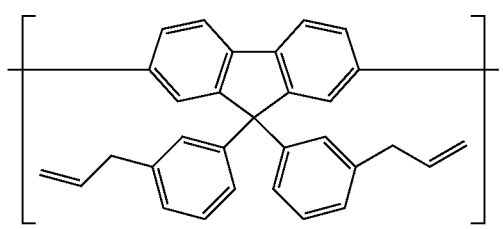
(2-5)
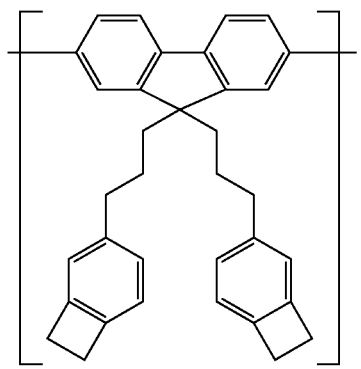
(2-6)
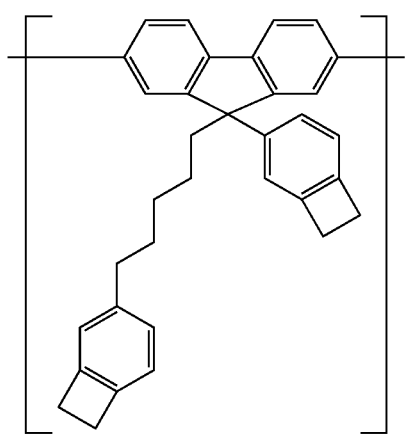
(2-7)
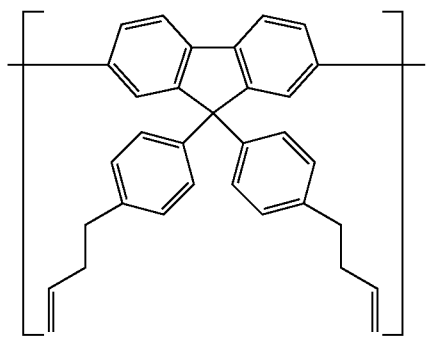
(2-8)
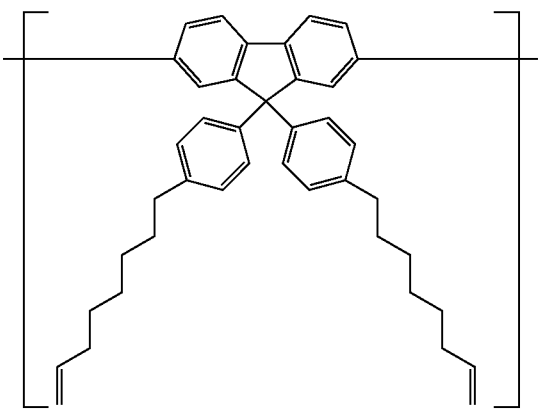
(2-9)
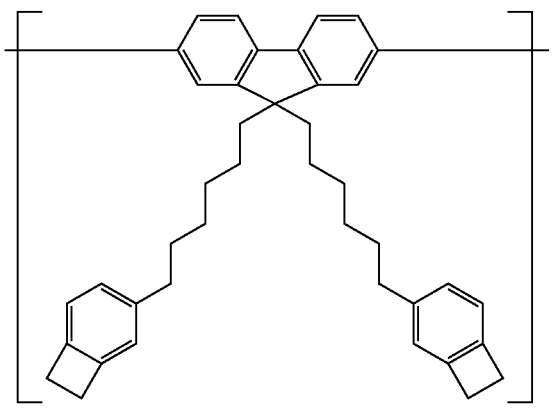
(2-10)
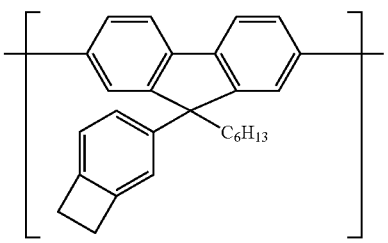
(2-11)
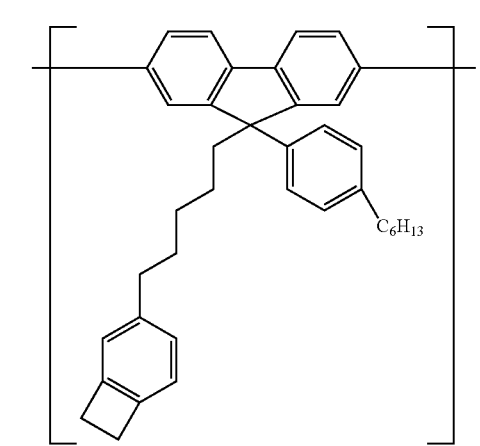

(2-12) 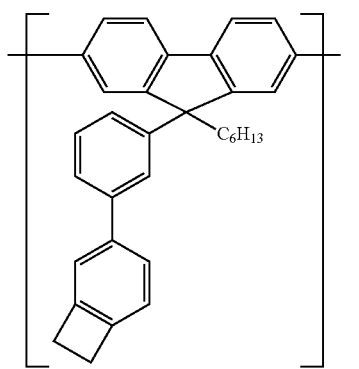
(2-13) 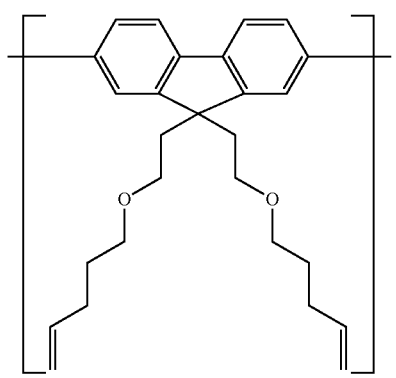
(2-14) 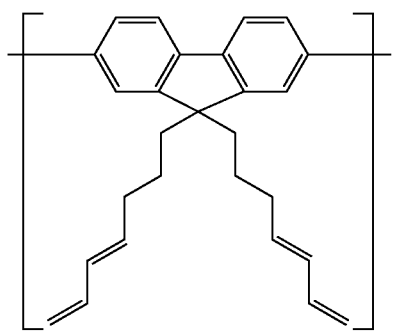
(2-15) 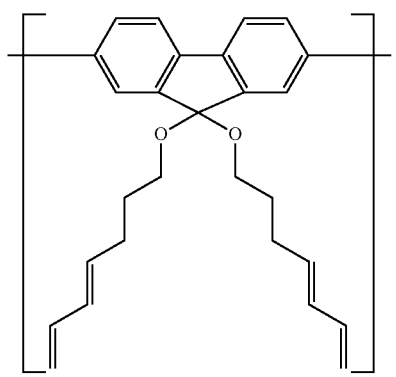
[Chemical Formula 84]
(2-16) 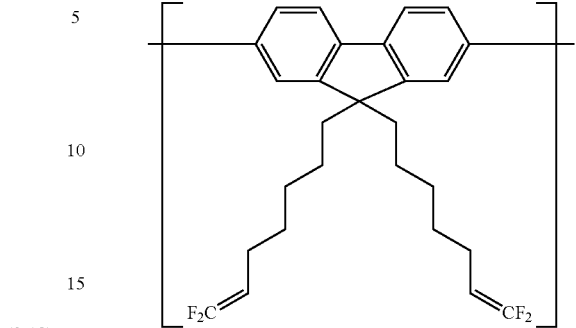
(2-17) 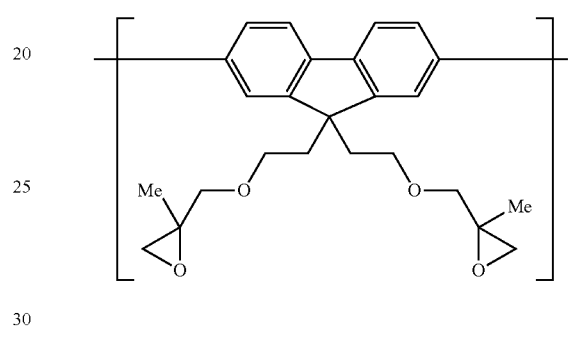
(2-18) 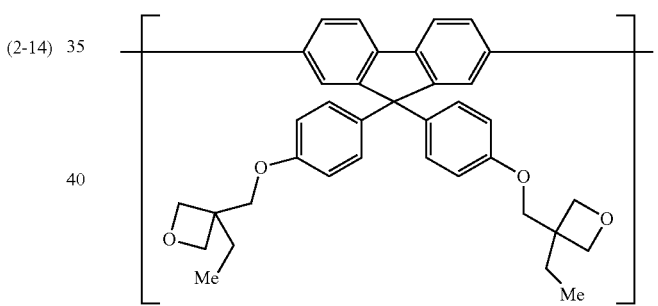
(2-19) 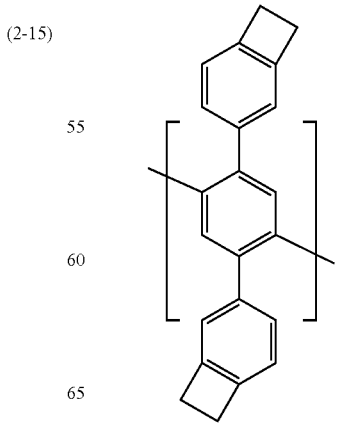

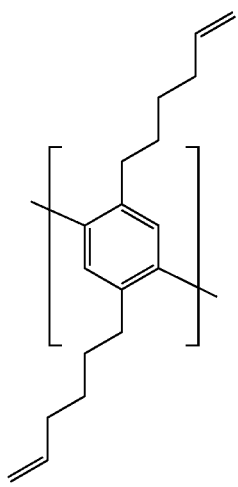 (2-20)
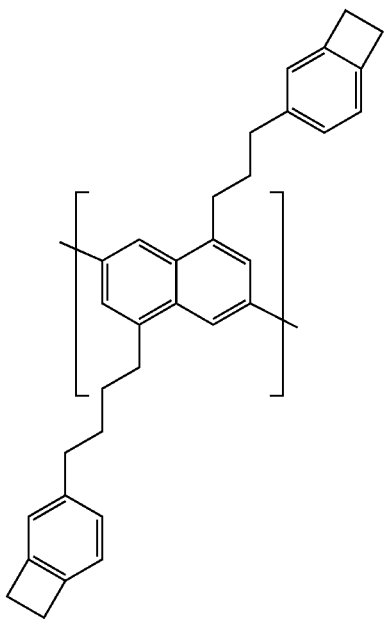 (2-23)
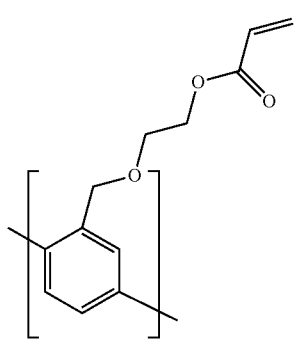 (2-21)
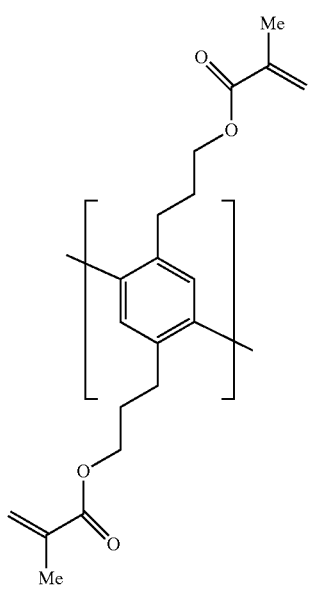 (2-22)
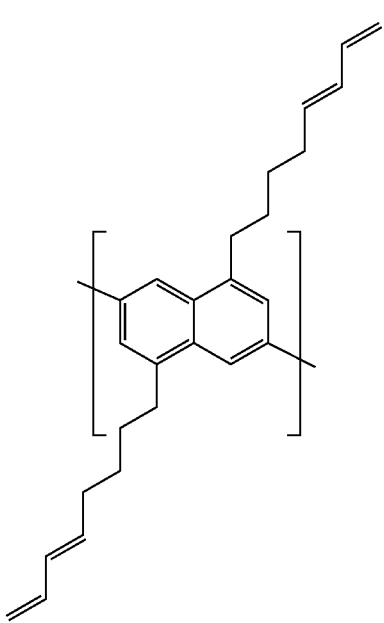 (2-24)

(2-25)
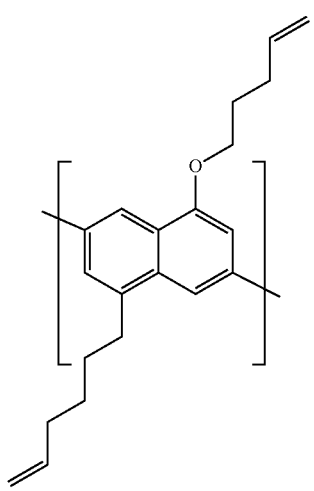
(2-28)
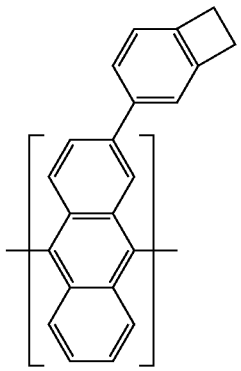
(2-26)
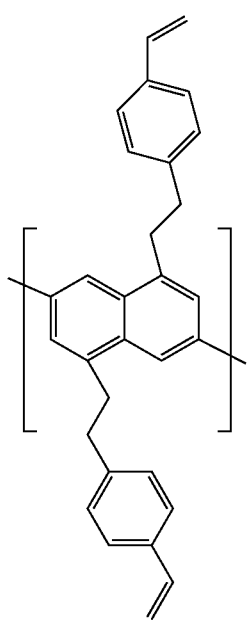
(2-29)
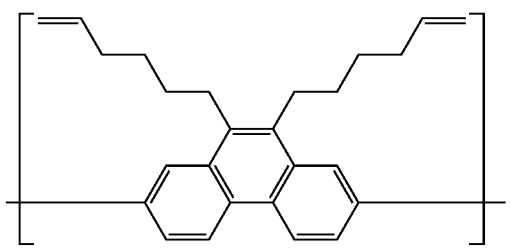
(2-30)
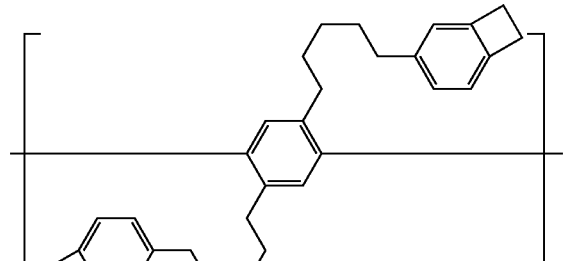
(2-27)
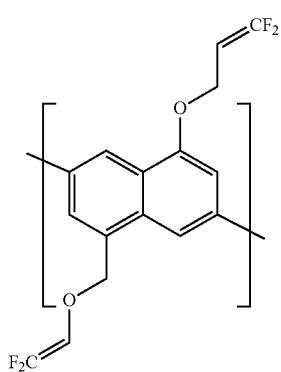
[Chemical Formula 85]
(2'-1)
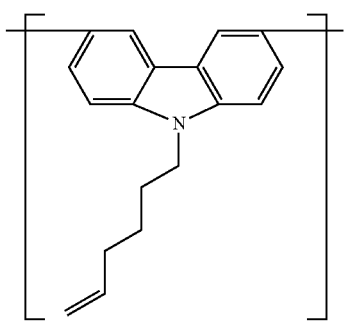

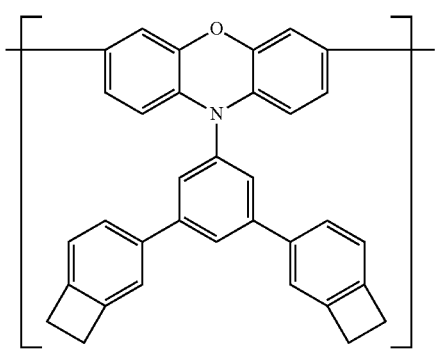
(2'-2)

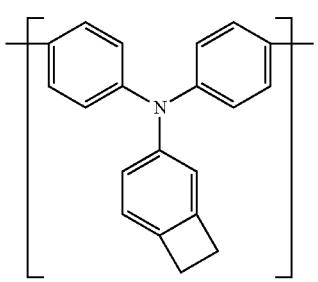
(2'-3)

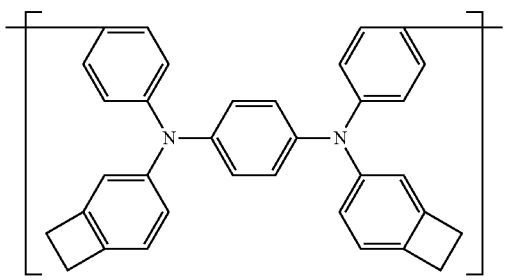
(2'-4)

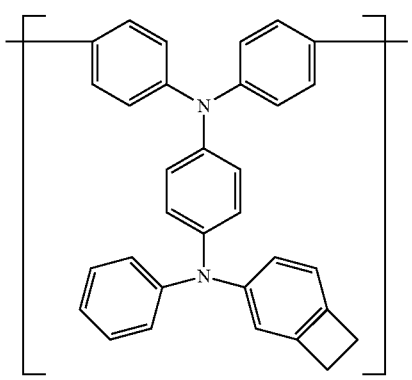
(2'-5)

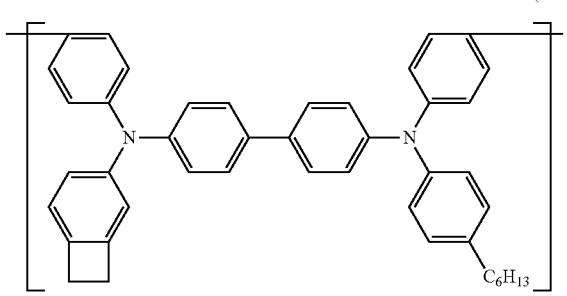
(2'-6)

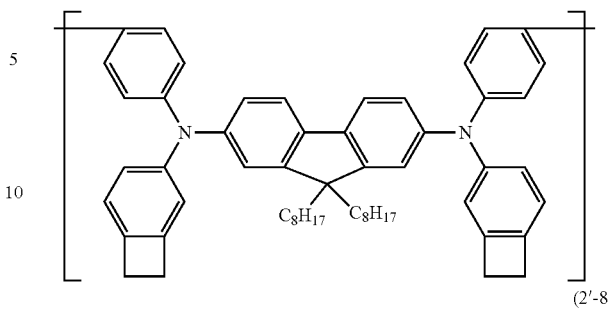
(2'-7)

(2'-8)

(2'-9)

[Other Constitutional Unit]

It is preferable that the polymer compound of the second organic layer further contains a constitutional unit represented by the formula (X), since hole transportability is excellent. Further, it is preferable that the polymer compound of the second organic layer further contains a constitutional unit represented by the formula (Y), since the light emitting device of the present invention is more excellent in the external quantum efficiency.

It is preferable that the polymer compound of the second organic layer further contains a constitutional unit represented by the formula (X) and a constitutional unit represented by the formula (Y), since hole transportability is excellent and the light emitting device of the present invention is more excellent in the external quantum efficiency.

The definition, examples and preferable range of the constitutional unit represented by the formula (X) and the constitutional unit represented by the formula (Y) which the polymer compound of the second organic layer may contain are the same as the definition, examples and preferable range of the above-described constitutional units represented by the formulae (X) and (Y) which the polymer host may contain, respectively.

In the polymer compound of the second organic layer, the constitutional unit represented by the formula (X) and the constitutional unit represented by the formula (Y) may each be contained singly or in combination of two or more kinds thereof.

The amount of the constitutional unit represented by the formula (X) is preferably 0.1 to 90 mol %, more preferably 1 to 70 mol %, further preferably 10 to 50 mol %, with respect to the total amount of constitutional units contained in the polymer compound of the second organic layer, since hole transportability is excellent.

The amount of the constitutional unit represented by the formula (Y) in which $Ar^{Y1}$ is an arylene group is preferably 0.5 to 80 mol %, more preferably 30 to 60 mol %, with respect to the total amount of constitutional units contained in the polymer compound of the second organic layer, since the light emitting device of the present invention is more excellent in the external quantum efficiency.

The amount of the constitutional unit represented by the formula (Y) in which $Ar^{Y1}$ is a divalent heterocyclic group or a divalent group in which at least one arylene group and at least one divalent heterocyclic group are bonded directly is preferably 0.5 to 40 mol %, more preferably 3 to 30 mol %, with respect to the total amount of constitutional units contained in the polymer compound of the second organic layer, since the polymer compound of the second organic layer is excellent in charge transportability.

The polymer compound of the second organic layer includes, for example, polymer compounds P-7 to P-14 shown in Table 2. In the table, the "other" constitutional unit denotes a constitutional unit other than the constitutional units represented by the formula (2), the formula (2'), the formula (X) and the formula (Y).

TABLE 2

| | constitutional unit and mole fraction thereof | | | | |
|---|---|---|---|---|---|
| polymer compound | formula (2) p' | formula (2') q' | formula (X) r' | formula (Y) s' | other t' |
| P-7 | 0.1 to 99.9 | 0.1 to 99.9 | 0 | 0 | 0 to 30 |
| P-8 | 0.1 to 99.9 | 0 | 0.1 to 99.9 | 0 | 0 to 30 |
| P-9 | 0.1 to 99.9 | 0 | 0 | 0.1 to 99.9 | 0 to 30 |
| P-10 | 0 | 0.1 to 99.9 | 0.1 to 99.9 | 0 | 0 to 30 |
| P-11 | 0 | 0.1 to 99.9 | 0 | 0.1 to 99.9 | 0 to 30 |
| P-12 | 0.1 to 99.8 | 0.1 to 99.8 | 0.1 to 99.8 | 0 | 0 to 30 |
| P-13 | 0.1 to 99.8 | 0.1 to 99.8 | 0 | 0.1 to 99.8 | 0 to 30 |
| P-14 | 0.1 to 99.7 | 0.1 to 99.7 | 0.1 to 99.7 | 0.1 to 99.7 | 0 to 30 |

[in the table, p', q', r', s', and t' represent the mole fraction of each constitutional unit. p'+q'+r'+s'+t'=100 and 70≤p'+q'+r'+s'≤100.]

The polymer compound of the second organic layer may be any of a block copolymer, a random copolymer, an alternative copolymer or a graft copolymer, and may also be a copolymer in another form, and is preferably a copolymer obtained by copolymerizing plural types of raw material monomers.

The polystyrene-equivalent number-average molecular weight of the polymer compound of the second organic layer is preferably $5 \times 10^3$ to $1 \times 10^6$, more preferably $1 \times 10^4$ to $5 \times 10^5$, further preferably $1.5 \times 10^4$ to $1 \times 10^5$.

[Production Method of Polymer Compound of Second Organic Layer]

The polymer compound of the second organic layer can be produced by the same method as the production method of the polymer host described above.

[Low-Molecular Weight Compound of Second Organic Layer]

The low-molecular weight compound of the second organic layer is preferably a low-molecular weight compound represented by the formula (3).

[Chemical Formula 86]

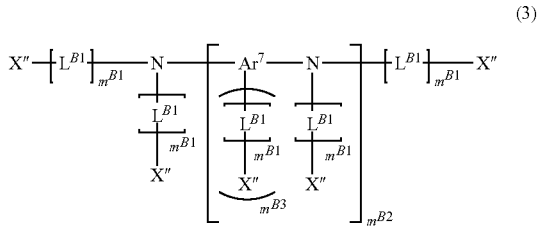

(3)

[wherein, $m^{B1}$, $m^{B2}$ and $m^{B3}$ each independently represent an integer of 0 or more. A plurality of $m^{B1}$ may be the same or different. When a plurality of $m^{B3}$ are present, they may be the same or different.

$Ar^7$ is an aromatic hydrocarbon group, a heterocyclic group or a group in which at least one aromatic hydrocarbon ring and at least one hetero ring are bonded directly, and these groups optionally have a substituent. When a plurality of $Ar^7$ are present, they may be the same or different.

$L^{B1}$ is an alkylene group, a cycloalkylene group, an arylene group, a divalent heterocyclic group, a group represented by —N(R''')—, an oxygen atom or a sulfur atom, and these groups optionally have a substituent. R''' is a hydrogen atom, an alkyl group, a cycloalkyl group, an aryl group or a monovalent heterocyclic group, and these groups optionally have a substituent. When a plurality of $L^{B1}$ are present, they may be the same or different.

X'' is a cross-linkable group, a hydrogen atom, an alkyl group, a cycloalkyl group, an aryl group or a monovalent heterocyclic group, and these groups optionally have a substituent. A plurality of X'' may be the same or different. At least one of a plurality of X'' is a cross-linkable group.]

$m^{B1}$ is usually an integer of 0 to 10, preferably an integer of 0 to 5, more preferably an integer of 0 to 2, further preferably 0 or 1, particularly preferably 0, since synthesis of the cross-linkable material becomes easy.

$m^{B2}$ is usually an integer of 0 to 10, and it is preferably an integer of 0 to 5, more preferably an integer of 0 to 3, further preferably 1 or 2, particularly preferably 1, since synthesis of the cross-linkable material becomes easy and the light emitting device of the present invention is more excellent in the external quantum efficiency.

$m^{B3}$ is usually an integer of 0 to 5, preferably an integer of 0 to 4, more preferably an integer of 0 to 2, further preferably 0, since synthesis of the cross-linkable material becomes easy.

The definition and examples of the arylene group portion obtained by removing $m^{B3}$ substituents from the aromatic hydrocarbon group represented by $Ar^7$ are the same as the definition and examples of the above-described arylene group represented by $Ar^{X2}$ in the formula (X).

The definition and examples of the divalent heterocyclic group portion obtained by removing $m^{B3}$ substituents from the heterocyclic group represented by $Ar^7$ are the same as the definition and examples of the above-described divalent heterocyclic group portion represented by $Ar^{X2}$ in the formula (X).

The definition and examples of the divalent group obtained by removing $m^{B3}$ substituents from the group in which at least one aromatic hydrocarbon ring and at least one hetero ring are bonded directly represented by $Ar^7$ are the same as the definition and examples of the above-described divalent group in which at least one arylene group and at least one divalent heterocyclic group are bonded directly represented by $Ar^{X2}$ in the formula (X).

The definition and examples of the substituent which the group represented by $Ar^7$ optionally has are the same as the definition and examples of the above-described substituent which the group represented by $Ar^{X2}$ optionally has in the formula (X).

$Ar^7$ is preferably an aromatic hydrocarbon group, and this aromatic hydrocarbon group optionally has a substituent, since the light emitting device of the present invention is more excellent in the external quantum efficiency.

The definition and examples of the alkylene group, the cycloalkylene group, the arylene group and the divalent heterocyclic group represented by $L^{B1}$ are the same as the definition and examples of the alkylene group, the cycloalkylene group, the arylene group and the divalent heterocyclic group represented by $L^A$ described above, respectively.

$L^{B1}$ is preferably an alkylene group, an arylene group or an oxygen atom, more preferably an alkylene group or an arylene group, further preferably a phenylene group, a fluorenediyl group or an alkylene group, particularly preferably a phenylene group or an alkylene group, and these groups optionally have a substituent, since synthesis of the cross-linkable material becomes easy.

X" is preferably a cross-linkable group represented by any of the formula (XL-1) to the formula (XL-17), an aryl group or a monovalent heterocyclic group, more preferably a cross-linkable group represented by the formula (XL-1), the formula (XL-3), the formula (XL-7) to the formula (XL-10), the formula (XL-16) or the formula (XL-17), or an aryl group, further preferably a cross-linkable group represented by the formula (XL-1), the formula (XL-16) or the formula (XL-17), a phenyl group, a naphthyl group or a fluorenyl group, particularly preferably a cross-linkable group represented by the formula (XL-16) or the formula (XL-17), a phenyl group or a naphthyl group, especially preferably a cross-linkable group represented by the formula (XL-16) or a naphthyl group, and these groups optionally have a substituent.

The cross-linkable material includes, for example, low-molecular weight compounds represented by the formula (3-1) to the formula (3-16), and is preferably a low-molecular weight compound represented by the formula (3-1) to the formula (3-10), more preferably a low-molecular weight compound represented the formula (3-5) to the formula (3-9).

[Chemical Formula 87]

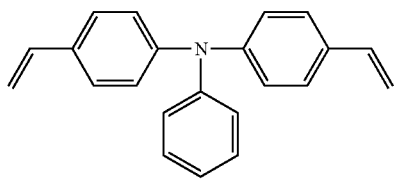

(3-1)

-continued

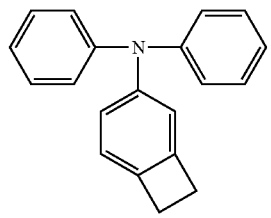

(3-2)

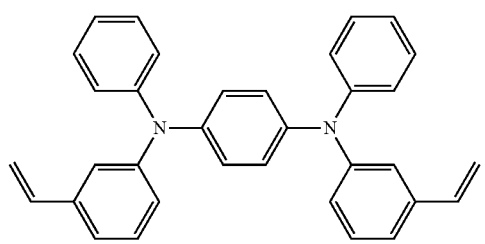

(3-3)

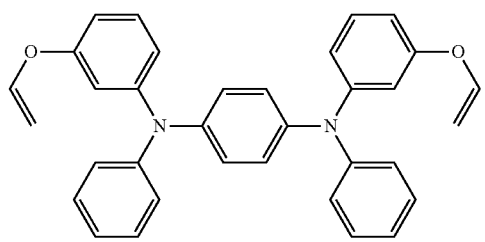

(3-4)

[Chemical Formula 88]

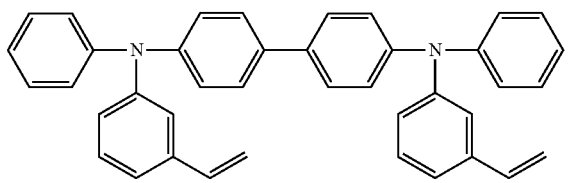

(3-5)

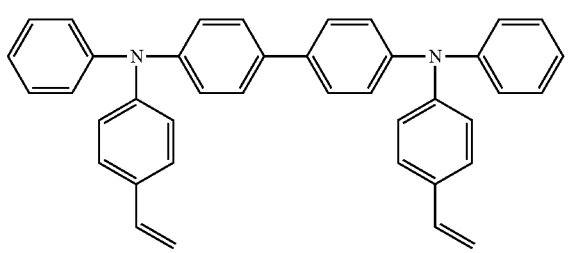

(3-6)

(3-7)

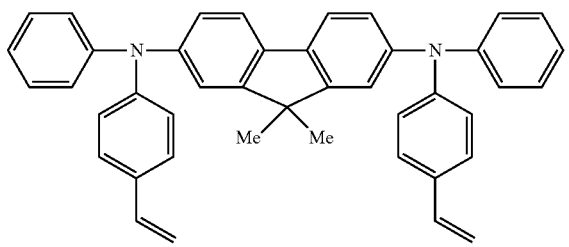

[Chemical Formula 89]
(3-8)
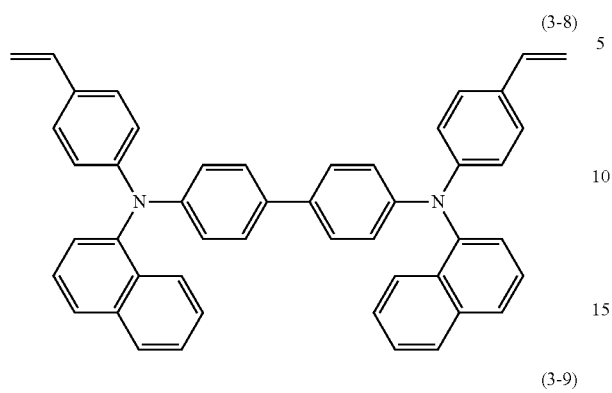
(3-9)
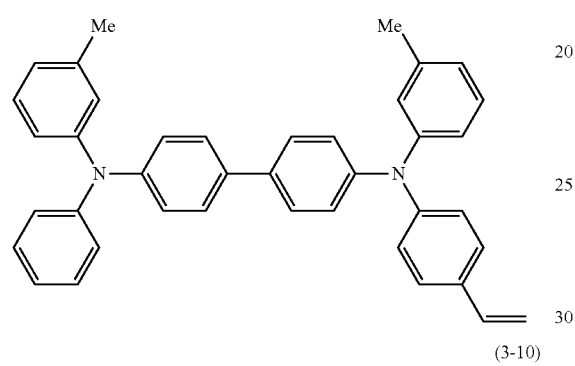
(3-10)
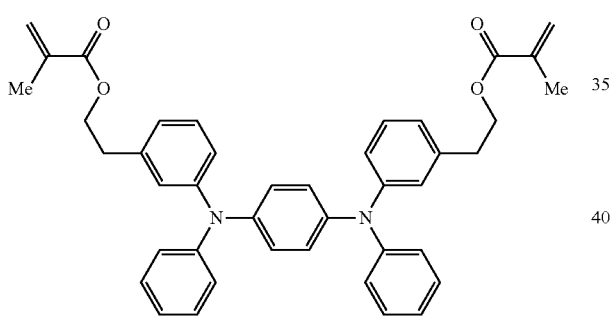
[Chemical Formula 90]
(3-11)
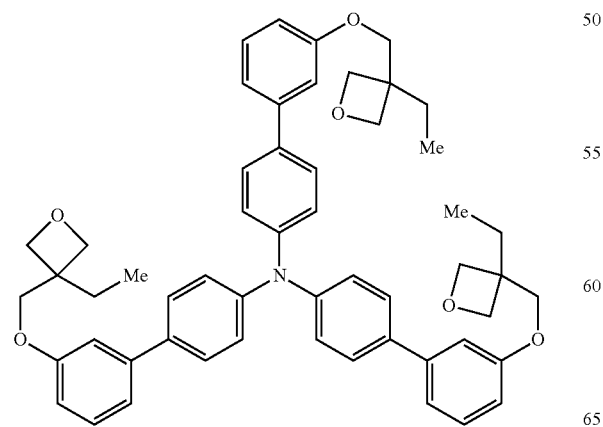
(3-12)
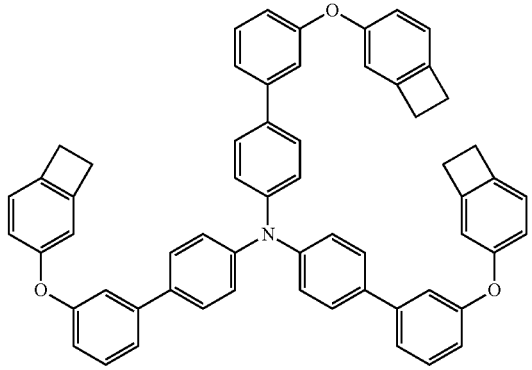
(3-13)
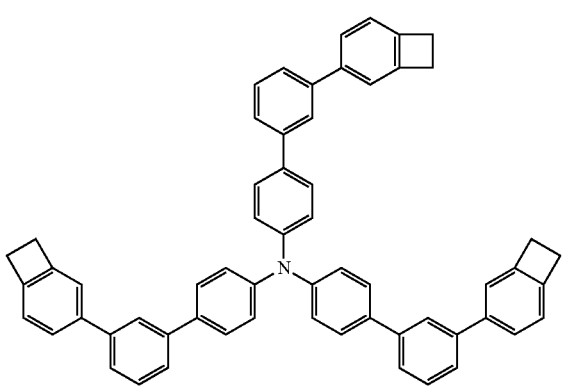
[Chemical Formula 91]
(3-14)
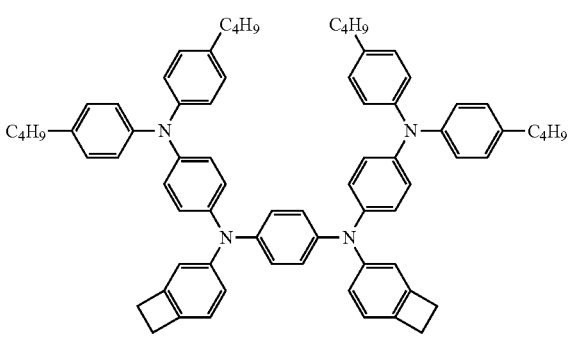
(3-15)
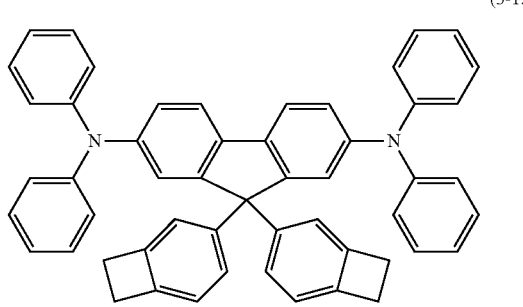

-continued (3-16)

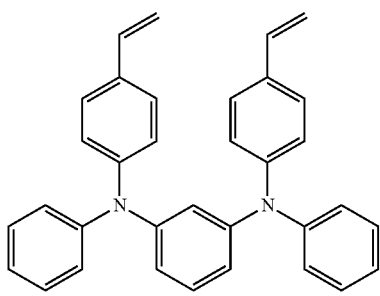

The low-molecular weight compound of the second organic layer is available, for example, from Aldrich Corp., Luminescence Technology Corp. and American Dye Source. In addition, the low-molecular weight compound of the second organic layer can be synthesized, for example, according to a method described in International Publication WO 1997/033193, International Publication WO 2005/035221 and International Publication WO 2005/049548.

[Metal Complex Represented by the Formula (1)]

In the second composition, the metal complex represented by the formula (1) may be contained singly or in combination of two or more kinds thereof.

The metal complex represented by the formula (1) is usually a compound showing phosphorescence at room temperature, preferably a compound showing emission from the triplet excited state at room temperature.

The metal complex represented by the formula (1) is constituted of M as the central metal, a ligand of which number is prescribed by a subscript $n^1$ and a ligand of which number is prescribed by a subscript $n^2$.

M is preferably an iridium atom or a platinum atom, more preferably an iridium atom, since the light emitting device of the present invention is excellent in the external quantum efficiency.

$n^1$ is preferably 2 or 3, more preferably 3, when M is a ruthenium atom, a rhodium atom or an iridium atom.

$n^1$ is preferably 2, when M is a palladium atom or a platinum atom.

$E^1$ and $E^2$ are each preferably a carbon atom.

Ring $L^2$ is preferably a 5- or 6-membered aromatic hetero ring, more preferably a 5-membered aromatic hetero ring having two or more and four or less nitrogen atoms as the constituent atom or a 6-membered aromatic hetero ring having one or more and four or less nitrogen atoms as the constituent atom, further preferably a 5-membered aromatic hetero ring having two or more and three or less nitrogen atoms as the constituent atom or a 6-membered aromatic hetero ring having one or more and two or less nitrogen atoms as the constituent atom, and these rings optionally have a substituent. When Ring $L^1$ is a 6-membered aromatic hetero ring, it is preferable that $E^1$ is a carbon atom.

Ring $L^2$ includes, for example, a diazole ring, a triazole ring, a pyridine ring, a diazabenzene ring, a triazine ring, a quinoline ring and an isoquinoline ring, and is preferably a diazole ring, a triazole ring, a pyridine ring, a pyrimidine ring, a quinoline ring or an isoquinoline ring, more preferably a diazole ring, a triazole ring, a pyridine ring, a quinoline ring or an isoquinoline ring, further preferably a pyridine ring, a quinoline ring or an isoquinoline ring, particularly preferably a pyridine ring, and these rings optionally have a substituent.

Ring $L^2$ is preferably a 5-membered or 6-membered aromatic hydrocarbon ring or a 5-membered or 6-membered aromatic hetero ring, more preferably a 6-membered aromatic hydrocarbon ring or a 6-membered aromatic hetero ring, further preferably a 6-membered aromatic hydrocarbon ring, and these rings optionally have a substituent. When Ring $L^2$ is a 6-membered aromatic hetero ring, it is preferable that $E^2$ is a carbon atom.

Ring $L^2$ includes, for example, a benzene ring, a naphthalene ring, a fluorene ring, a phenanthrene ring, an indene ring, a pyridine ring, a diazabenzene ring and a triazine ring, and is preferably a benzene ring, a naphthalene ring, a fluorene ring, a pyridine ring or a pyrimidine ring, more preferably a benzene ring, a pyridine ring or a pyrimidine ring, further preferably a benzene ring, and these rings optionally have a substituent.

The substituent which Ring $L^1$ and Ring $L^2$ optionally have is preferably an alkyl group, a cycloalkyl group, an alkoxy group, a cycloalkoxy group, an aryl group, an aryloxy group, a monovalent heterocyclic group, a substituted amino group or a halogen atom, more preferably an alkyl group, a cycloalkyl group, an alkoxy group, a cycloalkoxy group, an aryl group, a monovalent heterocyclic group or a fluorine atom, further preferably an alkyl group, a cycloalkyl group, an aryl group or a monovalent heterocyclic group, particularly preferably an alkyl group, an aryl group or a monovalent heterocyclic group, especially preferably a monovalent heterocyclic group, and these groups optionally further have a substituent.

The aryl group as the substituent which Ring $L^1$ and Ring $L^2$ optionally have is preferably a phenyl group, a naphthyl group, an anthracenyl group, a phenanthrenyl group, a dihydrophenanthrenyl group, a fluorenyl group or a pyrenyl group, more preferably a phenyl group, a naphthyl group or a fluorenyl group, further preferably a phenyl group, and these groups optionally further have a substituent.

The monovalent heterocyclic group as the substituent which Ring $L^1$ and Ring $L^2$ optionally have is preferably a pyridyl group, a pyrimidinyl group, a triazinyl group, a quinolinyl group, an isoquinolinyl group, a dibenzofuranyl group, a dibenzothienyl group, a carbazolyl group, an azacarbazolyl group, a diazacarbazolyl group, a phenoxazinyl group or a phenothiazinyl group, more preferably a pyridyl group, a pyrimidinyl group, a triazinyl group, a carbazolyl group, an azacarbazolyl group or a diazacarbazolyl group, further preferably a pyridyl group, a pyrimidinyl group or a triazinyl group, particularly preferably a triazinyl group, and these groups optionally further have a substituent.

The substituent which the amino group has in the substituted amino group as the substituent which Ring $L^1$ and Ring $L^2$ optionally have is preferably an aryl group or a monovalent heterocyclic group, more preferably an aryl group, and these groups optionally further have a substituent. The examples and preferable range of the aryl group as the substituent which the amino group has are the same as the examples and preferable range of the aryl group as the substituent which Ring $L^1$ and Ring $L^2$ optionally have. The examples and preferable range of the monovalent heterocyclic group as the substituent which the amino group has are the same as the examples and preferable range of the monovalent heterocyclic group as the substituent which Ring $L^1$ and Ring $L^2$ optionally have.

The substituent which the substituent which Ring $L^1$ and Ring $L^2$ optionally have optionally further has is preferably an alkyl group, a cycloalkyl group, an alkoxy group, a cycloalkoxy group, an aryl group, an aryloxy group, a monovalent heterocyclic group, a substituted amino group or a halogen atom, more preferably an alkyl group, a cycloalkyl group, an alkoxy group, a cycloalkoxy group, an aryl group, a monovalent heterocyclic group or a fluorine atom, further preferably an alkyl group, a cycloalkyl group, an aryl group or a monovalent heterocyclic group, particularly preferably an alkyl group, a cycloalkyl group or an aryl group, and these groups optionally further have a substituent.

The aryl group, the monovalent heterocyclic group or the substituted amino group as the substituent which Ring $L^1$ and Ring $L^2$ optionally have is preferably a group represented by the formula (D-A) or (D-B), more preferably a group represented by the formula (D-A), since the light emitting device of the present invention is more excellent in the external quantum efficiency.

[Chemical Formula 92]

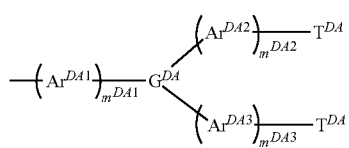
(D-A)

[wherein, $m^{DA1}$, $m^{DA2}$ and $m^{DA3}$ each independently represent an integer of 0 or more.

$G^{DA}$ is a nitrogen atom, an aromatic hydrocarbon group or a heterocyclic group, and these groups optionally have a substituent.

$Ar^{DA1}$, $Ar^{DA2}$ and $Ar^{DA3}$ each independently represent an arylene group or a divalent heterocyclic group, and these groups optionally have a substituent. When a plurality of $Ar^{DA1}$, $Ar^{DA2}$ and $Ar^{DA3}$ are present, they may be the same or different at each occurrence.

$T^{DA}$ is an aryl group or a monovalent heterocyclic group, and these groups optionally have a substituent. A plurality of $T^{DA}$ may be the same or different.]

[Chemical Formula 93]

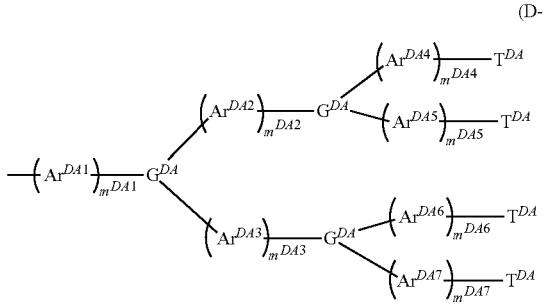
(D-B)

[wherein, $m^{DA1}$, $m^{DA2}$, $m^{DA3}$, $m^{DA4}$, $m^{DA5}$, $m^{DA6}$ and $m^{DA7}$ each independently represent an integer of 0 or more.

$G^{DA}$ is a nitrogen atom, an aromatic hydrocarbon group or a heterocyclic group, and these groups optionally have a substituent. A plurality of $G^{DA}$ may be the same or different.

$Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group, and these groups optionally have a substituent. When a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ are present, they may be the same or different at each occurrence.

$T^{DA}$ is an aryl group or a monovalent heterocyclic group, and these groups optionally have a substituent. A plurality of $T^{DA}$ may be the same or different.]

$m^{DA1}$, $m^{DA2}$, $m^{DA3}$, $m^{DA4}$, $m^{DA5}$, $m^{DA6}$ and $m^{DA7}$ are each usually an integer of 10 or less, preferably an integer of 5 or less, more preferably 0 or 1. It is preferable that $m^{DA1}$, $m^{DA2}$, $m^{DA3}$, $m^{DA4}$, $m^{DA5}$, $m^{DA6}$ and $m^{DA7}$ are the same integer.

$G^{DA}$ is preferably a group represented by the formulae (GDA-11) to (GDA-15), more preferably a group represented by the formula (GDA-11) to the formula (GDA-14), further preferably a group represented by the formula (GDA-11) or the formula (GDA-14), particularly preferably a group represented by the formula (GDA-14).

[Chemical Formula 94]

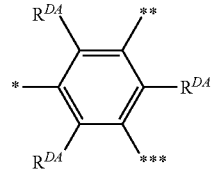
(GDA-11)

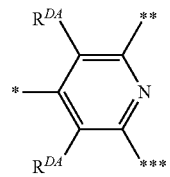
(GDA-12)

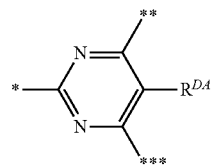
(GDA-13)

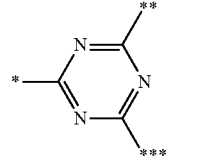
(GDA-14)

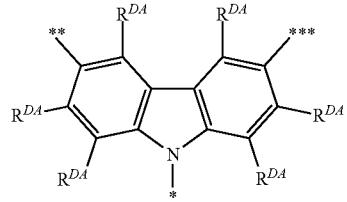
(GDA-15)

[wherein,

* represents a bond to $Ar^{DA1}$ in the formula (D-A), to $Ar^{DA1}$ in the formula (D-B), to $Ar^{DA2}$ in the formula (D-B) or to $Ar^{DA3}$ in the formula (D-B).

** represents a bond to $Ar^{DA2}$ in the formula (D-A), to $Ar^{DA2}$ in the formula (D-B), to $Ar^{DA4}$ in the formula (D-B) or to $Ar^{DA6}$ in the formula (D-B).

*** represents a bond to $Ar^{DA3}$ in the formula (D-A), to $Ar^{DA3}$ in the formula (D-B), to $Ar^{DA5}$ in the formula (D-B) or to $Ar^{DA7}$ in the formula (D-B).

$R^{DA}$ is a hydrogen atom, an alkyl group, a cycloalkyl group, an alkoxy group, a cycloalkoxy group, an aryl group or a monovalent heterocyclic group, and these groups optionally further have a substituent. When a plurality of $R^{DA}$ are present, they may be the same or different.]

$R^{DA}$ is preferably a hydrogen atom, an alkyl group, a cycloalkyl group, an alkoxy group or a cycloalkoxy group, more preferably a hydrogen atom, an alkyl group or a cycloalkyl group, and these groups optionally have a substituent.

$Ar^{DA1}$, $Ar^{DA2}$, $Ar^{DA2}$, $Ar^{DA4}$, $Ar^{DA5}$, $Ar^{DA6}$ and $Ar^{DA7}$ are each preferably a group represented by the formulae (ArDA-1) to (ArDA-3).

[Chemical Formula 95]

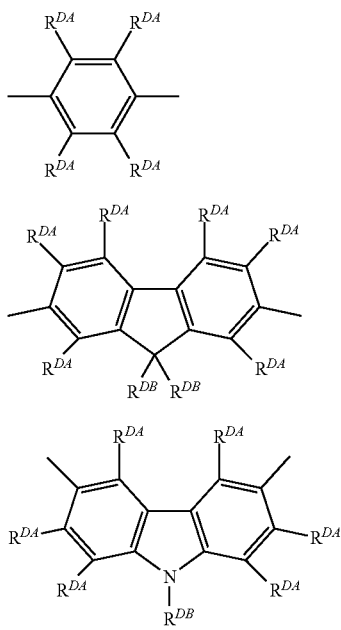

(ArDA-1)

(ArDA-2)

(ArDA-3)

[wherein, $R^{DA}$ represents the same meaning as described above.

$R^{DB}$ is a hydrogen atom, an alkyl group, a cycloalkyl group, an aryl group or a monovalent heterocyclic group, and these groups optionally have a substituent. When a plurality of $R^{DB}$ are present, they may be the same or different.]

$R^{DB}$ is preferably an alkyl group, a cycloalkyl group, an aryl group or a monovalent heterocyclic group, more preferably an aryl group or a monovalent heterocyclic group, further preferably aryl group.

$T^{DA}$ is preferably a group represented by the formulae (TDA-1) to (TDA-3), more preferably a group represented by the formula (TDA-1).

[Chemical Formula 96]

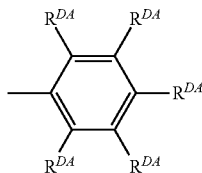

(TDA-1)

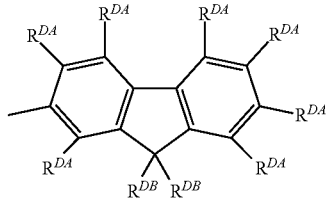

(TDA-2)

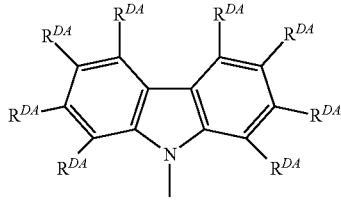

(TDA-3)

[wherein, $R^{DA}$ and $R^{DB}$ represent the same meaning as described above.]

The group represented by the formula (D-A) is preferably a group represented by the formulae (D-A1) to (D-A3), more preferably a group represented by the formula (D-A1) or (D-A3), further preferably a group represented by the formula (D-A3).

[Chemical Formula 97]

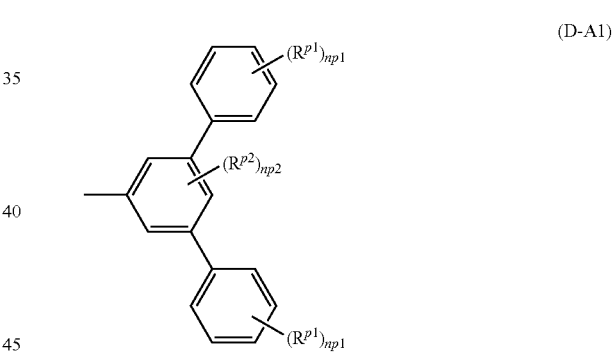

(D-A1)

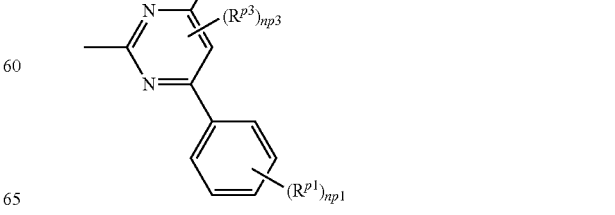

(D-A2)

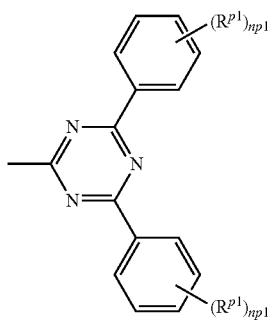
(D-A3)

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3 and np3 represents 0 or 1. A plurality of np1 may be the same or different.]

The group represented by the formula (D-B) is preferably a group represented by the formulae (D-B1) to (D-B3), more preferably a group represented by the formula (D-B3).

[Chemical Formula 98]

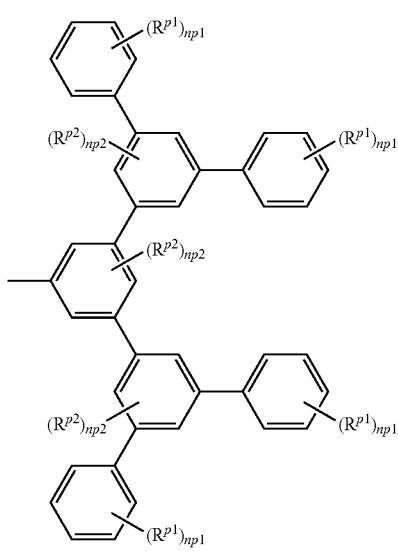
(D-B1)

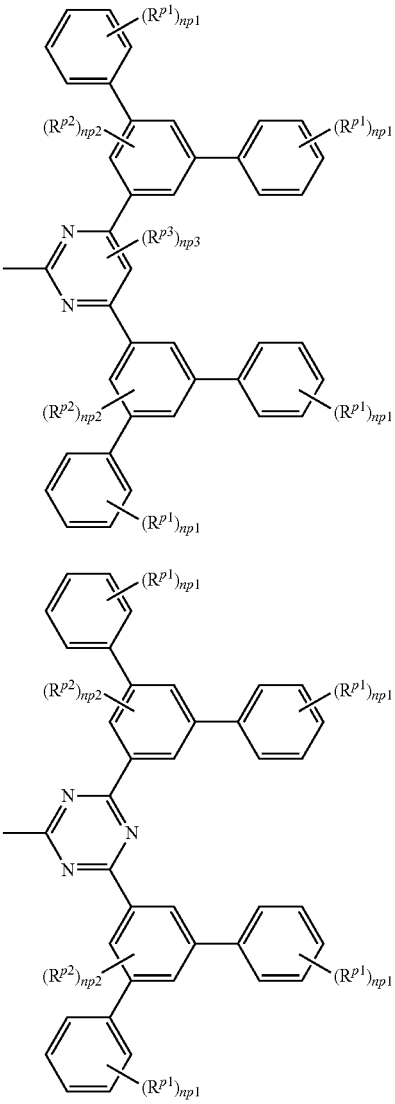

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3 and np3 represents 0 or 1. When a plurality of np1 and np2 are present, they may be the same or different at each occurrence.]

np1 is preferably an integer of 0 to 3, more preferably an integer of 1 to 3, further preferably 1. np2 is preferably 0 or 1, more preferably 0. np3 is preferably 0.

$R^{p1}$, $R^{p2}$ and $R^{p3}$ are each preferably an alkyl group or a cycloalkyl group.

[Anionic bidentate ligand]

The anionic bidentate ligand represented by $A^1$-$G^1$-$A^2$ includes, for example, ligands represented by the following formulae.

[Chemical Formula 99]

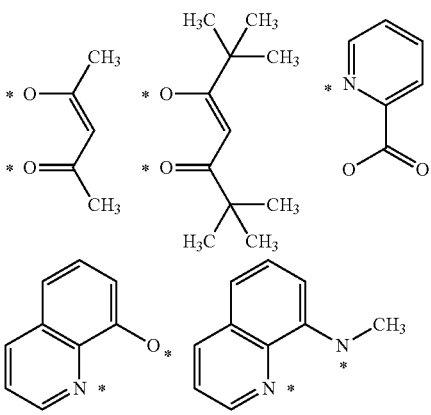

[Chemical Formula 100]

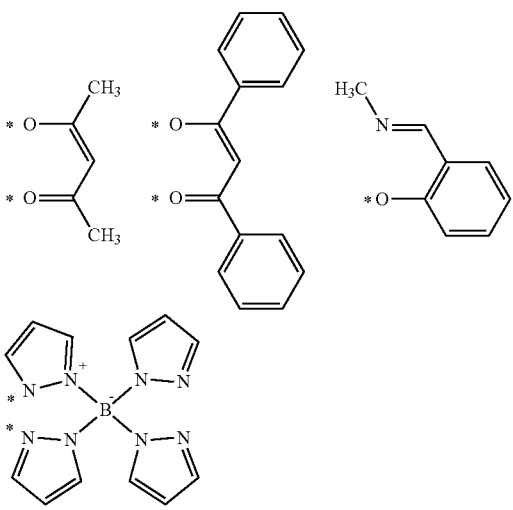

[wherein, * represents a site binding to M.]

The metal complex represented by the formula (1) is preferably a metal complex represented by the formula (1-A) or a metal complex represented by the formula (1-B), more preferably a metal complex represented by the formula (1-B), since the light emitting device of the present invention is more excellent in the external quantum efficiency.

[Metal Complex Represented by the Formula (1-A)]

When Ring $L^{1A}$ is a diazole ring, an imidazole ring in which $E^{11A}$ is a nitrogen atom or an imidazole ring in which $E^{12A}$ is a nitrogen atom is preferable, an imidazole ring in which $E^{11A}$ is a nitrogen atom is more preferable.

When Ring $L^{1A}$ is a triazole ring, a triazole ring in which $E^{11A}$ and $E^{12A}$ are each a nitrogen atom or a triazole ring in which $E^{11A}$ and $E^{13A}$ are each a nitrogen atom is preferable, a triazole ring in which $E^{11A}$ and $E^{12A}$ are each a nitrogen atom is more preferable.

The examples and preferable range of the aryl group, the monovalent heterocyclic group and the substituted amino group represented by $R^{11A}$, $R^{12A}$, $R^{13A}$, $R^{21A}$, $R^{22A}$, $R^{23A}$ and $R^{24A}$ are the same as the examples and preferable range of the aryl group, the monovalent heterocyclic group and the substituted amino group as the substituent which Ring $L^1$ and Ring $L^2$ optionally have, respectively.

The examples and preferable range of the substituent which $R^{11A}$, $R^{12A}$, $R^{13A}$, $R^{21A}$, $R^{22A}$, $R^{23A}$ and $R^{24A}$ optionally have are the same as the examples and preferable range of the substituent which the substituent which Ring $L^1$ and Ring $L^2$ optionally have optionally further has.

When $E^{11A}$ is a nitrogen atom and $R^{11A}$ is present, $R^{11A}$ is preferably an alkyl group, a cycloalkyl group, an aryl group or a monovalent heterocyclic group, more preferably an aryl group or a monovalent heterocyclic group, further preferably an aryl group, and these groups optionally have a substituent.

When $E^{11A}$ is a carbon atom, $R^{11A}$ is preferably a hydrogen atom, an alkyl group, a cycloalkyl group, an aryl group, a monovalent heterocyclic group or a substituted amino group, more preferably a hydrogen atom, an alkyl group, a cycloalkyl group or an aryl group, further preferably a hydrogen atom, an alkyl group or cycloalkyl group, particularly preferably a hydrogen atom, and these groups optionally have a substituent.

When $E^{12A}$ is a nitrogen atom and $R^{12A}$ is present, $R^{12A}$ is preferably an alkyl group, a cycloalkyl group, an aryl group or a monovalent heterocyclic group, more preferably an aryl group or a monovalent heterocyclic group, further preferably an aryl group, and these groups optionally have a substituent.

When $E^{12A}$ is a carbon atom, $R^{12A}$ is preferably a hydrogen atom, an alkyl group, a cycloalkyl group, an aryl group, a monovalent heterocyclic group or a substituted amino group, more preferably a hydrogen atom, an alkyl group, a cycloalkyl group or an aryl group, further preferably a hydrogen atom, an alkyl group or a cycloalkyl group, particularly preferably a hydrogen atom, and these groups optionally have a substituent.

When $E^{13A}$ is a nitrogen atom and $R^{13A}$ is present, $R^{13A}$ is preferably an alkyl group, a cycloalkyl group, an aryl group or a monovalent heterocyclic group, more preferably an aryl group or a monovalent heterocyclic group, further preferably an aryl group, and these groups optionally have a substituent.

When $E^{13A}$ is a carbon atom, $R^{13A}$ is preferably a hydrogen atom, an alkyl group, a cycloalkyl group, an aryl group, a monovalent heterocyclic group or a substituted amino group, more preferably a hydrogen atom, an alkyl group, a cycloalkyl group or an aryl group, further preferably a hydrogen atom, an alkyl group or a cycloalkyl group, particularly preferably a hydrogen atom, and these groups optionally have a substituent.

When Ring $L^{2A}$ is a pyridine ring, a pyridine ring in which $E^{21A}$ is nitrogen atom, a pyridine ring in which $E^{22A}$ is a nitrogen atom or a pyridine ring in which $E^{23A}$ is a nitrogen atom is preferable, a pyridine ring in which $E^{22A}$ is a nitrogen atom is more preferable.

When Ring $L^{2A}$ is a pyrimidine ring, a pyrimidine ring in which $E^{22A}$ and $E^{24A}$ are each a nitrogen atom is preferable.

Ring $L^{2A}$ is preferably a benzene ring.

$R^{21A}$, $R^{22A}$, $R^{23A}$ and $R^{24A}$ are each preferably a hydrogen atom, an alkyl group, a cycloalkyl group, an alkoxy group, a cycloalkoxy group, an aryl group, a monovalent heterocyclic group, a fluorine atom or a substituted amino group, more preferably a hydrogen atom, an alkyl group, a cycloalkyl group, an aryl group, a monovalent heterocyclic group or a substituted amino group, further preferably a hydrogen atom, an alkyl group, a cycloalkyl group, a group represented by the formula (D-A) or a group represented by the formula (D-B), particularly preferably a hydrogen atom, an alkyl group, a group represented by the formula (D-A) or a group represented by the formula (D-B), especially preferably a hydrogen atom or a group represented by the formula (D-A), and these groups optionally have a substituent.

When Ring $L^{2A}$ has an aryl group, a monovalent heterocyclic group or a substituted amino group, it is preferable that $R^{22A}$ or $R^{23A}$ is an aryl group, a monovalent heterocyclic group or a substituted amino group, it is more preferable that $R^{22A}$ is an aryl group, a monovalent heterocyclic group or a substituted amino group.

When Ring $L^{2A}$ has an alkyl group or a cycloalkyl group, it is preferable that $R^{22A}$ or $R^{23A}$ is an alkyl group or a cycloalkyl group, it is more preferable that $R^{23A}$ is an alkyl group or a cycloalkyl group.

The metal complex represented by the formula (1-A) is preferably a metal complex represented by the formula (1-A1), a metal complex represented by the formula (1-A2), a metal complex represented by the formula (1-A3) or a metal complex represented by the formula (1-A4), more preferably a metal complex represented by the formula (1-A1) or a metal complex represented by the formula (1-A3), further preferably a metal complex represented by the formula (1-A1), since the light emitting device of the present invention is further excellent in the external quantum efficiency.

[Chemical Formula 101]

(1-A1)

(1-A2)

(1-A3)

-continued

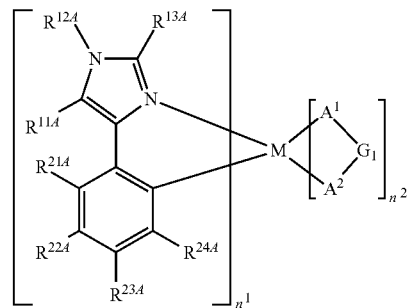
(1-A4)

[wherein,
M, $n^1$, $n^2$, $R^{11A}$, $R^{12A}$, $R^{13A}$, $R^{21A}$, $R^{22A}$, $R^{22A}$, $R^{24A}$ and $A^1$-$G^1$-$A^2$ represent the same meaning as described above.]

[Metal Complex Represented by the Formula (1-B)]

When Ring $L^{1B}$ is pyrimidine ring, a pyrimidine ring in which $E^{11B}$ is a nitrogen atom is preferable.

When Ring $L^{2B}$ is a pyridine ring, a pyridine ring in which $E^{21B}$ is a nitrogen atom, a pyridine ring in which $E^{22B}$ is a nitrogen atom or a pyridine ring in which $E^{23B}$ is a nitrogen atom is preferable, a pyridine ring in which $E^{22B}$ is a nitrogen atom is more preferable.

When Ring $L^{2B}$ is a pyrimidine ring, a pyrimidine ring in which $E^{22B}$ and $E^{24B}$ are each a nitrogen atom is preferable.

Ring $L^{2B}$ is preferably a benzene ring.

The examples and preferable range of the aryl group, the monovalent heterocyclic group and the substituted amino group represented by $R^{11B}$, $R^{12B}$, $R^{13E}$, $R^{14B}$, $R^{21B}$, $R^{22B}$, $R^{23B}$ and $R^{24B}$ are the same as the examples and preferable range of the aryl group, the monovalent heterocyclic group and the substituted amino group as the substituent which Ring $L^1$ and Ring $L^2$ optionally have, respectively.

The examples and preferable range of the substituent which $R^{11B}$, $R^{12B}$, $R^{13B}$, $R^{14B}$, $R^{21B}$, $R^{22B}$, $R^{23B}$ and $R^{24B}$ optionally have are the same as the examples and preferable range of the substituent which the substituent which Ring $L^1$ and Ring $L^2$ optionally have optionally further has.

$R^{11B}$, $R^{12B}$, $R^{13B}$, $R^{14B}$, $R^{21B}$, $R^{22B}$, $R^{23B}$ and $R^{24B}$ are each preferably a hydrogen atom, an alkyl group, a cycloalkyl group, an alkoxy group, a cycloalkoxy group, a fluorine atom, an aryl group, a monovalent heterocyclic group or a substituted amino group, more preferably a hydrogen atom, an alkyl group, a cycloalkyl group, an aryl group, a monovalent heterocyclic group or a substituted amino group, further preferably a hydrogen atom, an alkyl group, a cycloalkyl group, a group represented by the formula (D-A) or a group represented by the formula (D-B), particularly preferably a hydrogen atom, an alkyl group, a group represented by the formula (D-A) or a group represented by the formula (D-B), especially preferably a hydrogen atom or a group represented by the formula (D-A), and these groups optionally have a substituent.

When Ring $L^{1B}$ has an alkyl group, a cycloalkyl group, an aryl group, a monovalent heterocyclic group or a substituted amino group, it is preferable that $R^{11B}$, $R^{12B}$ or $R^{13B}$ is an alkyl group, a cycloalkyl group, an aryl group, a monovalent heterocyclic group or a substituted amino group, it is more preferable that $R^{12B}$ or $R^{13B}$ is an alkyl group, a cycloalkyl group, an aryl group, a monovalent heterocyclic group or a substituted amino group, it is further preferable that $R^{13B}$ is an alkyl group, a cycloalkyl group, an aryl group, a monovalent heterocyclic group or a substituted amino group.

When Ring $L^{2B}$ has an aryl group, a monovalent heterocyclic group or a substituted amino group, it is preferable that $R^{22B}$ or $R^{23B}$ is an aryl group, a monovalent heterocyclic group or a substituted amino group, it is more preferable that $R^{22B}$ is an aryl group, a monovalent heterocyclic group or a substituted amino group.

When Ring $L^{2B}$ has an alkyl group or a cycloalkyl group, it is preferable that $R^{22B}$ or $R^{23B}$ is an alkyl group or a cycloalkyl group, it is more preferable that $R^{23B}$ is an alkyl group or a cycloalkyl group.

The metal complex represented by the formula (1-B) is preferably a metal complex represented by the formula (1-B1), a metal complex represented by the formula (1-B2), a metal complex represented by the formula (1-B3), a metal complex represented by the formula (1-B4) or a metal complex represented by the formula (1-B5), more preferably a metal complex represented by the formula (1-B1), a metal complex represented by the formula (1-B2) or a metal complex represented by the formula (1-B3), further preferably a metal complex represented by the formula (1-B1) or a metal complex represented by the formula (1-B3), particularly preferably a metal complex represented by the formula (1-B1), since the light emitting device of the present invention is further excellent in the external quantum efficiency.

The examples and preferable range of the aryl group, the monovalent heterocyclic group and the substituted amino group represented by $R^{15B}$, $R^{16B}$, $R^{17B}$ and $R^{18B}$ are the same as the examples and preferable range of the aryl group, the monovalent heterocyclic group and the substituted amino group as the substituent which Ring $L^1$ and Ring $L^2$ optionally have, respectively.

The examples and preferable range of the substituent which $R^{15B}$, $R^{16B}$, $R^{17B}$ and $R^{18B}$ optionally have are the same as the examples and preferable range of the substituent which the substituent which Ring $L^1$ and Ring $L^2$ optionally have optionally further has.

$R^{15B}$, $R^{16B}$, $R^{17B}$ and $R^{19B}$ are each preferably a hydrogen atom, an alkyl group, a cycloalkyl group, an alkoxy group, a cycloalkoxy group, a fluorine atom, an aryl group, a monovalent heterocyclic group or a substituted amino group, more preferably a hydrogen atom, an alkyl group, a cycloalkyl group, an alkoxy group, a cycloalkoxy group, an aryl group, a monovalent heterocyclic group or a substituted amino group, further preferably a hydrogen atom, an alkyl group, a cycloalkyl group, an aryl group, a monovalent heterocyclic group or a substituted amino group, particularly preferably a hydrogen atom, an alkyl group or a cycloalkyl group, especially preferably a hydrogen atom, and these groups optionally have a substituent.

The metal complex represented by the formula (1) includes, for example, metal complexes represented by the following formulae.

[Chemical Formula 102]

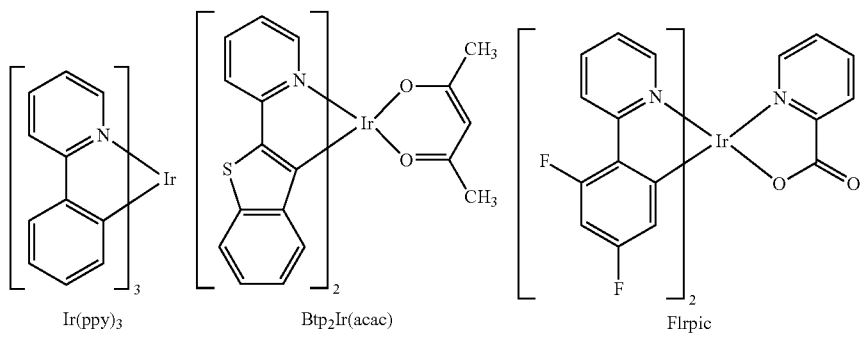

Ir(ppy)₃     Btp₂Ir(acac)     FIrpic

[Chemical Formula 103]

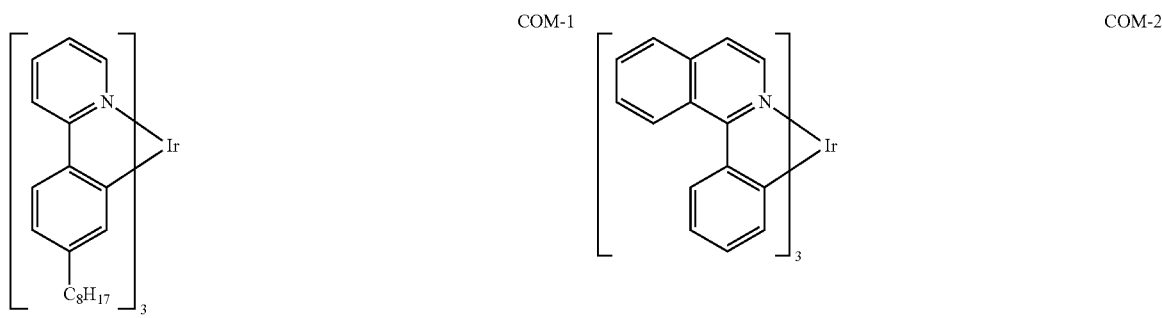

COM-1     COM-2

-continued
COM-3
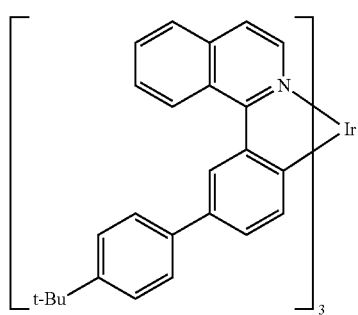
COM-4
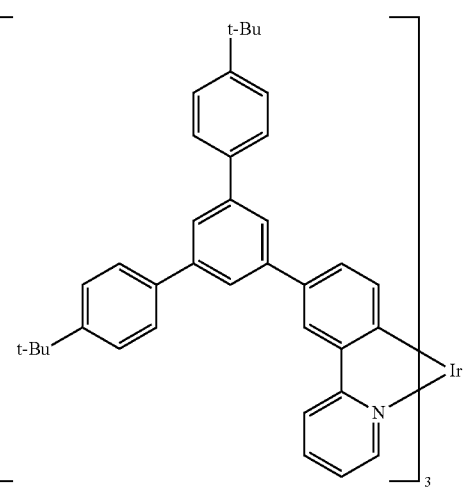
COM-5
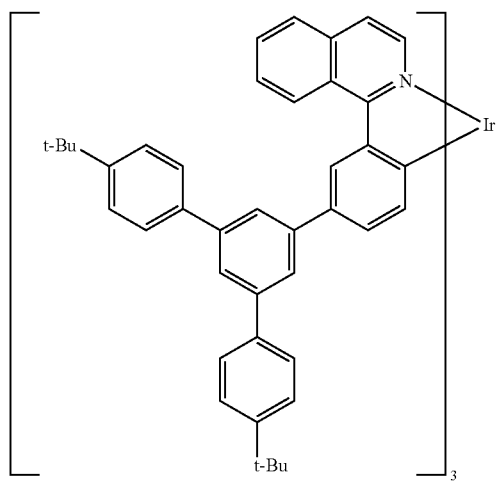
[Chemical Formula 104]
COM-6
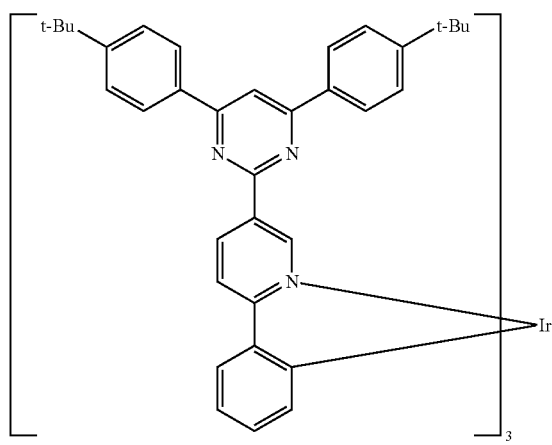
COM-7
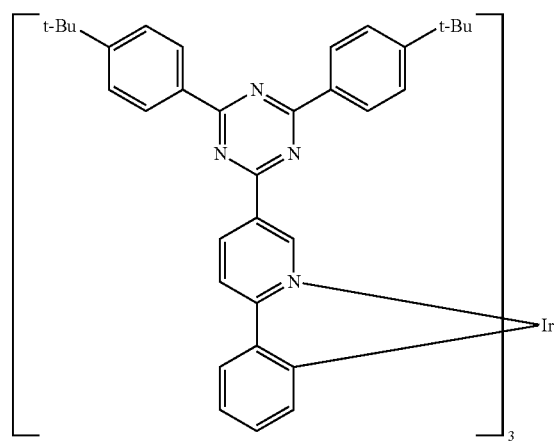

-continued
COM-8
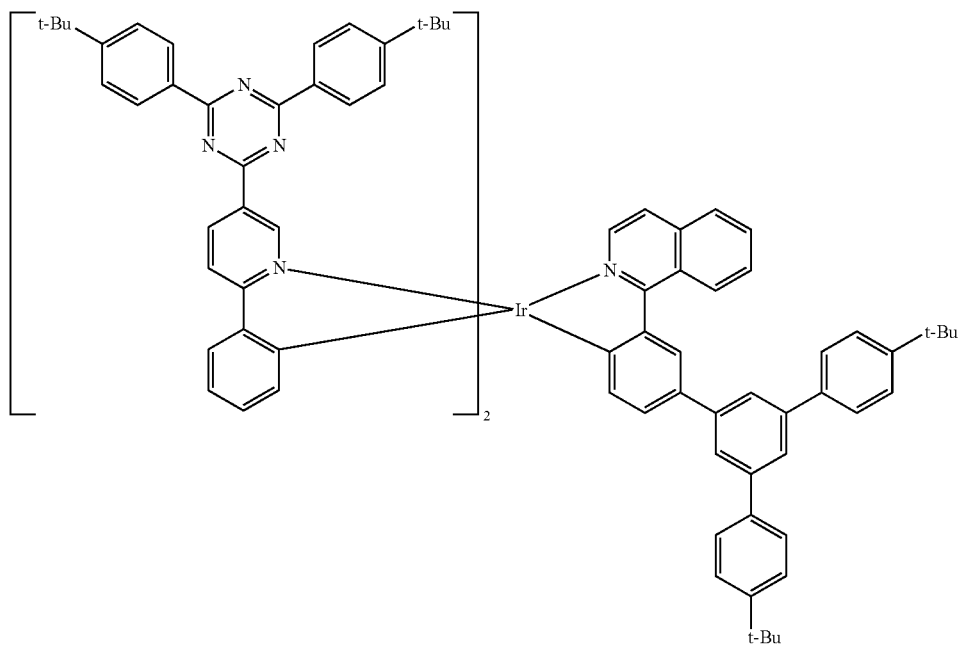
[Chemical Formula 105]
COM-9 COM-10
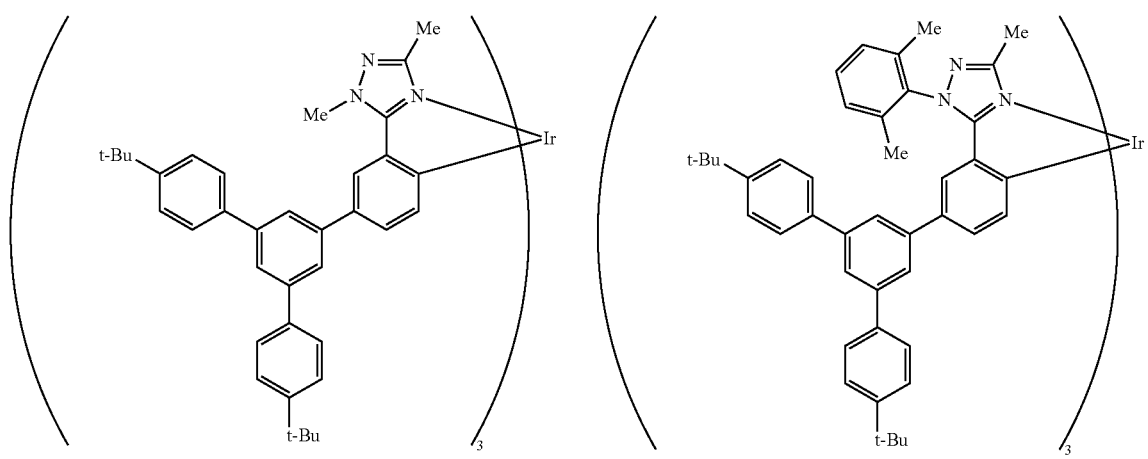
COM-11 COM-12
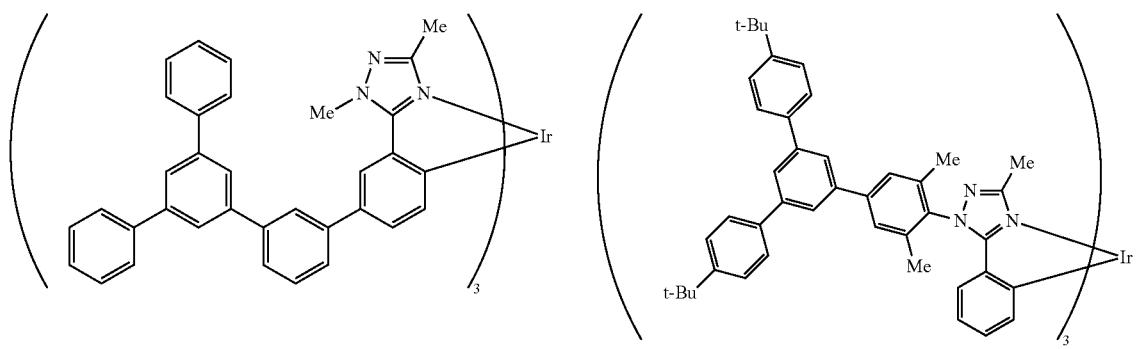

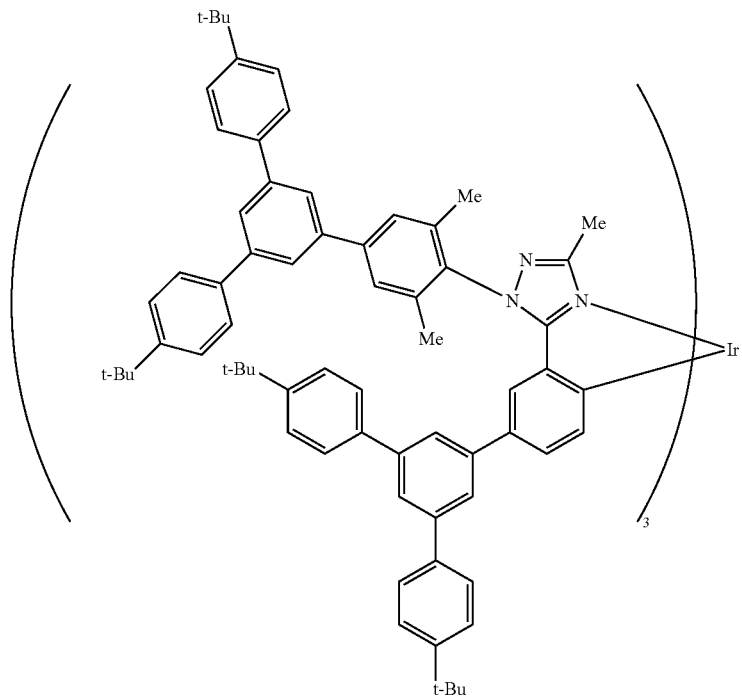
COM-13
[Chemical Formula 106]
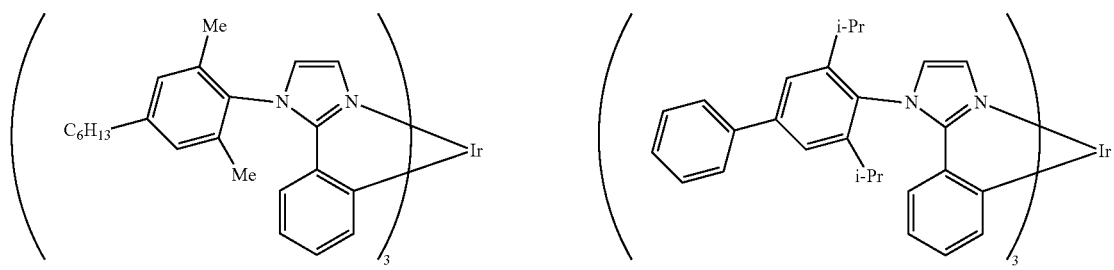
COM-14
COM-15
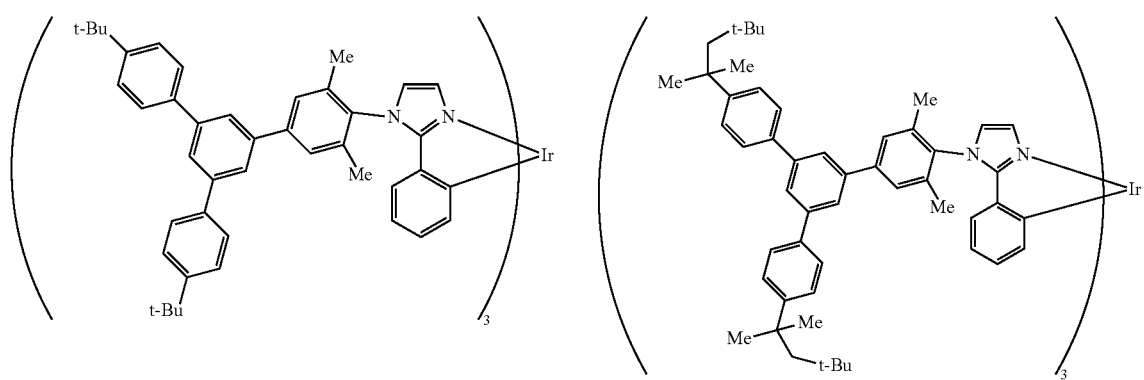
COM-16
COM-17

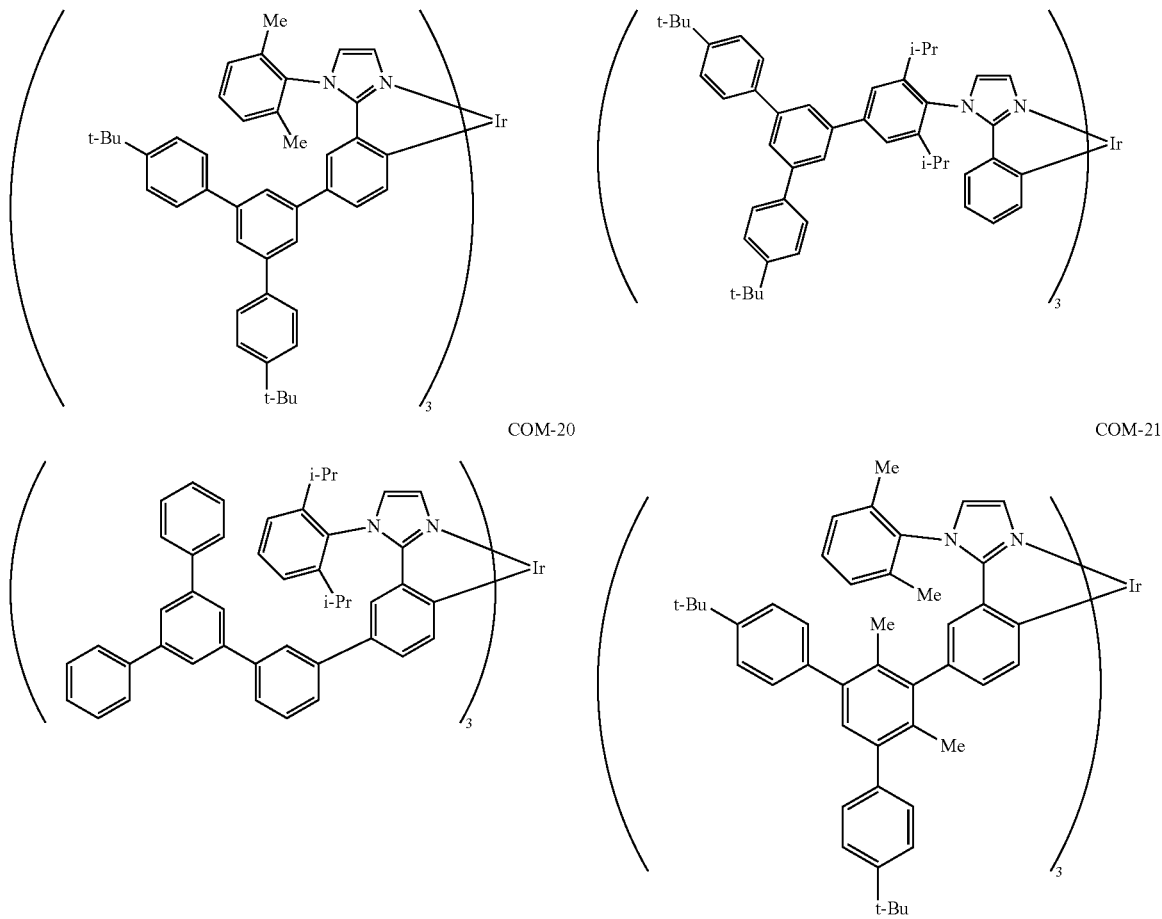

The metal complex represented by the formula (1) can be synthesized, for example, by a method described in "Journal of the American Chemical Society, Vol. 107, pp. 1431-1432 (1985)", "Journal of the American Chemical Society, Vol. 106, pp. 6647-6653 (1984)", Japanese Translation of PCT International Application Publication No. JP-T-2004-530254, Japanese Unexamined Patent Application Publication No. 2008-179617, Japanese Unexamined Patent Application Publication No. 2011-105701, Japanese Translation of PCT International Application Publication No. JP-T-2007-504272, International Publication WO 2006/121811, Japanese Unexamined Patent Application Publication No. 2013-147450 and Japanese Unexamined Patent Application Publication No. 2014-224101.

[Composition Ratio of Second Composition, and the Like]

The content of the metal complex represented by the formula (1) in the second composition is usually 0.01 to 90 parts by mass, preferably 0.1 to 75 parts by mass, more preferably 1 to 60 parts by mass, further preferably 5 to 50 parts by mass, when the sum of the metal complex represented by the formula (1) and the cross-linked body of a cross-linkable material is taken as 100 parts by mass.

The second composition may be a composition containing a metal complex represented by the formula (1), a cross-linked body of a cross-linkable material, and at least one material selected from the group consisting of a hole transporting material, a hole injection material, an electron transporting material, an electron injection material, a light emitting material and an antioxidant.

The examples and preferable range of the hole transporting material, the electron transporting material, the hole injection material, the electron injection material and the light emitting material contained in the second composition are the same as the examples and preferable range of the hole transporting material, the electron transporting material, the hole injection material, the electron injection material and the light emitting material contained in the first composition. In the second composition, the contents of the hole transporting material, the electron transporting material, the hole injection material, the electron injection material and the light emitting material are each usually 1 to 1000 parts by mass, preferably 5 to 500 parts by mass, when the sum of the metal complex represented by the formula (1) and the cross-linked body of a cross-linkable material is taken as 100 parts by mass.

The examples and preferable range of the antioxidant contained in the second composition are the same as the examples and preferable range of the antioxidant contained in the first composition. In the second composition, the content of the antioxidant is usually 0.001 to 10 parts by mass, when the sum of the metal complex represented by the formula (1) and the cross-linked body of a cross-linkable material is taken as 100 parts by mass.

[Second Ink]

Layer A can be formed, for example, by using a composition containing a metal complex represented by the formula (1), a cross-linkable material and a solvent (hereinafter, referred to as "second ink" in some cases). The second ink can be suitably used in the wet method explained in the section of the first ink. The preferable range of the viscosity of the second ink is the same as the preferable range of the viscosity of the first ink. The examples and preferable range of the solvent contained in the second ink are the same as the examples and preferable range of the solvent contained in the first ink In the second ink, the content of the solvent is usually 1000 to 100000 parts by mass, preferably 2000 to 20000 parts by mass, when the sum of the metal complex represented by the formula (1) and the cross-linkable material is taken as 100 parts by mass.

[Polymer Compound X]

In Layer B, the polymer compound X may be contained singly or in combination of two or more kinds thereof.

The constitutional unit Z in the polymer compound X is preferably a constitutional unit containing a group obtained by removing from a metal complex represented by the formula (1) one or more and five or less hydrogen atoms bonding directly to carbon atoms or hetero atoms constituting the metal complex, more preferably a constitutional unit containing a group obtained by removing from a metal complex represented by the formula (1) one or more and three or less hydrogen atoms bonding directly to carbon atoms or hetero atoms constituting the metal complex, further preferably a constitutional unit represented by the formula (1B), a constitutional unit represented by the formula (2B), a constitutional unit represented by the formula (3B) or a constitutional unit represented by the formula (4B), particularly preferably a constitutional unit represented by the formula (1B), a constitutional unit represented by the formula (2B) or a constitutional unit represented by the formula (3B), especially preferably a constitutional unit represented by the formula (3B), since the light emitting device of the present invention is excellent in the external quantum efficiency and synthesis thereof is easy.

[Constitutional Unit Represented by the Formula (1B)]

$R^A$ is preferably an aryl group or a monovalent heterocyclic group, more preferably an aryl group, and these groups optionally have a substituent.

$R^B$ is preferably a hydrogen atom, an alkyl group, a cycloalkyl group, an aryl group or a monovalent heterocyclic group, more preferably a hydrogen atom, an alkyl group, a cycloalkyl group or an aryl group, further preferably a hydrogen atom or an alkyl group, particularly preferably a hydrogen atom, and these groups optionally have a substituent.

$L^C$ is preferably —$C(R^B)_2$—, an arylene group or a divalent heterocyclic group, more preferably —$C(R^B)_2$— or an arylene group, further preferably an arylene group, particularly preferably a group represented by the formula (A-1) or (A-2), and these groups optionally have a substituent.

The examples and preferable range of the arylene group and the divalent heterocyclic group represented by $L^C$ are the same as the examples and preferable range of the arylene group and the divalent heterocyclic group represented by $Ar^{Y1}$ described above, respectively.

The examples and preferable range of the substituent which $R^A$, $R^B$ and $L^C$ optionally have are the same as the examples and preferable range of the substituent which the group represented by $Ar^{Y1}$ optionally has described above, respectively.

$n^{c1}$ is usually an integer of 0 to 10, preferably an integer of 0 to 5, more preferably an integer of 0 to 2, further preferably 0 or 1, particularly preferably 0.

When the polymer compound X is a polymer compound containing a constitutional unit represented by the formula (1B), the constitutional unit represented by the formula (1B) is an end constitutional unit.

The "end constitutional unit" means a constitutional unit at the end of the polymer compound. The end constitutional unit is preferably a constitutional unit derived from an end sealant in the production of the polymer compound.

$M^{1B}$ is preferably a group represented by the formula (BM-1).

[Chemical Formula 107]

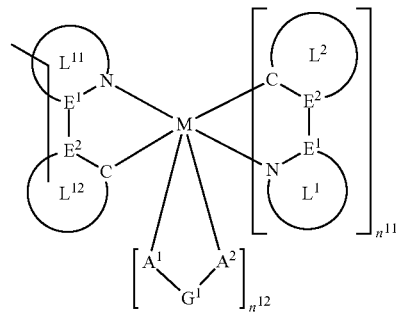

(BM-1)

[wherein,

M, $E^1$, $E^2$, Ring $L^1$, Ring $L^2$ and $A^1$-$G^1$-$A^2$ represent the same meaning as described above.

Ring $L^{11}$ represents an aromatic hetero ring, and these rings optionally have a substituent. When a plurality of the substituents are present, they may be the same or different and may be combined together to form a ring together with atoms to which they are attached.

Ring $L^{12}$ represents an aromatic hydrocarbon ring or an aromatic hetero ring, and these rings optionally have a substituent. When a plurality of the substituents are present, they may be the same or different and may be combined together to form a ring together with atoms to which they are attached.

One of Ring $L^{11}$ and Ring $L^{12}$ has one connecting bond.

$n^{11}$ and $n^{12}$ each independently represent an integer of 0 or more, provided that $n^{11}+n^{12}$ is 1 or 2. $n^{11}+n^{12}$ is 2 when M is a ruthenium atom, a rhodium atom or an iridium atom, while $n^{11}+n^{12}$ is 1 when M is a palladium atom or a platinum atom.]

When M is a ruthenium atom, a rhodium atom or an iridium atom, it is more preferable that $n^{11}$ is 2.

When M is a palladium atom or a platinum atom, it is preferable that $n^{11}$ is 1.

When Ring $L^{11}$ does not have a connecting bond, the definition, examples and preferable range of Ring $L^{11}$ are the same as the definition, examples and preferable range of the above-described Ring $L^1$.

When Ring $L^{11}$ has a connecting bond, the definition, examples and preferable range of the ring portion obtained by removing the connecting bond of Ring $L^{11}$ are the same as the definition, examples and preferable range of the above-described Ring $L^1$.

When Ring $L^{12}$ does not have a connecting bond, the definition, examples and preferable range of Ring $L^{12}$ are the same as the definition, examples and preferable range of the above-described Ring $L^2$.

When Ring $L^{12}$ has a connecting bond, the definition, examples and preferable range of the ring portion obtained by removing the connecting bond of Ring $L^{12}$ are the same as the definition, examples and preferable range of the the above-described Ring $L^2$.

The definition, examples and preferable range of the substituent which Ring $L^{11}$ and Ring $L^{12}$ optionally have are the same as the definition, examples and preferable range of the substituent which Ring $L^1$ and Ring $L^2$ optionally have described above.

[Constitutional Unit Represented by the Formula (2B)]

$L^d$ is preferably —$C(R^B)_2$—, an arylene group or a divalent heterocyclic group, more preferably an arylene group or a divalent heterocyclic group, further preferably an arylene group, particularly preferably a group represented by the formula (A-1) or (A-2), and these groups optionally have a substituent.

$L^e$ is preferably —$C(R^B)_2$—, an arylene group or a divalent heterocyclic group, more preferably —$C(R^B)_2$— or an arylene group, further preferably an arylene group, particularly preferably a group represented by the formula (A-1) or (A-2), and these groups optionally have a substituent.

The examples and preferable range of the arylene group and the divalent heterocyclic group represented by $L^d$ and $L^e$ are the same as the examples and preferable range of the arylene group and the divalent heterocyclic group represented by $Ar^{Y1}$ described above, respectively.

$n^{d1}$ and $n^{e1}$ are each usually an integer of 0 to 10, preferably an integer of 0 to 5, more preferably an integer of 0 to 2, further preferably 0 or 1, particularly preferably 0.

$Ar^{1M}$ is preferably a group obtained by removing from a benzene ring, a naphthalene ring, a fluorene ring, a phenanthrene ring, a dihydrophenanthrene ring, a pyridine ring, a diazabenzene ring, a triazine ring, a carbazole ring, a phenoxazine ring or a phenothiazine ring three hydrogen atoms bonding directly to carbon atoms or hetero atoms constituting the ring, more preferably a group obtained by removing from a benzene ring, a naphthalene ring, a fluorene ring, a phenanthrene ring or a dihydrophenanthrene ring three hydrogen atoms bonding directly to carbon atoms constituting the ring, further preferably a group obtained by removing from a benzene ring or a fluorene ring three hydrogen atoms bonding directly to carbon atoms constituting the ring, particularly preferably a group obtained by removing from a benzene ring three hydrogen atoms bonding directly to carbon atoms constituting the ring, and these groups optionally have a substituent.

The examples and preferable range of the substituent which $L^d$, $L^e$ and $Ar^{1M}$ optionally have are the same as the examples and preferable range of the substituent which the group represented by $Ar^{Y1}$ optionally has described above, respectively.

[Constitutional Unit Represented by the Formula (3B)]

$M^{2B}$ is preferably a group represented by the formula (BM-2) or (BM-3), further preferably a group represented by the formula (BM-2).

[Chemical Formula 108]

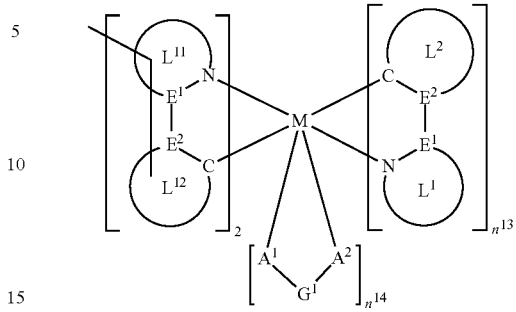

(BM-2)

[wherein,

M, $E^1$, $E^2$, Ring $L^1$, Ring $L^2$, Ring $L^{11}$, Ring $L^{12}$ and $A^1$-$G^1$-$A^2$ represent the same meaning as described above. A plurality of Ring $L^{11}$ may be the same or different. A plurality of Ring $L^{12}$ may be the same or different.

$n^{13}$ and $n^{14}$ each independently represent an integer of 0 or more, provided that $n^{13}+n^{14}$ is 0 or 1. $n^{13}+n^{14}$ is 1 when M is a ruthenium atom, a rhodium atom or an iridium atom, while $n^{13}+n^{14}$ is 0 when M is a palladium atom or a platinum atom.]

When M is a ruthenium atom, a rhodium atom or an iridium atom, it is preferable that $n^{13}$ is 1.

[Chemical Formula 109]

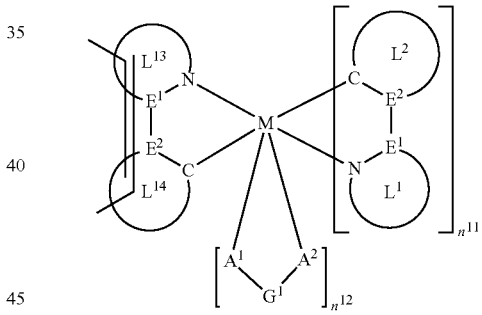

(BM-3)

[wherein,

M, $E^1$, $E^2$, Ring $L^1$, Ring $L^2$, $A^1$-$G^1$-$A^2$, $n^{11}$ and $n^{12}$ represent the same meaning as described above.

Ring $L^{1B}$ represents an aromatic hetero ring, and these rings optionally have a substituent. When a plurality of the substituents are present, they may be the same or different and may be combined together to form a ring together with atoms to which they are attached.

Ring $L^{14}$ represents an aromatic hydrocarbon ring or an aromatic hetero ring, and these rings optionally have a substituent. When a plurality of the substituents are present, they may be the same or different and may be combined together to form a ring together with atoms to which they are attached.

One of Ring $L^{13}$ and Ring $L^{14}$ has two connecting bonds, or Ring $L^{13}$ and Ring $L^{14}$ each have one connecting bond.]

When Ring $L^{13}$ does not have a connecting bond, the definition, examples and preferable range of Ring $L^{13}$ are the same as the definition, examples and preferable range of the above-described Ring $L^1$.

When Ring $L^{13}$ has a connecting bond, the definition, examples and preferable range of the ring portion obtained by removing a connecting bond of Ring $L^{13}$ are the same as the definition, examples and preferable range of the above-described Ring $L^1$.

When Ring $L^{14}$ does not have a connecting bond, the definition, examples and preferable range of Ring $L^{14}$ are the same as the definition, examples and preferable range of the above-described Ring $L^2$.

When Ring $L^{14}$ has a connecting bond, the definition, examples and preferable range of the ring portion obtained by removing a connecting bond of Ring $L^{14}$ are the same as the definition, examples and preferable range of the above-described Ring $L^2$.

The definition, examples and preferable range of the substituent which Ring $L^{13}$ and Ring $L^{14}$ optionally have are the same as the definition, examples and preferable range of the substituent which Ring $L^1$ and Ring $L^2$ optionally have described above.

It is preferable that each of Ring $L^{13}$ and Ring $L^{14}$ has one connecting bond.

[Constitutional Unit Represented by the Formula (4B)]

$M^{3B}$ is preferably a group represented by the formula (BM-4).

[Chemical Formula 110]

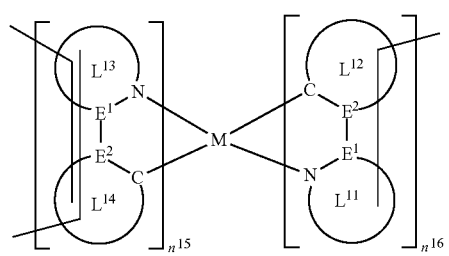

(BM-4)

[wherein,

M, $E^1$, $E^2$, ring $R^{11}$, ring $R^{12}$, ring $R^{13}$ and ring $R^{14}$ represent the same meaning as described above.

$n^{15}$ represents 0 or 1. $n^{16}$ represents 1 or 3. When M is a ruthenium atom, a rhodium atom or an iridium atom, $n^{15}$ is 0 and $n^{16}$ is 3. When M is a palladium atom or a platinum atom, $n^{15}$ is 1 and $n^{16}$ is 1.]

The constitutional unit Z includes, for example, constitutional units represented by the formulae (1B-1) to (1B-17), the formulae (1G-1) to (1G-13), the formulae (2G-1) to (2G-16), the formulae (3G-1) to (3G-23) and the formulae (4G-1) to (4G-6).

[Chemical Formula 111]

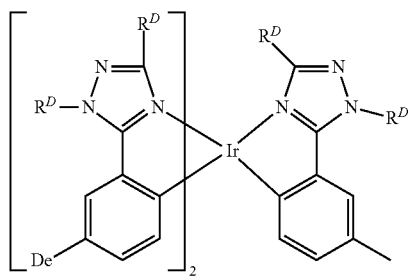

(1B-1)

-continued

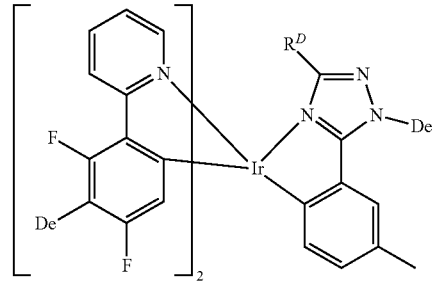

(1B-2)

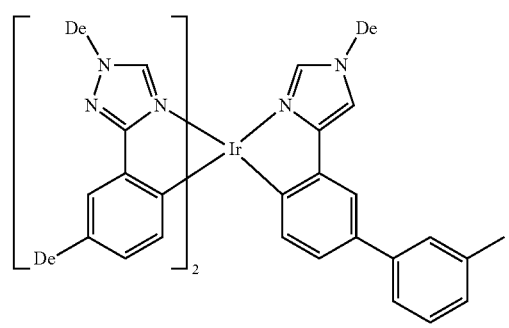

(1B-3)

[Chemical Formula 112]

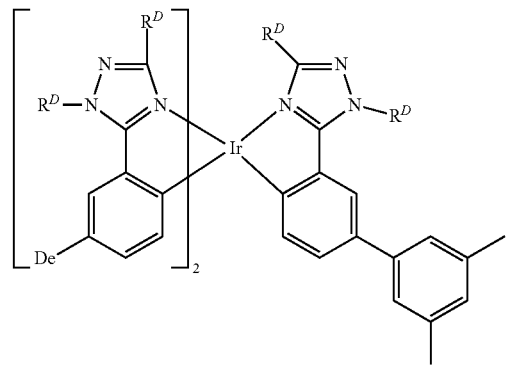

(1B-4)

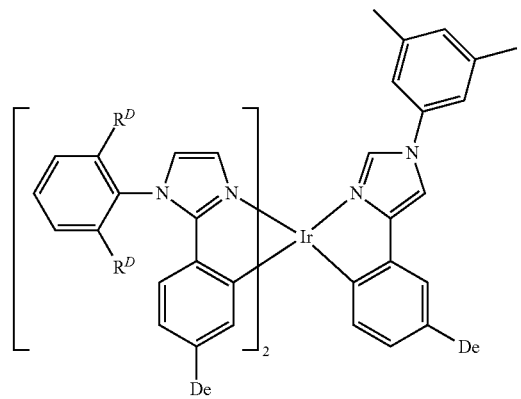

(1B-5)

[Chemical Formula 114]
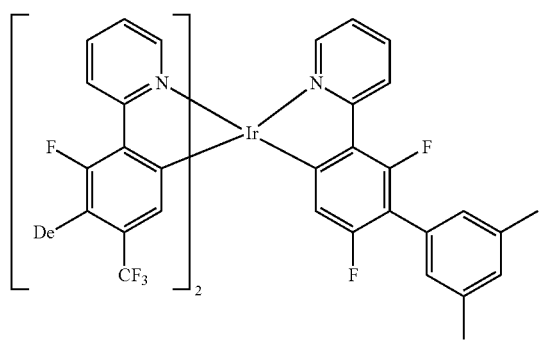
(1B-6)
[Chemical Formula 113]
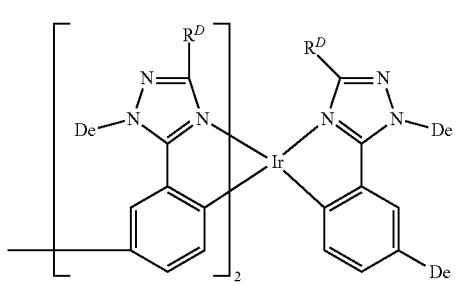
(1B-7)
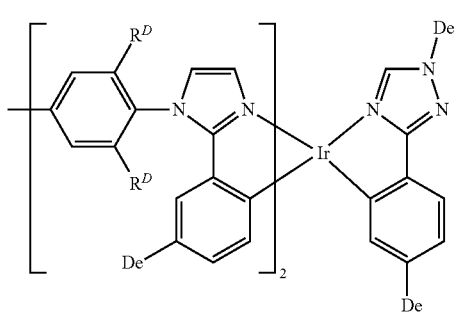
(1B-8)
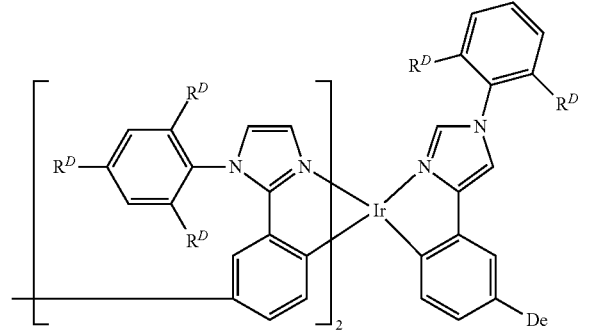
(1B-9)
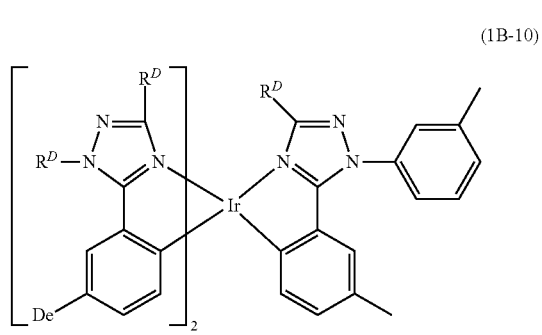
(1B-10)
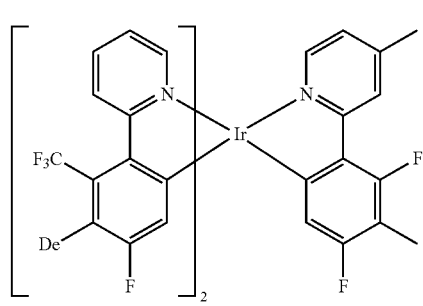
(1B-11)
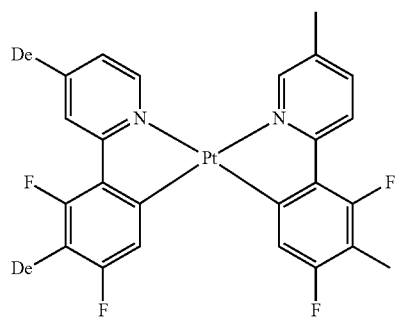
(1B-12)
[Chemical Formula 115]
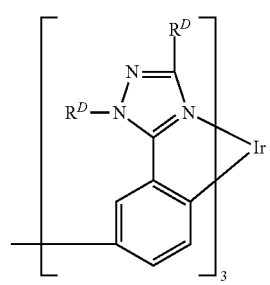
(1B-13)
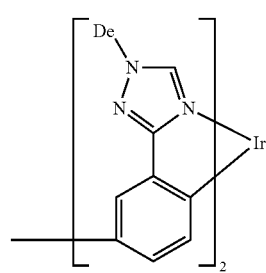
(1B-14)

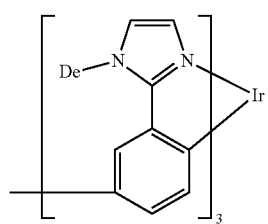
(1B-15)
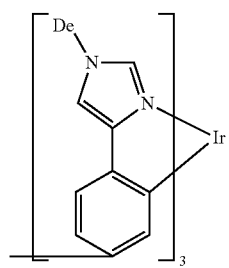
(1B-16)
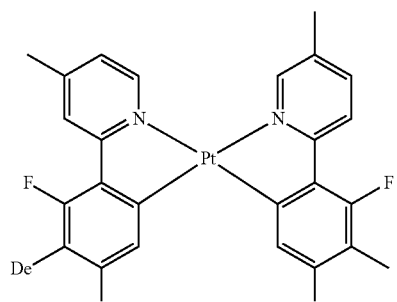
(1B-17)
[Chemical Formula 116]
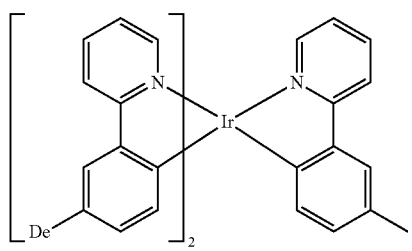
(1G-1)
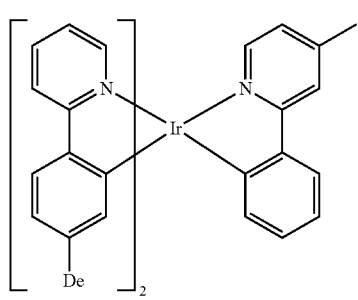
(1G-2)
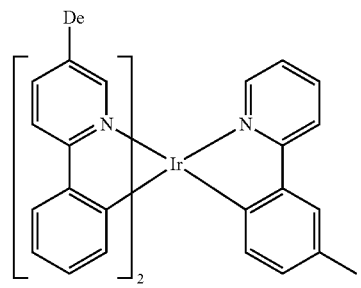
(1G-3)
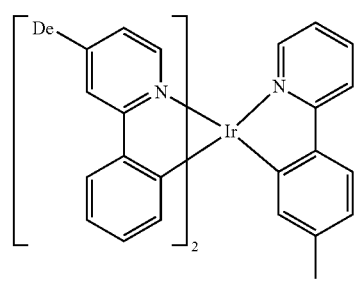
(1G-4)
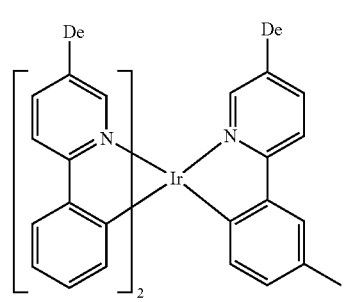
(1G-5)
[Chemical Formula 117]
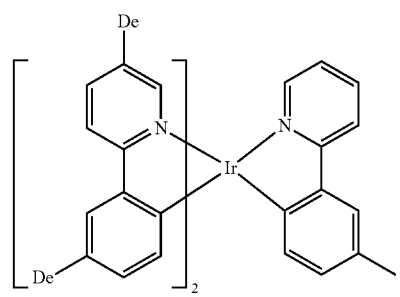
(1G-6)
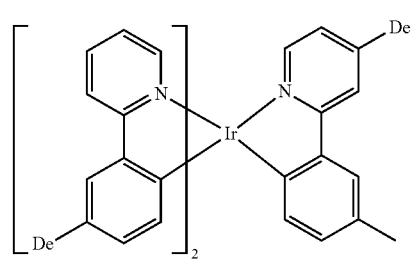
(1G-7)

(1G-8)
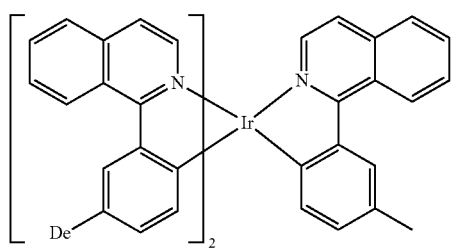
(1G-9)
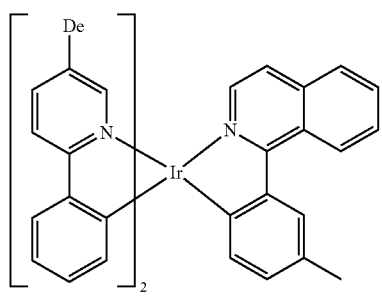
[Chemical Formula 118]
(1G-10)
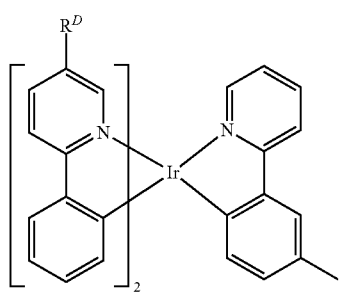
(1G-11)
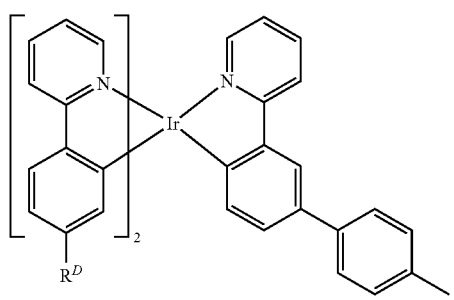
(1G-12)
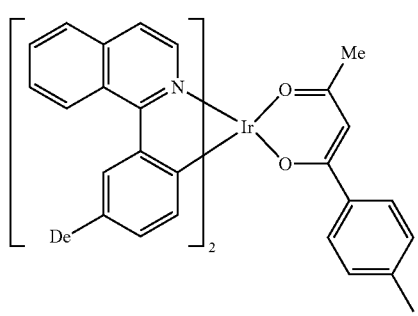
(1G-13)
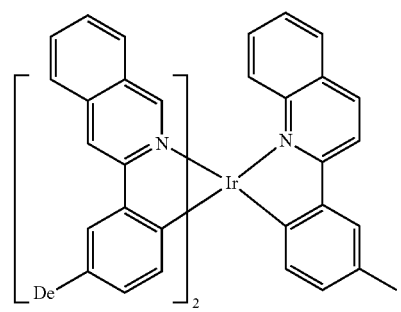
[Chemical Formula 119]
(2G-1)
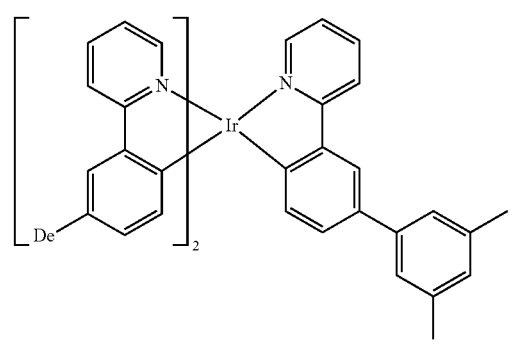
(2G-2)
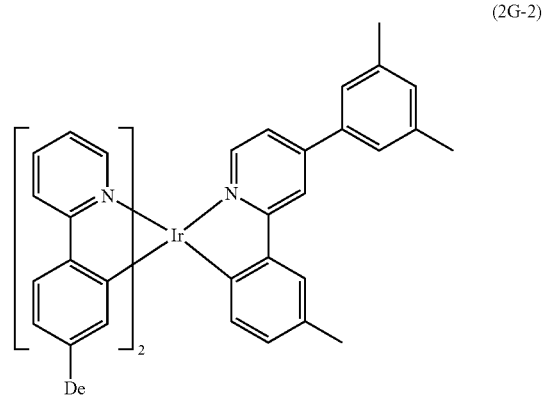
(2G-3)
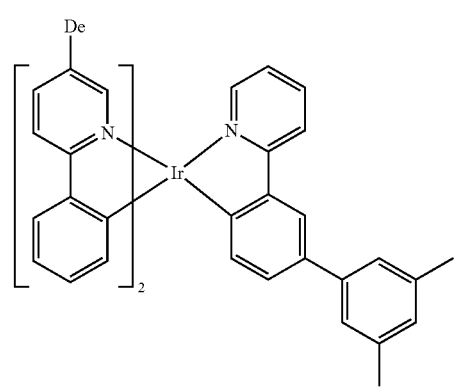

-continued
(2G-4)
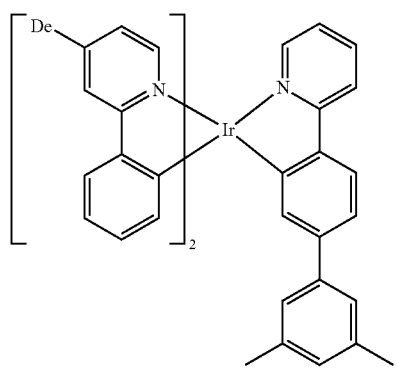
[Chemical Formula 120]
(2G-5)
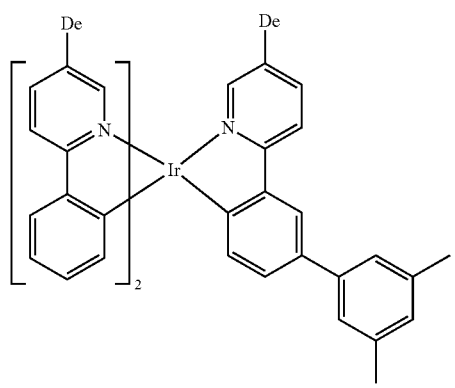
(2G-6)
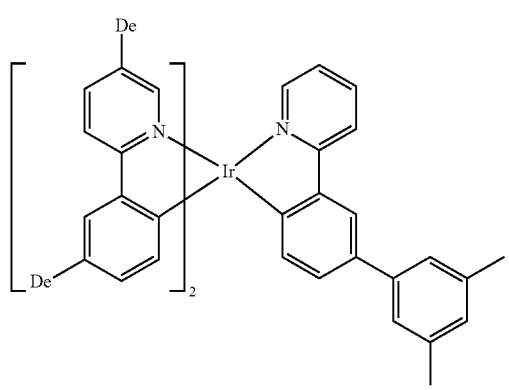
(2G-7)
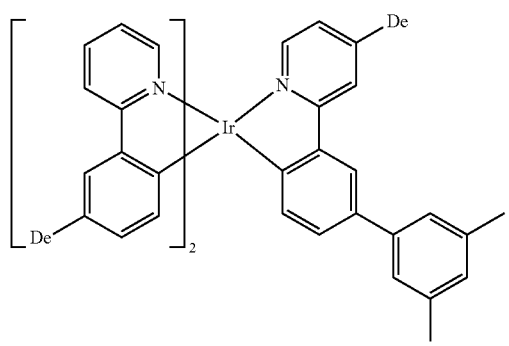
-continued
(2G-8)
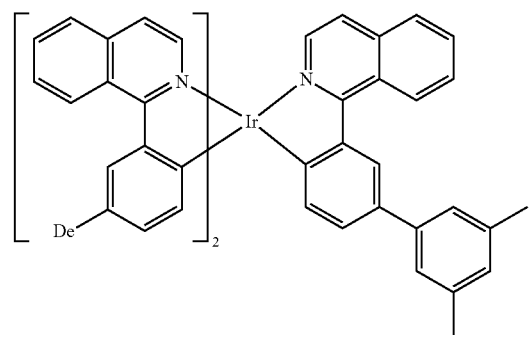
[Chemical Formula 121]
(2G-9)
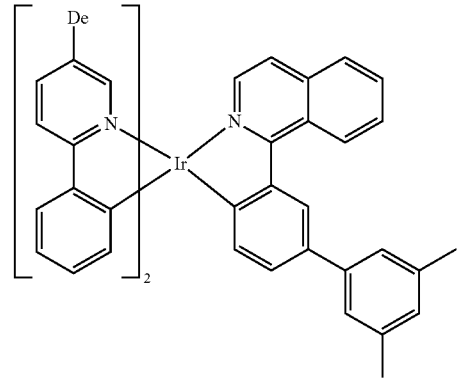
(2G-10)
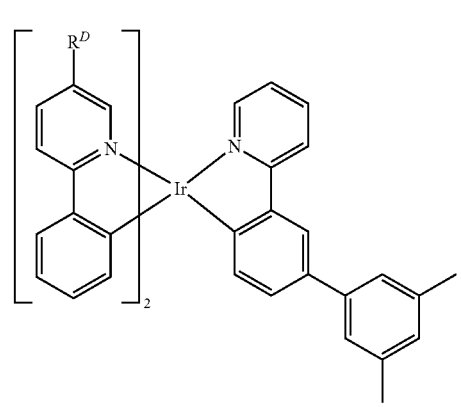
(2G-11)
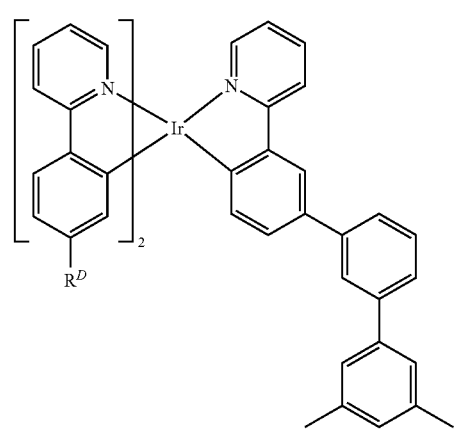

-continued
(2G-12)
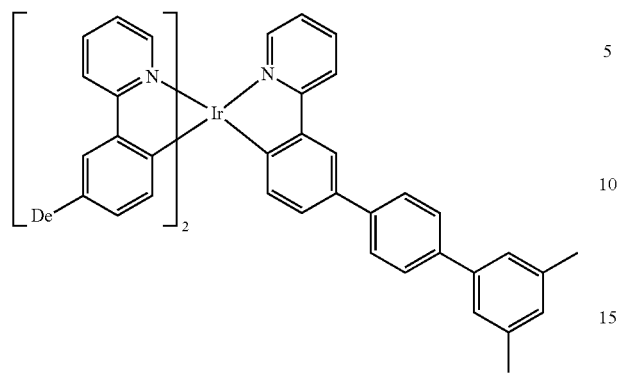
[Chemical Formula 122]
(2G-13)
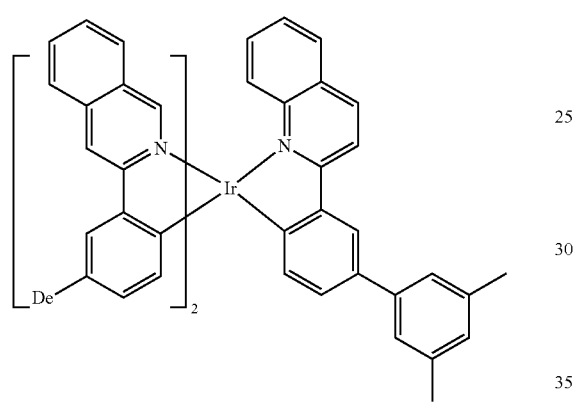
(2G-14)
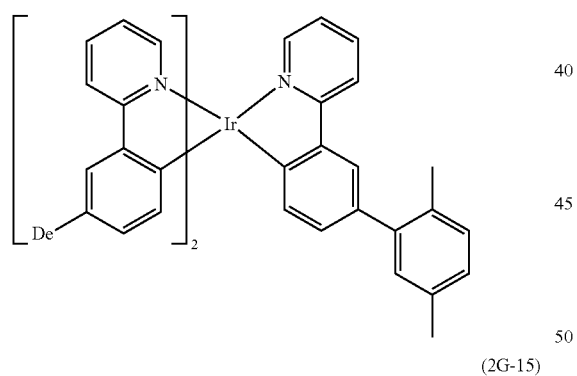
(2G-15)
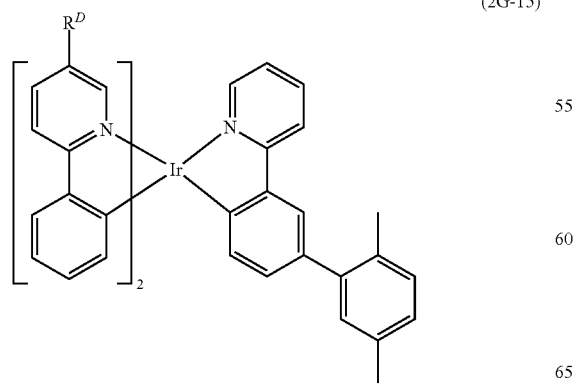
-continued
(2G-16)
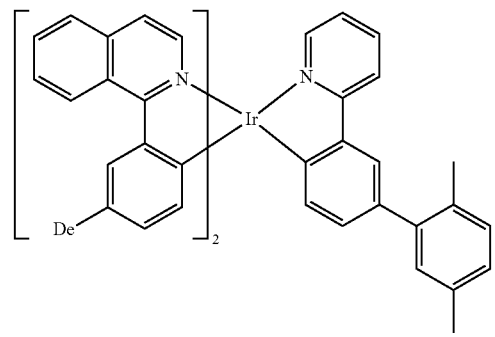
[Chemical Formula 123]
(3G-1)
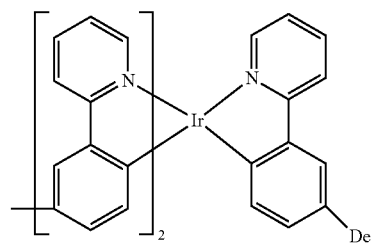
(3G-2)
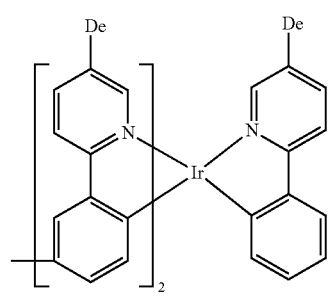
(3G-3)
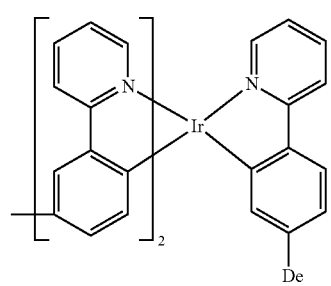
(3G-4)
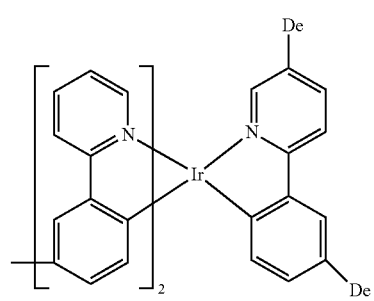

(3G-5)
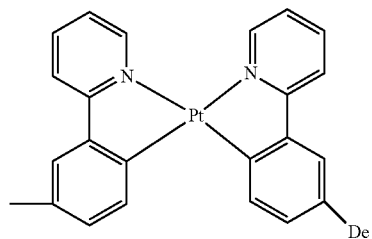
[Chemical Formula 124]
(3G-6)
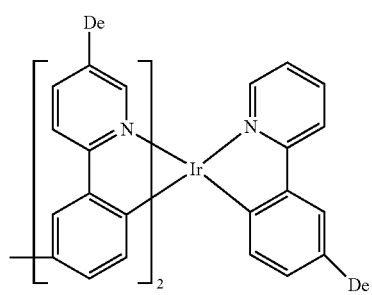
(3G-7)
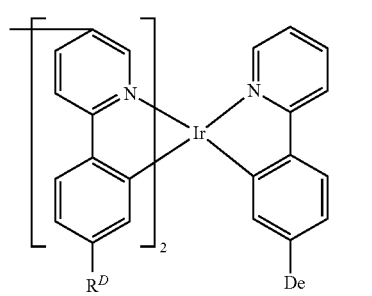
(3G-8)
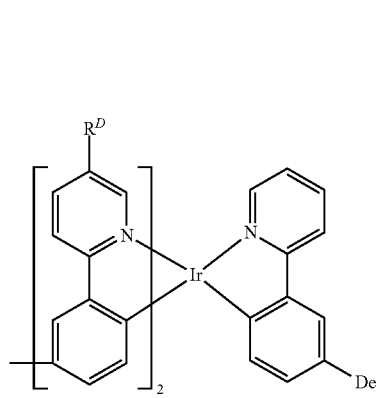
(3G-9)
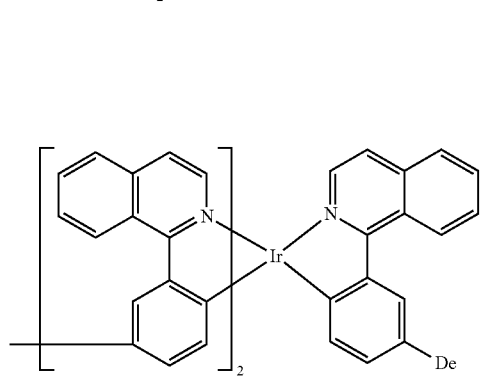
(3G-10)
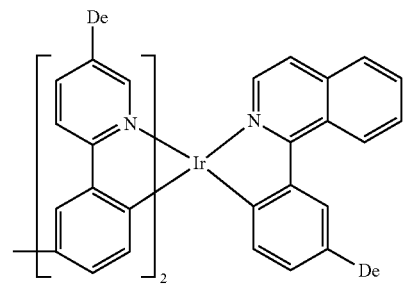
[Chemical Formula 125]
(3G-11)
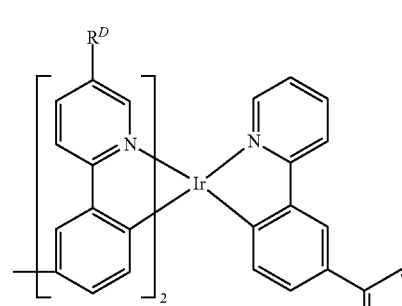
(3G-12)
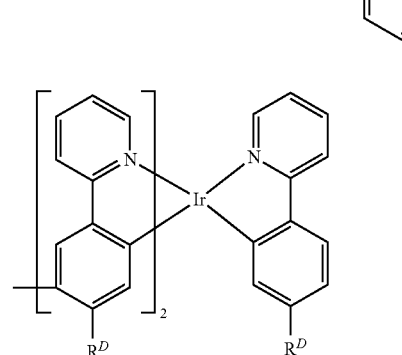
(3G-13)
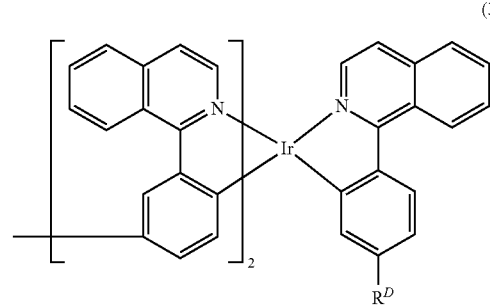
(3G-14)
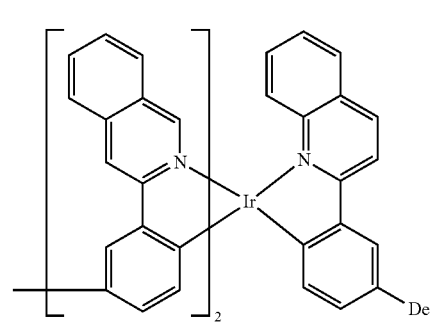

[Chemical Formula 126]
(3G-15)
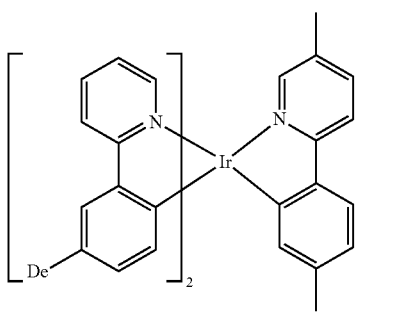
(3G-16)
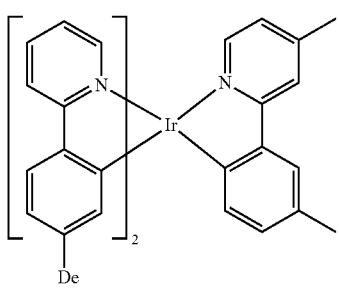
(3G-17)
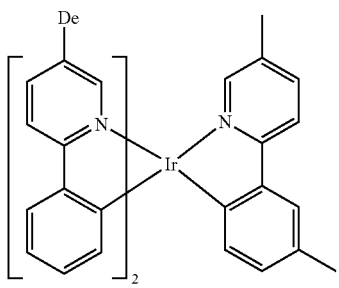
(3G-18)
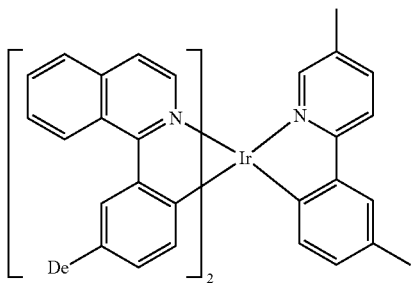
(3G-19)
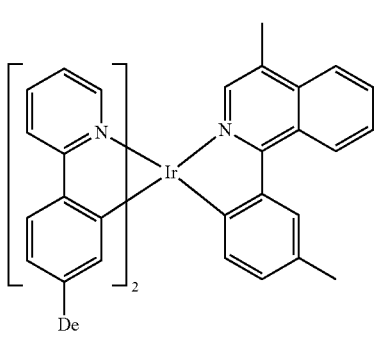
[Chemical Formula 127]
(3G-20)
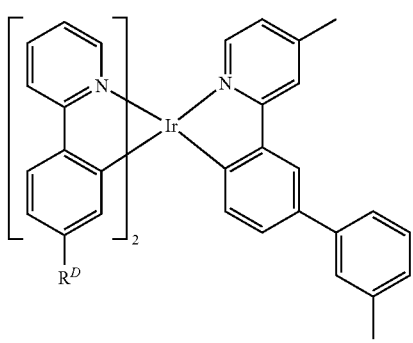
(3G-21)
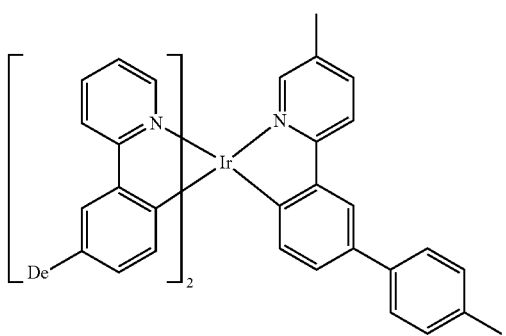
(3G-22)
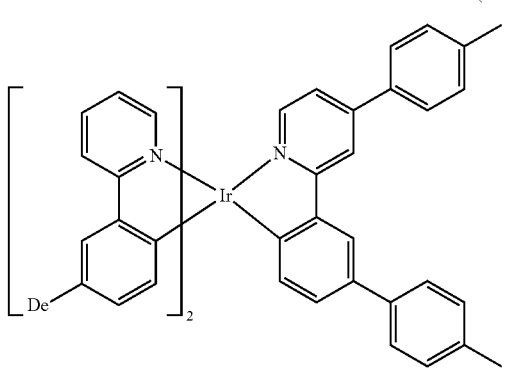
(3G-23)
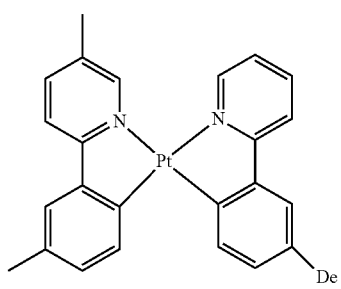

[Chemical Formula 128]

(4G-1)
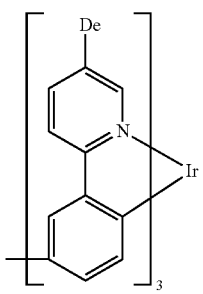

(4G-2)
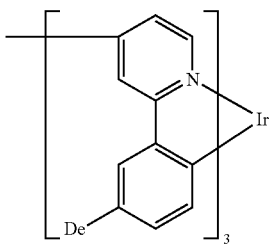

(4G-3)
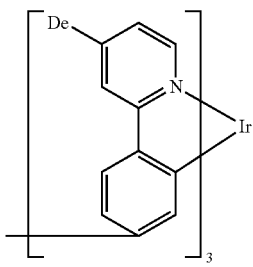

(4G-4)
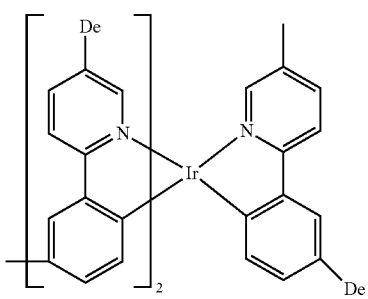

(4G-5)
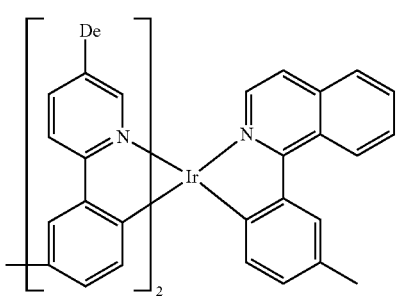

(4G-6)
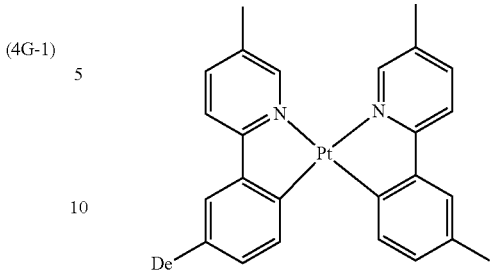

[wherein, $R^D$ represents an alkyl group, a cycloalkyl group, an alkoxy group or a cycloalkoxy group, and these groups optionally have a substituent.

De represents an aryl group or a monovalent heterocyclic group, and these groups optionally have a substituent.]

The alkyl group or the cycloalkyl group represented by $R^D$ is preferably a methyl group, an ethyl group, an isopropyl group, a tert-butyl group, a hexyl group, a 2-ethylhexyl group, a cyclohexyl group or a tert-octyl group. The alkoxy group or the cycloalkoxy group represented by $R^D$ is preferably a methoxy group, a 2-ethylhexyloxy group or a cyclohexyloxy group.

$R^D$ is preferably an alkyl group optionally having a substituent or a cycloalkyl group optionally having a substituent, more preferably an alkyl group optionally having a substituent, further preferably a methyl group, an ethyl group, an isopropyl group, a tert-butyl group, a hexyl group, a 2-ethylhexyl group or a tert-octyl group.

The examples and preferable range of the aryl group and the monovalent heterocyclic group represented by De are the same as the examples and preferable range of the aryl group and the monovalent heterocyclic group as the substituent which Ring $L^1$ and Ring $L^2$ optionally have, respectively.

De is preferably a group represented by the formulae (D-A1) to (D-A3) or the formulae (D-B1) to (D-B3), more preferably a group represented by the formulae (D-A1) to (D-A3).

In the polymer compound X, the amount of the constitutional unit Z is preferably 0.01 to 50 mol %, more preferably 0.1 to 30 mol %, further preferably 0.5 to 10 mol %, particularly preferably 1 to 5 mol %, with respect to the total amount of constitutional units contained in the polymer compound X, since the present invention is more excellent in the external quantum efficiency.

The definition, examples and preferable range of the constitutional unit represented by the formula (X) contained in the polymer compound X are the same as the definition, examples and preferable range of the constitutional unit represented by the formula (X) which the polymer host may contain described above.

In the polymer compound X, the constitutional unit represented by the formula (X) may be contained singly or in combination of two or more kinds thereof.

The amount of the constitutional unit represented by the formula (X) is preferably 0.1 to 90 mol %, more preferably 1 to 70 mol %, further preferably 10 to 50 mol %, with respect to the total amount of constitutional units contained in the polymer compound X, since hole transportability is excellent.

It is preferable that the polymer compound X further contains a constitutional unit represented by the formula (Y), since the light emitting device of the present invention is more excellent in the external quantum efficiency.

The definition, examples and preferable range of the constitutional unit represented by the formula (Y) which the polymer compound X may contain are the same as the definition, examples and preferable range of the constitutional unit represented by the formula (Y) which the polymer host may contain described above.

In the polymer compound X, the constitutional unit represented by the formula (Y) may be contained singly or in combination of two or more kinds thereof.

The amount of the constitutional unit represented by the formula (Y) in which $Ar^{Y1}$ is an arylene group is preferably 0.5 to 80 mol %, more preferably 30 to 60 mol %, with respect to the total amount of constitutional units contained in the polymer compound X, since the light emitting device of the present invention is more excellent in the external quantum efficiency.

The amount of the constitutional unit represented by the formula (Y) in which $Ar^{Y1}$ is a divalent heterocyclic group or a divalent group in which at least one arylene group and at least one divalent heterocyclic group are bonded directly is preferably 0.5 to 40 mol %, more preferably 3 to 30 mol %, with respect to the total amount of constitutional units contained in the polymer compound of the second organic layer, since the polymer compound X is excellent in charge transportability.

The polymer compound X includes, for example, polymer compounds P-15 to P-16 shown in Table 3. In the table, the "other" constitutional unit denotes a constitutional unit other than the constitutional unit Z, the constitutional unit represented by the formula (X) and the constitutional unit represented by the formula (Y).

TABLE 3

| polymer compound | constitutional unit Z p" | formula (X) q" | formula (Y) r" | other s" |
|---|---|---|---|---|
| P-15 | 0.1 to 99.9 | 0.1 to 99.9 | 0 | 0 to 30 |
| P-16 | 0.1 to 99.8 | 0.1 to 99.8 | 0.1 to 99.8 | 0 to 30 |

[in the table, p", q", r" and s" represent the mole fraction of each constitutional unit. p"+q"+r"=100 and 70≤p"+q"+r"+s"≤100.]

The polymer compound X may be any of a block copolymer, a random copolymer, an alternative copolymer or a graft copolymer, and may also be a copolymer in another form, and copolymers obtained by copolymerizing several raw material monomers are preferable.

The polystyrene-equivalent number-average molecular weight of the polymer compound X is preferably $5 \times 10^3$ to $1 \times 10^6$, more preferably $1 \times 10^4$ to $5 \times 10^5$, further preferably $1.5 \times 10^4$ to $1 \times 10^5$.

[Production Method of Polymer Compound X]

The polymer compound X can be produced by the same method as the production method of the polymer host described above. The polymer compound X can be synthesized according to a method described, for example, in Japanese Unexamined Patent Application Publication No. 2003-171659, International Publication WO 2006/003000, Japanese Unexamined Patent Application Publication No. 2010-43243, Japanese Unexamined Patent Application Publication No. 2011-105701, International Publication WO 2013/021180, Japanese Unexamined Patent Application Publication No. 2015-174931 and Japanese Unexamined Patent Application Publication No. 2015-174932, as the method other than the above-described production method.

[Third Composition]

Layer B may be a layer containing a composition containing the polymer compound X and at least one material selected from the group consisting of a hole transporting material, a hole injection material, an electron transporting material, an electron injection material, a light emitting material and an antioxidant (hereinafter, referred to as "third composition" in some cases).

The examples and preferable range of the hole transporting material, the electron transporting material, the hole injection material, the electron injection material and the light emitting material contained in the third composition are the same as the examples and preferable range of the hole transporting material, the electron transporting material, the hole injection material, the electron injection material and the light emitting material contained in the first composition. In the third composition, the contents of the hole transporting material, the electron transporting material, the hole injection material, the electron injection material and the light emitting material are each usually 1 to 1000 parts by mass, preferably 5 to 500 parts by mass, when the amount of the polymer compound X is taken as 100 parts by mass.

The examples and preferable range of the antioxidant contained in the third composition are the same as the examples and preferable range of the antioxidant contained in the first composition. In the third composition, the content of the antioxidant is usually 0.001 to 10 parts by mass, when the amount of the polymer compound X is taken as 100 parts by mass.

[Third Ink]

Layer B can be formed, for example, using a composition containing the polymer compound X and a solvent (hereinafter, referred to as "third ink" in some cases). The third ink can be suitably used in the wet method explained in the section of the first ink. The preferable range of the viscosity of the third ink is the same as the preferable range of the viscosity of the first ink. The examples and preferable range of the solvent contained in the third ink are the same as the examples and preferable range of the solvent contained in the first ink.

In the third ink, the content of the solvent is usually 1000 to 100000 parts by mass, preferably 2000 to 20000 parts by mass, when the amount of the polymer compound X is taken as 100 parts by mass.

[Cross-Linkable Polymer Compound Y]

In Layer C, the cross-linked body of the cross-linkable polymer compound Y may be contained singly or in combination of two or more kinds thereof.

The cross-linked body of the cross-linkable polymer compound Y is obtained by bringing the cross-linkable polymer compound Y into a crosslinked state by methods, conditions and the like described later.

The cross-linkable constitutional unit having a cross-linkable group may be contained singly or in combination of two or more kinds thereof, in the cross-linkable polymer compound Y.

The cross-linkable constitutional unit having a cross-linkable group is preferably a cross-linkable constitutional unit having at least one cross-linkable group selected from Group A of cross-linkable group, more preferably a constitutional unit represented by the formula (2) or a constitutional unit represented by the formula (2').

The examples and preferable range of the cross-linkable group selected from Group A of cross-linkable group in the cross-linkable constitutional unit having a cross-linkable group are the same as the examples and preferable range of the cross-linkable group selected from Group A of cross-linkable group as the cross-linkable material.

The definition, examples and preferable range of the cross-linkable constitutional unit having at least one cross-linkable group selected from Group A of cross-linkable group in the cross-linkable constitutional unit having a cross-linkable group are the same as the definition, examples and preferable range of the cross-linkable constitutional unit having at least one cross-linkable group selected from Group A of cross-linkable group in the polymer compound of the second organic layer.

The definition, examples and preferable range of the constitutional unit represented by the formula (2) in the cross-linkable constitutional unit having a cross-linkable group are the same as the definition, examples and preferable range of the constitutional unit represented by the formula (2) in the polymer compound of the second organic layer.

In the cross-linkable polymer compound Y, the constitutional unit represented by the formula (2) may be contained singly or in combination of two or more kinds thereof.

When the cross-linkable polymer compound Y contains two or more constitutional units represented by the formula (2), it is preferable that at least two of the constitutional units represented by the formula (2) are different from each other in its cross-linkable group represented by X. The preferable range of the combination of the cross-linkable groups represented by X different from each other is the same as the preferable range of the combination of the cross-linkable groups different from each other described above.

In the cross-linkable polymer compound Y, the amount of the constitutional unit represented by the formula (2) is preferably 0.5 to 90 mol %, more preferably 3 to 75 mol %, further preferably 5 to 60 mol %, with respect to the total amount of constitutional units contained in the polymer compound of the second organic layer, since the cross-linkable polymer compound Y is excellent in stability and the cross-linkable polymer compound Y is excellent in crosslinkability.

The definition, examples and preferable range of the constitutional unit represented by the formula (2') in the cross-linkable constitutional unit having a cross-linkable group are the same as the definition, examples and preferable range of the constitutional unit represented by the formula (2') in the polymer compound of the second organic layer.

In the cross-linkable polymer compound Y, the constitutional unit represented by the formula (2') may be contained singly or in combination of two or more kinds thereof.

When the cross-linkable polymer compound Y contains two or more constitutional units represented by the formula (2'), it is preferable that at least two of the constitutional units represented by the formula (2') are different from each other in its cross-linkable group represented by X'. The preferable range of the combination of the cross-linkable groups represented by X' different from each other is the same as the preferable range of the combination of the cross-linkable groups different from each other described above.

In the cross-linkable polymer compound Y, the amount of the constitutional unit represented by the formula (2') is preferably 0.5 to 50 mol %, more preferably 3 to 30 mol %, further preferably 5 to 20 mol %, with respect to the total amount of constitutional units contained in the polymer compound of the second organic layer, since the cross-linkable polymer compound Y is excellent in stability and the cross-linkable polymer compound Y is excellent in crosslinkability.

The examples and preferable range of the constitutional unit Z in the cross-linkable polymer compound Y are the same as the examples and preferable range of the constitutional unit Z in the polymer compound X.

In the cross-linkable polymer compound Y, the constitutional unit Z may be contained singly or in combination of two or more kinds thereof.

In the cross-linkable polymer compound Y, the amount of the constitutional unit Z is preferably 0.01 to 50 mol %, more preferably 0.1 to 30 mol %, further preferably 0.5 to 10 mol %, particularly preferably 1 to 5 mol %, with respect to the total amount of constitutional units contained in the cross-linkable polymer compound Y, since the present invention is more excellent in the external quantum efficiency.

The definition, examples and preferable range of the constitutional unit represented by the formula (X) contained in the cross-linkable polymer compound Y are the same as the definition, examples and preferable range of the constitutional unit represented by the formula (X) which the polymer host may contain described above.

In the cross-linkable polymer compound Y, the constitutional unit represented by the formula (X) may be contained singly or in combination of two or more kinds thereof.

The amount of the constitutional unit represented by the formula (X) is preferably 0.1 to 90 mol %, more preferably 1 to 70 mol %, further preferably 10 to 50 mol %, with respect to the total amount of constitutional units contained in the cross-linkable polymer compound Y, since hole transportability is excellent.

It is preferable that the cross-linkable polymer compound Y further contains a constitutional unit represented by the formula (Y), since the light emitting device of the present invention is more excellent in the external quantum efficiency.

The definition, examples and preferable range of the constitutional unit represented by the formula (Y) which the cross-linkable polymer compound Y may contain are the same as the definition, examples and preferable range of the constitutional unit represented by the formula (Y) which the polymer host may contain described above.

In the cross-linkable polymer compound Y, the constitutional unit represented by the formula (Y) may be contained singly or in combination of two or more kinds thereof.

The amount of the constitutional unit represented by the formula (Y) in which $Ar^{Y1}$ is an arylene group is preferably 0.5 to 80 mol %, more preferably 30 to 60 mol %, with respect to the total amount of constitutional units contained in the cross-linkable polymer compound Y, since the light emitting device of the present invention is more excellent in the external quantum efficiency.

The amount of the constitutional unit represented by the formula (Y) in which $Ar^{Y1}$ is a divalent heterocyclic group or a divalent group in which at least one arylene group and at least one divalent heterocyclic group are bonded directly is preferably 0.5 to 40 mol %, more preferably 3 to 30 mol %, with respect to the total amount of constitutional units contained in the cross-linkable polymer compound Y, since the cross-linkable polymer compound Y is excellent in charge transportability.

The cross-linkable polymer compound Y includes, for example, polymer compounds P-17 to P-22 shown in Table 4. In the table, the "other" constitutional unit denotes a constitutional unit other than the constitutional unit Z, the cross-linkable constitutional unit having a cross-linkable group, the constitutional unit represented by the formula (X) and the constitutional unit represented by the formula (Y).

TABLE 4 constitutional unit and mole fraction thereof

| polymer compound | constitutional unit Z $p'''$ | formula (2) $q'''$ | formula (2') $r'''$ | formula (X) $s'''$ | formula (Y) $t'''$ | other $u'''$ |
|---|---|---|---|---|---|---|
| P-17 | 0.1 to 99.8 | 0.1 to 99.8 | 0 | 0.1 to 99.8 | 0 | 0 to 30 |
| P-18 | 0.1 to 99.8 | 0 | 0.1 to 99.8 | 0.1 to 99.8 | 0 | 0 to 30 |
| P-19 | 0.1 to 99.7 | 0.1 to 99.7 | 0.1 to 99.7 | 0.1 to 99.7 | 0 | 0 to 30 |
| P-20 | 0.1 to 99.7 | 0.1 to 99.7 | 0 | 0.1 to 99.7 | 0.1 to 99.7 | 0 to 30 |
| P-21 | 0.1 to 99.7 | 0 | 0.1 to 99.7 | 0.1 to 99.7 | 0.1 to 99.7 | 0 to 30 |
| P-22 | 0.1 to 99.6 | 0.1 to 99.6 | 0.1 to 99.6 | 0.1 to 99.6 | 0.1 to 99.6 | 0 to 30 |

[in the table, $p'''$, $q'''$, $r'''$, $s'''$, $t'''$ and $u'''$ represent the mole fraction of each constitutional unit, $p'''+q'''+r'''+s'''+t'''+u'''=100$ and $70 \leq p'''+q'''+r'''+s'''+t''' \leq 100$.]

The cross-linkable polymer compound Y may be any of a block copolymer, a random copolymer, an alternative copolymer or a graft copolymer, and may also be a copolymer in another form, and copolymers obtained by copolymerizing several raw material monomers are preferable.

The polystyrene-equivalent number-average molecular weight of the cross-linkable polymer compound Y is preferably $5 \times 10^3$ to $1 \times 10^6$, more preferably $1 \times 10^4$ to $5 \times 10^5$, further preferably $1.5 \times 10^4$ to $1 \times 10^5$.

[Production Method of Cross-Linkable Polymer Compound Y]

The cross-linkable polymer compound Y can be produced by the same method as the production method of the polymer compound X described above.

[Fourth Composition]

The layer containing the cross-linked body of the cross-linkable polymer compound Y may be a layer containing a composition containing the cross-linked body of the cross-linkable polymer compound Y and at least one material selected from the group consisting of a hole transporting material, a hole injection material, an electron transporting material, an electron injection material, a light emitting material and an antioxidant (hereinafter, referred to as "fourth composition" in some cases).

The examples and preferable range of the hole transporting material, the electron transporting material, the hole injection material, the electron injection material and the light emitting material contained in the fourth composition are the same as the examples and preferable range of the hole transporting material, the electron transporting material, the hole injection material, the electron injection material and the light emitting material contained in the first composition. In the fourth composition, the contents of the hole transporting material, the electron transporting material, the hole injection material, the electron injection material and the light emitting material are each usually 1 to 1000 parts by mass, preferably 5 to 500 parts by mass, when the amount of the cross-linked body of the cross-linkable polymer compound Y is taken as 100 parts by mass.

The examples and preferable range of the antioxidant contained in the fourth composition are the same as the examples and preferable range of the antioxidant contained in the first composition. In the fourth composition, the content of the antioxidant is usually 0.001 to 10 parts by mass, when the amount of the cross-linked body of the cross-linkable polymer compound Y is taken as 100 parts by mass.

[Fourth Ink]

Layer C can be formed, for example, using a composition containing the cross-linkable polymer compound Y and a solvent (hereinafter, referred to as "fourth ink" in some cases). The fourth ink can be suitably used in the wet method explained in the section of the first ink. The preferable range of the viscosity of the fourth ink is the same as the preferable range of the viscosity of the first ink. The examples and preferable range of the solvent contained in the fourth ink are the same as the examples and preferable range of the solvent contained in the first ink.

In the fourth ink, the content of the solvent is usually 1000 to 100000 parts by mass, preferably 2000 to 20000 parts by mass, when the amount of the cross-linkable polymer compound Y is taken as 100 parts by mass.

[Layer Constitution of Light Emitting Device]

The light emitting device of the present invention may have a layer other than an anode, a cathode, a first organic layer and a second organic layer.

In the light emitting device of the present invention, the first organic layer is usually a light emitting layer (hereinafter, referred to as "first light emitting layer").

In the light emitting device of the present invention, the second organic layer is usually a hole transporting layer, a light emitting layer (that is, a light emitting layer other than the first light emitting layer, hereinafter, referred to as "second light emitting layer") or an electron transporting layer, preferably a hole transporting layer or a second light emitting layer.

In the light emitting device of the present invention, the emission color can be adjusted and the emission color can also be adjusted to white, by controlling the ratio of the content of a fluorescent low-molecular weight compound in the first organic layer to the content of a metal complex represented by the formula (1), a polymer compound X or a cross-linked body of a cross-linkable polymer compound Y in the second organic layer.

The emission color of the light emitting device can be confirmed by measuring the luminescent chromaticity of the light emitting device and determining the chromaticity coordinate (CIE chromaticity coordinate) thereof. In the white emission color, X of the chromaticity coordinate is within a range of 0.20 to 0.55 and Y of the chromaticity coordinate is within a range of 0.20 to 0.55.

The maximum peak wavelength of the emission spectrum of at least one of fluorescent low-molecular weight compounds contained in the first organic layer is preferably 380 nm or more and 495 nm or less, more preferably 400 nm or more and 485 nm or less, further preferably 420 nm or more and 475 nm or less, from the standpoint of adjusting the emission color of the light emitting device of the present invention (particularly, the standpoint of adjusting the emission color to white. Hereinafter, referred to simply as "similar standpoint").

From a similar standpoint, when two or more fluorescent low-molecular weight compounds are contained in the first organic layer, it is preferable that the maximum peak wavelengths of the emission spectra of at least two of the fluorescent low-molecular weight compounds contained in the first organic layer was are different from each other, and its difference is preferably 20 to 200 nm, more preferably 40 to 120 nm. The combination of the maximum peak wavelengths of the emission spectra of the at least two fluorescent low-molecular weight compounds is preferably a combination in which one is 380 nm or more and less than 495 nm and the other is 495 nm or more and 750 nm or less, more preferably a combination in which one is 400 nm or more and 485 nm or less and the other is 495 nm or more and 640 nm or less, further preferably a combination in which one is 420 nm or more and 475 nm or less and the other is 495 nm or more and 570 nm or less.

From a similar standpoint, the maximum peak wavelength of the emission spectrum of at least one of a metal complex represented by the formula (1) used for formation of Layer A, a metal complex corresponding to the residue of a metal complex represented by the formula (1) contained in the polymer compound X used for formation of Layer B and a metal complex corresponding to the residue of a metal complex represented by the formula (1) contained in the cross-linkable polymer compound Y used for formation of Layer C is preferably 495 nm or more and 750 nm or less, more preferably 590 nm or more and 640 nm or less.

From a similar standpoint, the emission spectrum of at least one of the polymer compound X used for formation of Layer B and the cross-linkable polymer compound Y used for formation of Layer C preferably has the maximum wavelength at 495 nm or more and 750 nm or less, more preferably has a maximum wavelength at 590 nm or more and 640 nm or less.

From a similar standpoint, it is preferable that the first organic layer further contains a light emitting material having a maximum wavelength of the emission spectrum at 380 nm or more and 750 nm or less (hereinafter, referred to as "light emitting material L" in some cases), different from the fluorescent low-molecular weight compound.

The examples and preferable range of the light emitting material L are the same as the examples and preferable range of the light emitting material which the first composition may contain.

From a similar standpoint, the emission spectrum of the light emitting material L preferably has a maximum wavelength at 450 nm or more and 620 nm or less, more preferably has a maximum wavelength at 495 nm or more and 570 nm or less.

From a similar standpoint, when the light emitting material Lisa metal complex represented by the formula (1), the maximum peak wavelength of the emission spectrum of the light emitting material L is preferably 450 nm or more and 620 nm or less, more preferably 495 nm or more and 570 nm or less.

From a similar standpoint, the maximum peak wavelength of the emission spectrum of the metal complex corresponding to the residue of a metal complex represented by the formula (1) contained in the polymer compound X which can be the light emitting material L is preferably 450 nm or more and 620 nm or less, more preferably 495 nm or more and 570 nm or less.

From a similar standpoint, the maximum peak wavelength of the emission spectrum of the metal complex corresponding to the residue of a metal complex represented by the formula (1) contained in the cross-linkable polymer compound Y which can be the light emitting material L is preferably 450 nm or more and 620 nm or less, more preferably 495 nm or more and 570 nm or less.

From a similar standpoint, when the second organic layer is Layer A, it is preferable that Layer A is a layer containing two or more metal complexes represented by the formula (1). In this case, it is preferable that the maximum peak wavelengths of the emission spectra of the at least two metal complexes represented by the formula (1) contained in Layer A are different from each other, and its difference is preferably 20 to 200 nm, more preferably 40 to 120 nm. The combination of the maximum peak wavelengths of the emission spectra of the at least two metal complexes represented by the formula (1) is preferably a combination in which one is 495 nm or more and 570 nm or less and the other is 590 nm or more and 640 nm or less.

From a similar standpoint, when the second organic layer is Layer B, Layer B is preferably a layer containing a metal complex represented by the formula (1) and the polymer compound X, a layer containing two or more polymer compounds X or a layer containing the polymer compound X containing two or more metal complexes represented by the formula (1), more preferably a layer containing a metal complex represented by the formula (1) and the polymer compound X.

From a similar standpoint, when Layer B is the layer containing a metal complex represented by the formula (1) and the polymer compound X, it is preferable that the maximum peak wavelength of the emission spectrum of the at least one metal complex represented by the formula (1) contained in Layer B and the maximum peak wavelength of the emission spectrum of the metal complex corresponding to the residue of a metal complex represented by the formula (1) contained in the at least one polymer compound X contained in Layer B are different, and its difference is preferably 20 to 200 nm, more preferably 40 to 120 nm. The combination of the maximum peak wavelength of the emission spectrum of the at least one metal complex represented by the formula (1) contained in Layer B with the maximum peak wavelength of the emission spectrum of the metal complex corresponding to the residue of a metal complex represented by the formula (1) contained in the at least one polymer compound X contained in Layer B is preferably a combination in which one is 495 nm or more and 570 nm or less and the other is 590 nm or more and 640 nm or less.

From a similar standpoint, when Layer B is the layer containing two or more polymer compounds X, it is preferable that the maximum peak wavelengths of the emission spectra of metal complexes corresponding to the residues of metal complexes represented by the formula (1) contained in the at least two polymer compounds X contained in Layer B are different, and its difference is preferably 20 to 200 nm, more preferably 40 to 120 nm. The combination of the maximum peak wavelengths of the emission spectra of metal complexes corresponding to the residues of metal complexes represented by the formula (1) contained the at least two polymer compounds X is preferably a combination in which one is 495 nm or more and 570 nm or less and the other is 590 nm or more and 640 nm or less.

From a similar standpoint, when Layer B is the layer containing the polymer compound X containing two or more metal complexes represented by the formula (1), it is preferable that the maximum peak wavelengths of the emission spectra of metal complexes corresponding to the residues of the at least two metal complexes represented by the formula (1) contained in the polymer compound X contained in Layer B are different, and its difference is preferably 20 to 200 nm, more preferably 40 to 120 nm. The combination of the maximum peak wavelengths of the emission spectra of metal complexes corresponding to the residues of the at least two metal complexes represented by the formula (1) contained in the polymer compound X is preferably a combination in which one is 495 nm or more and 570 nm or less and the other is 590 nm or more and 640 nm or less.

From a similar standpoint, when the second organic layer is Layer C, Layer C is preferably a layer containing a metal complex represented by the formula (1) and a cross-linked body of the cross-linkable polymer compound Y, a layer containing cross-linked bodies of the two or more cross-linkable polymer compounds Y or a layer containing a cross-linked body of the cross-linkable polymer compound Y containing two or more metal complexes represented by the formula (1), more preferably a layer containing a metal complex represented by the formula (1) and a cross-linked body of the cross-linkable polymer compound Y.

From a similar standpoint, when Layer C is the layer containing a metal complex represented by the formula (1) and a cross-linked body of the cross-linkable polymer compound Y, it is preferable that the maximum peak wavelength of the emission spectrum of the at least one metal complex represented by the formula (1) contained in Layer C and the maximum peak wavelength of the emission spectrum of the metal complex corresponding to the residue of a metal complex represented by the formula (1) contained in the at least one cross-linked body of the cross-linkable polymer compound Y contained in Layer C are different, and its difference is preferably 20 to 200 nm, more preferably 40 to 120 nm. The combination of the maximum peak wavelength of the emission spectrum of the at least one metal complex represented by the formula (1) contained in Layer C with the maximum peak wavelength of the emission spectrum of the metal complex corresponding to the residue of a metal complex represented by the formula (1) contained in the at least one cross-linked body of the cross-linkable polymer compound Y contained in Layer C is preferably a combination in which one is 495 nm or more and 570 nm or less and the other is 590 nm or more and 640 nm or less.

From a similar standpoint, when Layer C is the layer containing cross-linked bodies of the two or more cross-linkable polymer compounds Y, it is preferable that the maximum peak wavelengths of the emission spectra of metal complexes corresponding to the residues of metal complexes represented by the formula (1) contained in the cross-linked bodies of the at least two cross-linkable polymer compounds Y contained in Layer C are different, and its difference is preferably 20 to 200 nm, more preferably 40 to 120 nm. The combination of the maximum peak wavelengths of the emission spectra of metal complexes corresponding to the residues of metal complexes represented by the formula (1) contained in the at least two cross-linkable polymer compounds Y is preferably a combination in which one is 495 nm or more and 570 nm or less and the other is 590 nm or more and 640 nm or less.

From a similar standpoint, when Layer C is the layer containing a cross-linked body of the cross-linkable polymer compound Y containing two or more metal complexes represented by the formula (1), it is preferable that the maximum peak wavelengths of the emission spectra of metal complexes corresponding to the residues of the at least two metal complexes represented by the formula (1) contained in the cross-linked body of the cross-linkable polymer compound Y contained in Layer C are different, and its difference is preferably 20 to 200 nm, more preferably 40 to 120 nm. The combination of the maximum peak wavelengths of the emission spectra of metal complexes corresponding to the residues of the at least two metal complexes represented by the formula (1) contained in the cross-linked body of the cross-linkable polymer compound Y is preferably a combination in which one is 495 nm or more and 570 nm or less and the other is 590 nm or more and 640 nm or less.

The maximum peak wavelength and the maximum wavelength of the emission spectrum of a compound and a metal complex can be evaluated by dissolving a compound or a metal complex in an organic solvent such as xylene, toluene, chloroform, tetrahydrofuran and the like to prepare a dilute solution ($1 \times 10^{-6}$ to $1 \times 10 \times 3\%$ by mass), and measuring the PL spectrum of the dilute solution at room temperature. The organic solvent for dissolving a compound or a metal complex is preferably toluene or xylene.

In the light emitting device of the present invention, it is preferable that the first organic layer and the second organic layer are adjacent, since the light emitting device of the present invention is more excellent in the external quantum efficiency. In the light emitting device of the present invention, the second organic layer is preferably a layer disposed between the anode and the first organic layer, more preferably a hole transporting layer or a second light emitting layer disposed between the anode and the first organic layer, since the light emitting device of the present invention is more excellent in the external quantum efficiency.

In the light emitting device of the present invention, when the second organic layer is a hole transporting layer disposed between the anode and the first organic layer, it is preferable that a hole injection layer is further disposed between the anode and the second organic layer, since the light emitting device of the present invention is more excellent in the external quantum efficiency. Further, when the second organic layer is a hole transporting layer disposed between the anode and the first organic layer, it is preferable that at least one of an electron injection layer and an electron transporting layer is further disposed between the cathode and the first organic layer, since the light emitting device of the present invention is more excellent in the external quantum efficiency.

In the light emitting device of the present invention, when the second organic layer is a second light emitting layer disposed between the anode and the first organic layer, it is preferable that at least one of a hole injection layer and a hole transporting layer is further disposed between the anode and the second organic layer, since the light emitting device of the present invention is more excellent in the external quantum efficiency. Further, when the second organic layer is a second light emitting layer disposed between the anode and the first organic layer, it is preferable that at least one of an electron injection layer and an electron transporting layer is further disposed between the cathode and the first organic layer, since the light emitting device of the present invention is more excellent in the external quantum efficiency.

In the light emitting device of the present invention, when the second organic layer is a second light emitting layer disposed between the cathode and the first organic layer, it is preferable that at least one of a hole injection layer and a hole transporting layer is further disposed between the anode and the first organic layer, since the light emitting device of the present invention is more excellent in the external quantum efficiency. Further, when the second organic layer is a second light emitting layer disposed between the cathode and the first organic layer, it is preferable at least one of an electron injection layer and an electron transporting layer is further disposed between the cathode and the second organic layer, since the light emitting device of the present invention is more excellent in the external quantum efficiency.

In the light emitting device of the present invention, when the second organic layer is an electron transporting layer disposed between the cathode and the first organic layer, it is preferable that at least one of a hole injection layer and a hole transporting layer is further disposed between the anode and the first organic layer, since the light emitting device of the present invention is more excellent in the external quantum efficiency. Further, when the second organic layer is an electron transporting layer disposed between the cathode and the first organic layer, it is preferable that an electron injection layer is further disposed between the cathode and the second organic layer, since the light emitting device of the present invention is more excellent in the external quantum efficiency.

The specific layer constitution of the light emitting device of the present invention includes, for example, layer constitutions represented by the following (D1) to (D15). The light emitting device of the present invention usually has a substrate, and, an anode may be first laminated on the substrate or a cathode may be first laminated on the substrate.

(D1) anode/second light emitting layer (second organic layer)/first light emitting layer (first organic layer)/cathode (D2) anode/hole transporting layer (second organic layer)/first light emitting layer (first organic layer)/cathode (D3) anode/hole injection layer/second light emitting layer (second organic layer)/first light emitting layer (first organic layer)/cathode (D4) anode/hole injection layer/second light emitting layer (second organic layer)/first light emitting layer (first organic layer)/electron transporting layer/cathode (D5) anode/hole injection layer/second light emitting layer (second organic layer)/first light emitting layer (first organic layer)/electron injection layer/cathode (D6) anode/hole injection layer/second light emitting layer (second organic layer)/first light emitting layer (first organic layer)/electron transporting layer/electron injection layer/cathode (D7) anode/hole injection layer/hole transporting layer (second organic layer)/first light emitting layer (first organic layer)/cathode (D8) anode/hole injection layer/hole transporting layer (second organic layer)/first light emitting layer (first organic layer)/electron transporting layer/cathode (D9) anode/hole injection layer/hole transporting layer (second organic layer)/first light emitting layer (first organic layer)/electron injection layer/cathode (D10) anode/hole injection layer/hole transporting layer (second organic layer)/first light emitting layer (first organic layer)/electron transporting layer/electron injection layer/cathode (D11) anode/hole injection layer/hole transporting layer/second light emitting layer (second organic layer)/first light emitting layer (first organic layer)/electron transporting layer/electron injection layer/cathode (D12) anode/hole injection layer/hole transporting layer (second organic layer)/first light emitting layer (first organic layer)/second light emitting layer/electron transporting layer/electron injection layer/cathode (D13) anode/hole injection layer/hole transporting layer/first light emitting layer (first organic layer)/second light emitting layer (second organic layer)/electron transporting layer/electron injection layer/cathode (D14) anode/hole injection layer/hole transporting layer/first light emitting layer (first organic layer)/electron transporting layer (second organic layer)/electron injection layer/cathode (D15) anode/hole injection layer/hole transporting layer (second organic layer)/second light emitting layer/first light emitting layer (first organic layer)/electron transporting layer/electron injection layer/cathode In the above-described (D1) to (D15), "/" means adjacent lamination of layers before and after that. For example, "second light emitting layer (second organic layer)/first light emitting layer (first organic layer)" means adjacent lamination of a second light emitting layer (second organic layer) and a first light emitting layer (first organic layer).

Layer constitutions represented by (D3) to (D12) are preferable and layer constitutions represented by (D3) to (D10) are more preferable, since the light emitting device of the present invention is more excellent in the external quantum efficiency.

In the light emitting device of the present invention, two or more layers of each of an anode, a hole injection layer, a hole transporting layer, a second light emitting layer, an electron transporting layer, an electron injection layer and a cathode may be provided, if necessary.

When a plurality of anodes, hole injection layers, hole transporting layers, second light emitting layers, electron transporting layers, electron injection layers and cathodes are present, they may be the same or different at each occurrence.

The thicknesses of an anode, a hole injection layer, a hole transporting layer, a first organic layer, a second organic layer, a second light emitting layer, an electron transporting layer, an electron injection layer and a cathode are each usually 1 nm to 1 μm, preferably 2 nm to 500 nm, further preferably 5 nm to 150 nm.

In the light emitting device of the present invention, the order, number and thickness of layers to be laminated may be regulated in consideration of the light emission efficiency and device life of the light emitting device.

[Second Light Emitting Layer]

The second light emitting layer is a layer containing a second organic layer or a light emitting material. When the second light emitting layer is a layer containing a light emitting material, the light emitting material contained in the second light emitting layer includes, for example, light emitting materials which the above-described first composition may contain. The light emitting material to be contained in the second light emitting layer may be contained singly or in combination of two or more kinds thereof.

When the light emitting device of the present invention has a second light emitting layer and when a hole transporting layer described later and an electron transporting layer described later are not second organic layers, it is preferable that the second light emitting layer is the second organic layer.

[Hole Transporting Layer]

The hole transporting layer is layer containing a second organic layer or a hole transporting material. When the hole transporting layer is a layer containing a hole transporting material, the hole transporting material includes, for example, hole transporting materials which the above-described first composition may contain. The hole transporting material to be contained in the hole transporting layer may be contained singly or in combination of two or more kinds thereof.

When the light emitting device of the present invention has a hole transporting layer and when a second light emitting layer described above and an electron transporting layer described later are not second organic layers, it is preferable that the hole transporting layer is the second organic layer.

[Electron Transporting Layer]

The electron transporting layer is a layer containing a second organic layer or an electron transporting material, preferably a layer containing an electron transporting material. When the electron transporting layer is a layer containing an electron transporting material, the electron transporting material contained in the electron transporting layer includes, for example, electron transporting materials which the above-described first composition may contain. The electron transporting material to be contained in the electron transporting layer may be contained singly or in combination of two or more kinds thereof.

[Hole Injection Layer and Electron Injection Layer]

The hole injection layer is a layer containing a hole injection material. The hole injection material contained in the hole injection layer includes, for example, hole injection materials which the above-described first composition may contain. The hole injection material to be contained in the hole injection layer may be contained singly or in combination of two or more kinds thereof.

The electron injection layer is a layer containing an electron injection material. The electron injection material contained in the electron injection layer includes, for example, electron injection materials which the above-described first composition may contain. The electron injection material to be contained in the electron injection layer may be contained singly or in combination of two or more kinds thereof.

[Substrate/Electrode]

The substrate in the light emitting device may advantageously be a substrate on which an electrode can be formed and which does not chemically change when forming an organic layer, and it is a substrate made of a material such as, for example, glass, plastic, silicon and the like. When an opaque substrate is used, it is preferable that the electrode farthest from the substrate is transparent or semi-transparent.

The anode material includes, for example, electrically conductive metal oxides and semi-transparent metals, preferably, indium oxide, zinc oxide, tin oxide; electrically conductive compounds such as indium•tin•oxide (ITO), indium•zinc•oxide and the like; a composite of Ag, Pd and Cu (APC); NESA, gold, platinum, silver and copper.

The cathode material includes, for example, metals such as lithium, sodium, potassium, rubidium, cesium, beryllium, magnesium, calcium, strontium, barium, aluminum, zinc, indium and the like; alloys composed of two or more of them; alloys composed of one of them and one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

In the light emitting device of the present invention, at least one of the anode and the cathode is usually transparent or semi-transparent, and it is preferable that the anode is transparent or semi-transparent.

The method of forming the anode and the cathode includes, for example, a vacuum vapor deposition method, a sputtering method, an ion plating method, a plating method and a laminate method.

[Production Method of Light Emitting Device]

The method of forming the first organic layer, the second organic layer and other layers in the light emitting device of the present invention includes, for example, a vacuum vapor deposition method from powder and a method by film formation from solution or melted state when a low molecular weight compound is used, and includes, for example, a method by film formation from solution or melted state when a polymer compound is used.

The first organic layer, the second organic layer and other layers can be formed by a wet method such as a spin coat method, an inkjet printing method and the like using various inks and inks containing various materials described above. The first organic layer and the second organic layer may also be formed by a dry method such as a vacuum vapor deposition method and the like.

When the first organic layer is formed by a wet method, it is preferable to use the first ink.

When the second organic layer is formed by a wet method, it is preferable to use the second ink, the third ink or the fourth ink.

When the second organic layer (particularly, Layer A) is formed by a wet method using the second ink, the cross-linkable material contained in the second organic layer can be crosslinked by performing heating or irradiation (preferably, heating) after formation of the second organic layer. When the cross-linkable material is contained in the second organic layer under cross-linked state (a cross-linked body of the cross-linkable material), the second organic layer is substantially insolubilized in a solvent. Hence, the second organic layer can be suitably used for lamination of the light emitting device.

When the second organic layer (particularly, Layer C) is formed by a wet method using the fourth ink, the cross-linkable polymer compound Y contained in the second organic layer can be crosslinked by performing heating or irradiation (preferably, heating) after formation of the second organic layer. When the cross-linkable polymer compound Y is contained in the second organic layer in cross-linked state (a cross-linked body of the cross-linkable polymer compound Y), the second organic layer is substantially insolubilized in a solvent. Hence, the second organic layer can be suitably used for lamination of the light emitting device.

The heating temperature of the second organic layer is usually 25° C. to 300° C., preferably 50° C. to 250° C., more preferably 150° C. to 200° C., further preferably 170° C. to 190° C. The heating time of the second organic layer is usually 0.1 minute to 1000 minutes, preferably 0.5 minutes to 500 minutes, more preferably 1 minute to 120 minutes, further preferably 30 minutes to 90 minutes.

The light used for irradiation is, for example, ultraviolet light, near ultraviolet light or visible light.

The method for analyzing components contained in the first organic layer or the second organic layer includes, for example, chemical separation and analysis methods such as extraction and the like, instrumental analysis methods such as infrared spectroscopy (IR), nuclear magnetic resonance spectroscopy (NMR), mass spectrometry (MS) and the like, and analysis methods combining chemical separation and analysis methods and instrumental analysis methods.

By subjecting the first organic layer or second organic layer to solid-liquid extraction using an organic solvent such as toluene, xylene, chloroform, tetrahydrofuran and the like, it can be separated into components substantially insoluble in an organic solvent (insoluble components) and components soluble in an organic solvent (soluble components). The insoluble component can be analyzed by infrared spectroscopy or nuclear magnetic resonance spectroscopy and the soluble component can be analyzed by nuclear magnetic resonance spectroscopy or mass spectrometry.

[Application of Light Emitting Device]

For obtaining planar light emission using a light emitting device, a planar anode and a planar cathode may advantageously be disposed so as to overlap. For obtaining patterned light emission, there are a method of disposing a mask having a patterned window on the surface of a planar light emitting device, a method of forming a layer intending a no-emission portion extremely thick thereby attaining substantially no-emission and a method of forming an anode or a cathode, or both electrodes, in the form of pattern. By forming a pattern by any of these methods and by disposing some electrodes so that independent ON/OFF is possible, a segment type display capable of displaying numerals, letters and the like is obtained. For obtaining a dot matrix display, it is advantageous that both an anode and a cathode are formed in the form of stripe and disposed so as to be orthogonalized. Partial color display and multi-color display become possible by a method of separately painting several kinds of polymer compounds of different emission colors and a method of using a color filter or a fluorescence conversion filter. A dot matrix display can be driven passively, or can be driven actively in combination with TFT and the like. These display devices can be used as a display of computers, television sets, mobile terminals and the like. The planar light emitting device can be suitably used as a planar light source for backlight of liquid crystal displays or as a planar illumination light source. When a flexible substrate is used, it can be used also as a curved light source and a curved display.

EXAMPLES

The present invention will be illustrated further in detail by examples below, but the present invention is not limited to these examples.

In the examples, the polystyrene-equivalent number-average molecular weight (Mn) and the polystyrene-equivalent weight-average molecular weight (Mw) of polymer compounds were determined by any of the following size exclusion chromatography (SEC) using tetrahydrofuran as the moving bed. Each measurement conditions of SEC are as described below.

A polymer compound to be measured was dissolved in tetrahydrofuran at a concentration of about 0.05% by mass, and 10 μL of the solution was injected into SEC. The mobile phase was run at a flow rate of 2.0 mL/min. As the column, PLgel MIXED-B (manufactured by Polymer Laboratories Ltd.) was used. As the detector, a UV-VIS detector (manufactured by Shimadzu Corp., trade name: SPD-10Avp) was used.

In the examples, the maximum peak wavelength of the emission spectrum of the fluorescent compound was measured by a spectral photometer (manufactured by JASCO Corporation, FP-6500) at room temperature. The fluorescent compound was dissolved in toluene at a concentration of about $0.8 \times 10^{-4}$% by mass, to obtain a toluene solution which was then used as a sample. UV light having a wavelength of 325 nm was used as the excitation light, unless otherwise stated.

In the examples, the maximum peak wavelength of the emission spectrum of the metal complex and the polymer compound was measured by a spectral photometer (manufactured by JASCO Corporation, FP-6500) at room temperature. The metal complex or the polymer compound was dissolved in xylene at a concentration of about $0.8 \times 10^{-4}$% by mass, to obtain a xylene solution which was then used as a sample. UV light having a wavelength of 325 nm was used as the excitation light.

<Synthesis Example EM1> Synthesis and Obtaining of Fluorescent Compounds EM-A1 to EM-A6

The fluorescent compound EM-A1 was synthesized on the basis of a method described in Japanese Unexamined Patent Application Publication No. 2011-105643. The fluorescent compound EM-A2 was synthesized according to a method described in International Publication WO 2007/058368. The fluorescent compound EM-A3 was synthesized on the basis of a method described in International Publication WO 2010/058859. The fluorescent compound EM-A4 was purchased from Aldrich Corp. The fluorescent compound EM-A5 was synthesized according to a method described in International Publication WO 2013/064814. The fluorescent compound EM-A6 was purchased from Luminescense Technology Corp.

[Chemical Formula 129]

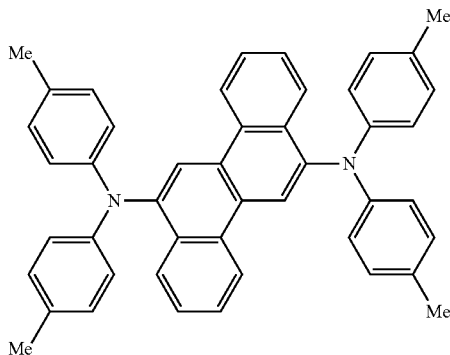

Fluorescent compound EM-A1

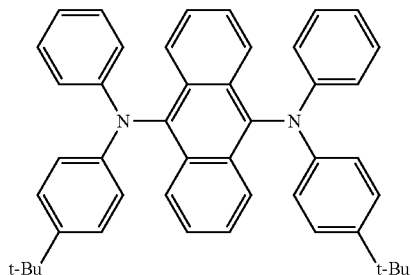

Fluorescent compound EM-A2

[Chemical Formula 130]
Fluorescent compound EM-A3
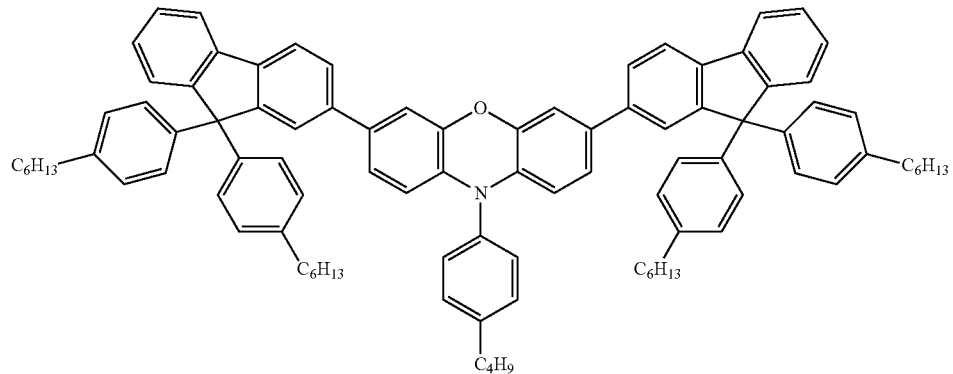
Fluorescent compound EM-A4
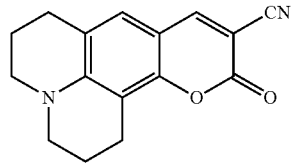
[Chemical Formula 131]
Fluorescent compound EM-A5
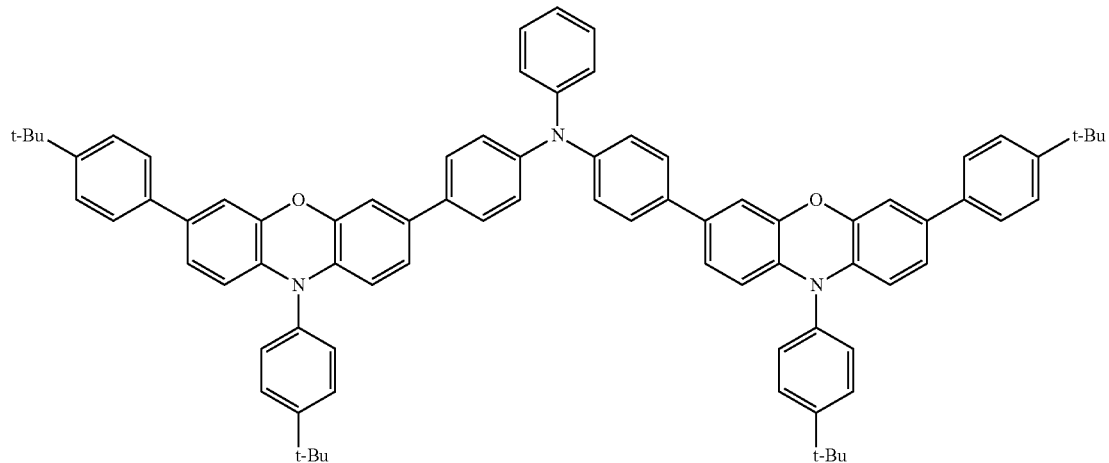

[Chemical Formula 132]

Fluorescent compound EM-A6

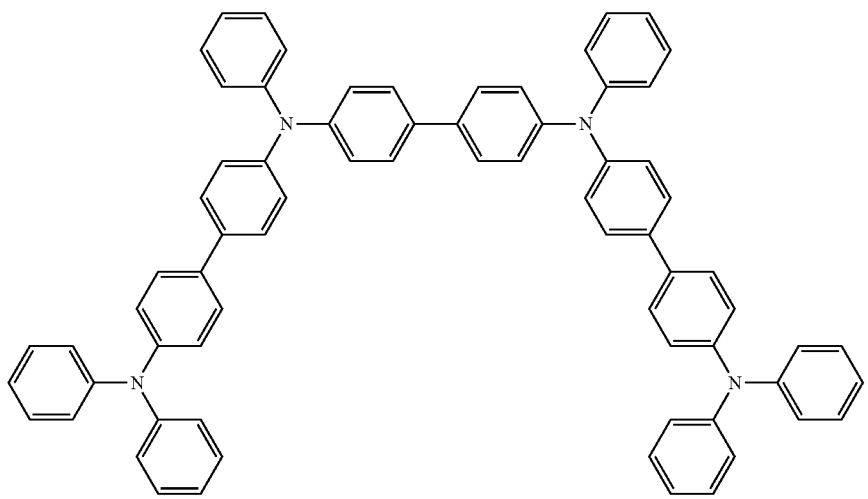

The maximum peak wavelength of the emission spectrum of the fluorescent compound EM-A1 was 454 nm. The maximum peak wavelength of the emission spectrum of the fluorescent compound EM-A2 was 521 nm. The maximum peak wavelength of the emission spectrum of the fluorescent compound EM-A3 was 449 nm. The maximum peak wavelength of the emission spectrum of the fluorescent compound EM-A4 was 458 nm. The maximum peak wavelength of the emission spectrum of the fluorescent compound EM-A5 was 430 nm. The maximum peak wavelength of the emission spectrum of the fluorescent compound EM-A6 was 411 m.

In measurement of the maximum peak wavelength of the emission spectrum of the fluorescent compound EM-A4, UV light having a wavelength of 400 nm was used as the excitation light.

<Synthesis Example EM2> Synthesis of Fluorescent Compounds EM-1 to EM-6

The fluorescent compound EM-1 was synthesized on the basis of a method described in International Publication WO 2008/059713. The fluorescent compound EM-2 was synthesized on the basis of a method described in International Publication WO 2011/098030. The fluorescent compound EM-3 was synthesized on the basis of a method described in Japanese Unexamined Patent Application Publication No. 2011-174059. The fluorescent compound EM-4 was synthesized on the basis of a method described in International Publication WO 2010/013006. The fluorescent compound EM-5 was synthesized on the basis of a method described in International Publication WO 2005/033051. The fluorescent compound EM-6 was synthesized on the basis of a method described in International Publication WO 2008/059713.

[Chemical Formula 133]

Fluorescent compound EM-1

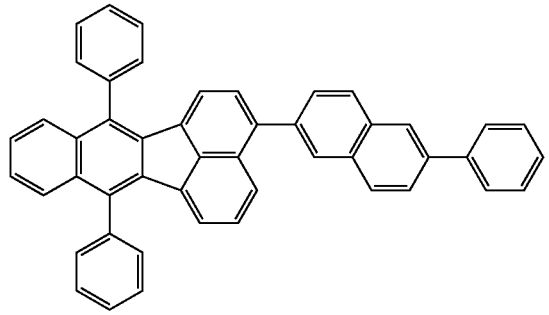

Fluorescent compound EM-2

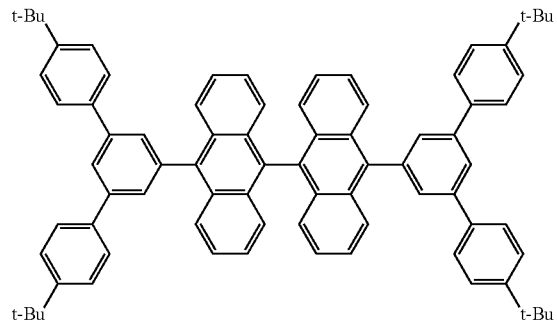

[Chemical Formula 134]

Fluorescent compound EM-3

Fluorescent compound EM-4

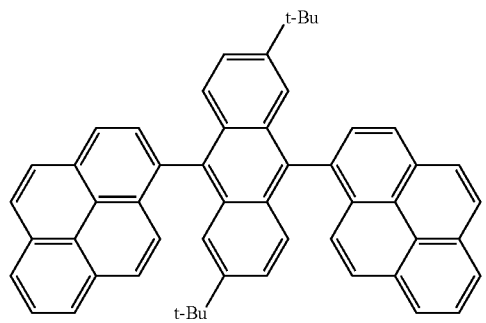
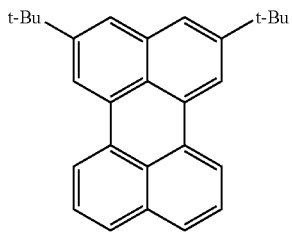

[Chemical Formula 135]

Fluorescent compound EM-5

Fluorescent compound EM-6

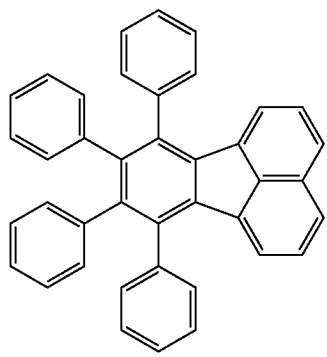
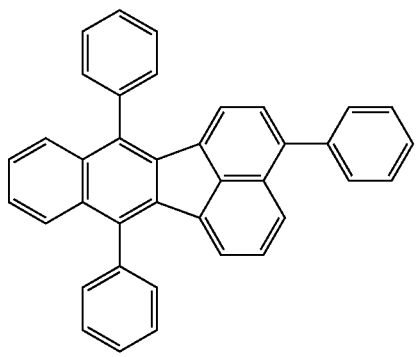

The maximum peak wavelength of the emission spectrum of the fluorescent compound EM-1 was 441 nm. The maximum peak wavelength of the emission spectrum of the fluorescent compound EM-2 was 431 nm. The maximum peak wavelength of the emission spectrum of the fluorescent compound EM-3 was 447 nm. The maximum peak wavelength of the emission spectrum of the fluorescent compound EM-4 was 453 nm. The maximum peak wavelength of the emission spectrum of the fluorescent compound EM-5 was 453 nm. The maximum peak wavelength of the emission spectrum of the fluorescent compound EM-6 was 432 nm.

<Synthesis Example R1> Synthesis of Metal Complex R1 and Metal Complex RM1

The metal complex R1 was synthesized according to a method described in Japanese Unexamined Patent Application Publication No. 2008-179617. The metal complex RM1 was synthesized according to a method described in International Publication WO 2009/157424.

[Chemical Formula 136]

Metal complex R1

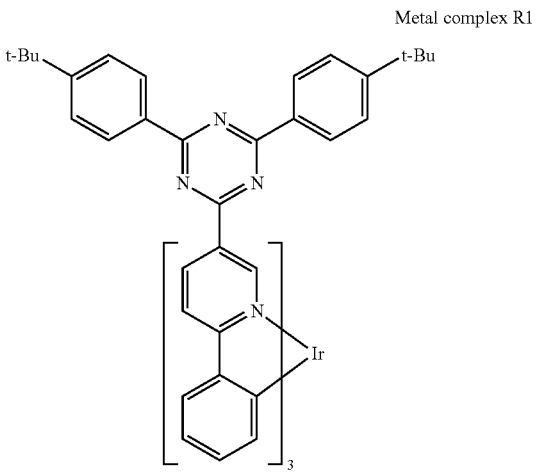

-continued

Metal complex RM1

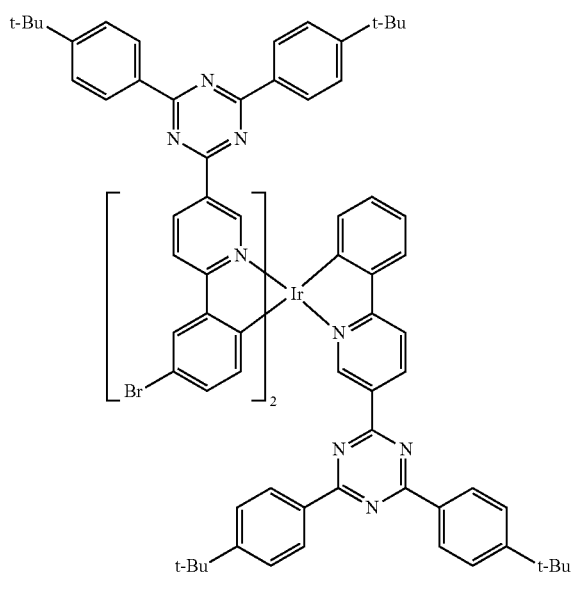

The maximum peak wavelength of the emission spectrum of the metal complex R1 was 594 nm.

<Synthesis Example G1> Synthesis of Metal Complex G1 and Metal Complex G2

The metal complex G1 was synthesized according to a method described in Japanese Unexamined Patent Application Publication No. 2013-237789.

The metal complex G2 was synthesized according to a method described in International Publication WO 2009/131255.

[Chemical Formula 137]

Metal complex G1

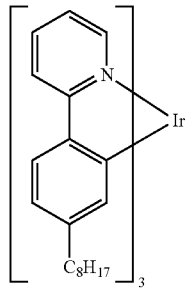

-continued

Metal complex G2

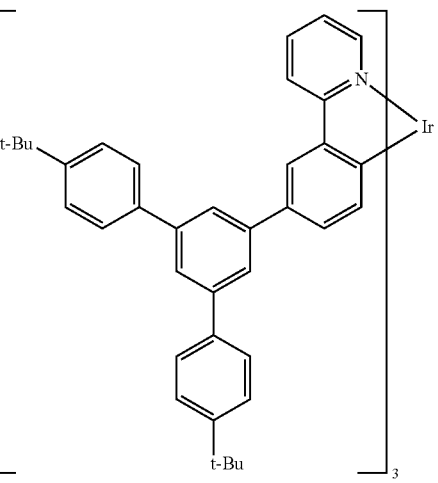

The maximum peak wavelength of the emission spectrum of the metal complex G1 was 508 nm.

The maximum peak wavelength of the emission spectrum of the metal complex G2 was 514 nm.

<Synthesis Example M1> Synthesis of Compounds M1 to M10

A compound M1 was synthesized according to a method described in Japanese Unexamined Patent Application Publication No. 2012-144721. As a compound M2, a commercially available product was used. The compounds M3, M4 and M5 were synthesized according to a method described in International Publication WO 2013/146806. The compounds M6 and M7 were synthesized according to a method described in Japanese Unexamined Patent Application Publication No. 2011-174062. The compound M8 was synthesized according to a method described in Japanese Unexamined Patent Application Publication No. 2008-106241. The compound M9 was synthesized according to a method described in Japanese Unexamined Patent Application Publication No. 2010-215886. The compound M10 was synthesized according to a method described in International Publication WO 2005/049546.

[Chemical Formula 138]
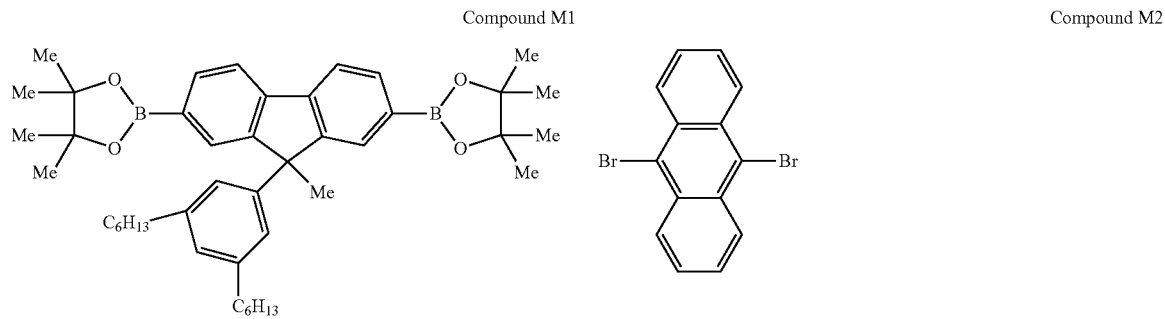
Compound M1    Compound M2
[Chemical Formula 139]
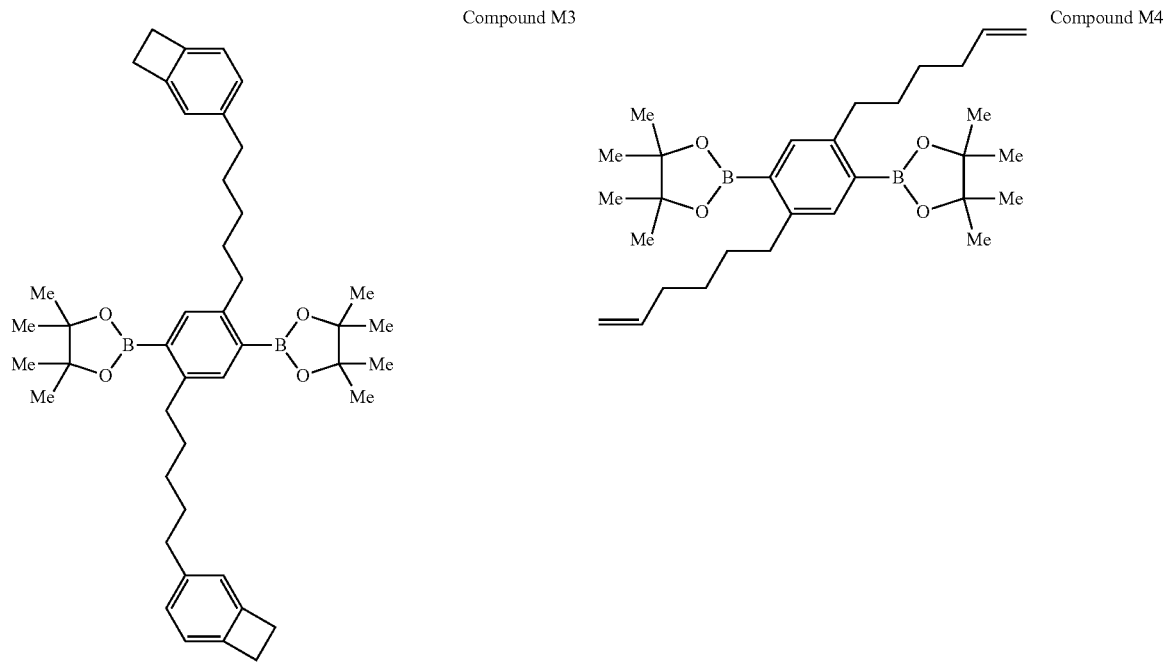
Compound M3    Compound M4
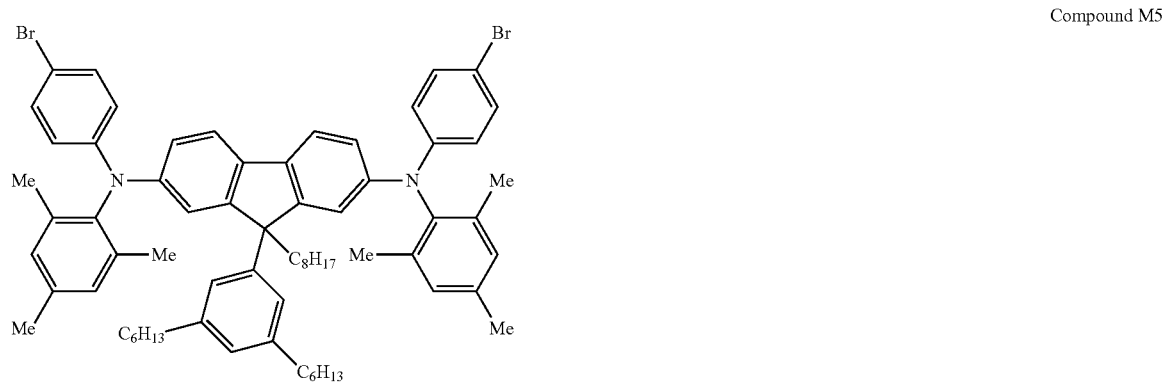
Compound M5

[Chemical Formula 140]

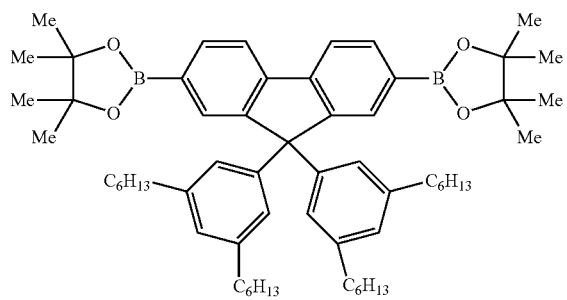

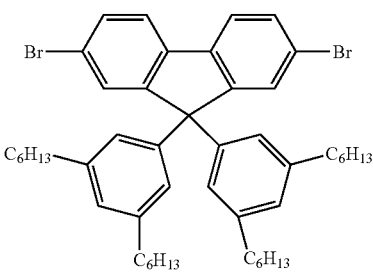
Compound M7

[Chemical Formula 141]

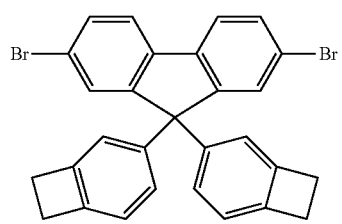
Compound M8

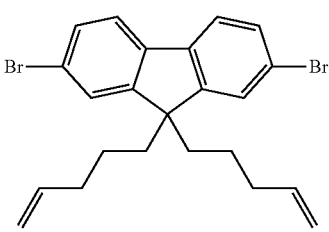
Compound M9

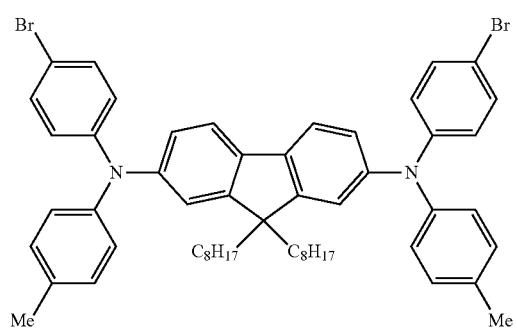
Compound M10

<Synthesis Example HP1> Synthesis of Polymer Compound Hp-1

(Step 1) An inert gas atmosphere was prepared in a reaction vessel, then, the compound M1 (1.73 g), the compound M2 (0.843 g), dichlorobis[tris(2-methoxyphenyl)phosphine]palladium (2.2 mg) and toluene (40 ml) were added, and the mixture was heated at 105° C.

(Step 2) Into the resultant reaction liquid was dropped a 20% by mass tetraethylammonium hydroxide aqueous solution (8.7 g), and the solution was refluxed for 3 hours.

(Step 3) Thereafter, to this were added 9-bromoanthracene (64.1 mg), a 20% by mass tetraethylammonium hydroxide aqueous solution (8.3 g) and dichlorobis[tris(2-methoxyphenyl)phosphine]palladium (2.2 mg), and the solution was refluxed for 16 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3% by mass acetic acid aqueous solution twice and with water twice, and the resultant solution was dropped into methanol, to find generation of a precipitate. The precipitate was dissolved in toluene, and the solution was purified by passing through an alumina column and a silica gel column in this order. The resultant solution was dropped into methanol, and the solution was stirred, to find generation of a precipitate. The precipitate was filtrated and dried, to obtain 0.91 g of a polymer compound HP-1. The polymer compound HP-1 had an Mn of $1.2 \times 10^5$ and an Mw of $4.8 \times 10^5$.

The polymer compound HP-1 is a copolymer constituted of a constitutional unit derived from the compound M1 and a constitutional unit derived from the compound M2 at a molar ratio of 50:50 according to the theoretical values calculated from the amounts of the charged raw materials.

The maximum peak wavelength of the emission spectrum of the polymer compound HP-1 was 436 nm.

<Synthesis Example HTL1> Synthesis of Polymer Compound HTL-1

(Step 1) An inert gas atmosphere was prepared in a reaction vessel, then, the compound M3 (0.800 g), the compound M4 (0.149 g), the compound M5 (1.66 g), dichlorbis(tris-o-methoxyphenylphosphine)palladium (1.4 mg) and toluene (45 ml) were added, and the mixture was heated at 100° C.

(Step 2) Into the reaction liquid was dropped a 20% by mass tetraethylammonium hydroxide aqueous solution (16 ml), and the solution was refluxed for 7 hours.

(Step 3) After the reaction, to this were added 2-ethylphenylboronic acid (90 mg) and dichlorbis(tris-o-methoxyphenylphosphine) palladium (1.3 mg), and the mixture was refluxed for 17.5 hours.

(Step 4) Thereafter, to this was added a sodium diethyldithiacarbamate aqueous solution, and the mixture was stirred at 85° C. for 2 hours. After cooling, the reaction liquid was washed with 3.6% by mass hydrochloric acid, 2.5% by mass ammonia water and water, and the resultant solution was dropped into methanol, to find generation of a precipitate. The precipitate was dissolved in toluene, and the solution was purified by passing through an alumina column and a silica gel column in this order. The resultant solution was dropped into methanol, and the solution was stirred, then, the resultant precipitate was isolated by filtration, which was then dried, to obtain 1.64 g of a polymer compound HTL-1. The polymer compound HTL-1 had an Mn of $3.5×10^4$ and an Mw of $2.2×10^5$.

The polymer compound HTL-1 is a copolymer constituted of a constitutional unit derived from the compound M3, a constitutional unit derived from the compound M4 and a constitutional unit derived from the compound M5 at a molar ratio of 40:10:50 according to the theoretical values calculated from the amounts of the charged raw materials.

The maximum peak wavelength of the emission spectrum of the polymer compound HTL-1 was 404 nm.

<Synthesis Example HTL2> Synthesis of Polymer Compound HTL-2

(Step 1) An inert gas atmosphere was prepared in a reaction vessel, then, the compound M3 (2.52 g), the compound M4 (0.470 g), the compound M5 (4.90 g), the metal complex RM1 (0.530 g), dichlorbis(tris-o-methoxyphenylphosphine)palladium (4.2 mg) and toluene (158 ml) were added, and the mixture was heated at 100° C.

(Step 2) Into the reaction liquid was dropped a 20% by mass tetraethylammonium hydroxide aqueous solution (16 ml), and the solution was refluxed for 8 hours.

(Step 3) After the reaction, to this were added phenylboronic acid (116 mg) and dichlorbis(tris-o-methoxyphenylphosphine)palladium (4.2 mg), and the solution was refluxed for 15 hours.

(Step 4) Thereafter, to this was added a sodium diethyldithiacarbamate aqueous solution, and the mixture was stirred at 85° C. for 2 hours. After cooling, the reaction liquid was washed with 3.6% by mass hydrochloric acid, 2.5% by mass ammonia water and water, and the resultant solution was dropped into methanol, to find generation of a precipitate. The precipitate was dissolved in toluene, and the solution was purified by passing through an alumina column and a silica gel column in this order. The resultant solution was dropped into methanol, and the solution was stirred, then, the resultant precipitate was isolated by filtration, which was then dried, to obtain 6.02 g of a polymer compound HTL-2. The polymer compound HTL-2 had an Mn of $3.8×10^4$ and an Mw of $4.5×10^5$.

The polymer compound HTL-2 is a copolymer constituted of a constitutional unit derived from the compound M3, a constitutional unit derived from the compound M4, a constitutional unit derived from the compound M5 and a constitutional unit derived from the metal complex RM1 at a molar ratio of 40:10:47:3 according to the theoretical values calculated from the amounts of the charged raw materials.

The emission spectrum of the polymer compound HTL-2 had maximum wavelengths at 404 nm and 600 nm, and the maximum peak wavelength of the emission spectrum of the polymer compound HTL-2 was 404 nm.

<Synthesis Example HTL3> Synthesis of Polymer Compound HTL-3

A polymer compound HTL-3 (1.43 g) was obtained in the same manner as in Synthesis Example HTL1 except that (Step 1) in Synthesis Example HTL1 was "An inert gas atmosphere was prepared in a reaction vessel, then, the compound M6 (1.13 g), the compound M10 (0.848 g), the compound M8 (0.0669 g), the compound M9 (0.0578 g), the metal complex RM1 (0.141 g), dichlorobis[tris(2-methoxyphenyl)phosphine]palladium (1.1 mg) and toluene (40 ml) were added, and the mixture was heated at 105° C.". The polymer compound HTL-3 had an Mn of $4.7×10^4$ and an Mw of $1.8×10'$.

The polymer compound HTL-3 is a copolymer constituted of a constitutional unit derived from the compound M6, a constitutional unit derived from the compound M10, a constitutional unit derived from the compound M8, a constitutional unit derived from the compound M9 and a constitutional unit derived from the metal complex RM1 at a molar ratio of 50:37:5:5:3 according to the theoretical values calculated from the amounts of the charged raw materials.

The emission spectrum of the polymer compound HTL-3 had maximum wavelengths at 438 nm, 464 nm and 603 nm, and the maximum peak wavelength of the emission spectrum of the polymer compound HTL-3 was 438 nm.

<Synthesis Example HTL4> Synthesis of Polymer Compound HTL-4

A polymer compound HTL-4 (1.51 g) was obtained in the same manner as in Synthesis Example HTL1 except that (Step 1) in Synthesis Example HTL1 was "An inert gas atmosphere was prepared in a reaction vessel, then, the compound M6 (1.34 g), the compound M7 (0.907 g), the compound M8 (0.0803 g), the compound M9 (0.0693 g), the metal complex RM1 (0.169 g), dichlorobis[tris(2-methoxyphenyl)phosphine]palladium (1.1 mg) and toluene (40 ml) were added, and the mixture was heated at 105° C.". The polymer compound HTL-4 had an Mn of $1.3*10^5$ and an Mw of $4.9*10^5$.

The polymer compound HTL-4 is a copolymer constituted of a constitutional unit derived from the compound M6, a constitutional unit derived from the compound M7, a constitutional unit derived from the compound M8, a constitutional unit derived from the compound M9 and a constitutional unit derived from the metal complex RM1 at a molar ratio of 50:37:5:5:3 according to the theoretical values calculated from the amounts of the charged raw materials.

The emission spectrum of the polymer compound HTL-4 had maximum wavelengths at 417 nm, 441 nm and 604 nm, and the maximum peak wavelength of the emission spectrum of the polymer compound HTL-4 was 417 nm.

<Example D1> Fabrication and Evaluation of Light Emitting Device D1

(Formation of Anode and Hole Injection Layer)

An TTO film with a thickness of 45 nm was attached to a glass substrate by a sputtering method, for form an anode. ND-3202 (manufactured by Nissan Chemical Corporation) as the hole injection material was spin-coated on the anode, to form a film with a thickness of 35 nm. Under an air atmosphere, the film was heated at 50° C. for 3 minutes, and further, heated at 230° C. for 15 minutes, to form a hole injection layer.

(Formation of Second Organic Layer)

The polymer compound HTL-2 was dissolved in xylene at a concentration of 0.6% by mass. The resultant xylene solution was spin-coated on the hole injection layer, to form a film with a thickness of 20 nm, and the film was heated on a hot plate at 180° C. for 60 minutes under a nitrogen gas atmosphere, to form a second organic layer. By this heating, the polymer compound HTL-2 turned into a cross-linked body.

(Formation of First Organic Layer)

The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass. The resultant chlorobenzene solution was spin-coated on the second organic layer, to form a film with a thickness of 60 nm, and the film was heated on a hot plate at 150° C. for 10 minutes under a nitrogen gas atmosphere, to form a first organic layer.

(Formation of Cathode)

The substrate carrying the first organic layer formed thereon was placed in a vapor deposition machine and the internal pressure thereof was reduced to $1\times10^{-4}$ Pa or less, then, as the cathode, sodium fluoride was vapor-deposited with a thickness of about 4 nm on the first organic layer, then, aluminum was vapor-deposited with a thickness of about 80 nm on the sodium fluoride layer. After vapor deposition, sealing was performed using a glass substrate, to fabricate a light emitting device D1.

(Evaluation of Light Emitting Device)

When voltage was applied to the light emitting device D1, EL light emission was observed. The external quantum efficiency at 400 cd/m$^2$ was measured. The resultant results are shown in Table 5.

Further, the CIE chromaticity coordinate (x, y) at 400 cd/m$^2$ was (0.18, 0.14).

<Example D2> Fabrication and Evaluation of Light Emitting Device D2

A light emitting device D2 was fabricated in the same manner as in Example D1 except that (Formation of second organic layer) in Example D1 was changed to (Formation of second organic layer D2) described below.

(Formation of Second Organic Layer D2)

The polymer compound HTL-1 and the metal complex R1 (polymer compound HTL-1/metal complex R1=65% by mass/35% by mass) were dissolved in xylene at a concentration of 0.6% by mass. The resultant xylene solution was spin-coated on the hole injection layer, to form a film with a thickness of 20 nm, and the film was heated on a hot plate at 180° C. for 60 minutes under a nitrogen gas atmosphere, to form a second organic layer. By this heating, the polymer compound HTL-1 turned into a cross-linked body.

(Evaluation of Light Emitting Device)

When voltage was applied to the light emitting device D2, EL light emission was observed. The external quantum efficiency at 400 cd/m$^2$ was measured. The resultant results are shown in Table 5.

Further, the CIE chromaticity coordinate (x, y) at 400 cd/m$^2$ was (0.15, 0.13).

<Example D3> Fabrication and Evaluation of Light Emitting Device D3

A light emitting device D3 was fabricated in the same manner as in Example D1 except that (Formation of second organic layer) in Example D1 was changed to (Formation of second organic layer D3) described below.

(Formation of Second Organic Layer D3)

The polymer compound HTL-2 was dissolved in xylene at a concentration of 1.2% by mass. The resultant xylene solution was spin-coated on the hole injection layer, to form a film with a thickness of 40 nm, and the film was heated on a hot plate at 180° C. for 60 minutes under a nitrogen gas atmosphere, to form a second organic layer. By this heating, the polymer compound HTL-2 turned into a cross-linked body.

(Evaluation of Light Emitting Device)

When voltage was applied to the light emitting device D3, EL light emission was observed. The external quantum efficiency at 400 cd/m$^2$ was measured. The resultant results are shown in Table 5.

Further, the CIE chromaticity coordinate (x, y) at 400 cd/m$^2$ was (0.19, 0.17).

<Example D4> Fabrication and Evaluation of Light Emitting Device D4

A light emitting device D4 was fabricated in the same manner as in Example D1 except that (Formation of second organic layer) of Example D1 was changed to (Formation of second organic layer D3) described above and (Formation of first organic layer) of Example D1 was changed to (Formation of first organic layer D4) described below.

(Formation of First Organic Layer D4)

The polymer compound HP-1 and the fluorescent compound EM-A1 (polymer compound HP-1/fluorescent compound EM-A1=91.5% by mass/8.5% by mass) were dissolved in chlorobenzene at a concentration of 0.7% by mass. The resultant chlorobenzene solution was spin-coated on the second organic layer, to form a film with a thickness of 40 nm, and the film was heated on a hot plate at 150° C. for 10 minutes under a nitrogen gas atmosphere, to form a first organic layer.

(Evaluation of Light Emitting Device) When voltage was applied to the light emitting device D4, EL light emission was observed. The external quantum efficiency at 400 cd/m$^2$ was measured. The resultant results are shown in Table 5.

Further, the CIE chromaticity coordinate (x, y) at 400 cd/m$^2$ was (0.20, 0.14).

<Example D5> Fabrication and Evaluation of Light Emitting Device D5

A light emitting device D5 was fabricated in the same manner as in Example D4 except that "The polymer compound HP-1 and the fluorescent compound EM-A1 (polymer compound HP-1/fluorescent compound EM-A1=97% by mass/3% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.7% by mass." in (Formation of first organic layer D4) of Example D4.

(Evaluation of Light Emitting Device)

When voltage was applied to the light emitting device D5, EL light emission was observed. The external quantum efficiency at 400 cd/m$^2$ was measured. The resultant results are shown in Table 5.

Further, the CIE chromaticity coordinate (x, y) at 400 cd/m$^2$ was (0.20, 0.14).

<Example D6> Fabrication and Evaluation of Light Emitting Device D6

A light emitting device D6 was fabricated in the same manner as in Example D1 except that (Formation of second organic layer) of Example D1 was changed to (Formation of second organic layer D6) described below and (Formation of first organic layer) of Example D1 was changed to (Formation of first organic layer D6) described below.
(Formation of Second Organic Layer D6)
The polymer compound HTL-2 and the metal complex G1 (polymer compound HTL-2/metal complex G1=80% by mass/20% by mass) were dissolved in xylene at a concentration of 1.2% by mass. The resultant xylene solution was spin-coated on the hole injection layer, to form a film with a thickness of 40 nm, and the film was heated on a hot plate at 180° C. for 60 minutes under a nitrogen gas atmosphere, to form a second organic layer. By this heating, the polymer compound HTL-2 turned into a cross-linked body.
(Formation of First Organic Layer-D6)
The polymer compound HP-1 and the fluorescent compound EM-A1 (polymer compound HP-1/fluorescent compound EM-A1=91.5% by mass/8.5% by mass) were dissolved in chlorobenzene at a concentration of 0.6% by mass. The resultant chlorobenzene solution was spin-coated on the second organic layer, to form a film with a thickness of 60 nm, and the film was heated on a hot plate at 150° C. for 10 minutes under a nitrogen gas atmosphere, to form a first organic layer.
(Evaluation of Light Emitting Device)
When voltage was applied to the light emitting device D6, EL light emission was observed. The external quantum efficiency at 400 cd/m$^2$ was measured. The resultant results are shown in Table 5.
Further, the CIE chromaticity coordinate (x, y) at 400 cd/m$^2$ was (0.33, 0.23).

<Example D7> Fabrication and Evaluation of Light Emitting Device D7

A light emitting device D7 was fabricated in the same manner as in Example D6 except that "The polymer compound HTL-2 and the metal complex G2 (polymer compound HTL-2/metal complex G2=80% by mass/20% by mass) were dissolved in xylene at a concentration of 1.2% by mass." instead of "The polymer compound HTL-2 and the metal complex G1 (polymer compound HTL-2/metal complex G1=80% by mass/20% by mass) were dissolved in xylene at a concentration of 1.2% by mass." in (Formation of second organic layer D6) of Example D6.
(Evaluation of Light Emitting Device)
When voltage was applied to the light emitting device D7, EL light emission was observed. The external quantum efficiency at 400 cd/m$^2$ was measured. The resultant results are shown in Table 5.
Further, the CIE chromaticity coordinate (x, y) at 400 cd/m$^2$ was (0.24, 0.19).

<Example D8> Fabrication and Evaluation of Light Emitting Device D8

A light emitting device D8 was fabricated in the same manner as in Example D6 except that "The polymer compound HTL-2 and the metal complex G2 (polymer compound HTL-2/metal complex G2=60% by mass/40% by mass) were dissolved in xylene at a concentration of 1.2% by mass." instead of "The polymer compound HTL-2 and the metal complex G1 (polymer compound HTL-2/metal complex G1=80% by mass/20% by mass) were dissolved in xylene at a concentration of 1.2% by mass." in (Formation of second organic layer D6) of Example D6.
(Evaluation of Light Emitting Device)
When voltage was applied to the light emitting device D8, EL light emission was observed. The external quantum efficiency at 400 cd/m$^2$ was measured. The resultant results are shown in Table 5.
Further, the CIE chromaticity coordinate (x, y) at 400 cd/m$^2$ was (0.27, 0.20).

<Example D9> Fabrication and Evaluation of Light Emitting Device D9

A light emitting device D9 was fabricated in the same manner as in Example D4 except that (Formation of first organic layer D4) of Example D4 was changed to (Formation of first organic layer D9) described below.
(Formation of First Organic Layer D9)
The polymer compound HP-1, the fluorescent compound EM-A1 and the metal complex G2 (polymer compound HP-1/fluorescent compound EM-A1/metal complex G2=71.5% by mass/8.5% by mass/20% by mass) were dissolved in chlorobenzene at a concentration of 0.9% by mass. The resultant chlorobenzene solution was spin-coated on the second organic layer, to form a film with a thickness of 60 nm, and the film was heated on a hot plate at 150° C. for 10 minutes under a nitrogen gas atmosphere, to form a first organic layer.
(Evaluation of Light Emitting Device)
When voltage was applied to the light emitting device D9, EL light emission was observed. The external quantum efficiency at 400 cd/m$^2$ was measured. The resultant results are shown in Table 5.
Further, the CIE chromaticity coordinate (x, y) at 400 cd/m$^2$ was (0.57, 0.37).

<Example D10> Fabrication and Evaluation of Light Emitting Device D10

A light emitting device D10 was fabricated in the same manner as in Example D9 except that "The polymer compound HP-1, the fluorescent compound EM-A1 and the metal complex G2 (polymer compound HP-1/fluorescent compound EM-A1/metal complex G2=51.5% by mass/8.5% by mass/40% by mass) were dissolved in chlorobenzene at a concentration of 0.9% by mass." instead of "The polymer compound HP-1, the fluorescent compound EM-A1 and the metal complex G2 (polymer compound HP-1/fluorescent compound EM-A1/metal complex G2=71.5% by mass/8.5% by mass/20% by mass) were dissolved in chlorobenzene at a concentration of 0.9% by mass." in (Formation of first organic layer-D9) of Example D9.
(Evaluation of Light Emitting Device)
When voltage was applied to the light emitting device D10, EL light emission was observed. The external quantum efficiency at 400 cd/m$^2$ was measured. The resultant results are shown in Table 5.
Further, the CIE chromaticity coordinate (x, y) at 400 cd/m$^2$ was (0.59, 0.39).

<Example D11> Fabrication and Evaluation of Light Emitting Device D11

A light emitting device D11 was fabricated in the same manner as in Example D1 except that "The polymer compound HP-1, the fluorescent compound EM-A1 and the fluorescent compound EM-A2 (polymer compound HP-1/fluorescent compound EM-A1/fluorescent compound EM-A2=90.5% by mass/8.5% by mass/1% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1.

(Evaluation of Light Emitting Device)

When voltage was applied to the light emitting device D11, EL light emission was observed. The external quantum efficiency at 400 cd/m² was measured. The resultant results are shown in Table 5.

Further, the CIE chromaticity coordinate (x, y) at 400 cd/m² was (0.25, 0.48).

<Example D12> Fabrication and Evaluation of Light Emitting Device D12

A light emitting device D12 was fabricated in the same manner as in Example D1 except that "The polymer compound HP-1 and the fluorescent compound EM-A3 (polymer compound HP-1/fluorescent compound EM-A3=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1.

(Evaluation of Light Emitting Device)

When voltage was applied to the light emitting device D12, EL light emission was observed. The external quantum efficiency at 400 cd/m² was measured. The resultant results are shown in Table 5.

Further, the CIE chromaticity coordinate (x, y) at 400 cd/m² was (0.19, 0.18).

<Example D13> Fabrication and Evaluation of Light Emitting Device D13

A light emitting device D13 was fabricated in the same manner as in Example D1 except that "The polymer compound HP-1 and the fluorescent compound EM-A4 (polymer compound HP-1/fluorescent compound EM-A4=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1.

(Evaluation of Light Emitting Device)

When voltage was applied to the light emitting device D13, EL light emission was observed. The external quantum efficiency at 400 cd/m² was measured. The resultant results are shown in Table 5.

Further, the CIE chromaticity coordinate (x, y) at 400 cd/m² was (0.24, 0.20).

<Example D14> Fabrication and Evaluation of Light Emitting Device D14

A light emitting device D14 was fabricated in the same manner as in Example D1 except that "The polymer compound HP-1 and the fluorescent compound EM-A1 (polymer compound HP-1/fluorescent compound EM-A1=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1, and further, (Formation of second organic layer) of Example D1 was changed to (Formation of second organic layer D14) described below.

(Formation of Second Organic Layer D14)

The low-molecular weight compound HTM-1 and the metal complex R1 (low-molecular weight compound HTM-1/metal complex R1=65% by mass/35% by mass) were dissolved in chlorobenzene at a concentration of 0.7% by mass. The resultant chlorobenzene solution was spin-coated on the hole injection layer, to form a film with a thickness of 20 nm, and the film was heated on a hot plate at 180° C. for 60 minutes under a nitrogen gas atmosphere, to form a second organic layer. By this heating, the low-molecular weight compound HTM-1 turned into a cross-linked body.

The compound HM-1 was purchased from Luminescense Technology Corp. The maximum peak wavelength of the emission spectrum of the compound HM-1 was 431 nm.

[Chemical Formula 142]

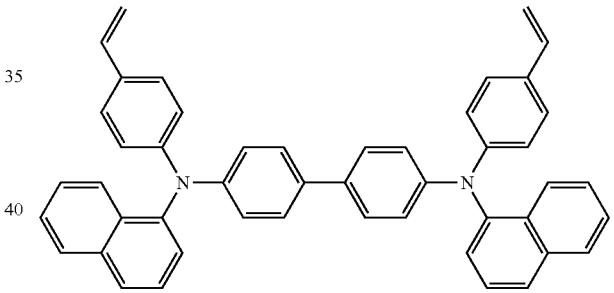

Compound HTM-1

(Evaluation of Light Emitting Device)

When voltage was applied to the light emitting device D14, EL light emission was observed. The external quantum efficiency at 400 cd/m² was measured. The resultant results are shown in Table 5.

Further, the CIE chromaticity coordinate (x, y) at 400 cd/m² was (0.21, 0.16).

<Comparative Example CD1> Fabrication and Evaluation of Light Emitting Device CD1

A light emitting device CD1 was fabricated in the same manner as in Example D1 except that "The polymer compound HTL-1 was dissolved in xylene at a concentration of 0.6% by mass." instead of "The polymer compound HTL-2 was dissolved in xylene at a concentration of 0.6% by mass." in (Formation of second organic layer) of Example D1, and "The polymer compound HP-1, the fluorescent compound EM-A1 and the metal complex R1 (polymer compound HP-1/fluorescent compound EM-A1/metal complex R1=88.5% by mass/8.5% by mass/3% by mass) were dissolved in chlorobenzene at a concentration of 0.6% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1.

(Evaluation of Light Emitting Device)

When voltage was applied to the light emitting device CD1, EL light emission was observed. The external quantum efficiency at 400 cd/m$^2$ was measured. The resultant results are shown in Table 5.

Further, the CIE chromaticity coordinate (x, y) at 400 cd/m$^2$ was (0.17, 0.13).

The results of Examples D1 to D14 and Comparative Example CD1 are shown in Table 5. The relative value of the external quantum efficiency of each light emitting device at 400 cd/m$^2$, when the external quantum efficiency of the light emitting device CD1 at 400 cd/m$^2$ taken as 1.0, is shown.

nm, and the film was heated on a hot plate at 150° C. for 10 minutes under a nitrogen gas atmosphere, to form a first organic layer.

(Evaluation of Light Emitting Device)

When voltage was applied to the light emitting device D15, EL light emission was observed. The external quantum efficiency at 100 cd/m$^2$ was measured. The resultant results are shown in Table 6.

Further, the CIE chromaticity coordinate (x, y) at 100 cd/m$^2$ was (0.20, 0.16).

<Example D16> Fabrication and Evaluation of Light Emitting Device D16

A light emitting device D16 was fabricated in the same manner as in Example D1 except that (Formation of second organic layer) of Example D1 was changed to (Formation of

TABLE 5

| | light emitting device | formation of second organic layer | | | formation of first organic layer | | | external quantum efficiency (relative value) |
|---|---|---|---|---|---|---|---|---|
| | | material | composition ratio (% by mass) | thickness (nm) | material | composition ratio (% by mass) | thickness (nm) | |
| Example D1 | D1 | HTL-2 | 100 | 20 | HP-1/EM-A1 | 91.5/8.5 | 60 | 14.1 |
| Example D2 | D2 | HTL-1/R1 | 65/35 | 20 | HP-1/EM-A1 | 91.5/8.5 | 60 | 4.1 |
| Example D3 | D3 | HTL-2 | 100 | 40 | HP-1/EM-A1 | 91.5/8.5 | 60 | 15.3 |
| Example D4 | D4 | HTL-2 | 100 | 40 | HP-1/EM-A1 | 91.5/8.5 | 40 | 11.3 |
| Example D5 | D5 | HTL-2 | 100 | 40 | HP-1/EM-A1 | 97/3 | 40 | 11.5 |
| Example D6 | D6 | HTL-2/G1 | 80/20 | 40 | HP-1/EM-A1 | 91.5/8.5 | 60 | 10.1 |
| Example D7 | D7 | HTL-2/G2 | 80/20 | 40 | HP-1/EM-A1 | 91.5/8.5 | 60 | 8.3 |
| Example D8 | D8 | HTL-2/G2 | 60/40 | 40 | HP-1/EM-A1 | 91.5/8.5 | 60 | 4.6 |
| Example D9 | D9 | HTL-2 | 100 | 40 | HP-1/EM-A1/G2 | 71.5/8.5/20 | 60 | 5.4 |
| Example D10 | D10 | HTL-2 | 100 | 40 | HP-1/EM-A1/G2 | 51.5/8.5/40 | 60 | 7.7 |
| Example D11 | D11 | HTL-2 | 100 | 20 | HP-1/EM-A1/EM-A2 | 90.5/8.5/1 | 60 | 15.3 |
| Example D12 | D12 | HTL-2 | 100 | 20 | HP-1/EM-A3 | 91.5/8.5 | 60 | 14.1 |
| Example D13 | D13 | HTL-2 | 100 | 20 | HP-1/EM-A4 | 91.5/8.5 | 60 | 9.6 |
| Example D14 | D14 | HTM-1/R1 | 65/35 | 20 | HP-1/EM-A1 | 91.5/8.5 | 60 | 6.1 |
| Comparative Example CD1 | CD1 | HTL-1 | 100 | 20 | HP-1/EM-A1/R1 | 88.5/8.5/3 | 60 | 1.0 |

<Example D15> Fabrication and Evaluation of Light Emitting Device D15

A light emitting device D15 was fabricated in the same manner as in Example D1 except that (Formation of first organic layer) of Example D1 was changed to (Formation of first organic layer D15) described below.

(Formation of First Organic Layer D15)

The polymer compound HP-1 and the fluorescent compound EM-1 (polymer compound HP-1/fluorescent compound EM-1=91.5% by mass/8.5% by mass) were dissolved in chlorobenzene at a concentration of 0.9% by mass. The resultant chlorobenzene solution was spin-coated on the second organic layer, to form a film with a thickness of 60 second organic layer D2) described above, and (Formation of first organic layer) of Example D1 was changed to (Formation of first organic layer D15) described above.

(Evaluation of Light Emitting Device)

When voltage was applied to the light emitting device D16, EL light emission was observed. The external quantum efficiency at 100 cd/m$^2$ was measured. The resultant results are shown in Table 6.

Further, the CIE chromaticity coordinate (x, y) at 100 cd/m$^2$ was (0.17, 0.15).

<Example D17> Fabrication and Evaluation of Light Emitting Device D17

A light emitting device D17 was fabricated in the same manner as in Example D1 except that (Formation of first organic layer) of Example D1 was changed to (Formation of first organic layer D17) described below.

(Formation of First Organic Layer D17)

The compound HM-1 and the fluorescent compound EM-1 (compound HM-1/fluorescent compound EM-1=91.5% by mass/8.5% by mass) were dissolved in toluene at a concentration of 1.6% by mass. The resultant toluene solution was spin-coated on the second organic layer, to form a film with a thickness of 60 nm, and the film was heated on a hot plate at 150° C. for 10 minutes under a nitrogen gas atmosphere, to form a first organic layer.

The compound HM-1 was purchased from AK Scientific, Inc. The maximum peak wavelength of the emission spectrum of the compound HM-1 was 425 nm.

[Chemical Formula 143]

Compound HM-1

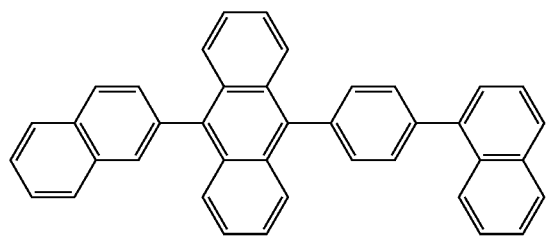

(Evaluation of Light Emitting Device)

When voltage was applied to the light emitting device D17, EL light emission was observed. The external quantum efficiency at 100 cd/m$^2$ was measured. The resultant results are shown in Table 6.

Further, the CIE chromaticity coordinate (x, y) at 100 cd/m$^2$ was (0.17, 0.16).

<Example D18> Fabrication and Evaluation of Light Emitting Device D18

A light emitting device D18 was fabricated in the same manner as in Example D1 except that (Formation of second organic layer) of Example D1 was changed to (Formation of second organic layer D18) described below, and (Formation of first organic layer) of Example D1 was changed to (Formation of first organic layer D17) described above.

(Formation of Second Organic Layer D18)

The polymer compound HTL-1 and the metal complex R1 (polymer compound HTL-1/metal complex R1=50% by mass/50% by mass) were dissolved in xylene at a concentration of 0.6% by mass. The resultant xylene solution was spin-coated on the hole injection layer, to form a film with a thickness of 20 nm, and the film was heated on a hot plate at 180° C. for 60 minutes under a nitrogen gas atmosphere, to form a second organic layer. By this heating, the polymer compound HTL-1 turned into a cross-linked body.

(Evaluation of Light Emitting Device)

When voltage was applied to the light emitting device D18, EL light emission was observed. The external quantum efficiency at 100 cd/m$^2$ was measured. The resultant results are shown in Table 6.

Further, the CIE chromaticity coordinate (x, y) at 100 cd/m$^2$ was (0.16, 0.15).

<Example D19> Fabrication and Evaluation of Light Emitting Device D19

A light emitting device D19 was fabricated in the same manner as in Example D18 except that "The polymer compound HTL-1 and the metal complex R1 (polymer compound HTL-1/metal complex R1=95% by mass/5% by mass) were dissolved in xylene at a concentration of 0.6% by mass." instead of "The polymer compound HTL-1 and the metal complex R1 (polymer compound HTL-1/metal complex R1=50% by mass/50% by mass) were dissolved in xylene at a concentration of 0.6% by mass." in (Formation of second organic layer-D18) of Example D18.

(Evaluation of Light Emitting Device)

When voltage was applied to the light emitting device D19, EL light emission was observed. The external quantum efficiency at 100 cd/m$^2$ was measured. The resultant results are shown in Table 6.

Further, the CIE chromaticity coordinate (x, y) at 100 cd/m$^2$ was (0.16, 0.21).

<Example D20> Fabrication and Evaluation of Light Emitting Device D20

A light emitting device D20 was fabricated in the same manner as in Example D1 except that (Formation of second organic layer) of Example D1 was changed to (Formation of second organic layer D3) described above, and (Formation of first organic layer) of Example D1 was changed to (Formation of first organic layer D15) described above.

(Evaluation of Light Emitting Device)

When voltage was applied to the light emitting device D20, EL light emission was observed. The external quantum efficiency at 100 cd/m$^2$ was measured. The resultant results are shown in Table 6.

Further, the CIE chromaticity coordinate (x, y) at 100 cd/m$^2$ was (0.22, 0.20).

<Example D21> Fabrication and Evaluation of Light Emitting Device D21

A light emitting device D17 was fabricated in the same manner as in Example D1 except that (Formation of second organic layer) of Example D1 was changed to (Formation of second organic layer D3) described above, and (Formation of first organic layer) of Example D1 was changed to (Formation of first organic layer D21) described below.

(Formation of First Organic Layer D21)

The polymer compound HP-1 and the fluorescent compound EM-1 (polymer compound HP-1/fluorescent compound EM-1=91.5% by mass/8.5% by mass) were dissolved in chlorobenzene at a concentration of 0.7% by mass. The resultant chlorobenzene solution was spin-coated on the second organic layer, to form a film with a thickness of 40 nm, and the film was heated on a hot plate at 150° C. for 10 minutes under a nitrogen gas atmosphere, to form a first organic layer.

(Evaluation of Light Emitting Device)

When voltage was applied to the light emitting device D21, EL light emission was observed. The external quantum efficiency at 100 cd/m$^2$ was measured. The resultant results are shown in Table 6.

Further, the CIE chromaticity coordinate (x, y) at 100 cd/m$^2$ was (0.22, 0.16).

<Example D22> Fabrication and Evaluation of Light Emitting Device D22

A light emitting device D22 was fabricated in the same manner as in Example D21 except that "The polymer compound HP-1 and the fluorescent compound EM-A1 (polymer compound HP-1/fluorescent compound EM-A1=97% by mass/3% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.7% by mass." in (Formation of first organic layer-D21) of Example D21.

(Evaluation of Light Emitting Device)

When voltage was applied to the light emitting device D22, EL light emission was observed. The external quantum efficiency at 100 cd/m$^2$ was measured. The resultant results are shown in Table 6.

Further, the CIE chromaticity coordinate (x, y) at 100 cd/m$^2$ was (0.22, 0.15).

<Example D23> Fabrication and Evaluation of Light Emitting Device D23

A light emitting device D23 was fabricated in the same manner as in Example D1 except that (Formation of second organic layer) of Example D1 was changed to (Formation of second organic layer D6) described above, and (Formation of first organic layer) of Example D1 was changed to (Formation of first organic layer D23) described below.

(Formation of First Organic Layer D23)

The polymer compound HP-1 and the fluorescent compound EM-1 (polymer compound HP-1/fluorescent compound EM-1=91.5% by mass/8.5% by mass) were dissolved in chlorobenzene at a concentration of 0.6% by mass. The resultant chlorobenzene solution was spin-coated on the second organic layer, to form a film with a thickness of 60 nm, and the film was heated on a hot plate at 150° C. for 10 minutes under a nitrogen gas atmosphere, to form a first organic layer.

(Evaluation of Light Emitting Device)

When voltage was applied to the light emitting device D23, EL light emission was observed. The external quantum efficiency at 100 cd/m$^2$ was measured. The resultant results are shown in Table 6.

Further, the CIE chromaticity coordinate (x, y) at 100 cd/m$^2$ was (0.44, 0.29).

<Example D24> Fabrication and Evaluation of Light Emitting Device D24

A light emitting device D24 was fabricated in the same manner as in Example D23 except that "The polymer compound HTL-2 and the metal complex G2 (polymer compound HTL-2/metal complex G2=80% by mass/20% by mass) were dissolved in xylene at a concentration of 1.2% by mass." instead of "The polymer compound HTL-2 and the metal complex G1 (polymer compound HTL-2/metal complex G1=80% by mass/20% by mass) were dissolved in xylene at a concentration of 1.2% by mass." in (Formation of second organic layer-D6) of Example D23.

(Evaluation of Light Emitting Device)

When voltage was applied to the light emitting device D24, EL light emission was observed. The external quantum efficiency at 100 cd/m$^2$ was measured. The resultant results are shown in Table 6.

Further, the CIE chromaticity coordinate (x, y) at 100 cd/m$^2$ was (0.28, 0.22).

<Example D25> Fabrication and Evaluation of Light Emitting Device D25

A light emitting device D25 was fabricated in the same manner as in Example D23 except that "The polymer compound HTL-2 and the metal complex G2 (polymer compound HTL-2/metal complex G1=60% by mass/40% by mass) were dissolved in xylene at a concentration of 1.2% by mass." instead of "The polymer compound HTL-2 and the metal complex G1 (polymer compound HTL-2/metal complex G1=80% by mass/20% by mass) were dissolved in xylene at a concentration of 1.2% by mass." in (Formation of second organic layer D6) of Example D23.

(Evaluation of Light Emitting Device)

When voltage was applied to the light emitting device D25, EL light emission was observed. The external quantum efficiency at 100 cd/m$^2$ was measured. The resultant results are shown in Table 6.

Further, the CIE chromaticity coordinate (x, y) at 100 cd/m$^2$ was (0.32, 0.24).

<Example D26> Fabrication and Evaluation of Light Emitting Device D26

A light emitting device D26 was fabricated in the same manner as in Example D21 except that (Formation of first organic layer D21) of Example D21 was changed to (Formation of first organic layer D26) described below.

(Formation of First Organic Layer D26)

The polymer compound HP-1, the fluorescent compound EM-1 and the metal complex G2 (polymer compound HP-1/fluorescent compound EM-1/metal complex G2=71.5% by mass/8.5% by mass/20% by mass) were dissolved in chlorobenzene at a concentration of 0.9% by mass. The resultant chlorobenzene solution was spin-coated on the second organic layer, to form a film with a thickness of 60, and the film was heated on a hot plate at 150° C. for 10 minutes under a nitrogen gas atmosphere, to form a first organic layer.

(Evaluation of Light Emitting Device)

When voltage was applied to the light emitting device D26, EL light emission was observed. The external quantum efficiency at 100 cd/m$^2$ was measured. The resultant results are shown in Table 7.

Further, the CIE chromaticity coordinate (x, y) at 100 cd/m$^2$ was (0.57, 0.38).

<Example D27> Fabrication and Evaluation of Light Emitting Device D27

A light emitting device D27 was fabricated in the same manner as in Example D26 except that "The polymer compound HP-1, the fluorescent compound EM-1 and the metal complex G2 (polymer compound HP-1/fluorescent compound EM-1/metal complex G2=51.5% by mass/8.5% by mass/40% by mass) were dissolved in chlorobenzene at a concentration of 0.9% by mass." instead of "The polymer compound HP-1, the fluorescent compound EM-1 and the metal complex G2 (polymer compound HP-1/fluorescent compound EM-1/metal complex G2=71.5% by mass/8.5% by mass/20% by mass) were dissolved in chlorobenzene at a concentration of 0.9% by mass." in (Formation of first organic layer D26) of Example D26.

(Evaluation of Light Emitting Device)

When voltage was applied to the light emitting device D27, EL light emission was observed. The external quantum efficiency at 100 cd/m$^2$ was measured. The resultant results are shown in Table 7.

Further, the CIE chromaticity coordinate (x, y) at 100 cd/m$^2$ was (0.59, 0.40).

<Example D28> Fabrication and Evaluation of Light Emitting Device D28

A light emitting device D28 was fabricated in the same manner as in Example D1 except that "The polymer compound HP-1, the fluorescent compound EM-1 and the fluorescent compound EM-A2 (polymer compound HP-1/fluorescent compound EM-1/fluorescent compound EM-A2=90.5% by mass/8.5% by mass/1% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1.

(Evaluation of Light Emitting Device)

When voltage was applied to the light emitting device D28, EL light emission was observed. The external quantum efficiency at 100 cd/m² was measured. The resultant results are shown in Table 7.

Further, the CIE chromaticity coordinate (x, y) at 100 cd/m² was (0.28, 0.48).

<Example D29> Fabrication and Evaluation of Light Emitting Device D29

A light emitting device D29 was fabricated in the same manner as in Example D1 except that "The polymer compound HP-1 and the fluorescent compound EM-2 (polymer compound HP-1/fluorescent compound EM-2=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1.

(Evaluation of Light Emitting Device)

When voltage was applied to the light emitting device D29, EL light emission was observed. The external quantum efficiency at 100 cd/m² was measured. The resultant results are shown in Table 7.

Further, the CIE chromaticity coordinate (x, y) at 100 cd/m² was (0.21, 0.16).

<Example D30> Fabrication and Evaluation of Light Emitting Device D30

A light emitting device D30 was fabricated in the same manner as in Example D1 except that "The polymer compound HP-1 and the fluorescent compound EM-3 (polymer compound HP-1/fluorescent compound EM-3=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1.

(Evaluation of Light Emitting Device)

When voltage was applied to the light emitting device D30, EL light emission was observed. The external quantum efficiency at 100 cd/m² was measured. The resultant results are shown in Table 7.

Further, the CIE chromaticity coordinate (x, y) at 100 cd/m² was (0.22, 0.17).

<Example D31> Fabrication and Evaluation of Light Emitting Device D31

A light emitting device D31 was fabricated in the same manner as in Example D1 except that "The polymer compound HP-1 and the fluorescent compound EM-4 (polymer compound HP-1/fluorescent compound EM-4=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1.

(Evaluation of Light Emitting Device)

When voltage was applied to the light emitting device D31, EL light emission was observed. The external quantum efficiency at 100 cd/m² was measured. The resultant results are shown in Table 7.

Further, the CIE chromaticity coordinate (x, y) at 100 cd/m² was (0.20, 0.20).

<Example D32> Fabrication and Evaluation of Light Emitting Device D32

A light emitting device D32 was fabricated in the same manner as in Example D1 except that "The polymer compound HP-1 and the fluorescent compound EM-5 (polymer compound HP-1/fluorescent compound EM-5=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1.

(Evaluation of Light Emitting Device)

When voltage was applied to the light emitting device D32, EL light emission was observed. The external quantum efficiency at 100 cd/m² was measured. The resultant results are shown in Table 7.

Further, the CIE chromaticity coordinate (x, y) at 100 cd/m² was (0.21, 0.15).

<Example D33> Fabrication and Evaluation of Light Emitting Device D33

A light emitting device D33 was fabricated in the same manner as in Example D1 except that "The polymer compound HP-1 and the fluorescent compound EM-6 (polymer compound HP-1/fluorescent compound EM-6=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1.

(Evaluation of Light Emitting Device)

When voltage was applied to the light emitting device D33, EL light emission was observed. The external quantum efficiency at 100 cd/m² was measured. The resultant results are shown in Table 7.

Further, the CIE chromaticity coordinate (x, y) at 100 cd/m$^2$ was (0.21, 0.15).

<Example D34> Fabrication and Evaluation of Light Emitting Device D34

A light emitting device D34 was fabricated in the same manner as in Example D1 except that "The polymer compound HP-1 and the fluorescent compound EM-1 (polymer compound HP-1/fluorescent compound EM-1=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1, and further, (Formation of second organic layer) of Example D1 was changed to (Formation of second organic layer D14) described above.

(Evaluation of Light Emitting Device)

When voltage was applied to the light emitting device D34, EL light emission was observed. The external quantum efficiency at 100 cd/m$^2$ was measured. The resultant results are shown in Table 7.

Further, the CIE chromaticity coordinate (x, y) at 100 cd/m$^2$ was (0.26, 0.22).

<Comparative Example CD2> Fabrication and Evaluation of Light Emitting Device CD2

A light emitting device CD2 was fabricated in the same manner as in Example D1 except that "The polymer compound HTL-1 was dissolved in xylene at a concentration of 0.6% by mass." instead of "The polymer compound HTL-2 was dissolved in xylene at a concentration of 0.6% by mass." in (Formation of second organic layer) of Example D1, and "The polymer compound HP-1, the fluorescent compound EM-1 and the metal complex R1 (polymer compound HP-1/fluorescent compound EM-1/metal complex R1=88.5% by mass/8.5% by mass/3% by mass) were dissolved in chlorobenzene at a concentration of 0.6% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1.

(Evaluation of Light Emitting Device)

When voltage was applied to the light emitting device CD2, EL light emission was observed. The external quantum efficiency at 100 cd/m$^2$ was measured. The resultant results are shown in Table 7.

Further, the CIE chromaticity coordinate (x, y) at 100 cd/m$^2$ was (0.20, 0.18).

The results of Examples D15 to D34 and Comparative Example CD2 are shown in Table 6 and Table 7. The relative value of the external quantum efficiency of each light emitting device at 100 cd/m$^2$, when the external quantum efficiency of the light emitting device CD2 at 100 cd/m$^2$ is taken as 1.0, is shown.

TABLE 6

| | light emitting device | formation of second organic layer | | | formation of first organic layer | | | external quantum efficiency (relative value) |
|---|---|---|---|---|---|---|---|---|
| | | material | composition ratio (% by mass) | thickness (nm) | material | composition ratio (% by mass) | thickness (nm) | |
| Example D15 | D15 | HTL-2 | 100 | 20 | HP-1/EM-1 | 91.5/8.5 | 60 | 10.8 |
| Example D16 | D16 | HTL-1/R1 | 65/35 | 20 | HP-1/EM-1 | 91.5/8.5 | 60 | 5.8 |
| Example D17 | D17 | HTL-2 | 100 | 20 | HM-1/EM-1 | 91.5/8.5 | 60 | 5.2 |
| Example D18 | D18 | HTL-1/R1 | 50/50 | 20 | HM-1/EM-1 | 91.5/8.5 | 60 | 4.5 |
| Example D19 | D19 | HTL-1/R1 | 95/5 | 20 | HM-1/EM-1 | 91.5/8.5 | 60 | 10.4 |
| Example D20 | D20 | HTL-2 | 100 | 40 | HP-1/EM-1 | 91.5/8.5 | 60 | 12.4 |
| Example D21 | D21 | HTL-2 | 100 | 40 | HP-1/EM-1 | 91.5/8.5 | 40 | 9.8 |
| Example D22 | D22 | HTL-2 | 100 | 40 | HP-1/EM-1 | 97/3 | 40 | 10.9 |
| Example D23 | D23 | HTL-2/G1 | 80/20 | 40 | HP-1/EM-1 | 91.5/8.5 | 60 | 7.9 |
| Example D24 | D24 | HTL-2/G2 | 80/20 | 40 | HP-1/EM-1 | 91.5/8.5 | 60 | 7.1 |
| Example D25 | D25 | HTL-2/G2 | 60/40 | 40 | HP-1/EM-1 | 91.5/8.5 | 60 | 4.9 |

TABLE 7

| | light emitting device | formation of second organic layer | | | formation of first organic layer | | | external quantum efficiency (relative value) |
|---|---|---|---|---|---|---|---|---|
| | | material | composition ratio (% by mass) | thickness (nm) | material | composition ratio (% by mass) | thickness (nm) | |
| Example D26 | D26 | HTL-2 | 100 | 40 | HP-1/EM-1/G2 | 71.5/8.5/20 | 60 | 4.9 |
| Example D27 | D27 | HTL-2 | 100 | 40 | HP-1/EM-1/G2 | 51.5/8.5/40 | 60 | 5.5 |
| Example D28 | D28 | HTL-2 | 100 | 20 | HP-1/EM-1/EM-A2 | 90.5/8.5/1 | 60 | 13.1 |
| Example D29 | D29 | HTL-2 | 100 | 20 | HP-1/EM-2 | 91.5/8.5 | 60 | 13.1 |
| Example D30 | D30 | HTL-2 | 100 | 20 | HP-1/EM-3 | 91.5/8.5 | 60 | 13.4 |
| Example D31 | D31 | HTL-2 | 100 | 20 | HP-1/EM-4 | 91.5/8.5 | 60 | 10.9 |
| Example D32 | D32 | HTL-2 | 100 | 20 | HP-1/EM-5 | 91.5/8.5 | 60 | 13.3 |
| Example D33 | D33 | HTL-2 | 100 | 20 | HP-1/EM-6 | 91.5/8.5 | 60 | 12.0 |
| Example D34 | D34 | HTM-1/R1 | 65/35 | 20 | HP-1/EM-1 | 91.5/8.5 | 60 | 4.0 |
| Comparative Example CD2 | CD2 | HTL-1 | 100 | 20 | HP-1/EM-1/R1 | 88.5/8.5/3 | 60 | 1.0 |

<Example D35> Fabrication and Evaluation of Light Emitting Device D35

A light emitting device D35 was fabricated in the same manner as in Example D1 except that "The polymer compound HP-1 and the fluorescent compound EM-A1 (polymer compound HP-1/fluorescent compound EM-A1=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1.
(Evaluation of Light Emitting Device)

When voltage was applied to the light emitting device D35, EL light emission was observed. The external quantum efficiency at 50 cd/m² was measured. The resultant results are shown in Table 8.

Further, the CIE chromaticity coordinate (x, y) at 50 cd/m² was (0.21, 0.16).

<Example D36> Fabrication and Evaluation of Light Emitting Device D36

A light emitting device D36 was fabricated in the same manner as in Example D1 except that "The polymer compound HP-1 and the fluorescent compound EM-A1 (polymer compound HP-1/fluorescent compound EM-A1=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1, and further, (Formation of second organic layer) of Example D1 was changed to (Formation of second organic layer D36) described below.

(Formation of Second Organic Layer D36)

The polymer compound HTL-3 was dissolved in xylene at a concentration of 0.6% by mass. The resultant xylene solution was spin-coated on the hole injection layer, to form a film with a thickness of 20 nm, and the film was heated on a hot plate at 180° C. for 60 minutes under a nitrogen gas atmosphere, to form a second organic layer. By this heating, the polymer compound HTL-3 turned into a cross-linked body.
(Evaluation of Light Emitting Device)

When voltage was applied to the light emitting device D36, EL light emission was observed. The external quantum efficiency at 50 cd/m² was measured. The resultant results are shown in Table 8.

Further, the CIE chromaticity coordinate (x, y) at 50 cd/m² was (0.16, 0.14).

<Example D37> Fabrication and Evaluation of Light Emitting Device D37

A light emitting device D37 was fabricated in the same manner as in Example D1 except that "The polymer compound HP-1 and the fluorescent compound EM-A5 (polymer compound HP-1/fluorescent compound EM-A5=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1, and further, (Formation of second organic layer) of Example D1 was changed to (Formation of second organic layer D36) described above.

(Evaluation of Light Emitting Device) When voltage was applied to the light emitting device D37, EL light emission was observed. The external quantum efficiency at 50 cd/m² was measured. The resultant results are shown in Table 8.

Further, the CIE chromaticity coordinate (x, y) at 50 cd/m² was (0.17, 0.14).

<Example D38> Fabrication and Evaluation of Light Emitting Device D38

A light emitting device D38 was fabricated in the same manner as in Example D1 except that "The polymer compound HP-1 and the fluorescent compound EM-A6 (polymer compound HP-1/fluorescent compound EM-A6=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1, and further, (Formation of second organic layer) of Example D1 was changed to (Formation of second organic layer D36) described above.

(Evaluation of Light Emitting Device)

When voltage was applied to the light emitting device D38, EL light emission was observed. The external quantum efficiency at 50 cd/m$^2$ was measured. The resultant results are shown in Table 8.

Further, the CIE chromaticity coordinate (x, y) at 50 cd/m$^2$ was (0.19, 0.34).

<Comparative Example CD3> Fabrication and Evaluation of Light Emitting Device CD3

A light emitting device CD3 was fabricated in the same manner as in Example D1 except that "The polymer compound HP-1 and the fluorescent compound EM-A6 (polymer compound HP-1/fluorescent compound EM-A6=91.5% by mass/8.5% by mass) were dissolved in chlorobenzene at a concentration of 0.7% by mass." instead of "The polymer compound HP-1 and the fluorescent compound EM-A1 (polymer compound HP-1/fluorescent compound EM-A1=91.5% by mass/8.5% by mass) were dissolved in chlorobenzene at a concentration of 0.9% by mass." in (Formation of first organic layer) of Example D1, and further, "The polymer compound HTL-4 was dissolved in xylene at a concentration of 0.6% by mass." instead of "The polymer compound HTL-2 was dissolved in xylene at a concentration of 0.6% by mass." in (Formation of second organic layer) of Example D1.

(Evaluation of Light Emitting Device)

When voltage was applied to the light emitting device CD3, EL light emission was observed. The external quantum efficiency at 50 cd/m$^2$ was measured. The resultant results are shown in Table 8.

Further, the CIE chromaticity coordinate (x, y) at 50 cd/m$^2$ was (0.47, 0.35).

The results of Examples D35 to D38 and Comparative Example CD3 are shown in Table 8. The relative value of the external quantum efficiency of each light emitting device at 50 cd/m$^2$, when the external quantum efficiency of the light emitting device CD3 at 50 cd/m$^2$ is taken as 1.0, is shown.

TABLE 8

| | light emitting device | formation of second organic layer | | | formation of first organic layer | | | external quantum efficiency (relative value) |
|---|---|---|---|---|---|---|---|---|
| | | material | composition ratio (% by mass) | thickness (nm) | material | composition ratio (% by mass) | thickness (nm) | |
| Example D35 | D35 | HTL-2 | 100 | 20 | HP-1/EM-A1 | 91.5/8.5 | 60 | 2.1 |
| Example D36 | D36 | HTL-3 | 100 | 20 | HP-1/EM-A1 | 91.5/8.5 | 60 | 1.7 |
| Example D37 | D37 | HTL-3 | 100 | 20 | HP-1/EM-A5 | 91.5/8.5 | 60 | 1.3 |
| Example D38 | D38 | HTL-3 | 100 | 20 | HP-1/EM-A6 | 91.5/8.5 | 60 | 1.3 |
| Comparative Example CD3 | CD3 | HTL-4 | 100 | 20 | HP-1/EM-A6 | 91.5/8.5 | 60 | 1.0 |

INDUSTRIAL APPLICABILITY

According to the present invention, a light emitting device excellent in the external quantum efficiency can be provided.

The invention claimed is:

1. A light emitting device comprising an anode, a cathode, a first organic layer disposed between the anode and the cathode and a second organic layer disposed between the anode and the cathode, wherein the first organic layer is a layer containing a fluorescent low-molecular weight compound, and the second organic layer is selected from:

Layer C containing a cross-linked body of a cross-linkable polymer compound containing a constitutional unit having a group obtained by removing from a metal complex represented by the formula (1) a part or all of hydrogen atoms bonding directly to carbon atoms constituting $L^1$ or $L^2$ in the metal complex, a cross-linkable constitutional unit having a cross-linkable group, and a constitutional unit represented by the formula (X), Layer B containing a polymer compound containing a constitutional unit having a group obtained by removing from a metal complex represented by the formula (1) a part or all of hydrogen atoms bonding directly to carbon atoms constituting $L^1$ or $L^2$ in the metal complex, and a constitutional unit represented by the formula (X), or Layer A containing a composition containing a cross-linked body of a cross-linkable material and a metal complex represented by the formula (1):

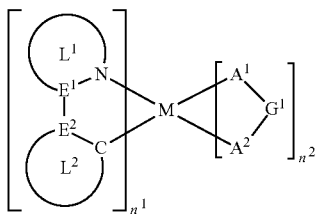

(1)

wherein,

M represents a ruthenium atom, a rhodium atom, a palladium atom, an iridium atom or a platinum atom, $n^1$ represents an integer of 1 or more, $n^2$ represents an integer of 0 or more and $n^1+n^2$ is 2 or 3, and $n^1+n^2$ is 3 when M is a ruthenium atom, a rhodium atom or an iridium atom, while $n^1+n^2$ is 2 when M is a palladium atom or a platinum atom, $E^1$ and $E^2$ each independently represent a carbon atom or a nitrogen atom, at least one of $E^1$ and $E^2$ is a carbon atom, when a plurality of $E^1$ and $E^2$ are present, they may be the same or different at each occurrence, Ring $L^1$ represents an aromatic hetero ring, and the ring optionally has a substituent, when a plurality of the substituents are present, they may be the same or different and may be combined together to form a ring together with atoms to which they are attached, when a plurality of Ring $L^1$ are present, they may be the same or different, Ring $L^2$ represents an aromatic hydrocarbon ring or an aromatic hetero ring, and these rings optionally have a substituent, when a plurality of the substituents are present, they may be the same or different and may be combined together to form a ring together with atoms to which they are attached, when a plurality of Ring $L^2$ are present, they may be the same or different, the substituent which Ring $L^1$ optionally has and the substituent which Ring $L^2$ optionally has may be combined together to form a ring together with atoms to which they are attached, $A^1$-$G^1$-$A^2$ represents an anionic bidentate ligand, $A^1$ and $A^2$ each independently represent a carbon atom, an oxygen atom or a nitrogen atom, and these atoms may be ring-constituent atoms, $G^1$ represents a single bond or an atomic group constituting a bidentate ligand together with $A^1$ and $A^2$, and when a plurality of $A^1$-$G^1$-$A^2$ are present, they may be the same or different,

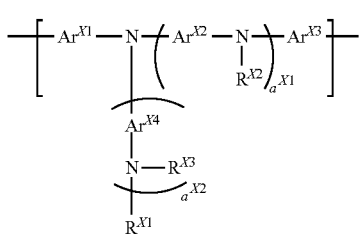

(X)

wherein, $a^{X1}$ and $a^{X2}$ each independently represent an integer of 0 or more, $Ar^{X1}$ and $Ar^{X3}$ each independently represent an arylene group or a divalent heterocyclic group, and these groups optionally have a substituent, $Ar^{X2}$ and $Ar^{X4}$ each independently represent an arylene group, a divalent heterocyclic group or a divalent group in which at least one arylene group and at least one divalent heterocyclic group are bonded directly, and these groups optionally have a substituent, when a plurality of $Ar^{X2}$ and $Ar^{X4}$ are present, they may be the same or different at each occurrence, $R^{X1}$, $R^{X2}$ and $R^{X3}$ each independently represent a hydrogen atom, an alkyl group, a cycloalkyl group, an aryl group or a monovalent heterocyclic group, and these groups optionally have a substituent, and when a plurality of $R^{X2}$ and $R^{X3}$ are present, they may be the same or different at each occurrence.

2. The light emitting device according to claim 1, wherein the fluorescent low-molecular weight compound is a compound represented by the formula (FB):

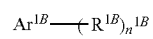

(FB)

wherein, $n^{1B}$ represents an integer of 0 or more and 15 or less, $Ar^{1B}$ represents an aromatic hydrocarbon group or an aromatic heterocyclic group, and these groups optionally have a substituent, when a plurality of the substituents are present, they may be the same or different and may be combined together to form a ring together with atoms to which they are attached, $R^{1B}$ represents an alkyl group, a cycloalkyl group, an alkoxy group, a cycloalkoxy group, an aryl group, a monovalent heterocyclic group, a substituted amino group, an alkenyl group, a cycloalkenyl group, an alkynyl group or a cycloalkynyl group, and these groups optionally have a substituent, and when a plurality of $R^{1B}$ are present, they may be the same or different and may be combined together to form a ring together with carbon atoms to which they are attached.

3. The light emitting device according to claim 2, wherein $n^{1B}$ is an integer of 1 or more and 8 or less, and $R^{1B}$ is an alkyl group, a cycloalkyl group, an alkoxy group, a cycloalkoxy group, an aryl group, a monovalent heterocyclic group, a substituted amino group, alkenyl group or a cycloalkenyl group and these groups optionally have a substituent.

4. The light emitting device according to claim 2, wherein $Ar^{1B}$ is a condensed-ring aromatic hydrocarbon group optionally having a substituent.

5. The light emitting device according to claim 1, wherein the second organic layer is the Layer B or the Layer C, and the constitutional unit having a group obtained by removing from a metal complex represented by the formula (1) a part or all of hydrogen atoms bonding directly to carbon atoms constituting $L^1$ or $L^2$ in the metal complex is a constitutional unit represented by the formula (1B), a constitutional unit represented by the formula (2B), a constitutional unit represented by the formula (3B) or a constitutional unit represented by the formula (4B):

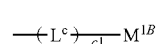

(1B)

wherein, $M^{1B}$ represents a group obtained by removing from said metal complex represented by the formula (1) one hydrogen atom bonding directly to a carbon atom or a hetero atom constituting the metal complex, $L^C$ represents an oxygen atom, a sulfur atom, —N($R^A$)—, —C($R^B$)$_2$—, —C($R^B$)=C($R^B$)—, —C≡C—, an arylene group or a divalent heterocyclic group, and these groups optionally have a substituent, $R^A$ represents a hydrogen atom, an alkyl group, a cycloalkyl group, an aryl group or a monovalent heterocyclic group, and these groups optionally have a substituent, $R^B$ represents a hydrogen atom, an alkyl group, a cycloalkyl group, an alkoxy group, a cycloalkoxy group, an aryl group or a monovalent heterocyclic group, and these groups optionally have a substituent, a plurality of $R^B$ may be the same or different and may be combined together to form a ring together with carbon atoms to which they are attached, and when a plurality of $L^C$ are present, they may be the same or different, $n^{c1}$ represents an integer of 0 or more,

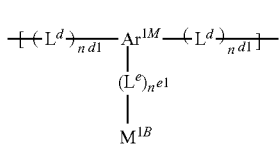

(2B)

wherein, $M^{1B}$ represents the same meaning as described above, $L^d$ and $L^e$ each independently represent an oxygen atom, a sulfur atom, —N($R^A$)—, —C($R^B$)$_2$—, —C($R^B$)=C($R^B$)—, —C≡C—, an arylene group or a divalent heterocyclic group, and these groups optionally have a substituent, $R^A$ and $R^B$ represent the same meaning as described above, when a plurality of $L^d$ and $L^e$ are present, they may be the same or different at each occurrence, $n^{d1}$ and $n^{e1}$ each independently represent an integer of 0 or more, a plurality of $n^{d1}$ may be the same or different, $Ar^{1M}$ represents an aromatic hydrocarbon group or a heterocyclic group, and these groups optionally have a substituent,

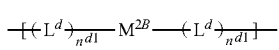

(3B)

wherein, $L^d$ and $n^{d1}$ represent the same meaning as described above, $M^{2B}$ represents a group obtained by removing from said metal complex represented by the formula (1) two hydrogen atoms bonding directly to carbon atoms constituting the metal complex,

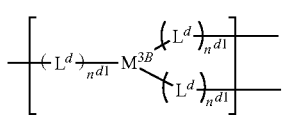

(4B)

wherein, $L^d$ and $n^{d1}$ represent the same meaning as described above, and $M^{3B}$ represents a group obtained by removing from said metal complex represented by the formula (1) three hydrogen atoms bonding directly to carbon atoms constituting the metal complex.

6. The light emitting device according to claim 1, wherein the second organic layer is the Layer A, and the cross-linkable material is a low-molecular weight compound having at least one cross-linkable group selected from Group A or a polymer compound containing a cross-linkable constitutional unit having at least one cross-linkable group selected from Group A:

(XL-1)

(XL-2)

(XL-3)

(XL-4)

(XL-5)

(XL-6)

(XL-7)

(XL-8)

(XL-9)

-continued

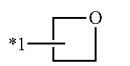  (XL-10)

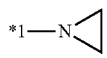  (XL-11)

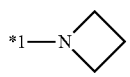  (XL-12)

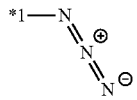  (XL-13)

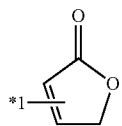  (XL-14)

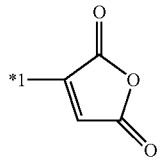  (XL-15)

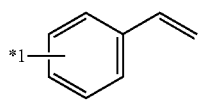  (XL-16)

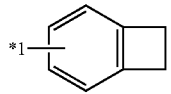  (XL-17)

wherein, $R^{XL}$ represents a methylene group, an oxygen atom or a sulfur atom, and $n^{XL}$ represents an integer of 0 to 5, when a plurality of $R^{XL}$ are present, they may be the same or different, and when a plurality of $n^{XL}$ are present, they may be the same or different, *1 represents a binding position, and these cross-linkable groups optionally have a substituent.

7. The light emitting device according to claim 6, wherein the cross-linkable material is a polymer compound containing a cross-linkable constitutional unit having at least one cross-linkable group selected from Group A, and
the cross-linkable constitutional unit is a constitutional unit represented by the formula (2) or a constitutional unit represented by the formula (2'):

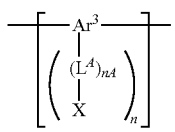  (2)

wherein,
nA represents an integer of 0 to 5, and n represents 1 or 2, when a plurality of nA are present, they may be the same or different,
$Ar^3$ represents an aromatic hydrocarbon group or a heterocyclic group, and these groups optionally have a substituent, $L^A$ represents an alkylene group, a cycloalkylene group, an arylene group, a divalent heterocyclic group, a group represented by —NR'—, an oxygen atom or a sulfur atom, and these groups optionally have a substituent, R' represents a hydrogen atom, an alkyl group, a cycloalkyl group, an aryl group or a monovalent heterocyclic group, and these groups optionally have a substituent, when a plurality of $L^A$ are present, they may be the same or different, X represents a cross-linkable group selected from Group A, and when a plurality of X are present, they may be the same or different,

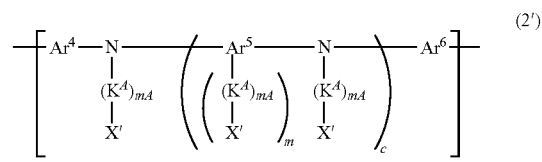  (2')

wherein,
mA represents an integer of 0 to 5, m represents an integer of 1 to 4, and c represents an integer of 0 or 1, when a plurality of mA are present, they may be the same or different, $Ar^5$ represents an aromatic hydrocarbon group, a heterocyclic group or a group in which at least one aromatic hydrocarbon ring and at least one hetero ring are bonded directly, and these groups optionally have a substituent, $Ar^4$ and $Ar^6$ each independently represent an arylene group or a divalent heterocyclic group, and these groups optionally have a substituent, $Ar^4$, $Ar^5$ and $Ar^6$ each may be bonded directly or via an oxygen atom or a sulfur atom to a group other than these groups bonded to a nitrogen atom to which these groups are attached, to form a ring, $K^A$ represents an alkylene group, a cycloalkylene group, an arylene group, a divalent heterocyclic group, a group represented by —NR'—, an oxygen atom or a sulfur atom, and these groups optionally have a substituent, R' represents a hydrogen atom, an alkyl group, a cycloalkyl group, an aryl group or a monovalent heterocyclic group, and these groups optionally have a substituent, when a plurality of $K^A$ are present, they may be the same or different, X' represents a cross-linkable group selected from Group A, a hydrogen atom, an alkyl group, a cycloalkyl group, an aryl group or a monovalent heterocyclic group, and these groups optionally have a substituent, when a plurality of X' are present, they may be the same or different, and at least one X' is a cross-linkable group selected from Group A.

8. The light emitting device according to claim 1, wherein the metal complex represented by the formula (1) is a metal complex represented by the formula (1-B):

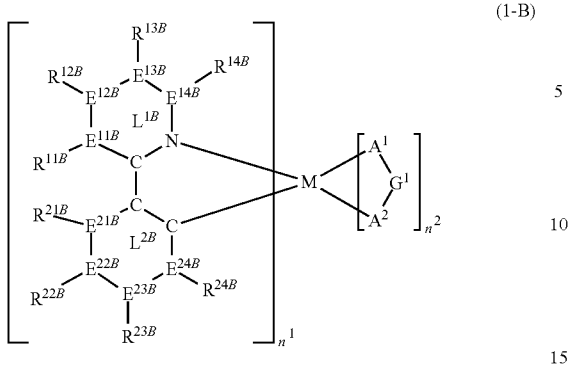

(1-B)

wherein,

M, $n^1$, $n^2$ and $A^1$-$G^1$-$A^2$ represent the same meaning as described above, $E^{11B}$, $E^{12B}$, $E^{13B}$, $E^{14B}$, $E^{21B}$, $E^{22B}$, $E^{23B}$ and $E^{24B}$ each independently represent a nitrogen atom or a carbon atom, when a plurality of $E^{11B}$, $E^{12B}$, $E^{13B}$, $E^{14B}$, $E^{21B}$, $E^{22B}$, $E^{23B}$ and $E^{24B}$ are present, they may be the same or different at each occurrence, when $E^{11B}$ is a nitrogen atom, $R^{11B}$ is absent, when $E^{12B}$ is a nitrogen atom, $R^{12B}$ is absent, when $E^{13B}$ is a nitrogen atom, $R^{13B}$ is absent, when $E^{14B}$ is a nitrogen atom, $R^{14B}$ is absent, when $E^{21B}$ is a nitrogen atom, $R^{21B}$ is absent, when $E^{22B}$ is a nitrogen atom, $R^{22B}$ is absent, when $E^{23B}$ is a nitrogen atom, $R^{23B}$ is absent, when $E^{24B}$ is a nitrogen atom, $R^{24B}$ is absent, $R^{11B}$, $R^{12B}$, $R^{13B}$, $R^{14B}$, $R^{21B}$, $R^{22B}$, $R^{23B}$ and $R^{24B}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and these groups optionally have a substituent, when a plurality of $R^{11B}$, $R^{12B}$, $R^{13B}$, $R^{14B}$, $R^{21B}$, $R^{22B}$, $R^{23B}$ and $R^{24B}$ are present, they may be the same or different at each occurrence, and, $R^{11B}$ and $R^{12B}$, $R^{12B}$ and $R^{13B}$, $R^{13B}$ and $R^{14B}$, $R^{11B}$ and $R^{21B}$, $R^{21B}$ and $R^{22B}$, $R^{22B}$ and $R^{23B}$, and $R^{23B}$ and $R^{24B}$ each may be combined together to form a ring together with atoms to which they are attached, Ring $L^{1B}$ represents a pyridine ring or a pyrimidine ring, and Ring $L^{2B}$ represents a benzene ring, a pyridine ring or a pyrimidine ring.

9. The light emitting device according to claim 8, wherein the metal complex represented by the formula (1-B) is a metal complex represented by the formula (1-B1), a metal complex represented by the formula (1-B2), a metal complex represented by the formula (1-B3), a metal complex represented by the formula (1-B4) or a metal complex represented by the formula (1-B5):

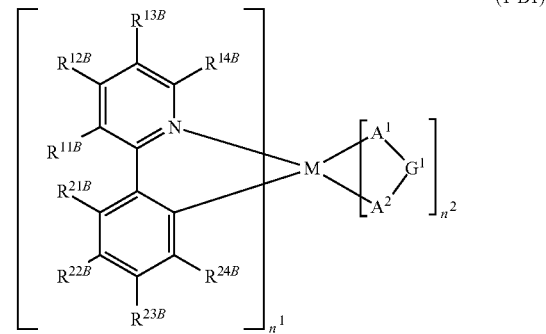

(1-B1)

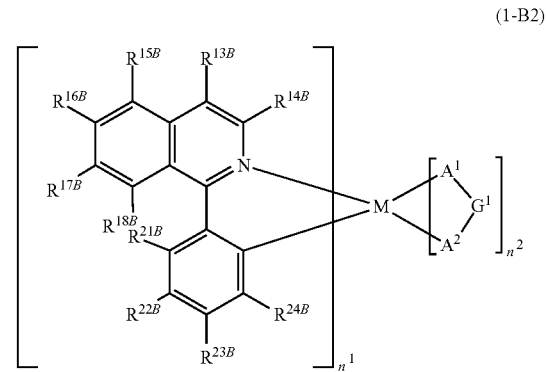

(1-B2)

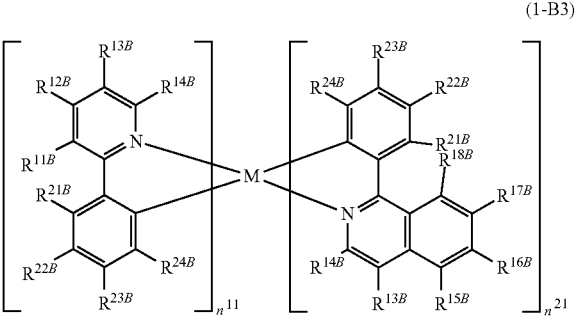

(1-B3)

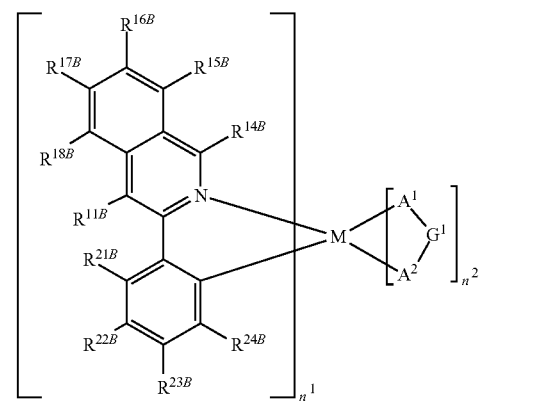

(1-B4)

-continued

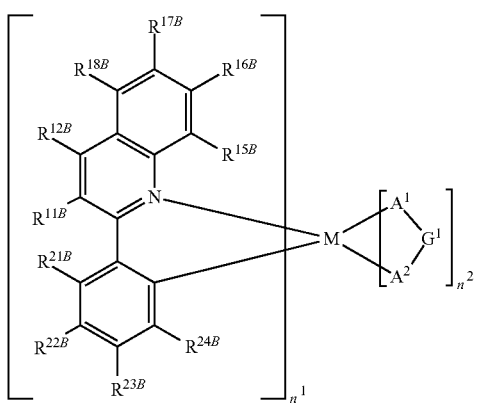

(1-B5)

wherein,

M, $n^1$, $n^2$ and $A^1$-$G^1$-$A^2$, $R^{11B}$, $R^{12B}$, $R^{13B}$, $R^{14B}$, $R^{21B}$, $R^{22B}$, $R^{23B}$ and $R^{24B}$ represent the same meaning as described above, $n^{11}$ and $n^{12}$ each independently represent an integer of 1 or more, and $n^{11}+n^{12}$ is 2 or 3, and $n^{11}+n^{12}$ is 3 when M is a ruthenium atom, a rhodium atom or an iridium atom, while $n^{11}+n^{12}$ is 2 when M is a palladium atom or a platinum atom, $R^{15B}$, $R^{16B}$, $R^{17B}$ and $R^{18B}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and these groups optionally have a substituent, when a plurality of $R^{15B}$, $R^{16B}$, $R^{17B}$ and $R^{18B}$ are present, they may be the same or different at each occurrence, and, $R^{13B}$ and $R^{15B}$, $R^{15B}$ and $R^{16B}$, $R^{16B}$ and $R^{17B}$, $R^{17B}$ and $R^{18B}$, and $R^{18B}$ and $R^{21B}$, each may be combined together to form a ring together with atoms to which they are attached.

10. The light emitting device according to claim 1, wherein the metal complex represented by the formula (1) is a metal complex represented by the formula (1-A):

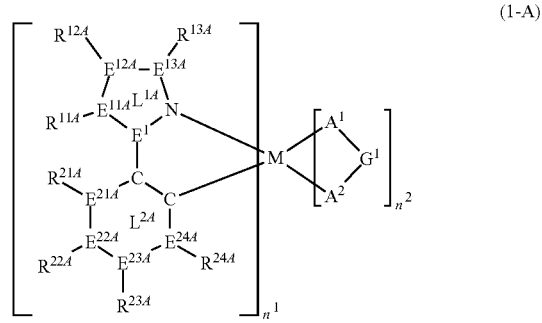

(1-A)

wherein,

M, $n^1$, $n^2$ and $A^1$-$G^1$-$A^2$ represent the same meaning as described above, $E^{11A}$, $E^{12A}$, $E^{13A}$, $E^{21A}$, $E^{22A}$ and $E^{24A}$ each independently represent a nitrogen atom or a carbon atom, when a plurality of $E^{11A}$, $E^{12A}$, $E^{13A}$, $E^{21A}$, $E^{22A}$ and $E^{24A}$ are present, they may be the same or different at each occurrence, when $E^{11A}$ is a nitrogen atom, $R^{11A}$ may be present or absent, when $E^{12A}$ is a nitrogen atom, $R^{12A}$ may be present or absent, when $E^{13A}$ is a nitrogen atom, $R^{13A}$ may be present or absent, when $E^{21A}$ is a nitrogen atom, $R^{21A}$ is absent, when $E^{22A}$ is a nitrogen atom, $R^{22A}$ is absent, when $E^{23A}$ is a nitrogen atom, $R^{23A}$ is absent, when $E^{24A}$ is a nitrogen atom, $R^{24A}$ is absent, $R^{11A}$, $R^{12A}$, $R^{13A}$, $R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and these groups optionally have a substituent, when a plurality of $R^{11A}$, $R^{12A}$, $R^{13A}$, $R^{21A}$, $R^{22A}$, $R^{23A}$ and $R^{24A}$ are present, they may be the same or different at each occurrence, $R^{11A}$ and $R^{12A}$, $R^{12A}$ and $R^{13A}$, $R^{11A}$ and $R^{21A}$, $R^{21A}$ and $R^{22A}$, $R^{22A}$ and $R^{23A}$, and $R^{23A}$ and $R^{24A}$ each may be combined together to form a ring together with atoms to which they are attached, Ring $L^{1A}$ represents a triazole ring or a diazole ring, and Ring $L^{2A}$ represents a benzene ring, a pyridine ring or a pyrimidine ring.

11. The light emitting device according to claim 1, wherein the first organic layer further contains a compound represented by the formula (FH-1), a polymer compound containing a constitutional unit represented by the formula (Y) or a combination thereof:

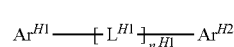

(FH-1)

wherein, $Ar^{H1}$ and $Ar^{H2}$ each independently represent an aryl group, a monovalent heterocyclic group or a substituted amino group, and these groups optionally have a substituent, $n^{H1}$ represents an integer of 0 or more and 15 or less, $L^{H1}$ represents an arylene group, a divalent heterocyclic group or a group represented by —[C($R^{H11}$)$_2$]$n^{H11}$—, and these groups optionally have a substituent, when a plurality of $L^{H1}$ are present, they may be the same or different, $n^{H11}$ represents an integer of 1 or more and 10 or less, $R^{H11}$ represents a hydrogen atom, an alkyl group, a cycloalkyl group, an alkoxy group, a cycloalkoxy group, an aryl group or a monovalent heterocyclic group, and these groups optionally have a substituent, and a plurality of $R^{H11}$ may be the same or different and may be combined together to form a ring together with carbon atoms to which they are attached,

(Y)

wherein, $Ar^{Y1}$ represents an arylene group, a divalent heterocyclic group or a divalent group in which at least one arylene group and at least one divalent heterocyclic group are bonded directly, and these groups optionally have a substituent.

12. The light emitting device according claim 1, wherein the first organic layer further contains at least one material selected from the group consisting of a hole transporting material, a hole injection material, an electron transporting material, an electron injection material and a light emitting material.

13. The light emitting device according to claim 1, wherein the first organic layer and the second organic layer are adjacent.

14. The light emitting device according to claim 1, wherein the second organic layer is a layer disposed between the anode and the first organic layer.

* * * * *